US012068029B2

(12) United States Patent
Bertin

(10) Patent No.: US 12,068,029 B2
(45) Date of Patent: Aug. 20, 2024

(54) THREE DIMENSIONAL (3D) MEMORIES WITH MULTIPLE RESISTIVE CHANGE ELEMENTS PER CELL AND CORRESPONDING ARCHITECTURES FOR IN-MEMORY COMPUTING

(71) Applicant: Nantero, Inc., Woburn, MA (US)

(72) Inventor: Claude L. Bertin, Ashburn, VA (US)

(73) Assignee: Nantero, Inc., Woburn, MA (US)

( * ) Notice: Subject to any disclaimer, the term of this patent is extended or adjusted under 35 U.S.C. 154(b) by 0 days.

(21) Appl. No.: 18/370,541

(22) Filed: Sep. 20, 2023

(65) Prior Publication Data

US 2024/0013834 A1 Jan. 11, 2024

Related U.S. Application Data

(63) Continuation of application No. 17/519,828, filed on Nov. 5, 2021, now Pat. No. 11,798,623.

(51) Int. Cl.

| | |
|---|---|
| ***G11C 11/00*** | (2006.01) |
| ***G11C 13/02*** | (2006.01) |
| ***H10K 10/50*** | (2023.01) |
| ***H10K 19/00*** | (2023.01) |
| ***H10K 85/20*** | (2023.01) |

(52) U.S. Cl.
CPC .......... *G11C 13/025* (2013.01); *H10K 10/50* (2023.02); *H10K 19/202* (2023.02); *H10K 85/221* (2023.02)

(58) Field of Classification Search
CPC ..... G11C 13/025; H10K 19/202; H10K 10/50
USPC .......................................................... 365/148
See application file for complete search history.

(56) References Cited

U.S. PATENT DOCUMENTS

| | | | | |
|---|---|---|---|---|
| 9,263,126 | B1 * | 2/2016 | Viviani | G11C 13/0007 |
| 9,299,430 | B1 * | 3/2016 | Bertin | G11C 13/025 |
| 9,412,447 | B1 * | 8/2016 | Bertin | G11C 13/0061 |
| 10,026,661 | B2 * | 7/2018 | Won | H01L 21/823475 |
| 10,290,327 | B2 * | 5/2019 | Luo | G11C 11/5614 |
| 10,937,498 | B2 * | 3/2021 | Bertin | G11C 13/025 |
| 11,145,337 | B1 * | 10/2021 | Akaogi | G11C 7/1084 |

* cited by examiner

*Primary Examiner* — Viet Q Nguyen
(74) *Attorney, Agent, or Firm* — Nantero, Inc.

(57) ABSTRACT

The present disclosure generally relates to multi-switch storage cells (MSSCs), three-dimensional MSSC arrays, and three-dimensional MSSC memory. Multi-switch storage cells include a cell select device, multiple resistive change elements, and an intracell wiring electrically connecting the multiple resistive change elements together and to the cell select device. MSSC arrays are designed (architected) and operated to prevent inter-cell (sneak path) currents between multi-switch storage cells, which prevents stored data disturb from adjacent cells and adjacent cell data pattern sensitivity. Additionally, READ and WRITE operations may be performed on one of the multiple resistive change elements in a multi-switch storage cell without disturbing the stored data in the remaining resistive change elements. However, controlled parasitic currents may flow in the remaining resistive change elements within the cell. Isolating each multi-switch storage cell in a three-dimensional MSSC array, enables in-memory computing for applications such as data processing for machine learning and artificial intelligence.

32 Claims, 89 Drawing Sheets

Cell = 3F x 2F = 6 $F^2$

Multi-Switch Storage Cell Equivalent Circuit

Thevenin Equivalent Circuit $V_{BL0} = V_{TH}\ (1-e^{-t/\tau TH})$ $\tau_{TH} = R_{TH} \times C_{BL0}$

1570

| READ Timing | | | Signal for $V_{SL}$ = 0.5 V | | | Signal for $V_{SL}$ = 1.0 V | | | Signal for $V_{SL}$ = 1.5 V | | |
|---|---|---|---|---|---|---|---|---|---|---|---|
| Access Time (ns) | Signal Develop-ment (ns) | CL Clock Cycles | $V_{BL}$ for $R_{LO}$ (mV) | $V_{REF}$ (mV) | SA/Latch Input Signal (mV) | $V_{BL}$ for $R_{LO}$ (mV) | $V_{REF}$ (mV) | SA/Latch Input Signal (mV) | $V_{BL}$ for $R_{LO}$ (mV) | $V_{REF}$ (mV) | SA/Lat ch Input Signal (mV) |
| 5 | 4 | 2 | 50 | 10 | **40** | 100 | 10 | **90** | 150 | 10 | **140** |

FIG. 15C

Footprint = 4F x 2F = 8 F²

Footprint = 4F x 3F = 12 F²

2800-1

| Cell | Switch Resistance | | BL Cap | Time | SL Volt | Thevenin Equivalent Circuit | | | BL Volt | |
|---|---|---|---|---|---|---|---|---|---|---|
| No. Switch n | Selec-ted $R_{SW-S}$ (kΩ) | Un-Selec-Ted $R_{SW-U}$ (kΩ) | $C_{BL}$ (fF) | BL Charge Time t (ns) | Select Line Volt $V_{SL}$ (V) | Vol-tage $V_{TH}$ (V) | Resis-tance $R_{TH}$ (kΩ) | Time Cons-tant $\tau_{TH}$ (ns) | BL Vol-tage $V_{BL}$ (mV) | |
| 2 | 100 | 2,000 | 400 | 4 | 1 | 0.952 | 95.2 | 38.1 | 94.9 | 1 ($R_{LO}$) |
| 2 | 100 | 100 | 400 | 4 | 1 | 0.500 | 50.0 | 20 | 90.6 | 2 ($R_{LO}$) |
| 2 | 2,000 | 2,000 | 400 | 4 | 1 | 0.500 | 1,000 | 400 | 5.0 | 3 ($R_{HI}$) |
| 2 | 2,000 | 100 | 400 | 4 | 1 | 0.048 | 95.2 | 38.1 | 4.7 | 4 ($R_{HI}$) |

FIG. 28A 2800-2

| Cell | Switch Resistance | | BL Cap | Time | SL Volt | Thevenin Equivalent Circuit | | | BL Volt | |
|---|---|---|---|---|---|---|---|---|---|---|
| No. Switch n | Selec-ted $R_{SW-S}$ (kΩ) | Un-Selec-Ted $R_{SW-U}$ (kΩ) | $C_{BL}$ (fF) | BL Charge Time t (ns) | Select Line Volt $V_{SL}$ (V) | Vol-tage $V_{TH}$ (V) | Resis-tance $R_{TH}$ (kΩ) | Time Cons-tant $\tau_{TH}$ (ns) | BL Vol-tage $V_{BL}$ (mV) | |
| 4 | 100 | 2,000 | 400 | 4 | 1 | 0.870 | 87.0 | 34.8 | 94.5 | 1 ($R_{LO}$) |
| 4 | 100 | 100 | 400 | 4 | 1 | 0.250 | 25.0 | 10 | 82.4 | 2 ($R_{LO}$) |
| 4 | 2,000 | 2,000 | 400 | 4 | 1 | 0.250 | 500 | 200 | 5.0 | 3 ($R_{HI}$) |
| 4 | 2,000 | 100 | 400 | 4 | 1 | 0.016 | 32.8 | 13.1 | 4.3 | 4 ($R_{HI}$) |

FIG. 28B 2800-3

| | Cell | Switch Resistance | | BL Cap | Time | SL Volt | Thevenin Equivalent Circuit | | | BL Volt |
|---|---|---|---|---|---|---|---|---|---|---|
| | No. Switch n | Selec -ted $R_{SW-S}$ (kΩ) | Un-Selec-Ted $R_{SW-U}$ (kΩ) | $C_{BL}$ (fF) | BL Charge Time t (ns) | Select Line Volt $V_{SL}$ (V) | Vol-tage $V_{TH}$ (V) | Resis-tance $R_{TH}$ (kΩ) | Time Cons-tant $\tau_{TH}$ (ns) | BL Vol-tage $V_{BL}$ (mV) |
| $R_{LO}$ 1 | 8 | 100 | 2,000 | 400 | 4 | 1 | 0.741 | 74.1 | 29.6 | 93.5 |
| $R_{LO}$ 2 | 8 | 100 | 100 | 400 | 4 | 1 | 0.125 | 12.5 | 5.0 | 68.8 |
| $R_{HI}$ 3 | 8 | 2,000 | 2,000 | 400 | 4 | 1 | 0.125 | 250 | 100 | 4.9 |
| $R_{HI}$ 4 | 8 | 2,000 | 100 | 400 | 4 | 1 | 0.007 | 14.2 | 5.67 | 3.6 |

FIG. 28C 2800-4

| Cell | Switch Resistance | | BL Cap | Time | SL Volt | Thevenin Equivalent Circuit | | | BL Volt | |
|---|---|---|---|---|---|---|---|---|---|---|
| No. Switch n | Selec-ted $R_{SW-S}$ (kΩ) | Un-Selec-Ted $R_{SW-U}$ (kΩ) | $C_{BL}$ (fF) | BL Charge Time t (ns) | Select Line Volt $V_{SL}$ (V) | Vol-tage $V_{TH}$ (V) | Resis-tance $R_{TH}$ (kΩ) | Time Cons-tant $\tau_{TH}$ (ns) | BL Vol-tage $V_{BL}$ (mV) | |
| 16 | 100 | 2,000 | 400 | 4 | 1 | 0.571 | 57.1 | 22.9 | 91.7 | 1 ($R_{LO}$) |
| 16 | 100 | 100 | 400 | 4 | 1 | 0.063 | 6.25 | 2.5 | 49.9 | 2 ($R_{LO}$) |
| 16 | 2,000 | 2,000 | 400 | 4 | 1 | 0.063 | 125 | 50 | 4.8 | 3 ($R_{HI}$) |
| 16 | 2,000 | 100 | 400 | 4 | 1 | 0.003 | 6.64 | 2.66 | 2.6 | 4 ($R_{HI}$) |

FIG. 28D 2800-5

| Cell | Switch Resistance | | BL Cap | Time | SL Volt | Thevenin Equivalent Circuit | | | BL Volt | |
|---|---|---|---|---|---|---|---|---|---|---|
| No. Switch n | Selec-ted $R_{SW-S}$ (kΩ) | Un-Selec-Ted $R_{SW-U}$ (kΩ) | $C_{BL}$ (fF) | BL Charge Time t (ns) | Select Line Volt $V_{SL}$ (V) | Vol-tage $V_{TH}$ (V) | Resis-tance $R_{TH}$ (kΩ) | Time Cons-tant $\tau_{TH}$ (ns) | BL Vol-tage $V_{BL}$ (mV) | |
| 16 | 100 | 2,000 | 400 | 4 | 1.5 | 0.857 | 57.1 | 22.9 | 137.6 | 1 ($R_{LO}$) |
| 16 | 100 | 100 | 400 | 4 | 1.5 | 0.094 | 6.25 | 2.5 | 74.8 | 2 ($R_{LO}$) |
| 16 | 2,000 | 2,000 | 400 | 4 | 1.5 | 0.094 | 125 | 50 | 7.2 | 3 ($R_{HI}$) |
| 16 | 2,000 | 100 | 400 | 4 | 1.5 | 0.005 | 6.64 | 2.66 | 3.9 | 4 ($R_{HI}$) |

FIG. 28E 2800-6

| Cell | Switch Resistance | | BL Cap | Time | SL Volt | Thevenin Equivalent Circuit | | | BL Volt | |
|---|---|---|---|---|---|---|---|---|---|---|
| No. Switch n | Selec -ted $R_{SW-S}$ (kΩ) | Un-Selec-Ted $R_{SW-U}$ (kΩ) | $C_{BL}$ (fF) | BL Charge Time t (ns) | Select Line Volt $V_{SL}$ (V) | Vol-tage $V_{TH}$ (V) | Resis-tance $R_{TH}$ (kΩ) | Time Cons-tant $\tau_{TH}$ (ns) | BL Vol-tage $V_{BL}$ (mV) | |
| 32 | 100 | 2,000 | 400 | 4 | 1 | 0.392 | 39.2 | 15.7 | 88.3 | 1 ($R_{LO}$) |
| 32 | 100 | 100 | 400 | 4 | 1 | 0.031 | 3.13 | 1.25 | 30 | 2 ($R_{LO}$) |
| 32 | 2,000 | 2,000 | 400 | 4 | 1 | 0.031 | 62.5 | 25 | 4.6 | 3 ($R_{HI}$) |
| 32 | 2,000 | 100 | 400 | 4 | 1 | 0.002 | 3.22 | 1.29 | 1.5 | 4 ($R_{HI}$) |

FIG. 28F 2800-7

| Cell | Switch Resistance | | BL Cap | Time | SL Volt | Thevenin Equivalent Circuit | | | BL Volt | |
|---|---|---|---|---|---|---|---|---|---|---|
| No. Switch n | Selec-ted $R_{SW-S}$ (kΩ) | Un-Selec-Ted $R_{SW-U}$ (kΩ) | $C_{BL}$ (fF) | BL Charge Time t (ns) | Select Line Volt $V_{SL}$ (V) | Vol-tage $V_{TH}$ (V) | Resis-tance $R_{TH}$ (kΩ) | Time Cons-tant $\tau_{TH}$ (ns) | BL Vol-tage $V_{BL}$ (mV) | |
| 32 | 100 | 2,000 | 400 | 4 | 1.5 | 0.588 | 39.2 | 15.7 | 132.4 | 1 ($R_{LO}$) |
| 32 | 100 | 100 | 400 | 4 | 1.5 | 0.047 | 3.13 | 1.25 | 45.0 | 2 ($R_{LO}$) |
| 32 | 2,000 | 2,000 | 400 | 4 | 1.5 | 0.047 | 62.5 | 25 | 6.9 | 3 ($R_{HI}$) |
| 32 | 2,000 | 100 | 400 | 4 | 1.5 | 0.002 | 3.22 | 1.29 | 2.3 | 4 ($R_{HI}$) |

FIG. 28G 2800-8

| Cell | Switch Resistance | | BL Cap | Time | SL Volt | Thevenin Equivalent Circuit | | | BL Volt | |
|---|---|---|---|---|---|---|---|---|---|---|
| No. Switch n | Selec-ted $R_{SW-S}$ (kΩ) | Un-Selec-Ted $R_{SW-U}$ (kΩ) | $C_{BL}$ (fF) | BL Charge Time t (ns) | Select Line Volt $V_{SL}$ (V) | Vol-tage $V_{TH}$ (V) | Resis-tance $R_{TH}$ (kΩ) | Time Cons-tant $\tau_{TH}$ (ns) | BL Vol-tage $V_{BL}$ (mV) | |
| 64 | 100 | 2,000 | 400 | 4 | 1 | 0.241 | 24.1 | 9.64 | 81.8 | 1 ($R_{LO}$) |
| 64 | 100 | 100 | 400 | 4 | 1 | 0.016 | 1.56 | 0.625 | 15.6 | 2 ($R_{LO}$) |
| 64 | 2,000 | 2,000 | 400 | 4 | 1 | 0.016 | 31.3 | 12.5 | 4.3 | 3 ($R_{HI}$) |
| 64 | 2,000 | 100 | 400 | 4 | 1 | 0.001 | 1.59 | 0.634 | 0.8 | 4 ($R_{HI}$) |

FIG. 28H 2800-9

| Cell | Switch Resistance | | BL Cap | Time | SL Volt | Thevenin Equivalent Circuit | | | BL Volt | |
|---|---|---|---|---|---|---|---|---|---|---|
| No. Switch n | Selec -ted $R_{SW-S}$ (kΩ) | Un-Selec-Ted $R_{SW-U}$ (kΩ) | $C_{BL}$ (fF) | BL Charge Time t (ns) | Select Line Volt $V_{SL}$ (V) | Vol-tage $V_{TH}$ (V) | Resis-tance $R_{TH}$ (kΩ) | Time Cons-tant $\tau_{TH}$ (ns) | BL Vol-tage $V_{BL}$ (mV) | |
| 64 | 100 | 2,000 | 400 | 4 | 1.5 | 0.361 | 24.1 | 9.64 | 122.8 | 1 ($R_{LO}$) |
| 64 | 100 | 100 | 400 | 4 | 1.5 | 0.023 | 1.56 | 0.625 | 23.4 | 2 ($R_{LO}$) |
| 64 | 2,000 | 2,000 | 400 | 4 | 1.5 | 0.023 | 31.3 | 12.5 | 6.4 | 3 ($R_{HI}$) |
| 64 | 2,000 | 100 | 400 | 4 | 1.5 | 0.001 | 1.59 | 0.634 | 1.2 | 4 ($R_{HI}$) |

FIG. 28I 2800-10

Table 2800-5 subset

Modified bit line voltage

| Cell | Switch Resistance | | BL Cap | Time | SL Volt | Thevenin Equivalent Ckt. | | | τ & BL Volt | τ & BL Volt | τ & BL Volt | τ & BL Volt | | |
|---|---|---|---|---|---|---|---|---|---|---|---|---|---|---|
| No. Switch n | Selec-ted $R_{SW-S}$ (kΩ) | Un-Selec-Ted $R_{SW-U}$ (kΩ) | $C_{BL}$ (fF) | BL Charge Time t (ns) | Select Line Volt $V_{SL}$ (V) | Vol-tage $V_{TH}$ (V) | Resis-tance $R_{TH}$ (kΩ) | Time Cons-tant $\tau_{TH}$ (ns) | Rch = 0 2.5 ns $V_{BL}$ (mV) | Rch = 1 kΩ 2.9 ns $V_{BL}$ (mV) | Rch = 2 kΩ 3.3 ns $V_{BL}$ (mV) | Rch = 5 kΩ 4.5 ns $V_{BL}$ (mV) | | |
| 16 | 100 | 100 | 400 | 4 | 1.5 | 0.094 | 6.25 | 2.5 | 74.8 | 70.1 | 65.9 | 55.2 | 2 $R_{LO}$ | READ 1 |
| 16 | 2,000 | 2,000 | 400 | 4 | 1.5 | 0.094 | 125 | 50 | 7.2 | 7.2 | 7.1 | 6.9 | 3 $R_{HI}$ | |
| 16 | 100 | 100 | 400 | 5 | 1.5 | 0.094 | 6.25 | 2.5 | 81.1 | 77.0 | 73.1 | 62.9 | 2 $R_{LO}$ | READ 2 |
| 16 | 2,000 | 2,000 | 400 | 5 | 1.5 | 0.94 | 125 | 50 | 8.9 | 8.9 | 8.8 | 8.6 | 3 $R_{HI}$ | |
| 16 | 100 | 100 | 400 | 4 | 2.5 | 0.16 | 6.25 | 2.5 | 124.7 | 116.9 | 109.8 | 92.0 | 2 $R_{LO}$ | READ 3 |
| 16 | 2,000 | 2,000 | 400 | 4 | 2.5 | 0.16 | 125 | 50 | 12.0 | 11.9 | 11.8 | 11.6 | 3 $R_{HI}$ | |

| Cell | Timing | | Signal for $V_{SL}$ = 1 V | | | | | Signal for $V_{SL}$ = 1.5 V | | | | |
|---|---|---|---|---|---|---|---|---|---|---|---|---|
| No. Switch | Access Time (ns) | Signal Devel. Time (ns) | Max. $V_{BL}$ for $R_{LO}$ row1 (mV) | Min. $V_{BL}$ for $R_{LO}$ row2 (mV) | Max. $V_{BL}$ for $R_{HI}$ row3 (mV) | $V_{REF}$ (mV) | SA/Latch Input Signal (mV) | Max. $V_{BL}$ for $R_{LO}$ row1 (mV) | Min. $V_{BL}$ for $R_{LO}$ row2 (mV) | Max. $V_{BL}$ for $R_{HI}$ row3 (mV) | $V_{REF}$ (mV) | SA/Latch Input Signal (mV) |
| 2 | 5 | 4 | 95 | 90 | 5 | 15 | 75 | | | | | |
| 4 | 5 | 4 | 94.5 | 82 | 5 | 15 | 67 | | | | | |
| 8 | 5 | 4 | 93.5 | 69 | 5 | 15 | 54 | | | | | |
| 16 | 5 | 4 | 92 | 50 | 5 | 15 | 35 | 138 | 75 | 7 | 15 | 60 |
| 32 | 5 | 4 | 88 | 30 | 4.6 | 15 | 15 | 132 | 45 | 7 | 15 | 30 |
| 64 | 5 | 4 | 82 | 15.6 | 4.3 | 15 | 0.6 | 123 | 23 | 6.4 | 15 | 8 |

| Cell | Timing | | Signal for $V_{SL}$ = 1 V | | | | | Signal for $V_{SL}$ = 1.5 V | | | | |
|---|---|---|---|---|---|---|---|---|---|---|---|---|
| No. Switch | Access Time (ns) | Signal Devel. Time (ns) | Max. $V_{BL}$ for $R_{LO}$ *row1* (mV) | Min. $V_{BL}$ for $R_{LO}$ *row2* (mV) | Max. $V_{BL}$ for $R_{HI}$ *row3* (mV) | $V_{REF}$ (mV) | SA/Latch Input Signal (mV) | Max. $V_{BL}$ for $R_{LO}$ *row1* (mV) | Min. $V_{BL}$ for $R_{LO}$ *row2* (mV) | Max. $V_{BL}$ for $R_{HI}$ *row3* (mV) | $V_{REF}$ (mV) | SA/Latch Input Signal (mV) |
| 2 | 5 | 4 | 95 | 90 | 5 | 47.5 | +- 42.5 | | | | | |
| 4 | 5 | 4 | 94.5 | 82 | 5 | 43.5 | +- 38.5 | | | | | |
| 8 | 5 | 4 | 93.5 | 69 | 5 | 37 | +- 32 | | | | | |
| 16 | 5 | 4 | 92 | 50 | 5 | 27.5 | +- 22.5 | 138 | 75 | 7 | 41 | +- 34 |
| 32 | 5 | 4 | 88 | 30 | 4.6 | 17.2 | +- 12.6 | 132 | 45 | 7 | 26 | +- 19 |
| 64 | 5 | 4 | 82 | 15.6 | 4.3 | 10 | +- 5.65 | 123 | 23 | 6.4 | 14.75 | +- 8.35 |

| Cell | Equivalent CKT Parameters | | | | WRITE Logic "1" | | | | WRITE Logic "0" | | | |
|---|---|---|---|---|---|---|---|---|---|---|---|---|
| Total No. SWs | 1 Selected $R_{SW-S}$* | Unselected $R_{SW-U}$ | n-1 Unselected $R_{SW-U}/15$ | $R_W$ | $V_{OVS}$ | Selected $R_{SW-S}$ $V_{BL}$ BE $V_{SL}$ TE | Unselected $R_{SW-U}$ $V_{BL}$ BE $V_{SL}$ TE | $\tau_{TH}$ for $C_{BL}$ = 400fF | $V_{OVS}$ | Selected $R_{SW-S}$ $V_{BL}$ BE $V_{SL}$ TE | Unselected $R_{SW-U}$ $V_{BL}$ BE $V_{SL}$ TE | $\tau_{TH}$ for $C_{BL}$ = 400fF |
| 16 | 2MΩ | 100kΩ | 6.7kΩ | 1kΩ | 1.58V | 1.5V 0V $\Delta V_{SW}$ = 1.5V $V_{SET-MAX}$ = 1.5V | 1.5V 0.75V $\Delta V_{SW}$ = 0.75V $V_{SET-MIN}$ = 1.0V | 0.35 ns | 0V | 0.13V 0V $\Delta V_{SW}$ = 0.13V $V_{SET-MIN}$ = 1.0V | 0.75V 0.13V $\Delta V_{SW}$ = 0.62V $V_{RESET-MIN}$ = 2V | 0.35 ns |
| 16 | 2MΩ | 2MΩ | 133kΩ | 1kΩ | 1.58V | 1.57V 0V $\Delta V_{SW}$ = 1.57V $V_{SET-MAX}$ = 1.5V | 1.57V 0.75V $\Delta V_{SW}$ = 0.82V $V_{SET-MIN}$ = 1.0V | 0.40 ns | 0V | 0.01V 0V $\Delta V_{SW}$ = 0.01V $V_{SET-MIN}$ = 1.0V | 0.75V 0.01V $\Delta V_{SW}$ = 0.74V $V_{RESET-MIN}$ = 2V | 0.40 ns |
| | | | | | | Switches 2MΩ→100kΩ | No Switching (No Disturb) | | | No Switching (No Disturb) 2 MΩ | No Switching (No Disturb) | |

| Item | Operating Conditions |
| --- | --- |
| 140 nm 4 Mb NRAM | 140 nm CMOS technology<br>& overlying CNT switches |
| CNT Switch Fast Write Operations | SET RESET<br>Bipolar: 5 ns 5 ns |
| Read Time (Non-Destructive Read) | 5 ns |
| Write Voltages & Currents | 1-1.5 V. SET; 2-2.5 V. RESET<br><10-20 μA |
| Read Voltage | 0.5-1V |
| Operation Reliability | -65°C to 165°C |
| Data Retention | >1,000y @ 85C (5eV)<br>>10y @ 300C (5eV) |
| Read Disturb | > $10^{16}$ reads |
| Endurance | > $10^{12}$ cycles |

FIG. 38
PRIOR ART

Cell = 3F x 2F = 6 $F^2$

THREE DIMENSIONAL (3D) MEMORIES WITH MULTIPLE RESISTIVE CHANGE ELEMENTS PER CELL AND CORRESPONDING ARCHITECTURES FOR IN-MEMORY COMPUTING

CROSS-REFERENCE OF RELATED CASES

This application is related to the following U.S. patents, which are assigned to the assignee of the present application, and are hereby incorporated by reference in their entirety:

- U.S. Pat. No. 7,835,170, filed on Aug. 8, 2007, entitled Memory Elements and Cross Point Switches and Arrays of Same Using Nonvolatile Nanotube Blocks;
- U.S. Pat. No. 7,852,114, filed on Aug. 6, 2009, entitled Nonvolatile Nanotube Programmable Logic Devices and a Nonvolatile Nanotube Field Programmable Gate Array Using Same;
- U.S. Pat. No. 8,008,745, filed on Aug. 8, 2007, entitled Latch Circuits and Operation Circuits Having Scalable Nonvolatile Nanotube Switches as Electronic Fuse Replacement Elements;
- U.S. Pat. No. 8,217,490, filed on Aug. 8, 2007, entitled Nonvolatile Nanotube Diodes and Nonvolatile Nanotube Blocks and Systems Using Same and Methods of Making Same;
- U.S. Pat. No. 8,659,940, filed on Mar. 24, 2011, entitled Carbon Nanotube-Based Neural Networks and Methods of Making and Using Same;
- U.S. Pat. No. 8,809,917, filed on Jul. 29, 2009, entitled Memory Elements and Cross Point Switches and Arrays of Same Using Nonvolatile Nanotube Blocks;
- U.S. Pat. No. 9,917,139, filed on Dec. 20, 2016, entitled Resistive Change Element Array Using Vertically Oriented Bit Lines;
- U.S. Pat. No. 10,340,005, filed on Oct. 5, 2017, entitled Resistive Change Element Arrays with In Situ Initialization;
- U.S. Pat. No. 10,546,859, filed on Oct. 8, 2018, entitled Double Density Nonvolatile Nanotube Switch Memory Cells; and
- U.S. Pat. No. 10,825,516, filed on Feb. 27, 2018, entitled Resistive Change Element Cells Sharing Selection Devices.

BACKGROUND

Technical Field

The present disclosure generally relates to memory cells with multiple resistive change elements per cell, arrays of memory cells with multiple resistive change elements per cell, memory with arrays of memory cells with multiple resistive change elements per cell, and methods of memory operation.

Discussion of Related Art

Any discussion of the related art throughout this specification should in no way be considered as an admission that such art is widely known or forms part of the common general knowledge in the field.

The marketplace demand for nonvolatile memory devices with larger storage capacity and lower costs has spurred the creation of memory devices with increased memory densities. Artificial intelligence data processing demands has created requirements for nonvolatile memory devices able to operate at high speed, DRAM-like performance for example. The traditional way of measuring memory density is the number of bits stored per square millimeter of layout area consumed (bits/mm$^2$), sometimes referred to as the footprint. Therefore, the memory density of a memory device can be increased by reducing the size of memory elements to consume less layout area by using a technology with a smaller minimum feature size, resulting in a smaller storage footprint, thereby increasing the number of bits memory elements can store in the same chip area. Alternatively, vertically stacking memory layers to form a three-dimensional memory structure without feature size reduction does not substantially increase the size of the memory device or layout area (footprint) while substantially increasing the memory storage capacity. For example, two memory layers doubles the memory capacity in approximately the same layout area (bits/mm$^2$). Combining feature size reduction and vertical stacking results in the smallest footprint and memory greatest density.

Resistive change memory is a technology well suited to meet the marketplace demand for low cost memory devices with high data storage capacities and able to operate at high speeds. A resistive change memory device has resistive change elements that are scalable to very high densities, incur very low fabrication costs, store nonvolatile memory states, and consume very little power. Resistive change devices and arrays store information by adjusting a resistive change element, typically comprising some material that can be adjusted between a number of non-volatile resistive states in response to some applied stimuli, within each individual array cell between two or more resistive states. For example, a two-state resistive change element can be configured to switch between a first resistive state (e.g., a high resistive state) that corresponds to a logic 0 and a second resistive state (e.g., a low resistive state) that corresponds to a logic 1. Using these two resistive states, the two-state resistive change element can store a single bit. Similarly, a four-state resistive change element can be configured to switch between a first resistive state (e.g., a very high resistive state) that corresponds to a logic 00, a second resistive state (e.g., a moderately high resistive state) that corresponds to a logic 01, a third resistive state (e.g., a moderately low resistive state) that corresponds to a logic 10, and a fourth resistive state (e.g., a very low resistive state) that corresponds to a logic 11. Using these four resistive states, the four-state resistive change element can store two logic bits. Resistive change elements may store still more than four resistive states thereby storing more logic bits. For example, a $2^m$-state resistive change element can be configured to switch between $2^m$ resistive states. Using these $2^m$-resistive states, the $2^m$-state resistive change element can store m logic bits. Note that the terms resistive change element and resistance change element are used interchangeably in this application.

Resistive change devices and arrays are often referred to as resistance RAMs (RRAMs) by those skilled in the art and are well known in the semiconductor industry. Such devices and arrays, for example, include, but are not limited to, phase change memory, solid electrolyte memory, metal oxide resistance memory, and carbon nanotube memory. The examples further below are described with respect to resistive change elements (RCEs) formed using nonvolatile carbon nanotube (CNT) switches. Resistive change element cells having one field effect transistor (FET) for a cell select device and one resistive change element are often referred to as 1T, 1R cells. The FET can be a metal oxide semiconductor field effect transistor (MOSFET) or alternatively, other types of FETs such as a carbon nanotube field effect transistor (CNTFET), a SiGe FET, a fully depleted silicon-on-insulator (SOT) FET, or a multiple gate FET such as a FinFET. Additionally, the FET can be an n-type or a p-type FET. Resistive change element cells having one diode for a cell select device and one resistive change element are often referred to as 1D, 1R cells.

For a single level memory, cross section 100 illustrated in prior art FIG. 1, shows that the densest arrays of 1T, 1R nonvolatile memory cells which include a FET as a cell select device and a resistive change element formed with a nonvolatile carbon nanotube (CNT) switch having a CNT fabric, a top electrode, and a bottom electrode, are formed with the 1T, 1R nonvolatile memory cells in electrical communication with array wiring with select lines approximately parallel to word lines and bit lines approximately orthogonal to select lines and word lines. Cell A and Cell B are adjacent 1T, 1R nonvolatile memory cells and Cell A and Cell B are mirror images of one another. Such prior art arrays, such as prior art cross section 100, have cell areas of approximately $6F^2$, where F is the minimum technology dimension for a semiconductor generation as illustrated by U.S. Pat. Nos. 7,835,170, 8,809,917, 9,917,139, and 10,340,005 issued to Bertin.

Prior art FIG. 2 illustrates plan view 200 of a single level 1T, 1R cell memory array with select lines SL approximately parallel to word lines WL and bit lines BL approximately orthogonal to select lines SL and word lines WL, with cells having minimum dimensions of 3F in the bit line direction and 2F in the word line direction, thereby forming $6F^2$ cells, which corresponds to cross section 100 illustrated in prior art FIG. 1. Word lines WL, bit lines BL, and select lines SL are shown as stick drawings to better illustrate the underlying cell structures. Referring to prior art FIGS. 1 and 2, bit line BL overlays word line WL/G and select line SL, thereby enabling the 2F cell dimension along the word line. The word line is shown as WL/G because in the gate region of FET 105, word line WL may form the FET 105 gate or be in electrical communication with a preformed FET 105 gate. Bit line BL is in electrical communication with drain D of FET 105 through stud vias SV and the drain D of FET 105 is shared with an adjacent 1T, 1R cell that is partially visible in prior art FIG. 1. Nonvolatile CNT switch 110 includes a CNT fabric 115, a top electrode TE, and a bottom electrode BE. Bottom electrode BE is in electrical communication with source S of FET 105 through a stud via SV. Top electrode TE is in electrical communication with select line SL. The drain D and the source S are formed in a p-type silicon substrate. Dielectric 120 fills the space between bit line BL and the underlying cell structures thereby insulating adjacent cells.

Memory density may be increased by fabricating additional memory array levels above the densest single level 1T, 1R cell memory array layout illustrated in plan-view 200 as described further below.

SUMMARY

The present disclosure provides an electrical device comprising a multi-switch storage cell array comprising a plurality of multi-switch storage cells, where each multi-switch storage cell comprises a plurality of resistive change elements in electrical communication with a cell select device, a plurality of bit lines for the multi-switch storage cell array, where each bit line is in electrical communication with at least one multi-switch storage cell, a plurality of word lines for the multi-switch storage cell array, where each word line is in electrical communication with at least one multi-switch storage cell, a plurality of groups of multiple select lines for the multi-switch storage cell array, where each group of multiple select lines is in electrical communication with at least one multi-switch storage cell, at least one driver circuit for each group of multiple select lines, a select line decoder in electrical communication with a plurality of output lines, where the select line decoder is configured to receive at least one input signal from a controller, and where the select line decoder is configured to apply voltages to the plurality of output lines based on at least one input signal from a controller, and a routing circuit for each group of multiple select lines, where each routing circuit is in electrical communication with a corresponding group of multiple select lines, a corresponding at least one driver circuit, and the plurality of output lines, and where each routing circuit is configured to create at least one current path between the corresponding at least one driver circuit and the corresponding group of multiple select lines based on voltages from the select line decoder.

According to another aspect of the present disclosure, the at least one driver circuit for each group of multiple select lines is at least three driver circuits for each group of multiple select lines.

According to another aspect of the present disclosure, the at least three driver circuits for each group of multiple select lines comprises a read driver circuit, a reset driver circuit, and a write driver circuit.

According to another aspect of the present disclosure, the at least one driver circuit for each group of multiple select lines is at least four driver circuits for each group of multiple select lines.

According to another aspect of the present disclosure, the at least four driver circuits for each group of multiple select lines comprises a read driver circuit, a reset driver circuit, a write driver circuit, and an initialization driver circuit.

According to another aspect of the present disclosure, the cell select device is a field effect transistor.

According to another aspect of the present disclosure, each resistive change element in the plurality of resistive change elements has a first electrode, a second electrode, and a resistive change material between the first electrode and the second electrode.

According to another aspect of the present disclosure, the resistive change material comprises a nanotube fabric.

The present disclosure provides an electrical device comprising a multi-switch storage cell array, where the multi-switch storage cell array comprises a plurality of bit lines, a plurality of word lines, a plurality of groups of multiple select lines, and a plurality of multi-switch storage cells, where each multi-switch storage cell comprises a plurality of resistive change elements, where each resistive change element has a first electrode, a second electrode, and a resistive change material between the first electrode and the second electrode, and where each first electrode is in electrical communication with a select line of a group of multiple select lines, a field effect transistor having a drain terminal, a gate terminal, and a source terminal, where the drain terminal is in electrical communication with a bit line of the plurality of bit lines, and where the gate terminal is in electrical communication with a word line of the plurality of word lines, and an intracell wiring electrically connecting second electrodes of the plurality of resistive change elements together and to the source of the field effect transistor, a select line decoder in electrical communication with a plurality of output lines, where the select line decoder is configured to receive at least one input signal from a controller, and where the select line decoder is configured to apply voltages to the plurality of output lines based on at least one input signal from a controller, two buses for each group of multiple select lines, a plurality of router circuits for each group of multiple select lines, where each router circuit is in electrical communication with a select line of a corresponding group of multiple select lines, an output line of the plurality of output lines, and a corresponding two buses, and where each router circuit is configured to create a current path between the select line and one of the corresponding two buses based on a voltage on the output line, and a group of driver circuits for each group of multiple select lines, where each group of driver circuits is in electrical communication with a corresponding two buses.

According to another aspect of the present disclosure, the word line forms the gate terminal of the field effect transistor.

According to another aspect of the present disclosure, the resistive change material comprises a nanotube fabric.

According to another aspect of the present disclosure, each group of driver circuits comprises a read driver circuit, a reset driver circuit, and a write driver circuit.

According to another aspect of the present disclosure, the read driver circuit and the reset driver circuit are in electrical communication with one bus of the corresponding two buses and the write driver circuit is in electrical communication with other bus of the corresponding two buses.

According to another aspect of the present disclosure, the electrical device further comprises a field effect transistor in electrical communication with the reset driver circuit and other bus of the corresponding two buses.

According to another aspect of the present disclosure, the electrical device further comprises a field effect transistor in electrical communication with one bus of the corresponding two buses and a field effect transistor in electrical communication with other bus of the corresponding two buses.

According to another aspect of the present disclosure, each group of driver circuits comprises a read driver circuit, a reset driver circuit, a write driver circuit, and an initialization driver circuit.

According to another aspect of the present disclosure, the read driver circuit, the reset driver circuit, and the initialization driver circuit are in electrical communication with one bus of the corresponding two buses and the write driver circuit is in electrical communication with other bus of the corresponding two buses.

According to another aspect of the present disclosure, the electrical device further comprises a field effect transistor in electrical communication with the initialization driver circuit and other bus of the corresponding two buses.

According to another aspect of the present disclosure, the electrical device further comprises a field effect transistor in electrical communication with one bus of the corresponding two buses and a field effect transistor in electrical communication with other bus of the corresponding two buses.

According to another aspect of the present disclosure, each router circuit comprises a n-type field effect transistor having a gate terminal, a first terminal, and a second terminal, a p-type field effect transistor having a gate terminal, a first terminal, and a second terminal, and the gate terminal of the n-type field effect transistor is in electrical communication with the gate terminal of the p-type field effect transistor and the first terminal of the n-type field effect transistor is in electrical communication with the first terminal of the p-type field effect transistor.

According to another aspect of the present disclosure, the gate terminal of the n-type field effect transistor and the gate terminal of the p-type field effect transistor are in electrical communication with the output line of the plurality of output lines, the first terminal of the n-type field effect transistor and the first terminal of the p-type field effect transistor are in electrical communication with the select line of the corresponding group of select lines, and the second terminal of the n-type field effect transistor is in electrical communication with one bus of the corresponding two buses and the second terminal of the p-type field effect transistor is in electrical communication with other bus of the corresponding two buses.

According to another aspect of the present disclosure, the plurality of groups of multiple select lines are parallel to the plurality of word lines and the plurality of bit lines are orthogonal to the plurality of groups of multiple select lines and the plurality of word lines.

According to another aspect of the present disclosure, the plurality of bit lines overpass the plurality of groups of multiple select lines and the plurality of word lines.

Other features and advantages of the present disclosure will become apparent from the following description, which is provided below in relation to the accompanying drawings.

BRIEF DESCRIPTION OF THE DRAWINGS

FIG. 11A shows a schematic representation of a 3D MSSC memory bit line charge data path used for READ, RESET WRITE logic “1”, and WRITE logic “0” operations, that also includes voltages and current flows corresponding to a READ operation that corresponds to the 3D MSSC memory READ operation illustrated in FIG. 10.

FIG. 11B-1 shows resistive change element operational voltages and polarity between top and bottom electrodes and current flowing between top and bottom electrodes for bit line charge READ operations.

FIG. 11B-2 shows resistive change element operational voltages and polarity between top and bottom electrodes and current flowing between top and bottom electrodes for discharge READ operations.

FIG. 11B-3 shows resistive change element operational voltages and polarities between top and bottom electrodes and currents flowing between top and bottom electrodes for SET and RESET operations.

FIG. 15C is a table showing bit line charge READ voltage levels, sense amplifier/latch input signal voltages, and switching speeds for select line voltages ranging from 0.5 V to 1.5 V.

FIG. 24-1 illustrates a first part of a schematic representation of a 3D multi-switch storage cell array schematic, with each cell having n resistive change elements in electrical communication with n select lines with each of the n select lines in electrical communication with a top electrode of one of the n resistive change elements and bottom electrodes in electrical communication with each other and a source of a cell select FET. The cell select FET has a gate in electrical communication with a word line parallel to the n select lines and a drain in electrical communication with a bit line orthogonal to the word line and the n select lines. The select lines are also in electrical communication with corresponding top electrodes in all multi-switch storage cells along the corresponding word line and the select lines are orthogonal to all the bit lines in the memory subarray.

FIG. 24-2 illustrates a second part of a schematic representation of a 3D multi-switch storage cell array schematic, with each cell having n resistive change elements in electrical communication with n select lines with each of the n select lines in electrical communication with a top electrode of one of the n resistive change elements and bottom electrodes in electrical communication with each other and a source of a cell select FET. The cell select FET has a gate in electrical communication with a word line parallel to the n select lines and a drain in electrical communication with a bit line orthogonal to the word line and the n select lines. The select lines are also in electrical communication with corresponding top electrodes in all multi-switch storage cells along the corresponding word line and the select lines are orthogonal to all the bit lines in the memory subarray.

FIG. 28A is a table of bit line charge READ voltages in a 3D multi-switch storage cell array for a select line voltage of 1 Volt and 2 resistive change elements in the multi-switch storage cell. Rows 1 and 2 show bit line voltages at a bit line charge time of 4 ns for a low resistance selected resistive change element and maximum and minimum unselected resistance values corresponding to rows 1 and 2, respectively. Rows 3 and 4 show bit line voltages at a bit line charge time of 4 ns for a high resistance selected resistive change element and maximum and minimum unselected resistance values corresponding to rows 3 and 4, respectively.

FIG. 28B is a table of bit line charge READ voltages in a 3D multi-switch storage cell array for a select line voltage of 1 Volt and 4 resistive change elements in the multi-switch storage cell. Rows 1 and 2 show bit line voltages at a bit line charge time of 4 ns for a low resistance selected resistive change element and maximum and minimum unselected resistance values corresponding to rows 1 and 2, respectively. Rows 3 and 4 show bit line voltages at a bit line charge time of 4 ns for a high resistance selected resistive change element and maximum and minimum unselected resistance values corresponding to rows 3 and 4, respectively.

FIG. 28C is a table of bit line charge READ voltages in a 3D multi-switch storage cell array for a select line voltage of 1 Volt and 8 resistive change elements in the multi-switch storage cell. Rows 1 and 2 show bit line voltages at a bit line charge time of 4 ns for a low resistance selected resistive change element and maximum and minimum unselected resistance values corresponding to rows 1 and 2, respectively. Rows 3 and 4 show bit line voltages at a bit line charge time of 4 ns for a high resistance selected resistive change element and maximum and minimum unselected resistance values corresponding to rows 3 and 4, respectively.

FIG. 28D is a table of bit line charge READ voltages in a 3D multi-switch storage cell array for a select line voltage of 1 Volt and 16 resistive change elements in the multi-switch storage cell. Rows 1 and 2 show bit line voltages at a bit line charge time of 4 ns for a low resistance selected resistive change element and maximum and minimum unselected resistance values corresponding to rows 1 and 2, respectively. Rows 3 and 4 show bit line voltages at a bit line charge time of 4 ns for a high resistance selected resistive change element and maximum and minimum unselected resistance values corresponding to rows 3 and 4, respectively. FIG. 28E is a table of bit line charge READ voltages in a 3D multi-switch storage cell array for a select line voltage of 1.5 Volts and 16 resistive change elements in the multi-switch storage cell. Rows 1 and 2 show bit line voltages at a bit line charge time of 4 ns for a low resistance selected resistive change element and maximum and minimum unselected resistance values corresponding to rows 1 and 2, respectively. Rows 3 and 4 show bit line voltages at a bit line charge time of 4 ns for a high resistance selected resistive change element and maximum and minimum unselected resistance values corresponding to rows 3 and 4, respectively.

FIG. 28F is a table of bit line charge READ voltages in a 3D multi-switch storage cell array for a select line voltage of 1 Volt and 32 resistive change elements in the multi-switch storage cell. Rows 1 and 2 show bit line voltages at a bit line charge time of 4 ns for a low resistance selected resistive change element and maximum and minimum unselected resistance values corresponding to rows 1 and 2, respectively. Rows 3 and 4 show bit line voltages at a bit line charge time of 4 ns for a high resistance selected resistive change element and maximum and minimum unselected resistance values corresponding to rows 3 and 4, respectively.

FIG. 28G is a table of bit line charge READ voltages in a 3D multi-switch storage cell array for a select line voltage of 1.5 Volts and 32 resistive change elements in the multi-switch storage cell. Rows 1 and 2 show bit line voltages at a bit line charge time of 4 ns for a low resistance selected resistive change element and maximum and minimum unselected resistance values corresponding to rows 1 and 2, respectively. Rows 3 and 4 show bit line voltages at a bit line charge time of 4 ns for a high resistance selected resistive change element and maximum and minimum unselected resistance values corresponding to rows 3 and 4, respectively.

FIG. 28H is a table of bit line charge READ voltages in a 3D multi-switch storage cell array for a select line voltage of 1 Volt and 64 resistive change elements in the multi-switch storage cell. Rows 1 and 2 show bit line voltages at a bit line charge time of 4 ns for a low resistance selected resistive change element and maximum and minimum unselected resistance values corresponding to rows 1 and 2, respectively. Rows 3 and 4 show bit line voltages at a bit line charge time of 4 ns for a high resistance selected resistive change element and maximum and minimum unselected resistance values corresponding to rows 3 and 4, respectively.

FIG. 28I is a table of bit line charge READ voltages in a 3D multi-switch storage cell array for a select line voltage of 1.5 Volts and 64 resistive change elements in the multi-switch storage cell. Rows 1 and 2 show bit line voltages at a bit line charge time of 4 ns for a low resistance selected resistive change element and maximum and minimum unselected resistance values corresponding to rows 1 and 2, respectively. Rows 3 and 4 show bit line voltages at a bit line charge time of 4 ns for a high resistance selected resistive change element and maximum and minimum unselected resistance values corresponding to rows 3 and 4, respectively.

FIG. 28J is a table showing the impact of cell select FET channel resistances on bit line charge READ voltages in a 3D multi-switch cell storage array for 16 resistive change elements in the multi-switch storage cell. Row 1 shows bit line voltages at a bit line charge time of 4 ns for a select line voltage of 1.5 Volts and a low resistance selected resistive change element and minimum unselected resistance value. Row 2 shows bit line voltages at a bit line charge time of 4 ns for a select line voltage of 1.5 Volts and a high resistance selected resistive change element and maximum unselected resistance values. Portions of rows 1 and 2 respectively correspond to rows 2 and 3 of the table shown in FIG. 28E. Row 3 shows bit line voltages at a bit line charge time of 5 ns for a select line voltage of 1.5 Volts and a low resistance selected resistive change element and minimum unselected resistance value. Row 4 shows bit line voltages at a bit line charge time of 5 ns for a select line voltage of 1.5 Volts and a high resistance selected resistive change element and maximum unselected resistance values. Row 5 shows bit line voltages at a bit line charge time of 4 ns for a select line voltage of 2.5 Volts and a low resistance selected resistive change element and minimum unselected resistance value. Row 6 shows bit line voltages at a bit line charge time of 4 ns for a select line voltage of 2.5 Volts and a high resistance selected resistive change element and maximum unselected resistance values.

FIG. 29 is a table of sense amplifier/latch bit line charge READ voltages in a 3D MSSC memory at the end of a signal development time of 4 ns for a select line voltage of 1 volt and 1.5 volts. In this table, the reference voltage is set at 15 milli-volts, which is well above the maximum bit line charge voltages for selected resistive change elements in high resistance states.

FIG. 30 is a table of sense amplifier/latch bit line charge READ voltages in a 3D MSSC memory at the end of a signal development time of 4 ns for a select line voltage of 1 volt and 1.5 volts. In this table, the reference voltages are set at the mid-point between minimum bit line charge voltages for selected resistive change elements in low resistive states and maximum bit line charge voltages for selected resistive change elements in high resistive states.

FIG. 36 is a table of logic "1" and logic "0" WRITE operating voltages for 3D MSSC memory with multi-switch storage cells showing that the WRITE operation to a selected resistive change element does not disturb the stored resistance states of the unselected resistive change elements. A RESET-before-WRITE operation precedes WRITE operations.

FIG. 38 is a table summarizing the operating conditions of a 4 Megabit NRAM at the 140 nm CMOS technology node, including performance, data retention, and maximum number of cycles.

FIG. 41B is configured to also perform the functions illustrated in FIG. 41A.

FIG. 44-1 illustrates a first part of a schematic of a 3D MSSC array select line drive matrix with at least one redundant resistive change element. If a defective resistive change element is detected, electrically programmable redundancy latches, controlled by a 3D MSSC memory on-chip controller, store the address location of the defective RCE, disconnects and replaces the defective RCE with a working redundant RCE.

FIG. 44-2 illustrates a second part of a schematic of a 3D MSSC array select line drive matrix with at least one redundant resistive change element. If a defective resistive change element is detected, electrically programmable redundancy latches, controlled by a 3D MSSC memory on-chip controller, store the address location of the defective RCE, disconnects and replaces the defective RCE with a working redundant RCE.

DETAILED DESCRIPTION

Structures and operating modes of 3D Nonvolatile Memories with multi-switch storage cells having multiple resistive change elements per cell increase memory function over memories with 1T, 1R cells by more than an order of magnitude with the same number of word lines, bit lines, word line drivers, and sense amplifier/latches (SA/Latches).

Figure 2:
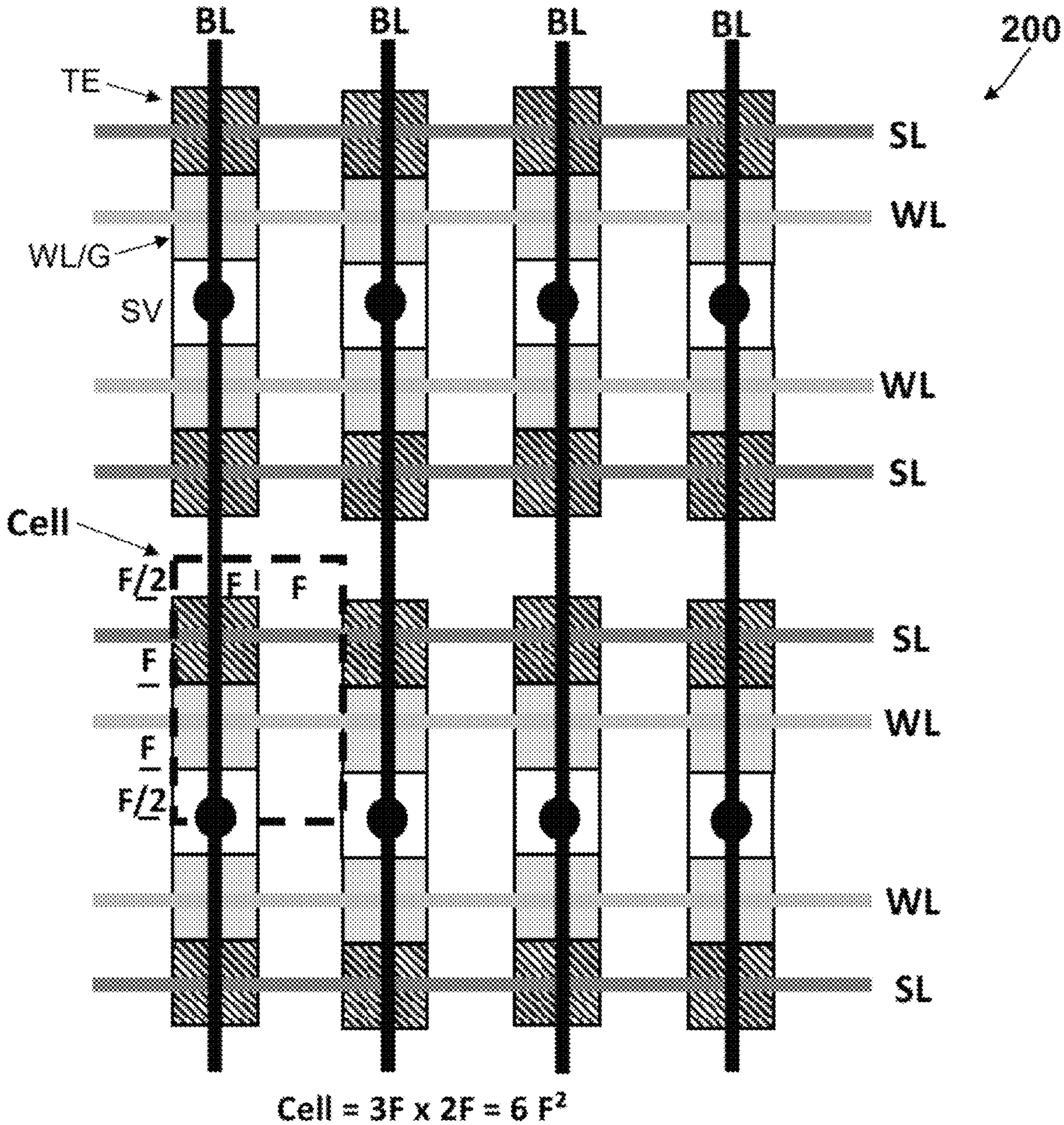
FIG. 2 shows a prior art plan view of a single level 1T, 1R cell memory array corresponding to FIG. 1 prior art cross section showing dense 1T, 1R area of $6F^2$, where F is a minimum technology dimension.
Figure 3:
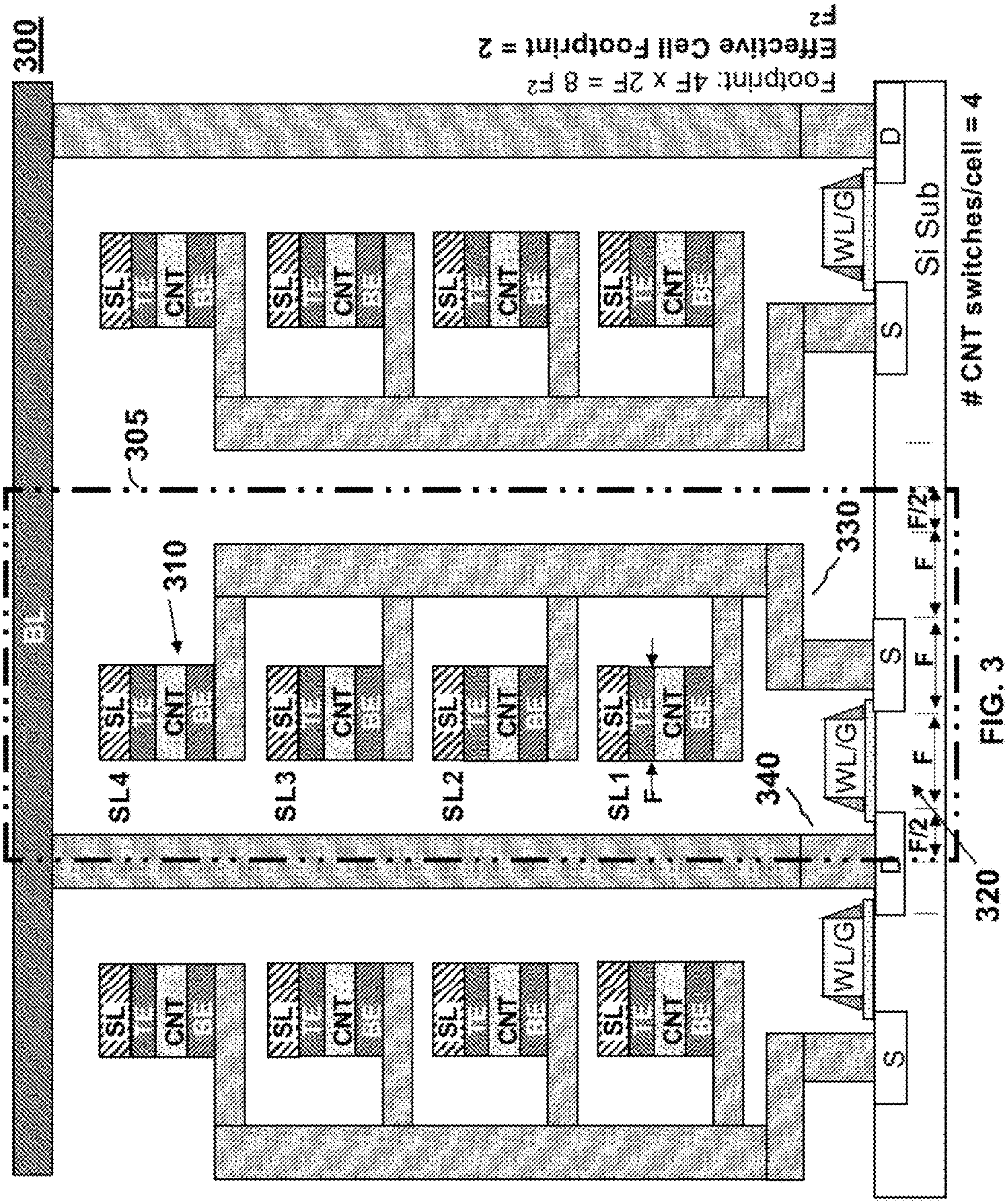
FIG. 3 shows a cross section of a three-dimensional multi-switch storage cell (MSSC) array formed with multi-switch storage cells at word line and bit line intersections.

The nonvolatile 3D MSSC memory described further below may increase the memory capacity by a factor of 10 times or more by forming multiple layers of CNT switches stacked above the single level 1T, 1R cell memory array plan view 200 illustrated in prior art FIG. 2, electrically connecting CNT switches in all levels of the stack to a 3D grid of array lines as illustrated in FIG. 3. FIG. 3 illustrates a 3D MSSC array 300 formed with multi-switch storage cells and an array architecture in which select lines are approximately parallel to word lines and bit lines are approximately orthogonal to and overpassing select lines and word lines. It is noted that the select lines and the word lines are described as approximately parallel and the bit lines are described as approximately orthogonal to the select lines and the word lines to allow for variations from exactly parallel and exactly orthogonal due to the fabrication process. It is also noted that the terms bit lines, select lines, and word lines herein are for convenience of description and ease of distinction between array lines and are not intended to be rigid designations of array lines, and that array lines of a same structure could be relabeled.

A multi-switch storage cell includes a cell select device, such as a field effect transistor (FET), multiple resistive change elements, typically from two resistive change elements up to approximately sixty-four resistive change elements, and intracell wiring electrically connecting the multiple resistive change elements together and to the cell select device. FETs as cell select devices can be metal oxide semiconductor field effect transistors (MOSFETs) or alternatively, other types of FETs such as carbon nanotube field effect transistors (CNTFETs), SiGe FETs, fully depleted silicon-on-insulator (SOI) FETs, or multiple gate FETs such as FinFETs. Additionally, FETs as cell select devices can be n-type or p-type FETs. Further, multi-switch storage cells may also be referred to as 1T, nR cells with 1T referring to the one cell select device and nR referring to the number of resistive change elements with n being a number from two up to approximately sixty-four.

Referring to FIG. 3, the 3D MSSC array 300 is formed with multi-switch storage cells 305 at each word line-bit line intersection and corresponding array interconnections. Multi-switch storage cell 305 includes a cell select FET 320, stacked n resistive change elements, in this example n=4 CNT switches, and intracell wiring 330 electrically connecting the resistive change elements together and to a source of the cell select FET 320. Each resistive change element of the multi-switch storage cell 305 has the same structure, and thus, the discussion below of resistive change element 310 is applicable to each resistive change element of the multi-switch storage cell 305. Resistive change element 310 includes a bottom electrode BE, a CNT fabric CNT, and a top electrode TE. The CNT fabric CNT serves as the resistive change material. The bottom electrode BE is in contact with the CNT fabric CNT and the top electrode TE is in contact with the CNT fabric CNT. Alternatively, resistive change element 310 can include at least one intervening layer located between the bottom electrode BE and the CNT fabric CNT, at least one intervening layer located between the CNT fabric CNT and the top electrode TE, or at least one intervening layer located between the bottom electrode BE and the CNT fabric CNT and at least one intervening layer located between the CNT fabric CNT and the top electrode TE. Alternatively, the bottom electrode BE can be omitted from the resistive change element 310, the top electrode TE can be omitted from the resistive change element 310, or the bottom electrode BE and the top electrode TE can be omitted from the resistive change element 310. Element 310 is referred to as a CNT switch and a resistive change element in this application. It is noted that while the present disclosure provides some examples of resistive change elements including CNT fabrics as resistive change materials the present disclosure is not limited to resistive change elements including CNT fabrics as resistive change materials and that the present disclosure is applicable to resistive change elements comprising another resistive change material such as other carbon allotropes such as Buckyballs, graphene flakes, nanocapsules, and nanohorns. Additionally, the present disclosure is applicable to other types of resistive change elements such as phase change, metal oxide, and solid electrolyte.

The bottom electrodes of the resistive change elements of the multi-switch storage cell 305 are in electrical communication with each other and the source of the cell select FET 320. The top electrode of each resistive change element of the multi-switch storage cell 305 is in electrical communication with a separate select line, and thus, the 3D MSSC array 300 requires a group of n approximately parallel select lines per cell along the bit line direction (n=4 in this example). A word line WL/G forms the gate of the cell select FET 320. Alternatively, a gate of the cell select FET 320 is in electrical communication with a word line. The select lines are approximately parallel to the word line and are in electrical communication with all top electrodes of resistive change elements of cells along the word line. A bit line BL approximately orthogonal to the word lines and the select lines is in electrical communication with a drain of the cell select FET 320. It is noted that the select lines are described as approximately parallel, the select lines and the word lines are described as approximately parallel, and the bit lines are described as approximately orthogonal to the select lines and the word lines to allow for variations from exactly parallel and exactly orthogonal due to the fabrication process.

Multi-switch storage cell (MSSC) 305 has interconnected resistive change elements (RCE) 310 formed with stacked CNT switches. In this example, multi-switch storage cells are formed with 4 layers of CNT switches and corresponding array interconnections. Intracell wiring 330 electrically connects CNT switch bottom electrodes BE together and to the source S of the underlying cell select FET 320. Separate select lines SL1, SL2, SL3, and SL4 are each in electrical communication with a top electrode TE of one of the four stacked CNT switches and multiple top electrodes of CNT switches in other multi-switch storage cells along the word line direction. Bit line BL is in electrical communication with the drain of the cell select FET 320 through bit line stud 340. Each multi-switch storage cell along the word line direction is in electrical communication with a corresponding bit line BL, which is approximately orthogonal to the word line WL/G in each cell and approximately orthogonal to the select lines SL1, SL2, SL3, and SL4.

Prior art FIGS. 1, 2, and 4-9 are described in detail in U.S. Pat. No. 10,340,005 issued to Bertin. This patent describes in detail array layouts, memory circuit schematics, and operation of a single level 1T, 1R cell memory array. The open array architecture of this single level 1T, 1R cell memory is similar in operation to the multi-level 3D MSSC memory, with some changes made to accommodate the multi-switch storage cell 3D MSSC memory functions as described further below.

Resistive change elements in these examples are formed using CNT switches as described further above. The CNT switch in these examples is a bidirectional switch to which a SET voltage in the range of 1-1.5 volts may be applied to bottom electrode BE with respect to top electrode TE, which causes the CNT switch resistance to change from a high resistance state $R_{HI}$ to a low resistance state $R_{LO}$. However, if the CNT switch resistance is already in a low resistance state $R_{LO}$, then the resistance is unchanged. If a RESET voltage in the range of 2-2.5 volts is applied to a top electrode TE relative to a bottom electrode BE, then the CNT switch resistance changes from a low resistance state $R_{LO}$ to a high resistance state $R_{HI}$. However, if the CNT switch resistance is already in a high resistance state $R_{HI}$, then the resistance is unchanged.

A feature of the select line parallel to word line open array architecture is that when relatively high voltages are applied to array lines by a driver, the terminals of the cell select transistor (FET) are not exposed to the high voltages. Prior art FIG. 4, corresponding to prior art FIG. 2, illustrates 1T, 1R cell memory array RESET voltage distribution 400 in which a RESET voltage of 2.75 volts is applied to select line SL[1], word line WL[1] is at 1.2 volts, and FET1, FET2, FET3, and FET4 are in an ON state, electrically connecting source and drain terminals. All bit lines BL[0], BL[1], BL[2], and BL[3] are at zero voltage during a RESET operation. Word lines WL[0], WL[2], and WL[3] are at zero volts and corresponding FETs are in an OFF state. Corresponding select lines SL[0], SL[2], and SL[3] are also at zero volts.

Figure 1:
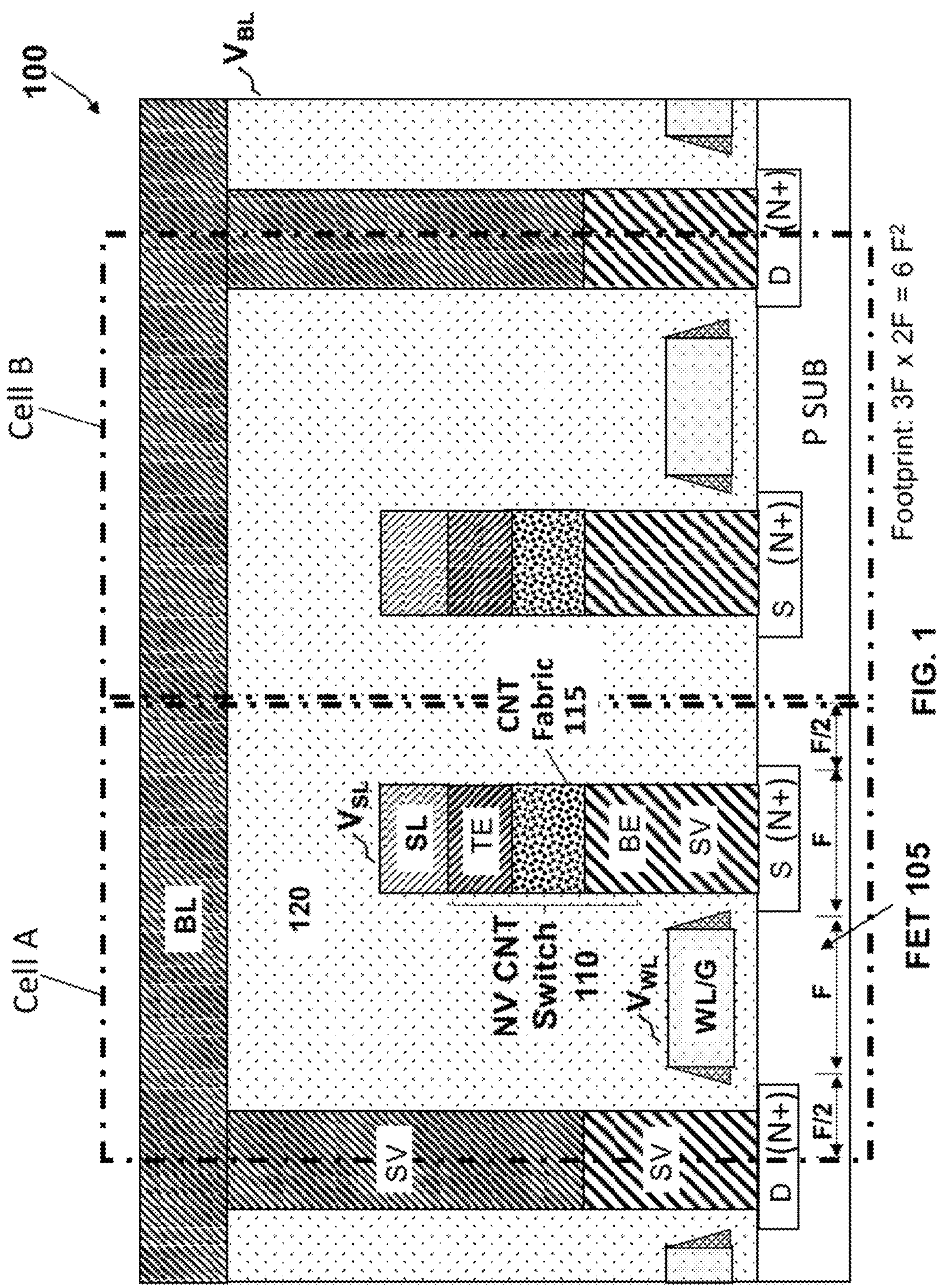
FIG. 1 shows a prior art array cross section of dense 1T, 1R nonvolatile memory cells.
Figure 4:
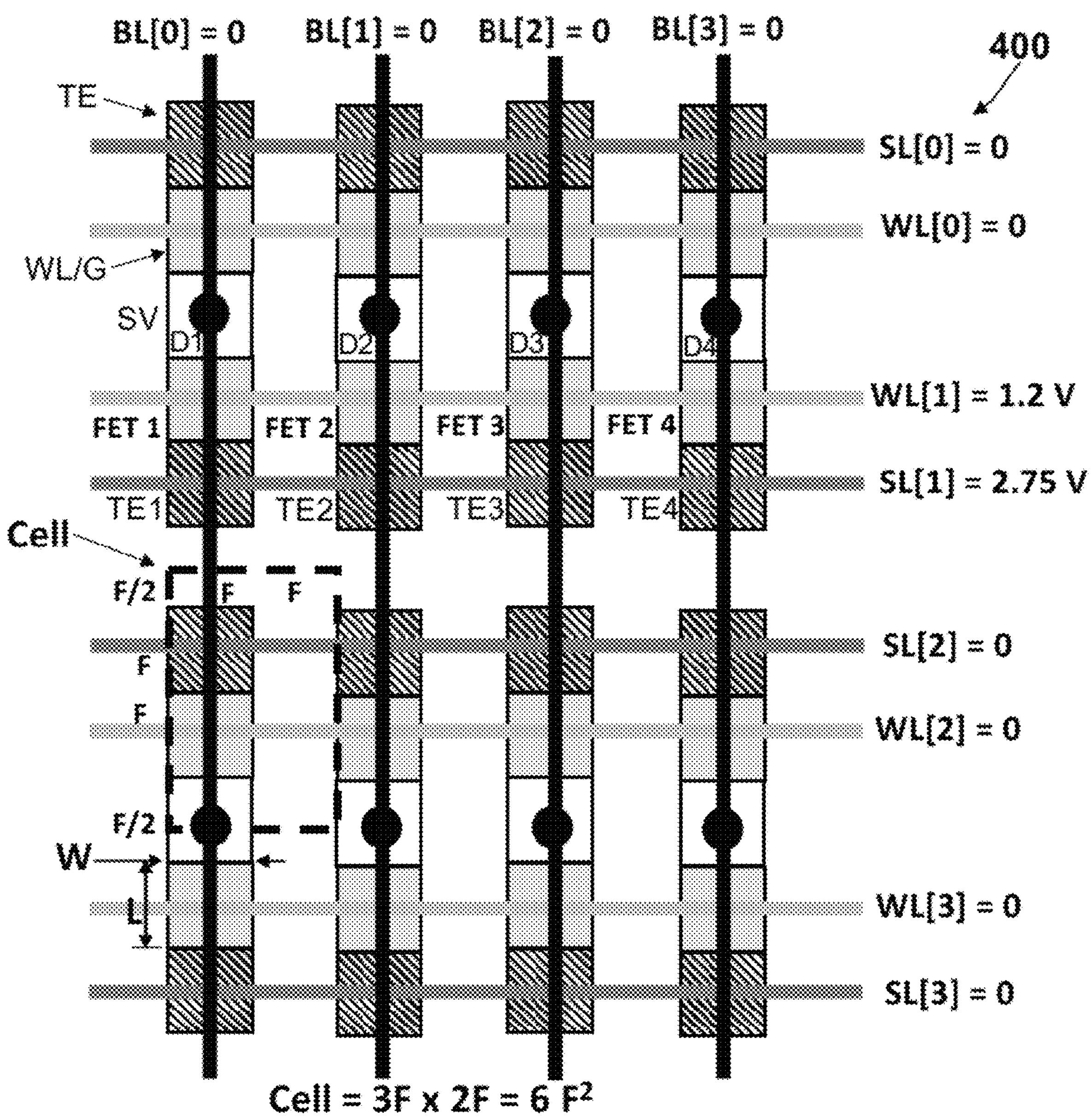
FIG. 4 shows a prior art plan view of a single level 1T, 1R cell memory array corresponding to the FIG. 2 prior art cross section that shows voltages used in a resistance value RESET operation.
Figure 5A:
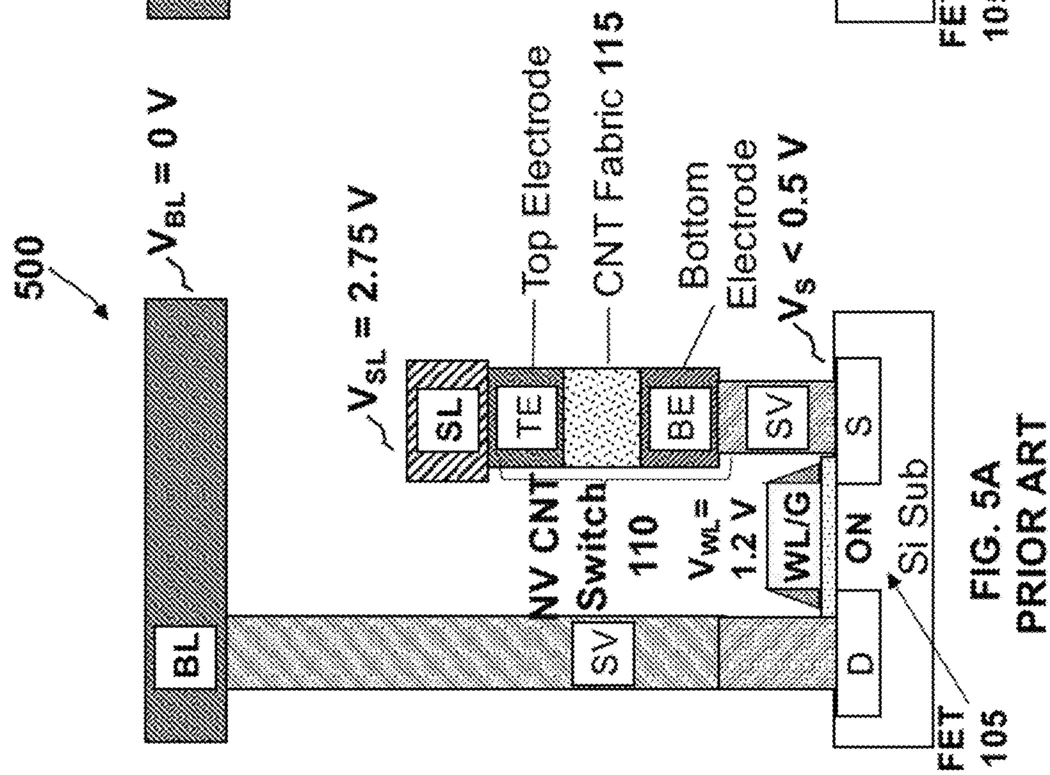
FIG. 5A shows a prior art cross section of a single level 1T, 1R cell memory array corresponding to prior art FIG. 1 and FIG. 2, showing voltages across the cell select transistor (FET) for a selected cell during a RESET operation.
Figure 5B:
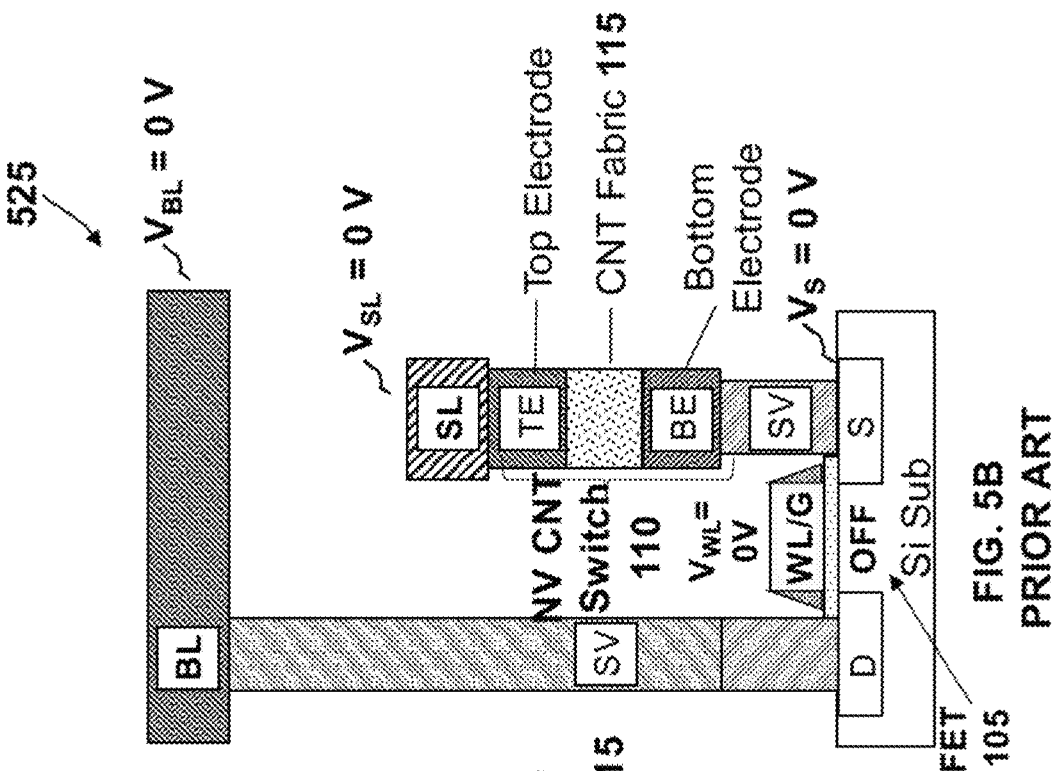
FIG. 5B shows a prior art cross section of a single level 1T, 1R cell memory array corresponding to prior art FIG. 1 and FIG. 2, showing voltages across the cell select transistor (FET) for unselected cells during a RESET operation.

Referring now to prior art FIGS. 5A and 5B, corresponding to prior art FIG. 1, selected nonvolatile memory cell 500 shows a RESET operation with select line voltage $V_{SL}$ at RESET voltage 2.75 V and FET 105 ON, such that a RESET current flows through NV CNT switch 110 and FET 105 to bit line BL at $V_{BL}$=0 V. Cell select FET 105 of nonvolatile memory cell 500 illustrated in prior art FIG. 5A corresponds to any one of the cell select FETs FET1, FET2, FET3, and FET4 corresponding to 1T, 1R cell memory array RESET voltage distribution 400 illustrated in prior art FIG. 4. Referring to prior art FIG. 5A, and assuming a CNT switch 110 resistance of 100 kΩ and a cell select FET 105 ON resistance of 20 kΩ, then the source voltage with respect to ground (zero volts) is 2.75V×(20 kΩ/(100 kΩ+20 kΩ))= 0.45 V, enabling the use of a cell select FET of minimum dimensions.

Referring now to prior art FIG. 5B, corresponding to prior art FIG. 1, unselected nonvolatile memory cell 525 shows a select line voltage $V_{SL}$=0 V, a corresponding word line voltage $V_{WL}$=0 V, and a corresponding bit line voltage $V_{BL}$=0 V. Therefore, there is no (zero) voltage on all cell select FETs of unselected cells.

Figure 6:
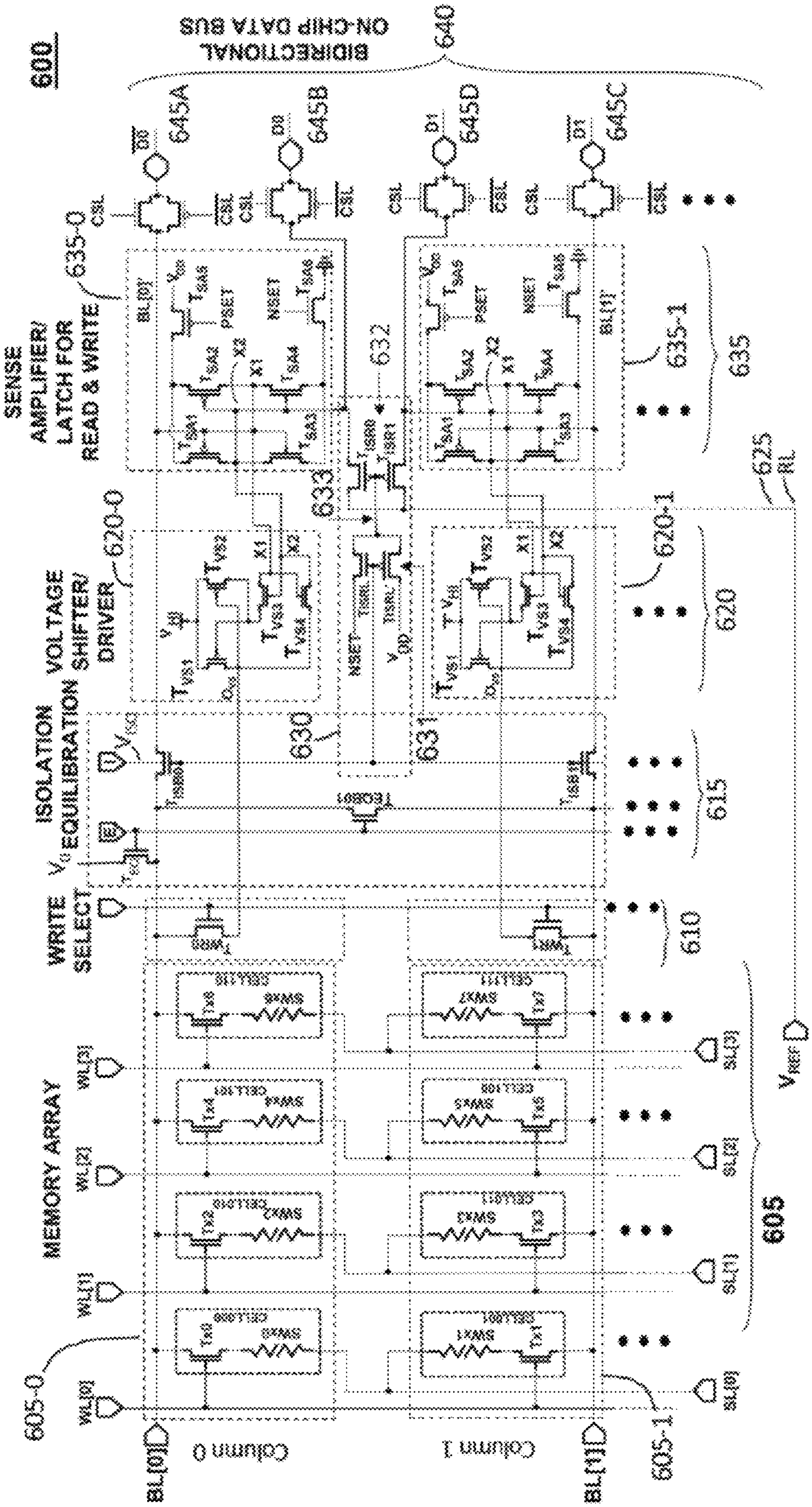
FIG. 6 shows a prior art open architecture schematic that includes a memory array formed with interconnected 1T, 1R cells, equilibration and isolation devices, sense amplifier/latch circuits, and on-chip data bus as well as voltage shifter/driver circuits providing READ and WRITE data paths.

Referring now to open architecture schematic 600 illustrated in prior art FIG. 6, schematic 600 is a circuit schematic representation of the data path, which includes a storage array section 605 with word lines WL approximately parallel to select lines SL and array bit lines BL approximately orthogonal to the word lines and the select lines. Storage array section 605 is a schematic representation of plan view 200 of a single level 1T, 1R cell memory array layout illustrated in prior art FIG. 2. Storage subarray 605-0 array bit line BL[0] is in electrical communication with a first terminal of isolation device $T_{ISB0}$ and bit line segment BL[0]' is in electrical communication with a second terminal of $T_{ISB0}$. Bit line segment BL[0]' is also in electrical communication with terminal X1 of SA/Latch 635-0. Terminal X2 of SA/Latch 635-0 is in electrical communication with reference line interface circuit 630 which electrically connects or disconnects terminal X2 and reference line 625. Reference line interface circuit 630 includes isolation device circuit 632, which is in electrical communication with terminal X2 of SA/Latch 635-0, reference line 625, and mode control output 633 of mode control circuit 631.

Figure 7A:
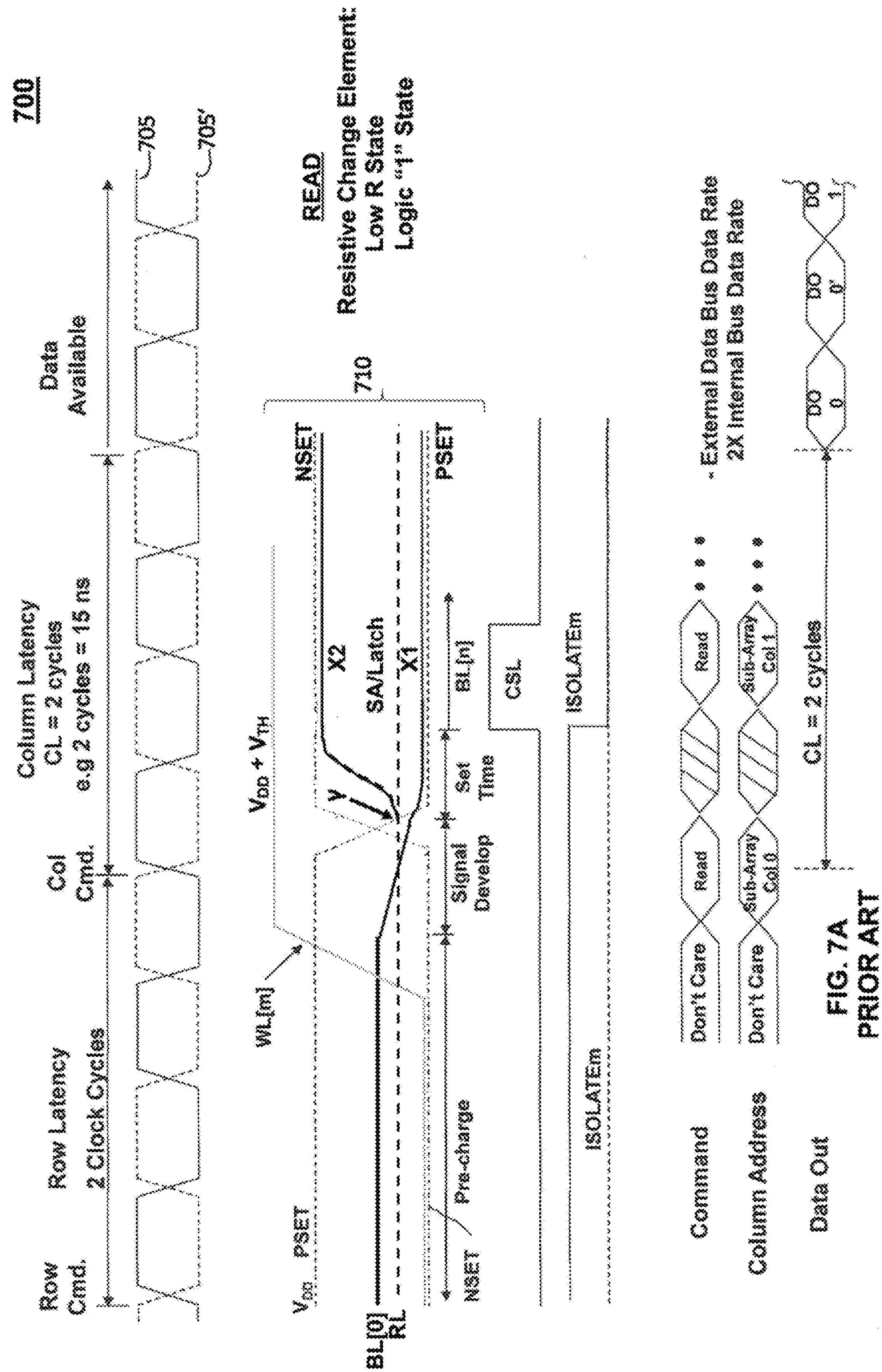
FIG. 7A shows a prior art READ timing diagram corresponding to the FIG. 6 prior art open architecture schematic showing waveforms for a READ operation of a resistive change element in a low resistance state corresponding to a logic "1" using a bit line discharge detection method.

Referring now to READ timing diagram 700 illustrated in prior art FIG. 7A, reference line interface circuit 630 electrically connects terminal X2 to $V_{REF}$ of reference line 625 during signal development time, and disconnects terminal X2 at the onset of SA/Latch set time indicated by the symbol gamma (γ). The onset of set time is determined when SA/Latch control signal NSET transitions from zero volts to the power supply voltage $V_{DD}$, which is typically 1 V as illustrated by sensing waveforms 710 in prior art FIG. 7A. Sensing waveforms 710 illustrate 1T, 1R cell memory bit line discharge sensing of a resistive change element in storage subarray 605-0 in a low resistance state $R_{LO}$. When control signal CSL is activated, data from SA/Latch 635-0 are transmitted to bus lines forming bidirectional on-chip data bus 640 illustrated in prior art FIG. 6. During the control signal CSL activation period, SA/Latch 635-0 terminal X1 in electrical communication with bidirectional on-chip data bus line 645A and terminal X2 in electrical communication with bidirectional on-chip data bus line 645B. Clock signal 705 and second clock signal 705', which is 180 degrees out of phase with clock signal 705, enable double data rate (DDR2) operation with an external bus data rate 2 times faster than the data rate of the bidirectional on-chip data bus. The time delay (latency) between column address time to data out is two clock cycles (CL=2).

Referring now to open architecture schematic 600 illustrated in prior art FIG. 6, storage subarray 605-1 array bit line BL[1] is in electrical communication with a first terminal of isolation device $T_{ISB1}$ and bit line segment BL[1]' is in electrical communication with a second terminal of $T_{ISB1}$. Bit line segment BL[1]' is also in electrical communication with terminal X1 of SA/Latch 635-1. Terminal X2 of SA/Latch 635-1 is in electrical communication with reference line interface circuit 630 which electrically connects or disconnects terminal X2 and reference line 625. Reference line interface circuit 630 includes isolation device circuit 632, which is in electrical communication with terminal X2 of SA/Latch 635-1, reference line 625, and mode control output 633 of mode control circuit 631.

Figure 7B:
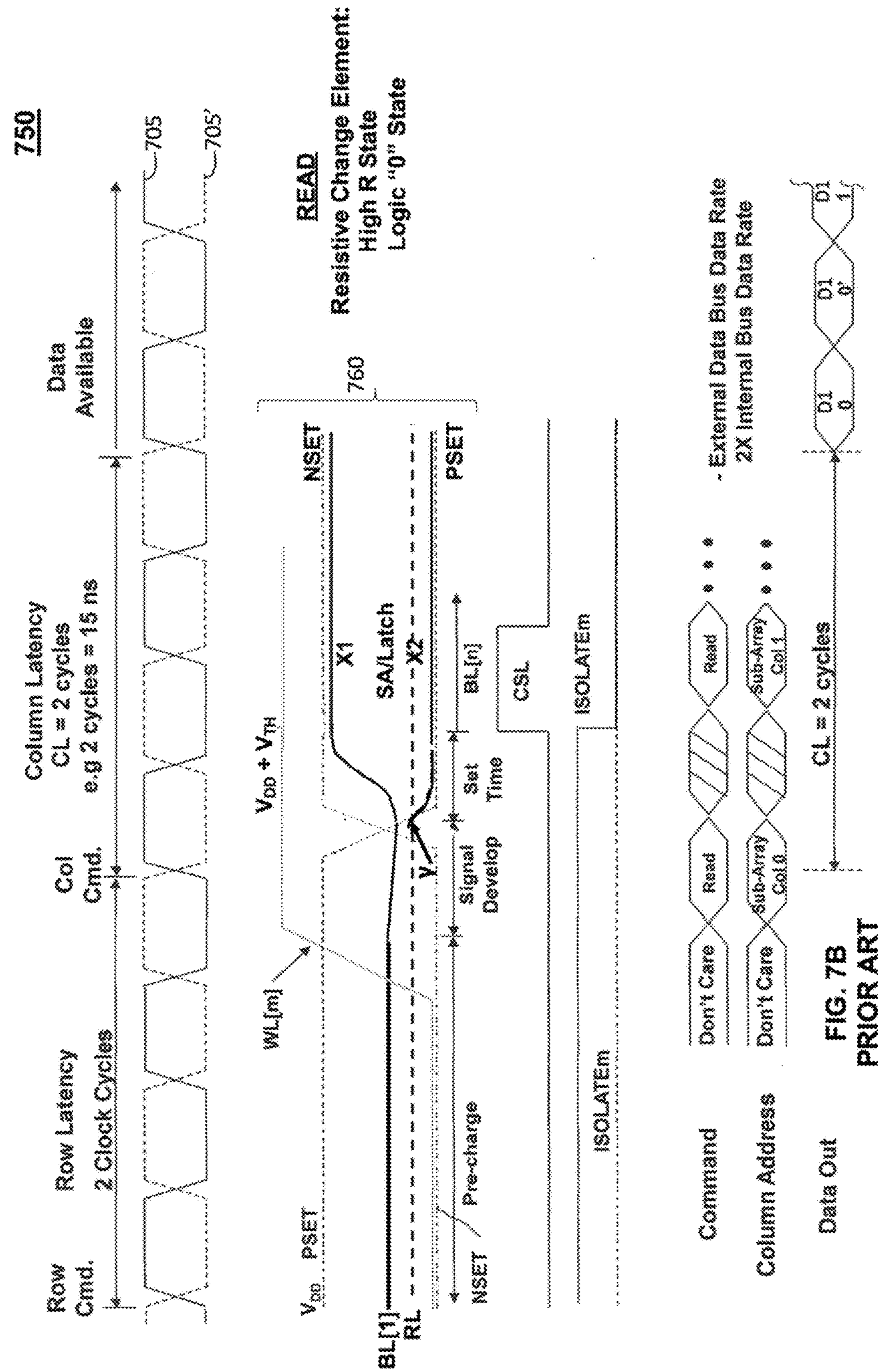
FIG. 7B shows a prior art READ timing diagram corresponding to the FIG. 6 prior art open architecture schematic showing waveforms for a READ operation of a resistive change element in a high resistance state corresponding to a logic "0" using a bit line discharge detection method.

Referring now to READ timing diagram 750 illustrated in prior art FIG. 7B, reference line interface circuit 630 electrically connects terminal X2 to $V_{REF}$ of reference line 625 during signal development time, and disconnects terminal X2 at the onset of SA/Latch set time indicated by the symbol gamma (γ). The onset of set time is determined when SA/Latch control signal NSET transitions from zero volts to the power supply voltage $V_{DD}$, which is typically 1 V as illustrated by sensing waveforms 760 in prior art FIG. 7B. Sensing waveforms 760 illustrate 1T, 1R cell memory bit line discharge sensing of a resistive change element in storage subarray 605-1 in a high resistance state $R_{HI}$. When control signal CSL is activated, data from SA/Latch 635-1 are transmitted to bus lines forming bidirectional on-chip data bus 640 illustrated in prior art FIG. 6. During the control signal CSL activation period, SA/Latch 635-1 terminal X1 in electrical communication with bidirectional on-chip data bus line 645C and terminal X2 in electrical communication with bidirectional on-chip data bus line 645D. Clock signal 705 and second clock signal 705', which is 180 degrees out of phase with clock signal 705, enable double data rate (DDR2) operation with an external bus data rate 2 times faster than the data rate of the bidirectional on-chip data bus. The time delay (latency) between column address time to data out is two clock cycles (CL=2).

There is one SA/Latch for each array bit line and one bidirectional on-chip data bus line for each SA/Latch for a single rail bidirectional on-chip data bus. There are two bidirectional on-chip data bus lines, one true and one complement for a dual rail bidirectional on-chip data bus. Open architecture schematic 600 shows a dual rail bidirectional on-chip data bus. The number of data lines for single rail or data complementary pairs may be 8, 16, 32, 64, 128, 256, 512, 1024, or more depending on architectural requirements.

Referring now to open architecture schematic 600 illustrated in prior art FIG. 6 and representative SA/Latches 635-0 and 635-1, each SA/Latch is formed by a pair of cross coupled CMOS inverters and a pull up and a pulldown transistor. A first inverter includes transistors $T_{SA1}$ and $T_{SA3}$ in series form an output X2 and a second inverter includes transistors $T_{SA2}$ and $T_{SA4}$ in series form an output X1. The drains of Tsai and $T_{SA2}$ are in electrical communication with pullup transistor $T_{SA5}$, which is in electrical communication with voltage source $V_{DD}$. The sources of transistors Tsai and $T_{SA4}$ are in electrical communication with pull down transistor $T_{SA6}$, which is in electrical communication with a reference voltage source such as ground (zero volts). The output of the first inverter X2 is in electrical communication with the gates of second inverter transistors $T_{SA2}$ and $T_{SA4}$ and the output of second inverter X1 is in electrical communication with the gates of first inverter transistors Tsai and $T_{SA3}$.

Referring now to prior art FIG. 6 illustrating open architecture schematic 600, is a circuit schematic representation of the data path, with emphasis on circuits and timing for a WRITE operation. Open architecture schematic 600 requires a RESET-before-WRITE operation. Referring to 1T, 1R cell memory array RESET voltage distribution 400 array voltages shown in prior art FIG. 4, RESET is achieved by applying 2.75 volts to a select line, such as select line SL[1], in electrical communication with a CNT switch top electrode TE, with corresponding word line WL[1] at 1.2 V such that corresponding cell select FETs conduct RESET currents to corresponding CNT switches to grounded bit lines. Corresponding CNT switches transition from a low resistance $R_{LO}$ to a high resistance $R_{HI}$ or remain in a high resistance $R_{HI}$ state.

In a WRITE operation, isolation devices $T_{ISB0}$ and $T_{ISB1}$ are in an OFF state. Therefore, bit line segments BL[0]' and BL[1]' are disconnected from array bit lines BL[0] and BL[1], respectively. In a WRITE operation to adjust a resistive state of a resistive change element to a low resistive state, a SET voltage $V_{SET}$=1.5 volts is applied by the cell select FET to the bottom electrode of a CNT switch. Data pulses on bidirectional on-chip data bus lines of bidirectional on-chip data bus 640 illustrated in prior art FIG. 6, received from an external bus, are transmitted to corresponding SA/Latches 635-0 and 635-1. In a dual rail bidirectional bus, a logic 1 corresponds to a pulse amplitude of 1 volt applied to a one terminal, X1 for example, of a SA/Latch and zero volts applied to terminal X2. A logic 0 corresponds to a pulse of amplitude 1 V applied to terminal X2 of the latch and zero volts applied to terminal X1.

The output of SA/Latches needs to be amplified to $V_{SET}$=1.5 volts and applied to array bit lines. SA/Latch 635-0 and SA/Latch 635-1 are in electrical communication with voltage shifter/drivers 620-0 and 620-1, respectively, which provide output voltages $O_{VS}$ of 1.5 volts.

Referring now to voltage shifter/drivers 620-0 and 620-1 illustrated in open array schematic 600 shown in prior art FIG. 6, PFET devices $T_{VS1}$ and $T_{VS2}$ have source terminals that are in electrical communication with each other and VFR, which enables the required output voltage $O_{VS}$=1.5 V for the WRITE operation in which a selected resistive change element transitions from a high resistance state $R_{HI}$ to a low resistance state $R_{LO}$. Output voltage $O_{VS}$=0 V if the selected resistive change element is to remain in a high resistance $R_{HI}$ state. The drain of $T_{VS1}$ is in electrical communication with the drain of NFET device $T_{VS4}$ and the gate of $T_{VS2}$ at node $O_{VS}$. The drain of $T_{VS2}$ is in electrical communication with the drain of NFET $T_{VS3}$ and the gate of $T_{VS1}$. The source of $T_{VS3}$ is in electrical communication with the gate of $T_{VS4}$ and terminal X1 in electrical communication with a corresponding SA/Latch terminal. The source of $T_{VS4}$ is in electrical communication with the gate of $T_{VS3}$ and terminal X2 also in electrical communication with a corresponding SA/Latch terminal.

Referring now to WRITE selection section 610 and storage array section 605 illustrated in open architecture 600, in this example, an output voltage $O_{VS}$=1.5 volts is applied to a first terminal of FET $T_{WR0}$, a WRITE select pulse of 1.5 V+Vth is applied to the gate, and a second terminal of FET $T_{WR0}$ applies 1.5 V to array bit line BL[0]. Representative select line SL[1] is at zero volts, word line WL[1] gate voltage of 1.5 V+Vth is applied to cell select FET $T_{X2}$, which transmits the 1.5 V on array bit line BL[0] to the bottom electrode BE of CNT switch $S_{WX2}$ with top electrode TE in electrical communication with select line SL[1] is at zero volts. CNT switch $S_{WX2}$ transitions from a high resistance state $R_{HI}$ to a low resistance state $R_{LO}$. CELL010 stores low resistance state $R_{LO}$ corresponding to a logic 1.

In this example, an output voltage $O_{VS}$=0 is applied to a first terminal of FET $T_{WR1}$, the WRITE select pulse of 1.5 V+Vth is also applied to the gate, and a second terminal of FET $T_{WR1}$ applies 0 V to array bit line BL[1]. Since select line SL[1] is at zero volts, word line WL[1] gate voltage of 1.5 V+Vth is applied to cell select FET $T_X3$, which transmits the 0 V on BL[1] to the bottom electrode BE of CNT switch SWx3 with top electrode TE in electrical communication with select line SL[1] at zero volts. CNT switch SWx3 remains at high resistance state $R_{HI}$. CELL011 stores a high resistance state $R_{HI}$ corresponding to a logic 0.

At this point in the specification, it is noted that if SET operations can be performed at the same operating voltage $V_{DD}$=1 V as SA/Latches 635, then the outputs of SA/Latches 635 do not need to be amplified to 1.5 V and voltage shifter/drivers 620 may be eliminated. Hence, $V_{SET}$=1 V may be applied to bit line segments BL0' and BL1' by SA/Latches 635-0 and 635-1, respectively, and to array bit line lines BL0 and BL1, respectively, through isolation devices $T_{ISB0}$ and $T_{ISB1}$, respectively.

Figure 8:
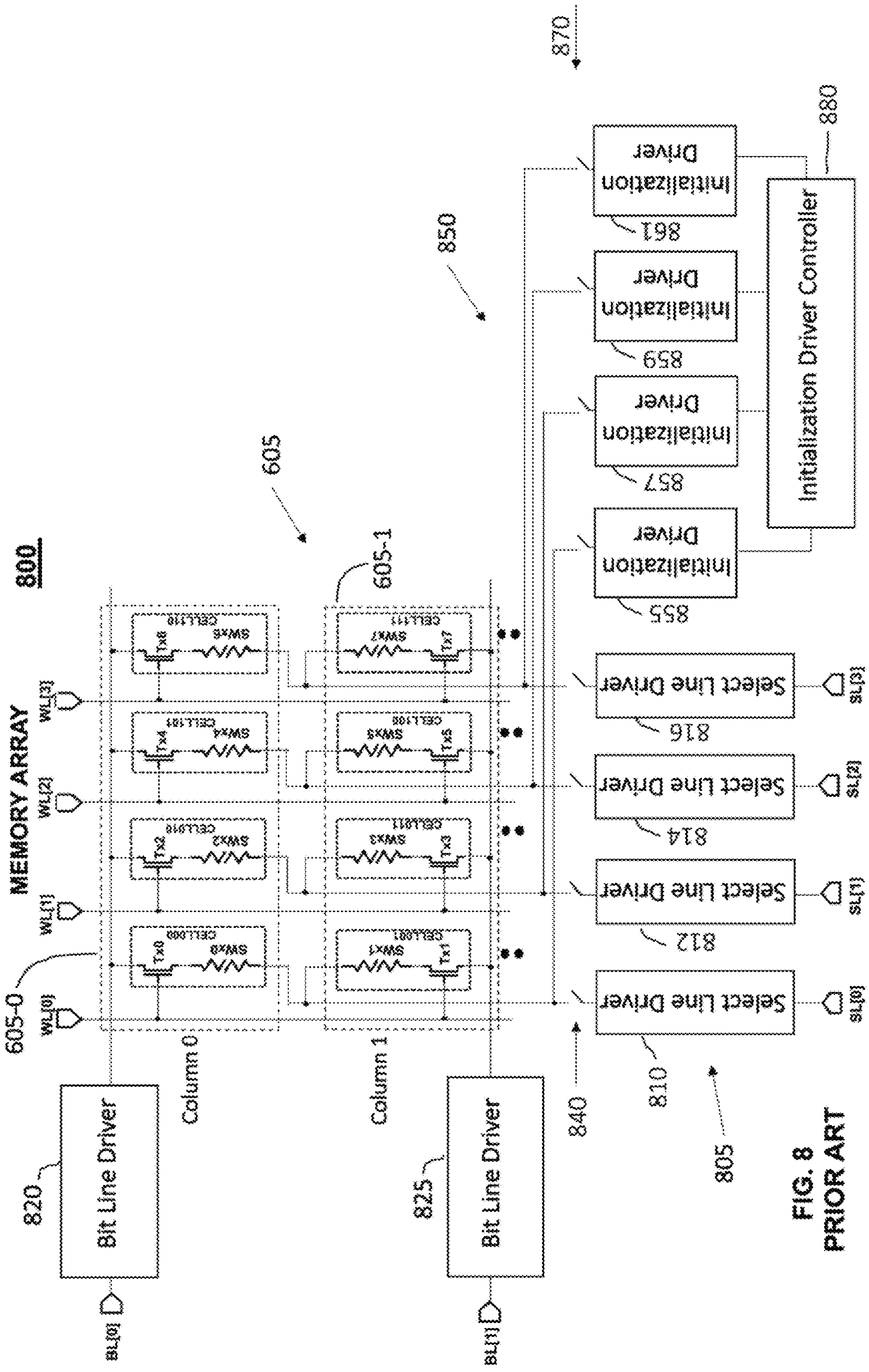
FIG. 8 shows prior art bit line drivers, select line drivers, and initialization drivers for performing RESET and INITIALIZATION operations on resistive change elements in the memory array, of FIG. 6.

Referring now to prior art FIG. 8, initialization and RESET circuits 800 for a memory array with 1T, 1R cells are shown. The initialization and RESET circuits 800 show the memory array 605 of the open architecture schematic 600 shown in prior art FIG. 6, select line drivers 805 which include select line drivers 810, 812, 814, and 816 in electrical communication with select lines SL[0], SL[1], SL[2], and SL[3] through optional select line driver switches 840 for electrically connecting select line drivers to corresponding select lines, bit line drivers 820, 825 in electrical communication with bit lines BL[0], BL[1], initialization drivers 850 which include initialization drivers 855, 857, 859, 861 in electrical communication with select lines SL[0], SL[1], SL[2], and SL[3] through optional initialization driver switches 870 for electrically connecting initialization drivers to corresponding select lines, and an initialization driver controller 880 in electrical communication with the initialization drivers 850. When the select line driver switches 840 are not required, outputs of the select line drivers 805 can be switched to a tristate mode and remain in electrical communication with the select lines SL[0], SL[1], SL[2], and SL[3]. When initialization driver switches 870 are not required, outputs of the initialization drivers 850 can be switched to a tristate mode and remain in electrical communication with the select lines SL[0], SL[1], SL[2], and SL[3]. For ease of illustration, FIG. 8 does not show other portions of the open architecture schematic 600, although, other portions of the open architecture schematic 600 are discussed with respect to RESET-before-WRITE operations and initialization operations described below.

At this point in the specification, the RESET-before-WRITE operation performed using bit line drivers 820, 825, select line drivers 805, and word line drivers (not shown) is described below. Additionally, a CNT switch initialization operation using bit line drivers 820, 825, initialization drivers 850, and word line drivers (not shown) is described further below. The output of each of the select line drivers 810, 812, 814, 816 may be in tristate, at zero volts, or at 2.75 V in a RESET operation. Isolation devices $T_{ISB0}$ and $T_{ISB1}$ are in an OFF state, thereby disconnecting array bit line BL[0] from bit line segment BL[0]' and array bit line BL[1]

and array bit line segment BL[1]' during a RESET operation. 1T, 1R cell memory array RESET voltage distribution 400 illustrated in prior art FIG. 4 corresponds to storage array section 605 illustrated in prior art FIG. 6. In this example, select line driver 812 drives select line SL[1] to 2.75 V, a word line driver (not shown) drives word line WL[1] to 1.2 V, and bit line driver 820 drives array bit line BL[0] to zero volts and bit line driver 825 drives array bit line BL[1] to zero volts. Hence, cell select FET $T_{X2}$ is ON and CNT switch SWx2 switches to or remains in high resistance state $R_{HI}$. Therefore, memory array cell CELL010 is in a high resistance state $R_{HI}$ prior to the start of the WRITE operation. Also, cell select FET $T_{X3}$ is ON and CNT switch SWx3 switches to or remains in high resistance state $R_{HI}$. Therefore, memory array cell CELL011 is in a high resistance state prior to the start of the WRITE operation.

Figure 9A:
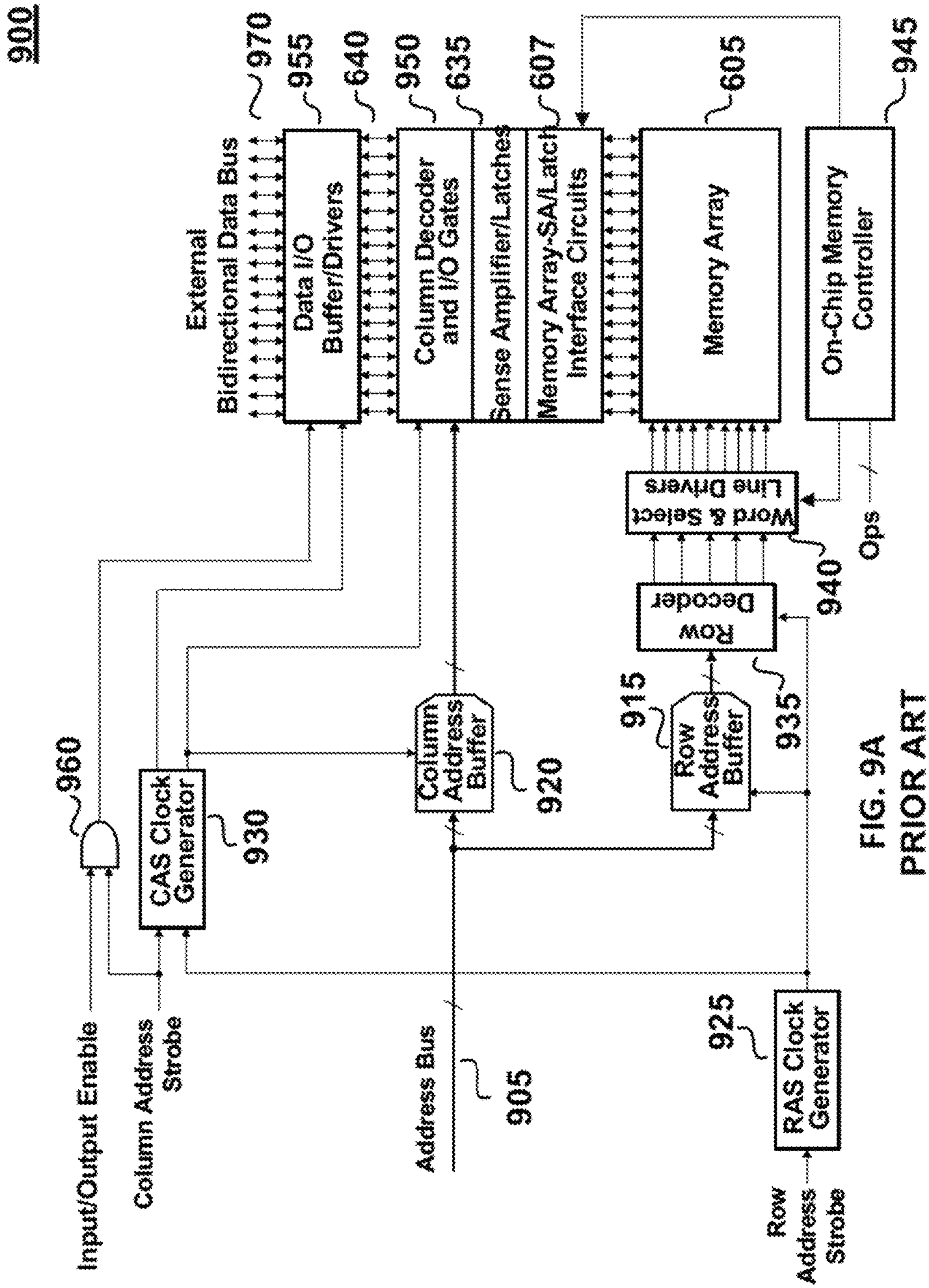
FIG. 9A shows a prior art resistive change memory chip architecture.

Referring now to resistive change memory chip architecture 900 with 1T, 1R cells and illustrated in prior art FIG. 9A, memory controller function may be on a separate chip or may be integrated as a part of another chip, such as a microprocessor, microcontroller, FPGA, or other logic functions, for example. This memory controller function manages the logic-memory interface and provides timing pulses, row and column addresses, data to be stored, and data to be read out, and a clock for a synchronized digital memory interface. An on-chip memory controller 945 manages typical memory chip operations such as timing, routing of addresses, data, modes of operation, data I/O buffer/drivers, and memory-specific operations such as RESET-before-WRITE operations, for example, as shown in WRITE timing diagram 980 illustrated in prior art FIG. 9B.

Resistive change memory chip architecture 900 illustrated in prior art FIG. 9A includes transmitting address information received from a logic chip via address bus 905 to row address buffer 915 and column address buffer 920 illustrated in prior art FIG. 9A. Row address strobe to RAS clock generator 925 results in timing pulses to row address buffer 915 and row decoder 935. Row address buffer 915 outputs to row decoder 935, which selects word and select line drivers 940. The outputs of word and select line drivers 940 are in electrical communication with word lines and corresponding select lines of memory array 605 as illustrated by open architecture schematic 600 shown in prior art FIG. 6. Word and select line drivers 940 include select line drivers 805 and initialization drivers 850 illustrated in prior art FIG. 8.

Memory array bit lines, such as array bit lines BL[0] and BL[1], for example, are in electrical communication with memory array-SA/Latch interface circuits 607 illustrated in prior art FIG. 9A, which act as an interface between memory array 605 and sense amplifier/latches 635 illustrated in prior art FIG. 6. Memory array-SA/Latch interface circuits 607 include isolation devices 615 and write select FET devices 610 as illustrated in prior art FIG. 6. During READ operations, isolation devices 615 are in a conductive ON state and electrically connect array bit lines BL[0] and BL[1] to SA/Latch 635-0 and SA/Latch 635-1, respectively of SA/Latches 635. During a WRITE operation, WRITE selection devices 610 are in a conductive ON state and electrically connect array bit lines BL[0] and BL[1] to voltage shifter/driver 620-0 and voltage shifter/driver 620-1, respectively, of voltage shifter/drivers 620. Voltage shifter/drivers 620 are in electrical communication with corresponding SA/Latches 635 as illustrated in prior art FIG. 6.

Resistive change memory chip architecture 900 illustrated in prior art FIG. 9A also includes CAS address strobe to CAS clock generator 930 which results in timing pulses to column address buffer 920, which transmits column addresses to column decoder and I/O gates 950, which electrically connect/disconnect sense amplifier/latches 635 and on-chip data bus 640 illustrated in prior art FIG. 6. CAS clock generator 930 also transmits timing pulses to data I/O buffer drivers 955, which is in electrical communication with on-chip bidirectional data bus 640 and external bidirectional data bus 970. Data I/O buffer/drivers 955 also receive input/output enable 960 pulses which enables transmission of data from on-chip bidirectional data bus 640 to external bidirectional data bus 970 or from external bidirectional data bus 970 to on-chip bidirectional data bus 640. External bidirectional data bus 970 is in electrical communication with a logic chip such as a microprocessor, a microcontroller, or a FPGA, for example.

On-chip memory controller 945 illustrated in prior art FIG. 9A includes typical input and output control operations Ops of a synchronous random access memory and memory-specific controller operations indicated by connections to word and select line drivers 940 and memory array-SA/Latch interface circuits 607 as described further above.

Referring now to READ timing diagram 700 illustrated in prior art FIG. 7A, clock signal 705 from the memory control function on a logic chip as described further above, an out-of-phase clock signal 705' may be generated as a method of achieving a synchronized data rate on external bidirectional data bus 970 that is twice the data rate as the data rate as on-chip bidirectional data bus 640. While this example describes a doubling of the data rate on external bidirectional data bus 970 illustrates a double data rate (a DDR2), similar methods may be used for to achieve triple the data rate (a DDR3), four times the data rage (a DDR4), and even higher synchronized data rates.

Another synchronized high data rate may be achieved with a wide external bidirectional data bus such as 1024, 2048, and even higher I/O interfaces. Also, the addressing approach may be modified by providing both row and column addresses at the time as in high performance static RAMs (SRAMs).

Figure 9B:
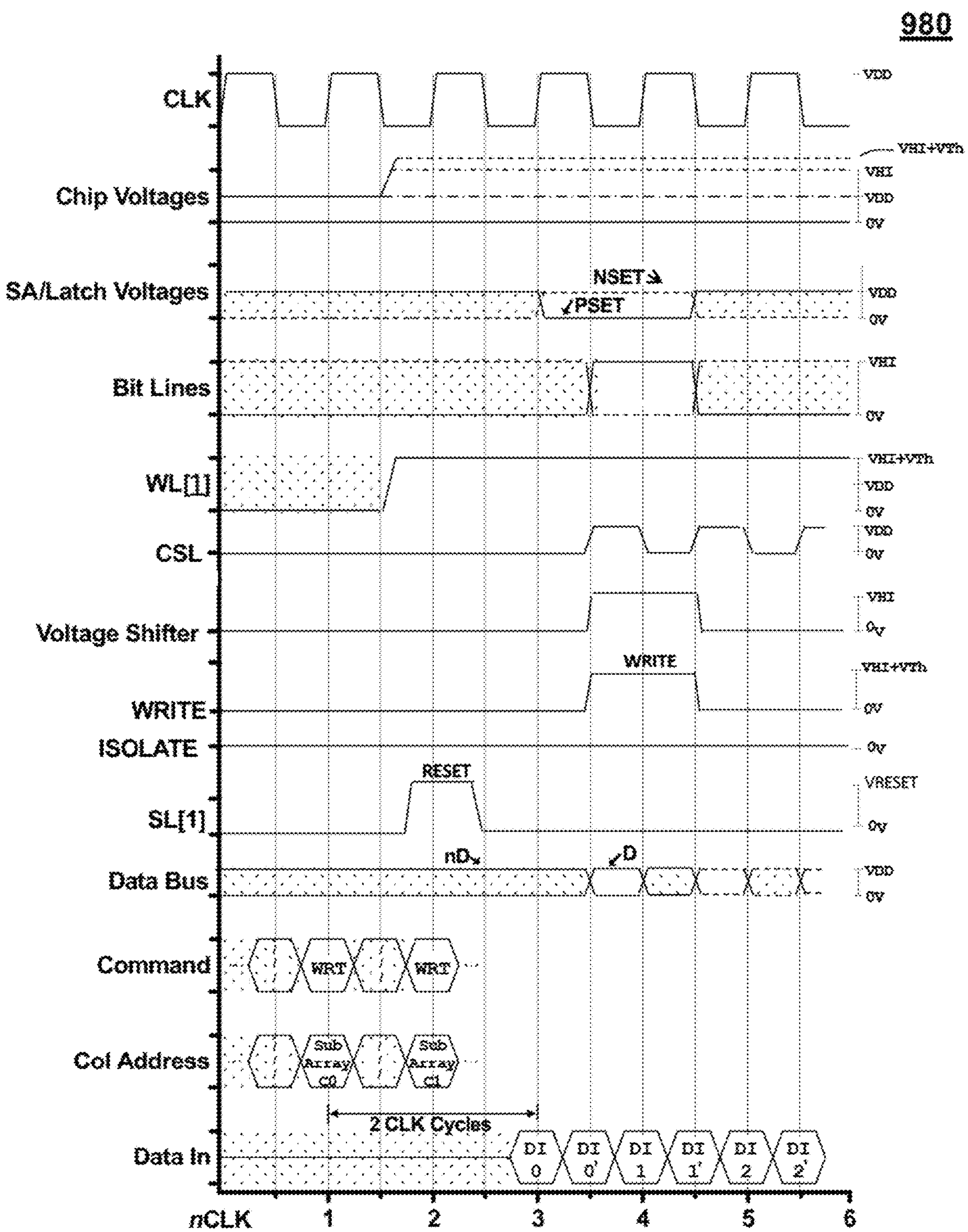
FIG. 9B shows a prior art WRITE timing diagram illustrating a RESET-before-WRITE operation and a WRITE operation performed on the FIG. 6 prior art open architecture schematic.

Referring now to prior art FIG. 9B, WRITE timing diagram 980 illustrates a RESET-before-WRITE operation. In this example, array bit line BL[0], array bit line BL[1], and other array bit lines intersecting word line WL[1] are held at zero volts at the beginning of the WRITE cycle as described with respect to prior art FIG. 8 further above. Referring now to open architecture 600 illustrated in prior art FIG. 6, isolation and equilibration section 615 devices are in an OFF state. WRITE select section 610 devices are in an OFF state during the RESET operation as described further above. Representative selected word line WL[1] is activated and remains activated until completion of WRITE operations. Corresponding representative select line SL[1] is pulsed as soon as WL[1] is activated as shown in WRITE timing diagram 980 illustrated in prior art FIG. 9B and as described with respect to prior art FIG. 8 further above. With select line SL[1] transitioning to a $V_{RESET}$ voltage of 2.75 V, all nonvolatile resistive change elements (NV CNT switches, for example) in electrical communication with to select line SL[1] are RESET from a low resistance state $R_{LO}$ to a high resistance state $R_{HI}$, or remain in a high resistance state $R_{HI}$. While a single $V_{RESET}$ pulse is shown in prior art FIG. 9B, multiple SELECT pulses may be used. Referring to prior art FIG. 8, nonvolatile resistive change elements SWx2 and SWx3 are in a high resistance state $R_{HI}$ after the RESET operation. CAS clock generator 930 also transmits timing pulses to data I/O buffer/drivers 955, while described with respect to selected word line WL[1] and corresponding select line SL[1], WRITE timing diagram 980 illustrated in prior art FIG. 9B also applies to word line WL[0] and corresponding select line SL[0]; word line WL[2] and corresponding select line SL[2]; and word line WL[3] and corresponding select line SL[3].

Assuming word line WL[1] remains selected and corresponding select line SL[1] has transitioned to zero volts, then after the completion of the RESET-before-WRITE operation at the beginning of the WRITE cycle, the WRITE select line shown in WRITE select section 610 illustrated in prior art FIG. 6 is pulsed, FET $T_{WR0}$ and FET $T_{WR1}$ are turned ON. Voltage shifter/driver 620-0 output $O_{VS}$ transmits WRITE data through FET $T_{WR0}$ to array bit line BL[0] and nonvolatile resistive change element $S_{WX2}$ to select line SL[1], which is at zero Volts. Also, voltage shifter/driver 620-1 output $O_{VS}$ transmits WRITE data through FET $T_{WR1}$ to array bit line BL[1] and nonvolatile resistive change element SWx3 to select line SL[1], which is at zero Volts. Nonvolatile resistive change elements SWx2 and SWx3 are already both in a RESET high resistance state $R_{HI}$ because of the RESET-before-WRITE operation described further above. WRITE operation is a SET operation with $V_{SET}$ pulses at 1.5 V.

Assuming $V_{SET}$=1.5 V, and assuming that switch SWx2 in electrical communication with array bit line BL[0] is to be switched to a low resistance $R_{LO}$ state corresponding to a logic "1" and that switch SWx3 in electrical communication with to BL[1] is to remain in a high resistance $R_{HI}$ state corresponding to a logic "0", then voltage shifter/driver 620-0 output $O_{VS}$ transmits a $V_{SET}$ voltage of 1.5 volts to array bit line BL[0] causing switch $S_{WX2}$ to transition from high resistance stated $R_{HI}$ to low resistance state $R_{LO}$, and voltage shifter/driver 620-1 $O_{VS}$ transmits zero volts to array bit line BL[1] causing switch SWx3 to remain in a high resistance state $R_{HI}$ as illustrated in prior art FIG. 9B.

Figure 10:
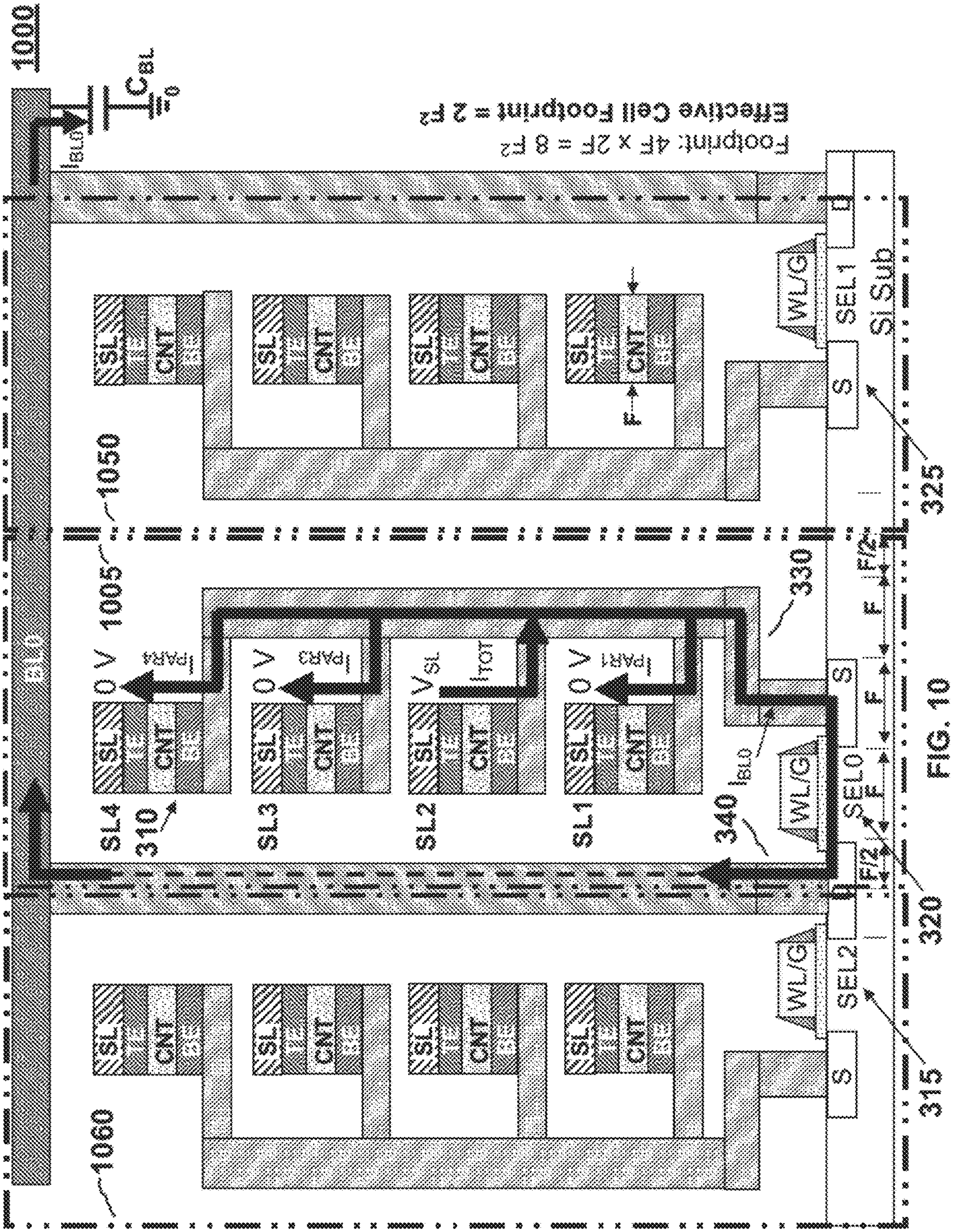
FIG. 10 shows a multi-switch storage cell bit line charge READ operation current flows in the corresponding FIG. 3, 3D MSSC array cross section, which include the total current flow through the selected resistive change element, parasitic current flow through unselected resistive change elements, and bit line current charging the bit line capacitance.

Referring now to 3D MSSC array 300 illustrated in FIG. 3, and corresponding 3D MSSC array 1000 in a READ mode as illustrated in FIG. 10 shows current flow through selected multi-switch storage cell 1005, which corresponds to multi-switch storage cell 305 illustrated in FIG. 3. Unselected multi-switch storage cells 1050 and 1060 conduct no current since all select lines in electrical communication with resistive change elements in multi-switch storage cell 1050 and all select lines in electrical communication with resistive change elements in multi-switch storage cell 1060 are at zero volts and multi-switch storage cell select FETs 325 (SEL1) and 315 (SEL2) are in an unselected OFF state, as are all other multi-switch storage cells along array bit line BL0. In this example, READ operations are performed by first discharging bit line BL0 to zero volts (ground) and then disconnecting BL0 (letting BL0 float). Next, in this example, bit line BL0 is charged by applying a select line voltage $V_{SL}$ to select line SL2 in electrical communication with the top electrode of one of the four (n=4) resistive change elements of multi-switch storage cell 1005 illustrated in FIG. 10. Total current $I_{TOT}$ flows from select line SL2 through the corresponding resistive change element from top electrode TE through the CNT fabric to bottom electrode BE to intracell wiring 330. Select lines SL1, SL3, and SL4 are in electrical communication with zero volts (ground), and each receives a parasitic currents $I_{PAR}$ flowing from the bottom electrode BE through the CNT fabric to the top electrode TE and then through the corresponding select line to ground. Bit line BL0 is at zero voltage at the beginning of the READ cycle, and bit line current $I_{BL0}$ flows through FET 320 charging bit line BL0. In the examples described further below, the drain-to-source resistance of FET 320 is substantially lower than the resistance of the selected resistive change element, even when in a low resistance state $R_{LO}$ such as 100 kΩ. Also, select line SL2 may be at 1 V or 1.5 V and the BL0 charge signal at development time gamma (γ) of 4 ns is less than 200 mV as described further below. Therefore, approximately the entire select line voltage $V_{SEL2}$ is between the top electrode TE and bottom electrode BE of the selected resistive change element.

Referring now to 3D MSSC array 1000 in READ mode illustrated in FIG. 10, values of $I_{TOT}$, $I_{PAR}$, and $I_{BL0}$ vary widely depending on the resistance state of each resistive change element in selected multi-switch storage cell 1005. The total parasitic current flowing in multi-switch storage cell 1005 is the sum of the parasitic current in the unselected resistive change elements, $I_{PAR1}$, $I_{PAR3}$, and $I_{PAR4}$ in this example. In examples described further below, low resistance $R_{LO}$ value is 100 kΩ and high resistance $R_{HI}$ value is 2 MΩ. SA/Latch signals at the end of a 4 ns signal development time have been calculated for selected stacked multi-switch storage cells with the number of resistive change elements n ranging from 2 to 64 as described further below.

3D multi-switch storage cell (MSSC) architecture designed for the 3D MSSC array described further above with respect to FIGS. 3, 10 and other 3D MSSC array configurations described further below is also described further below. The 3D MSSC memory described in this specification is a high performance 3D memory corresponding to high speed DRAM speeds and has the same high performance as the prior art 1T, 1R cell memory described with respect to the prior art FIGS. further above.

3D MSSC arrays use multi-switch storage cells (MSSCs) formed by adding resistive change elements (RCEs) to 1T, 1R cell memory arrays illustrated in prior art FIGS. 1, 2, 5A and 5B, and 6 described further above to form 3D multi-switch storage cells. Each multi-switch storage cell (MSSC) includes a cell select device (FET for example) with a gate in electrical communication with a word line (WL) and a drain in electrical communication with a bit line (BL) orthogonal to the WL, RCEs with a corresponding select line (SL) in electrical communication with a top electrode (TE) and parallel to the WL, and intracell wiring electrically connecting all bottom electrodes (BE) together and to a source of the cell select FET. The examples described in this application include 3D MSSC arrays with multi-switch storage cells having n=2 to 64 RCEs, although cells with n greater than 64 may also be used.

This 3D MSSC array architecture was chosen because multi-switch storage cell arrays are designed and operated to prevent sneak path currents between other multi-switch storage cells, and therefore have no nonvolatile stored resistance disturbs from adjacent cells and stored patterns within those cells. Consequently, RCE electrical characteristics (I-V curves) may be linear and/or nonlinear. A single RCE within a MSSC cell may be selected, while not disturbing the nonvolatile stored resistive states of the n−1 unselected RCEs during READ, RESET, and WRITE operations. However, parasitic currents flow in the n−1 unselected RCEs during READ and WRITE operations. RESET operations and Initialization operations, which may be needed after chip fabrication, may require select line voltages of up to 3 V. However, these voltages are applied using FETs at the periphery of the arrays. As a result of this 3D MSSC array architecture, the cell select FET terminal voltages between source and drain and substrate are limited to the maximum RCE SET voltage, 1.5 V in these examples, for both selected and unselected multi-switch storage cells as described further below. 3D MSSC arrays in these examples require WRITE voltages up to 1.5 V provided by a driver corresponding to the voltage shifter/driver illustrated in prior art FIG. 6. However, sense amplifier/latches (SA/Latches) voltages operate between zero and $V_{DD}$ ($V_{DD}$=1 V in these examples) as do other circuits on the 3D MSSC memory chip.

Schematic representations and resistive change element operational voltages and polarities are illustrated in FIGS. 11A-11E and described below to introduce architectural and operational concepts, which are described in detail further below.

Figures 1, 2, 3, 11A, 11B:
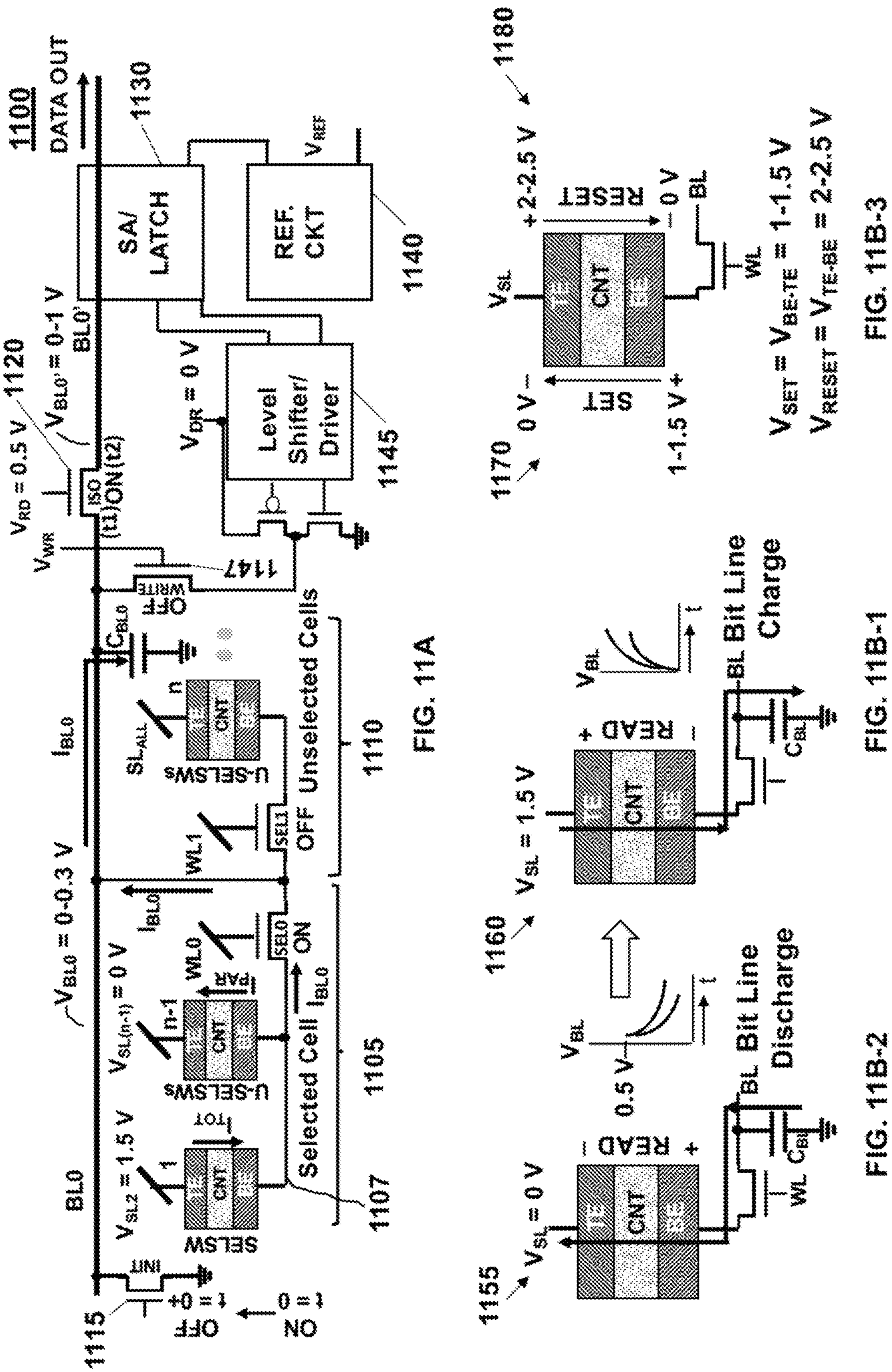

Referring now to FIG. 11A, a schematic representation 1100 of a 3D MSSC memory bit line charge data path used for READ, RESET, WRITE logic "1", and WRITE logic "0" operations, that also includes voltages and current flows corresponding to 3D MSSC array 1000 in READ mode illustrated in FIG. 10 is shown. Selected multi-switch storage cell 1105 corresponds to selected multi-switch storage cell 1005 and unselected multi-switch storage cell 1110 corresponds to unselected multi-switch storage cell 1050, both illustrated in FIG. 10. Selected multi-switch storage cell 1105, corresponding to selected multi-switch storage cell 1005 illustrated in FIG. 10, shows selected resistive change element SELSW having top electrode TE in electrical communication with activated select line SL2 with total current $I_{TOT}$ flowing from top electrode TE to bottom electrode BE and into cell wire 1107, which corresponds to intracell wiring 330 in FIG. 10. Total current $I_{TOT}=I_{PAR}+I_{BL0}$ charging current, where in this example, $I_{PAR}=I_{PAR1}$ $I_{PAR3}$ $I_{PAR4}$ as illustrated in FIGS. 10 and 11A. Bit line BL0 is representative of all bit lines in a sub-array with BL0, BL1, etc., with up to 16, 32, 64, 128, 256 or more bit lines, with each bit line in electrical communication with a corresponding SA/Latch.

Referring now to schematic representation 1100 illustrated in FIG. 11A, resistive change element operational voltages and polarities illustrated in FIGS. 11B-1, 11B-2, and 11B-3, and to descriptions of current flows in FIGS. 10 and 11A further above. FIG. 11B-1 illustrates bit line (BL) charge READ operational polarity 1160. FIG. 11B-2 illustrates bit line (BL) discharge READ operational polarity 1155 illustrated in prior art FIGS. 7A and 7B. FIG. 11B-3 illustrates SET operational polarity 1170 and RESET operational polarity 1180.

Referring now to BL charge READ operational polarity 1160, a select line voltage, such as select line voltage $V_{SL2}$, may be applied to a top electrode TE of a selected resistive change element, such as SELSW illustrated in FIG. 11A. Bottom electrode BE is in electrical communication with cell wire 1107 as illustrated in FIG. 11A. As described further above with respect to FIGS. 10 and 11A, the cell select FET drain-to-source resistance is substantially less than the resistive change element resistance and the array bit line BL0 READ voltage is less than 200 mV. Hence, the voltage across the resistive change element is approximately $V_{SL2}$, which in these READ examples is 1 to 1.5 V. Array bit line BL0 charge operational polarity 1160 is the same as RESET operational polarity 1180. Since $V_{RESET}$ voltage in this example is in the 2-2.5 V range, and since array bit line BL0 charge READ operational polarity 1160 is the same as RESET operational polarity 1180, then if $V_{SL}$ remains less than 2 V, the selected resistive change element is not disturbed during a bit line charge READ operation. Aligning array bit line BL0 charge operational polarity 1160 and RESET operational polarity 1180 maximizes the bit line charge READ signal, thereby enabling multi-switch storage cells with n up to at least 64. It also maximizes performance by minimizing signal development time as described further below.

Referring now to FIG. 11A, during the READ operation, equilibration device 1115 is activated and discharges array bit line voltage to zero volts (ground) at the beginning of the READ operation, and then is turned OFF allowing BL0 to float. Word line WL0 turns FET SEL0 ON and select line SL2 transitions to $V_{SL2}$ equal to 1 V or 1.5 V depending on the number of resistive change elements n in multi-switch storage cell 1105 as described further below. Bit line current $I_{BL0}$, a subset of total current $I_{TOT}$, charges array bit line BL0 capacitance $C_{BL0}$ to a voltage less than 200 mV during signal development time gamma (γ) as illustrated in FIG. 12C. Isolation device 1120, in electrical communication with array bit line BL0 at terminal (t1) and in electrical communication with bit line segment BL0' at terminal (t2), is activated by gate voltage $V_G$=0.5 V and both BL0 and BL0' are at the same READ signal voltage during the signal development time interval. At the end of signal development time gamma (γ), SA/Latch 1130 compares the READ signal on bit line segment BL0' to reference voltage $V_{REF}$ and SA/Latch 1130 either switches to a voltage $V_{DD}$ corresponding to a logic "1" state if the READ signal on bit line segment BL0' is higher than $V_{REF}$ or zero volts corresponding to a logic "0" state if the READ signal on bit line segment BL0' is lower than $V_{REF}$. $V_{DD}$=1 V in these examples. Level shifter/driver 1145 is not activated ($V_{DR}$=0 V) and WRITE FET 1147 is in an OFF state during a READ operation and are activated only during WRITE logic "1" or WRITE logic "0" operations.

Referring to FIG. 11A, if SA/Latch 1130 switches to $V_{DD}$=1.0 V, then bit line segment BL0' and terminal (t2) transition to 1.0 V. Since isolation device 1120 gate voltage $V_G$=0.5 V, isolation device 1120 is now in a saturation region, and as is well known in the semiconductor industry, the terminal (t1) voltage equals $V_G-V_{TH}$. If $V_{TH}$=0.2 volts for example, then array bit line BL0 transitions to $V_{BL0}$=0.3 V, which is applied to the bottom electrodes BE of all resistive change elements in multi-switch storage cell 1105 illustrated in FIG. 11A. Therefore, the n−1 unselected resistive change elements U-SELSWs in multi-switch storage cell 1105 have 0.3 V between bottom electrodes BE and top electrodes TE which are in electrical communication with zero volts (ground) through corresponding select lines SL. No READ disturb occurs since SET voltage $V_{SET}$=1-1.5 V applied between bottom electrodes BE and top electrodes TE as illustrated by SET operational polarity 1170 illustrated in FIG. 11B-3 and $V_{BL0}$=0.3 V is 0.7 V less than the minimum SET voltage $V_{SET}$=1 V.

Limiting bit line switching to 0.3 V during a READ operation may also result in significant READ power dissipation reduction. While in this example $V_{BL0}$=0.3 V for a resistive change element resistance at low resistance $R_{LO}$ as shown for representative array bit line BL0, all other bit lines are activated at the same time during a READ operation. There may be 8, 16, 32, 64, 128, 256 or more simultaneous bit lines READ operations. If the selected resistive change elements for all, or most, of these bit lines is in a low resistance state $R_{LO}$, then the power dissipation during a READ operation could be substantial if the array bit line voltage is not limited to 0.3 V.

Limiting bit line switching to 0.3 volts is possible because resistive change element READ operations do not destroy the stored resistance state and therefore do not require a write-back operation. This is referred to as non-destructive read out (NDRO). By way of example, the information stored on storage capacitors in dynamic random-access memories (DRAMs) is destroyed during a read operation (referred to as destructive read out (DRO)). Therefore, the stored information is restored by a write-back operation in DRAMs, which requires bit lines to switch to the same voltage as the corresponding SA/Latch terminal. For 3D MSSC memory, a write-back operation would require 1.5 V as described further above, which would greatly increase array power dissipation.

Referring to FIG. 11A, if SA/Latch 1130 switches to zero volts (ground), then bit line segment BL0' and terminal (t2) transition to 0 V. Since isolation device 1120 gate voltage $V_G$=0.5 V, isolation device 1120 is now in a linear region, and as is well known in the semiconductor industry, the terminal (t1) voltage equals terminal (t2) voltage of zero volts and array bit line BL0 transitions to $V_{BL0}$=0 V, which is applied to the bottom electrodes BE of all resistive change elements in multi-switch storage cell 1105 illustrated in FIG. 11A. Therefore, the n−1 unselected resistive change elements U-SELSWs in multi-switch storage cell 1105 have 0 V between bottom electrodes BE and top electrodes TE which are in electrical communication with zero volts (ground) through corresponding select lines SL. No READ disturb occurs since SET voltage $V_{SET}$=1-1.5 V applied between bottom electrodes BE and top electrodes TE as illustrated by SET operational polarity 1170 illustrated in FIG. 11B-3 and array bit line $V_{BL0}$ is substantially less than the minimum SET voltage $V_{SET}$=1 V.

Therefore, comparing $V_{SL}$ voltages and polarity to $V_{RESET}$ voltages and polarity and $V_{BL0}$ voltages and polarity to $V_{SET}$ voltages and polarity as illustrated in FIGS. 11A, 11B-1, 11B-2, and 11B-3, shows no READ disturb occurs during a bit line charge READ operation. This is because select line voltage $V_{SL2}$ applied to top electrode TE of selected resistive change element SELSW as illustrated in FIG. 11A remains substantially below 2 V and array bit line voltage $V_{BL0}$ applied to bottom electrodes BE of unselected resistive change elements U-SELSWs illustrated in FIG. 11A remain substantially below 1V.

$V_{SET}$ and $V_{RESET}$ voltages are determined by resistive change element design by controlling CNT switch 310 (FIGS. 3 & 10) fabric properties and physical dimensions (geometries). Resistive change elements in this example have SET voltages $V_{SET}$ in the range of 1-1.5 V and RESET voltages $V_{RESET}$ in the range of 2-2.5 volts as measured on fabricated CNT switch devices described in U.S. Pat. No. 10,340,005 issued to Bertin. To compensate for the parasitic current illustrated in FIG. 11A requires a RESET voltage $V_{RESET}$ of approximately two-times the SET voltage $V_{SET}$ ($V_{RESET}/V_{SET}\approx 2$). In these examples, $V_{SET}$=1-1.5 V and $V_{RESET}$=2-2.5 V.

Figure 12A:
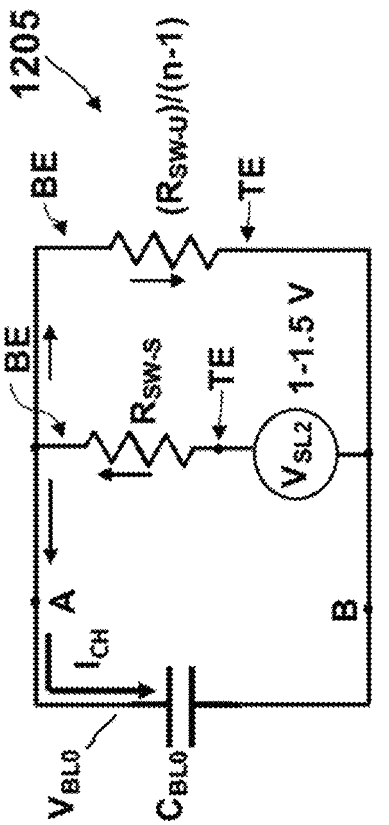
FIG. 12A shows a multi-switch storage cell equivalent circuit for calculating multi-switch storage cell bit line charge READ voltage amplitudes.
Figure 12B:
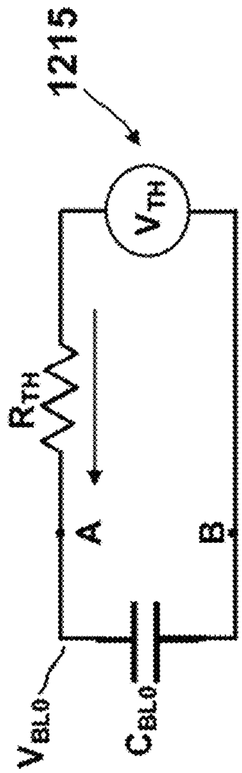
FIG. 12B shows a Thevenin equivalent circuit for calculating multi-switch storage cell bit line charge READ voltage amplitudes.
Figure 12C:
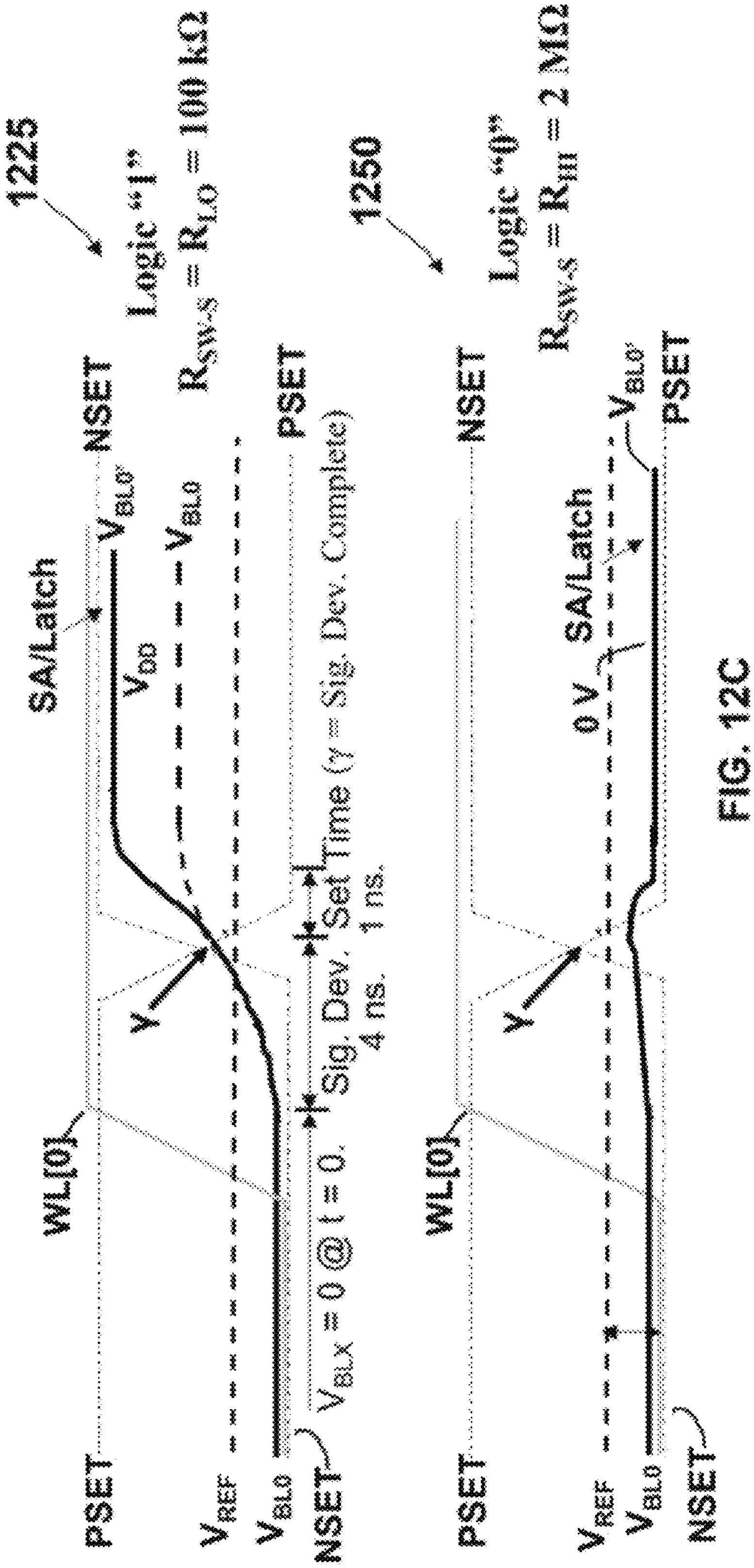
FIG. 12C shows timing diagrams for resistive change element in a low resistance state corresponding to a logic “1” and a high resistance state corresponding to a logic “0”.

At this point in the specification, methods of calculating bit line BL0 charge READ voltage amplitude $V_{BL0}$ as a function of the number of resistive change elements n in multi-switch storage cells is illustrated in FIGS. 12A, 12B, and 12C. READ voltage amplitude $V_{BL0}$ is a function of the number n and resistance values of resistive change elements in the multi-switch storage cell, the bit line capacitance $C_{BL0}$, the applied select line voltages for multi-switch storage cells, and signal development time as illustrated in FIG. 12C. There is one multi-switch storage cell at each bit line BL and word line WL intersection in 3D MSSC array 300 as illustrated in FIG. 3.

Multi-switch storage cell equivalent circuit 1205 illustrated in FIG. 12A corresponds to multi-switch storage cell 1105 illustrated in FIG. 11A. $R_{SW-S}$ is the resistance value of selected resistive change element SELSW illustrated in FIG. 11A and has two possible values, a low resistance value $R_{LO}$ corresponding to a stored logic "1" state and a high resistance value $R_{HI}$ corresponding to a stored logic "0" state. Referring now to a resistance value $R_{SW\_U}$ of each of the n−1 unselected resistive change elements U-SELSWs illustrated in FIG. 11A, which are electrically connected in parallel, each of the unselected resistive change elements U-SELSWs may be in a low resistance state $R_{LO}$ or a high resistance state $R_{HI}$ and depending on the stored logic state. Therefore, there are many possible parallel interconnected resistance values. However, when calculating READ voltage amplitude $V_{BL0}$ corresponding to resistance value $R_{SW-S}$, only the following values of READ voltage amplitude $V_{BL0}$ are of interest: the lowest possible voltage $V_{BL0}$ amplitude when $R_{SW-S}=R_{LO}$ and the highest possible voltage $V_{BL0}$ amplitude when $R_{SW-S}=R_{HI}$. In this specification, $R_{LO}$=100 kΩ and $R_{HI}$=2 MΩ.

The lowest possible READ voltage amplitude $V_{BL0}$ for $R_{SW-S}=R_{LO}$ occurs when all n−1 unselected resistive change elements in parallel are at $R_{LO}$ such that the parallel resistance $(R_{SW-U})(n-1)=R_{LO}/(n-1)$, which maximizes parasitic current $I_{PAR}$ illustrated in FIG. 11A. The highest possible READ voltage amplitude $V_{BL0}$ for $R_{SW-S}=R_{HI}$ occurs when all n−1 unselected resistive change elements in parallel are at $R_{HI}$ such that the parallel resistance $(R_{SW-U})/(n-1)=R_{HI}/(n-1)$, which minimizes parasitic current $I_{PAR}$ illustrated in FIG. 11A. Hence, for $R_{SW-S}=R_{LO}$, all other combinations of $R_{SW-U}$ values result in a higher READ voltage amplitude $V_{BL0}$, and for $R_{SW-S}=R_{HI}$, all other combinations of $R_{SW-U}$ values result in a lower READ voltage amplitude. The reference voltage $V_{REF}$ input to reference circuit 1140 illustrated in FIG. 11A is chosen to be higher than the highest possible READ voltage $V_{BL0}$ when $R_{SW-S}=R_{HI}$ and lower than the lowest possible READ voltage value $V_{BL0}$ when $R_{SW-S}=R_{LO}$ as described further below.

Thevenin equivalent circuit 1215 illustrated in FIG. 12B is a well-known network simplification approach for network analysis. Thevenin equivalent circuit 1215 is a simplification of multi-switch storage cell equivalent circuit 1205 illustrated in FIG. 12A that results in a simple network with a Thevenin equivalent voltage source VIE, resistance $R_{TH}$, and network time constant $\tau_{TH}$, which enables the calculation of READ voltage amplitude $V_{BL0}$ as a function of time t using the bit line READ voltage equation $V_{BL0}=V_{TH}\,(1-e^{-t/\tau}TH)$ when charging bit line capacitance $C_{BL0}$. Thevenin voltage $V_{TH}$ is the voltage across terminals A and B when the capacitance load $C_{BL0}$ is removed, Thevenin resistance $R_{TH}$ is the parallel combination of $R_{SW-S}$ and $(R_{SW-U})/(n-1)$, and time constant $\tau_{TH}=R_{TH}\times C_{BL0}$ as described in further detail in calculations further below. READ timing diagrams 1225 and 1250 are representative of the waveforms corresponding to resistive change elements having low resistance state $R_{LO}$ and high resistance state $R_{HI}$, respectively. Calculations of bit line charge READ performance for various array configurations and select line voltages are described further below and summarized in tables. These calculations compare signal input levels to SA/Latch 1130 illustrated in FIG. 11A at the end of a 4 ns signal development time. Comparing SA/Latch signal levels for the 1T, 1R cells limited to 0.5 V at a signal development time of 4 ns with those for multi-switch storage cells with bit line charge signal levels for SL charging voltages up to 1.5 V also at 4 ns shown in tables further below illustrates that 3D MSSC memory with up to 64 RCEs per cell are comparable in performance to bit line discharge method of FIG. 7A.

Figure 11C:
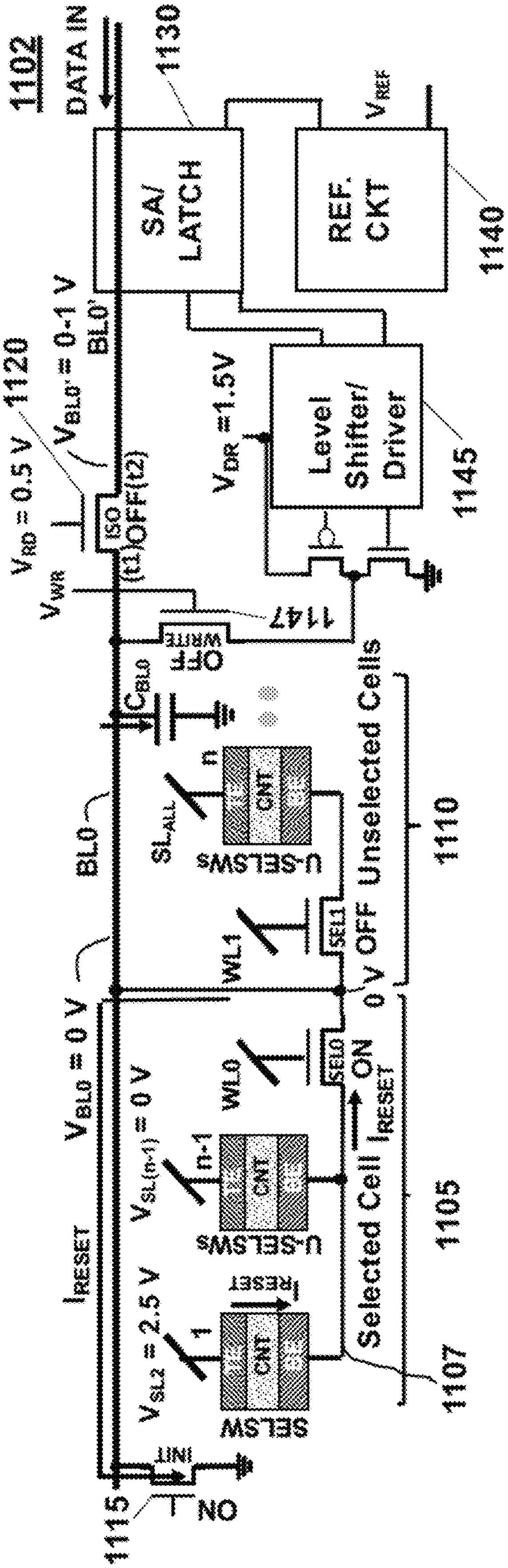
FIG. 11C shows a schematic representation of a 3D MSSC memory bit line charge data path used for READ, RESET WRITE logic “1”, and WRITE logic “0” operations, that also includes voltages and current flows corresponding to a RESET operation.

Referring now to FIG. 11C, a schematic representation 1102 of a 3D MSSC memory bit line charge data path used for READ, RESET, WRITE logic "1", and WRITE logic "0" operations, that also includes voltages and current flows corresponding to a 3D MSSC memory RESET operations is shown. During a 3D MSSC memory RESET operation, isolation device 1120 is in an OFF state and WRITE FET 1147 is in an OFF state, thereby isolating selected cell 1105 and unselected cells 1110 for each bit line in a 3D MSSC sub-array, hence, isolating the entire corresponding 3D MSSC sub-array from SA/Latch 1130 and level shifter/driver 1145 for each bit line. Equilibration device 1115 is in an ON conductive state.

In a 3D MSSC memory RESET operation, voltage $V_{SL2}$=2.5 V is applied to top electrode TE of selected RCE SELSW. RESET current $I_{RESET}$ flows through SELSW to bottom electrode BE and onto cell wire 1107, which is in electrical communication with the bottom electrodes BE of the n−1 unselected RCEs U-SELSWs and the source of cell select FET SEL0 in an ON conductive state. The top electrode TE of each of the n−1 unselected RCEs U-SELSWs is in electrical communication with a corresponding select line that is in electrical communication with zero volts (ground). The drain of FET SEL0 is in electrical communication with representative bit line BL0 held at zero voltage by equilibration device 1115 in an ON conductive state. Since the resistance of selected RCE SELSW is substantially higher than the channel resistance of cell select FET SEL0, the cell wire voltage is approximately zero Volts and essentially no current flows through the n−1 unselected RCEs U-SELSWs. Each selected RCE in electrical communication with activated select line SL2 switches from a low resistance SET state to a high resistance RESET state, or remains in a high resistance RESET state, such that at the end of the RESET operation, each selected RCE in electrical communication with SL2 is in a high resistance RESET state. No nonvolatile resistance state of the n−1 unselected RCEs is disturbed during a RESET operation.

Since the 3D MSSC memory RESET operation is performed on a 3D MSSC sub-array isolated from both SA/latch 1130 and level shifter/driver 1145 for each bit line in a sub-array, there is no need for data into SA/Latch 1130. However, since the 3D MSSC memory architecture requires a RESET-before-WRITE operation, data can be transferred from the I/O driver to the on-chip data bus, then to SA/Latch 1130, and then to level shifter/1145 during the RESET operation. WRITE FET 1147 may then be switched from an OFF to an ON state for WRITE operations described further below with respect to FIGS. 11D and 11E.

Figure 11D:
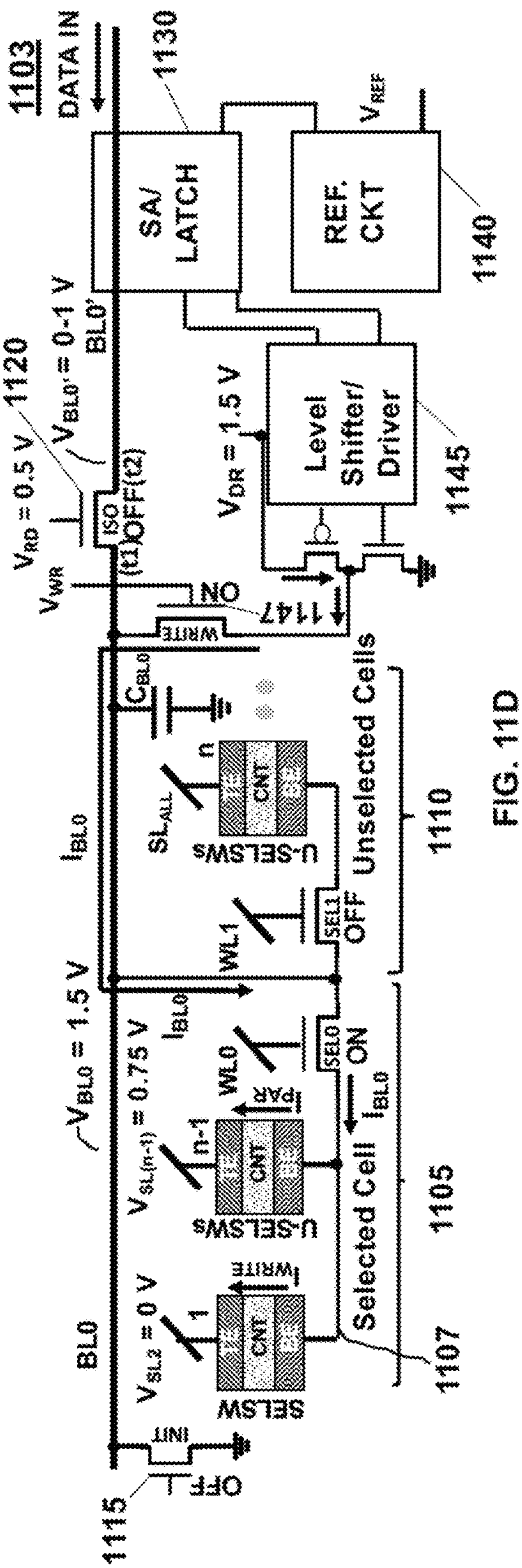
FIG. 11D shows a schematic representation of a 3D MSSC memory bit line charge data path used for READ, RESET WRITE logic “1”, and WRITE logic “0” operations, that also includes voltages and current flows corresponding to a WRITE logic “1” operation.

Referring now to FIG. 11D, a schematic representation 1103 of a 3D MSSC memory bit line charge data path used for READ, RESET, WRITE logic "1", and WRITE logic "0" operations, that also includes voltages and current flows corresponding to a 3D MSSC memory WRITE logic "1" operation is shown. Data in flows from the on-chip data bus to the corresponding SA/Latch 1130, WRITE FET 1147 is turned ON, and level shifter/driver 1145 drives representative bit line BL0 to 1.5 V and current $I_{BL0}$ flows from the level shifter 1145 pullup FET output, through WRITE FET 1147 and representative bit line BL0, through cell select FET SEL0, to cell wire 1107 at 1.5 V. WRITE current $I_{WRITE}$ flows from cell wire 1107 at 1.5 V to bottom electrode BE of the selected RCE SELSW to top electrode TE in electrical communication with $V_{SL2}$=0 V, and the selected RCE switches from a high resistance RESET state to a low resistance SET state. Cell wire 1107 is also in electrical communication with bottom electrodes BE of n−1 unselected RCEs U-SELSWs. To prevent nonvolatile resistance state disturb of the n−1 unselected RCEs, the top electrode TE of each unselected RCE in electrical communication with one of the corresponding n−1 select lines in electrical communication with a voltage of 0.75 V. Therefore, the voltage between bottom electrode BE and top electrode TE of each unselected RCE is at 0.75 V, which is lower than the $V_{SETMIN}$=1 V SET voltage, thereby preventing unselected RCE nonvolatile resistance state disturb during the WRITE logic "1" operation. Isolation device 1120 and equilibration device 1115 are both in a nonconducting OFF state.

Figure 11E:
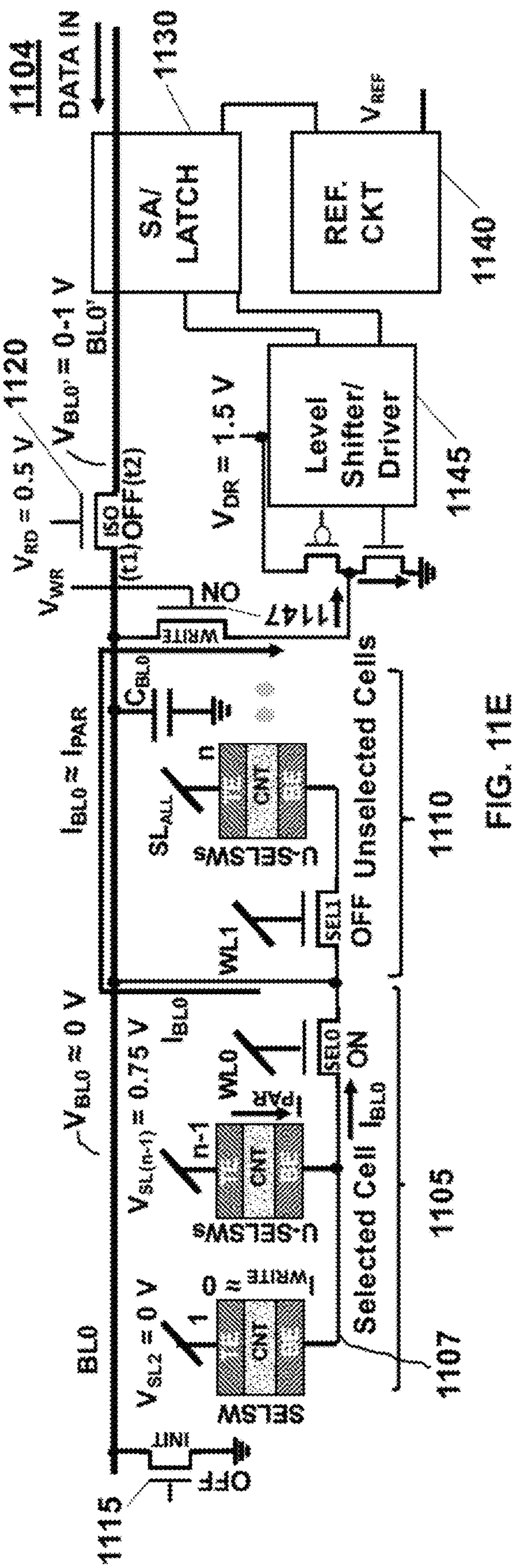
FIG. 11E shows a schematic representation of a 3D MSSC memory bit line charge data path used for READ, RESET WRITE logic “1”, and WRITE logic “0” operations, that also includes voltages and current flows corresponding to a WRITE logic “0” operation.

Referring now to FIG. 11E, a schematic representation 1104 of a 3D MSSC memory bit line charge data path used for READ, RESET, WRITE logic "1", and WRITE logic "0" operations, that also includes voltages and current flows corresponding to a 3D MSSC memory WRITE logic "0" operation is shown. Data in flows from the on-chip data bus to the corresponding SA/Latch 1130, WRITE FET 1147 is turned ON, and level shifter/driver 1145 drives representative bit line BL0 to approximately 0 V and parasitic current $I_{PAR}$ flows from unselected n−1 RCEs U-SELSWs top electrodes TE in electrical communication with corresponding n−1 select lines at 0.75 volts, through each unselected RCE to cell wire 1107, which is at approximately zero volts, through cell select FET SEL0 to representative bit line BL0, through WRITE FET 1147 in an ON conductive state, and through the level shifter/driver 1145 pulldown FET to zero volts (ground). Cell wire 1107 at approximately zero volts is also in electrical communication with bottom electrode BE of selected RCE SELSW with top electrode TE in electrical communication with $V_{SL2}$=0 V, therefore WRITE current $I_{WRITE}$ flowing through selected RCE SELSW is approximately zero and the RCE resistance remains in the high resistance RESET state. No resistance state disturb of the n−1 unselected RCEs occurs since the top electrode TE of each unselected RCE is in electrical communication with one of the corresponding n−1 select lines in electrical communication with a voltage of 0.75 V and the bottom electrode of each unselected RCE is in electrical communication with cell wire 1107 at approximately zero volts. Therefore, the voltage between top electrode TE and bottom electrode BE of each unselected RCE is at 0.75 V, which is lower than the $V_{RESETMIN}$=2 V RESET voltage, thereby preventing unselected RCE nonvolatile resistance state disturb during the WRITE logic "0" operation. Isolation device 1120 and equilibration device 1115 are both in a nonconducting OFF state.

The open architecture schematic 600 illustrated in prior art FIG. 6 shows the 1T, 1R cells with one word line and one select line for each cell. Each array word line has a word line driver. Each array select line has a select line driver as illustrated in prior art FIG. 8. Each array bit line is in electrical communication with a SA/Latch through an isolation device as illustrated in prior art FIG. 6. All drivers and SA/Latches are hard wired to corresponding array lines.

3D MSSC arrays of multi-switch storage cells in electrical communication with one word line and one bit line have each word line hard wired to a corresponding word line driver and each bit line hard wired to a corresponding SA/Latch. Additionally, each multi-switch storage cell is in electrical communication with a group of n select lines with n being the number of resistive change elements in each multi-switch storage cell.

The number n of resistive change elements in a multi-switch storage cell is from two up to approximately sixty-four. The upper bound for the number n of resistive change elements in a multi-switch storage cell is determined by the RESET voltage of the resistive change elements in the multi-switch storage cell. A select line voltage $V_{SL}$ for charge READ operations of multi-switch storage cells is limited to a voltage less than the RESET voltage so that resistive states of resistive change elements are not disturbed during charge READ operations. For a specified select line voltage $V_{SL}$ for charge READ operations, the upper bound for the number n of resistive change elements in a multi-switch storage cell is the largest number of resistive change elements where bit line voltages for charge READ operations are sufficient for accurately determining a resistive state of a resistive change element. Increasing the RESET voltage permits the select line voltage $V_{SL}$ for charge READ operations to be increased and increasing the select line voltage $V_{SL}$ for charge READ operations increases the number of resistive change elements in a multi-switch storage cell where bit line voltages for charge READ operations are sufficient for accurately determining a resistive state of a resistive change element. Therefore, multi-switch storage cells formed with resistive change elements having higher RESET voltages can be formed with larger numbers of resistive change elements. Examples below discuss multi-switch storage cells having from two resistive change elements up to sixty-four resistive change elements, but as also discussed below, multi-switch storage cells can have more than sixty-four resistive change elements.

3D MSSC array architecture designed for 3D MSSC arrays is described in detail further below. Select line hard wired drivers illustrated with respect to prior art 1T, 1R cell memory have been replaced with a select line drive matrix. This drive matrix uses the same number of select line drivers as the prior art 1T, 1R cell memory. However, select line drivers are in a select line drive matrix and are not hard wired to a dedicated select line. Each select line driver may drive any one select line of a group of n select lines via a routing circuit for each group of n select lines. Each routing circuit creates at least one current path between at least one select line driver for a group of n select lines and the group of n select lines based on voltages from a select line decoder. Each routing circuit has n individual router circuits, one per select line, and two of MSSC buses. Each router circuit of the n individual router circuits includes a pair of nFET and pFET devices with gates in electrical communication with each other, first terminals in electrical communication with each other and driving a corresponding select line, and second terminals, with the nFET second terminal in electrical communication with one of the two MSSC buses and the pFET second terminal in electrical communication with the other of the two MSSC buses. A select line decoder may be 1 of n binary decoder with outputs in electrical communication with gates of pairs of nFET and pFET devices of router circuits and with one output at a positive voltage and n−1 outputs at zero volts. There is one, select line decoder, for each 3D MSSC sub-array. This driver matrix provides the voltages and currents illustrated in FIGS. 11A, 11C, 11D, and 11E, which includes the following. For schematic representation of a 3D MSSC memory READ operation (FIG. 11A), $V_{SL2}$=1.5 volts to top electrode TE of the selected RCE and 0 V to the top electrodes TE of the n−1 unselected RCEs; for schematic representation of a 3D MSSC memory RESET operation (FIG. 11C), $V_{SL2}$=2.5 V to top electrode TE of the selected RCE and 0V to the top electrodes TE of the n−1 unselected RCEs; for schematic representation of a 3D MSSC memory WRITE logic "1" operation, (FIG. 11D), $V_{SL2}$=0 V for the selected RCE and 0.75 V for the n−1 unselected RCEs; and for schematic representation of a 3D MSSC memory WRITE logic "0" operation (FIG. 11E), $V_{SL2}$=0V for the selected RCE and 0.75 V for the n−1 unselected RCEs. A detailed description is provided further below corresponding to FIG. 41A and FIGS. 42A-42F.

The drive matrix is used for other operations as described further below. 3D MSSC memory cell level redundancy, for example, in which a failed RCE in a MSSC is disconnected and replaced by a spare RCE. Also, 3D MSSC memory initialization of RCEs after chip fabrication.

NV Memory with 1T, 1R Cells in Bit Line Charge READ Mode

At this point in the specification, referring to open architecture schematic 600 illustrated in prior art FIG. 6, changing the READ operation from bit line (BL) discharge sensing described further above with respect to READ timing diagrams 700 and 750 shown in prior art FIGS. 7A and 7B, respectively, to BL charge sensing as described further below, enables multiple resistive change elements per cell. These multiple resistive change elements enable memory function increases by more than an order of magnitude without additional cell select devices as described further below. RESET-before-WRITE and WRITE operations correspond to WRITE timing diagram 980 illustrated in prior art FIG. 9B described further above and remains essentially unchanged. Cells with multiple resistive change elements associate a stored low resistance state $R_{LO}$ with a logic "1" and a stored high resistance state $R_{HI}$ with a logic "0" state, which is the same approach described further above with single resistive change element cells.

Referring now to bit line (BL) charge READ operations for a single resistive change element per cell described further below, a bit line is charged by a select line voltage $V_{SL}$ applied to the top electrode TE of the selected resistive change element, whose bottom electrode BE is in electrical communication with the source terminal of a cell select FET. The cell select FET is turned ON by a corresponding word line, electrically connecting the FET drain and source terminals. A corresponding bit line in electrical communication with the drain terminal of the cell select FET is thereby charged. Referring now to open architecture schematic 1300 illustrated in FIG. 13A, FIG. 13A corresponds to open architecture schematic 600 illustrated in prior art FIG. 6 and described further above, with the following changes.

Figure 13A:
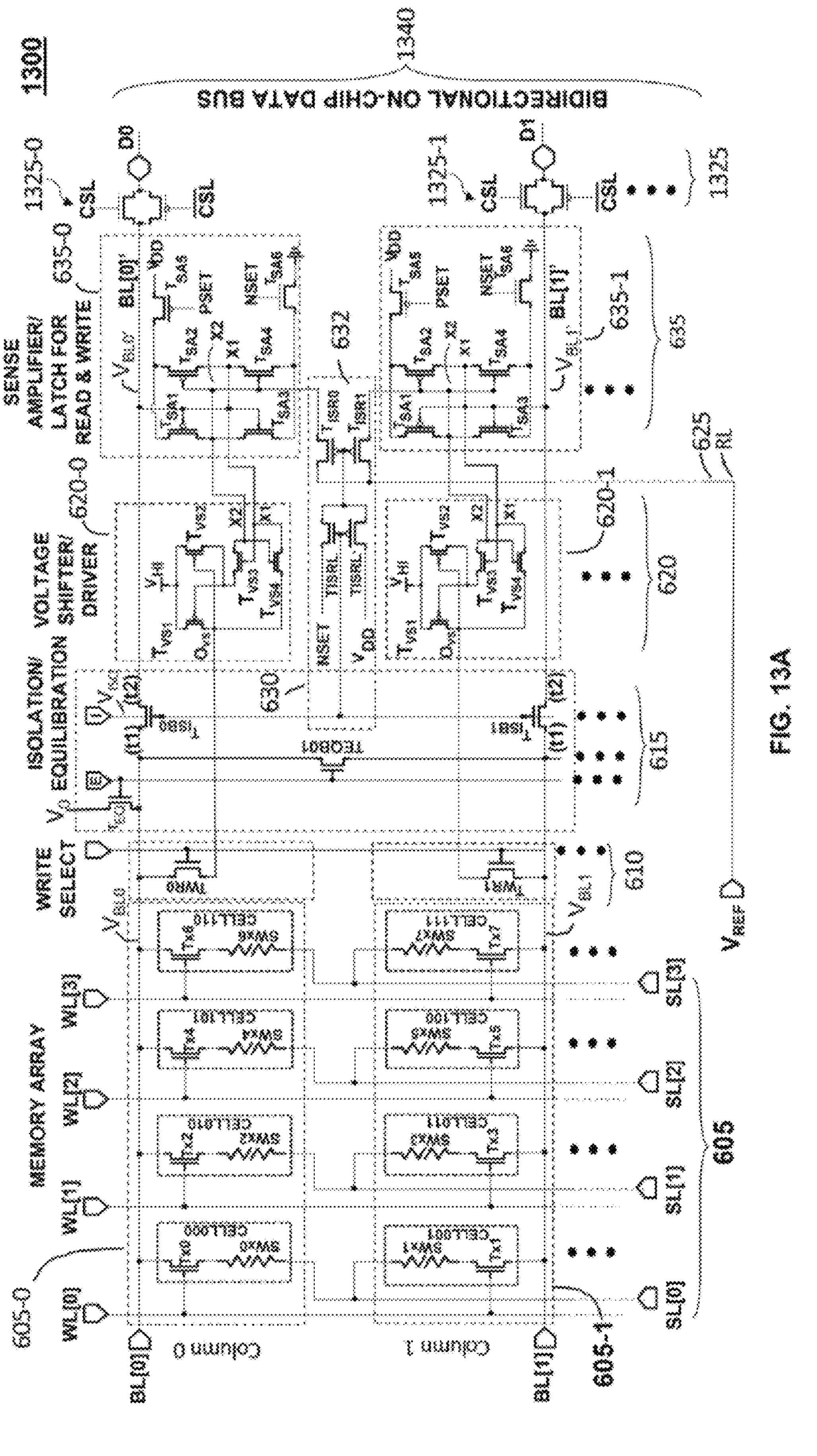
FIG. 13A shows an open architecture schematic with a single resistive change element per cell, a reference voltage in electrical communication with a single reference line, and select lines approximately parallel to word lines and bit lines approximately perpendicular to and overlying both word and select lines. READ and WRITE operations have different data paths between array bit lines and corresponding sense amplifier/latches (SA/Latches).

In a BL charge READ operation described further below, the bit line charges in a positive voltage direction instead of the negative voltage direction for the BL discharge methods described further above. In a BL charge READ operation, the bit line charge is faster and may drive the bit line to a higher bit line voltage, without stored resistance disturb. The bit line charges faster for a stored low resistance state $R_{LO}$ than for a stored high resistance state $R_{HI}$. The corresponding SA/Latch in electrical communication with the bit line segment switches and drives the bit line segment to voltage $V_{DD}$ for a low resistance state $R_{LO}$ and to GND for a high resistance state $R_{HI}$. Hence, bit line segments BL[0]' and BL[1]' output voltage logic states transmitted to on-chip bidirectional data bus 1340, shown in FIG. 13A, are shown as logic data D0 and D1, respectively. However, in a BL discharge READ operation described further above, the bit line discharges more quickly and in negative voltage direction for a stored low resistance state $R_{LO}$ than for a stored high resistance state $R_{HI}$. Therefore, the corresponding SA/Latch in electrical communication with the bit line segment switches and drives the bit line segment to 0 V for a low resistance state $R_{LO}$ and to voltage $V_{DD}$ for a high resistance state $R_{HI}$. Hence, bit line segments BL[0]' and BL[1]' output voltage logic states transmitted to bidirectional on-chip data bus 600, shown in prior art FIG. 6, are shown as logic data D0n and D1n, respectively.

In a WRITE operation, as described further above, each SA/Latch output drives the inputs of a voltage shifter/driver using lines X1-X1 and X2-X2. Because of the READ operation voltage polarity differences described further above with respect to FIG. 13A and prior art FIG. 6, the X1-X1 and X2-X2 connections shown in prior art FIG. 6 have been changed to those in FIG. 13A.

Open architecture schematic 600 bidirectional on-chip data bus 640 shows both true and complement logic output. However, this is optional. Open architecture schematic 1300 bidirectional on-chip data bus 1340 shows only a true logic output, although a complement logic output can be added as well.

With the exceptions described above, the memory array and all logic circuits shown and described further above with respect to open architecture schematic 600 illustrated in prior art FIG. 6 are essentially the same as in open architecture schematic 1300 illustrated in FIG. 13A and operate in essentially the same way.

Referring to cell and array layout 200 illustrated in prior art FIG. 2 and open architecture schematics 1300 illustrated in FIGS. 13A, select lines (SLs) are approximately parallel to word lines (WLs) and bit lines (BLs) are approximately orthogonal to and overlay word lines (WLs) and select lines (SLs). Select lines are in electrical communication with the top electrode (TE) of underlying resistive change elements (in this example, CNT switches) and bottom electrodes (BE) of resistive change elements are in electrical communication with the sources of corresponding cell select FETs. Word lines are in electrical communication with cell select FET gates, and bit lines are in electrical communication with drains of cell select FETs. The operation of open architecture schematic 1300 in a BL charge READ mode is shown and described further below in bit line charge READ timing diagrams 1500 and 1550 illustrated in FIG. 15A and FIG. respectively.

Figure 15A:
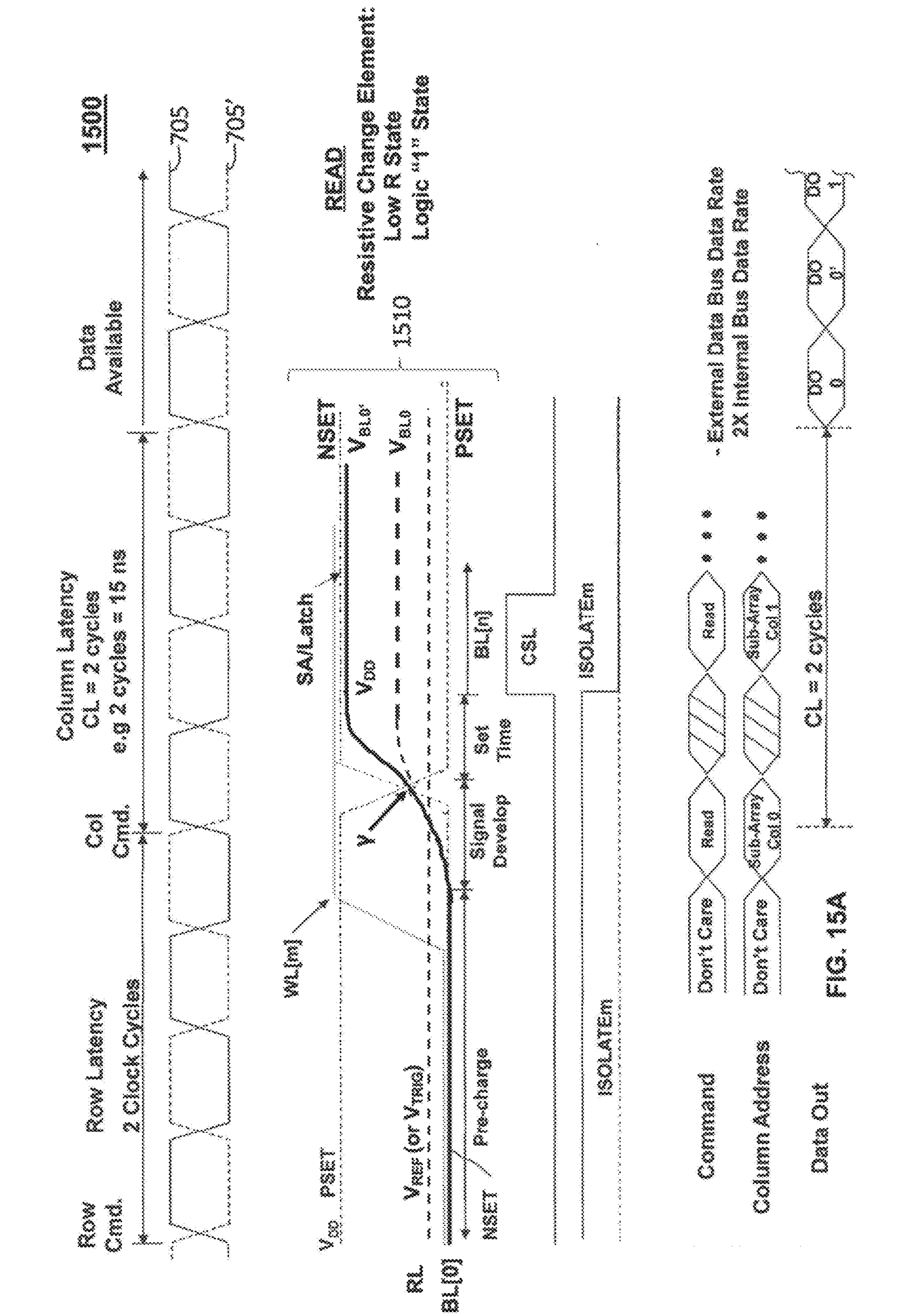
FIG. 15A is a waveform timing diagram illustrating an exemplary bit line charge READ timing diagram performed on a resistive change element in a low resistance state within the open memory architecture schematic corresponding to FIG. 13A.

Referring now to bit line charge READ timing diagram 1500 illustrated in FIG. 15A, sensing waveforms 1510 illustrate bit line charge sensing of a resistive change element in storage subarray 605-0 in a low resistance state $R_{LO}$ in electrical communication with array bit line BL[0]. Array bit line BL[0] is in electrical communication with bit line segment BL[0]' through isolation device $T_{ISB0}$ with gate voltage $V_{ISO}$=0.5 V and bit line segment BL[0]' is in electrical communication with terminal X1 of SA/Latch 635-0 as illustrated in open architecture schematic 1300 illustrated in FIG. 13A. Referring now to bit line charge READ timing diagram 1500 illustrated in FIG. 15A, signal development refers to the time interval in which a corresponding select line SL charges array bit line BL[0] and bit line segment BL[0]' through the selected resistive change element in resistance state $R_{LO}$. Time gamma (γ) represents the end of signal development and the onset of SA/Latch 635-0 set time interval. For a low resistance state $R_{LO}$, $V_{BL0}$ of array bit line BL[0] charge voltage exceeds a preset reference voltage $V_{REF}$ in electrical communication with reference line 625. SA/Latch 635-0 terminal X1, and bit line segment BL[0]' in electrical communication with terminal X1, switch to $V_{BL0'}=V_{DD}$=1 V. Isolation device $T_{ISB0}$ transitions from a linear to saturated mode, and array bit line BL[0] transitions to $V_{BL0}$=0.3 V ($V_{ISO}$=0.5 V minus $V_{TH}$=0.2 V). A logic "1" data pulse of 1 V, corresponding to low resistance state $R_{LO}$, is transmitted to bidirectional on-chip data bus line D0 and then to the external data bus.

Figure 15B:
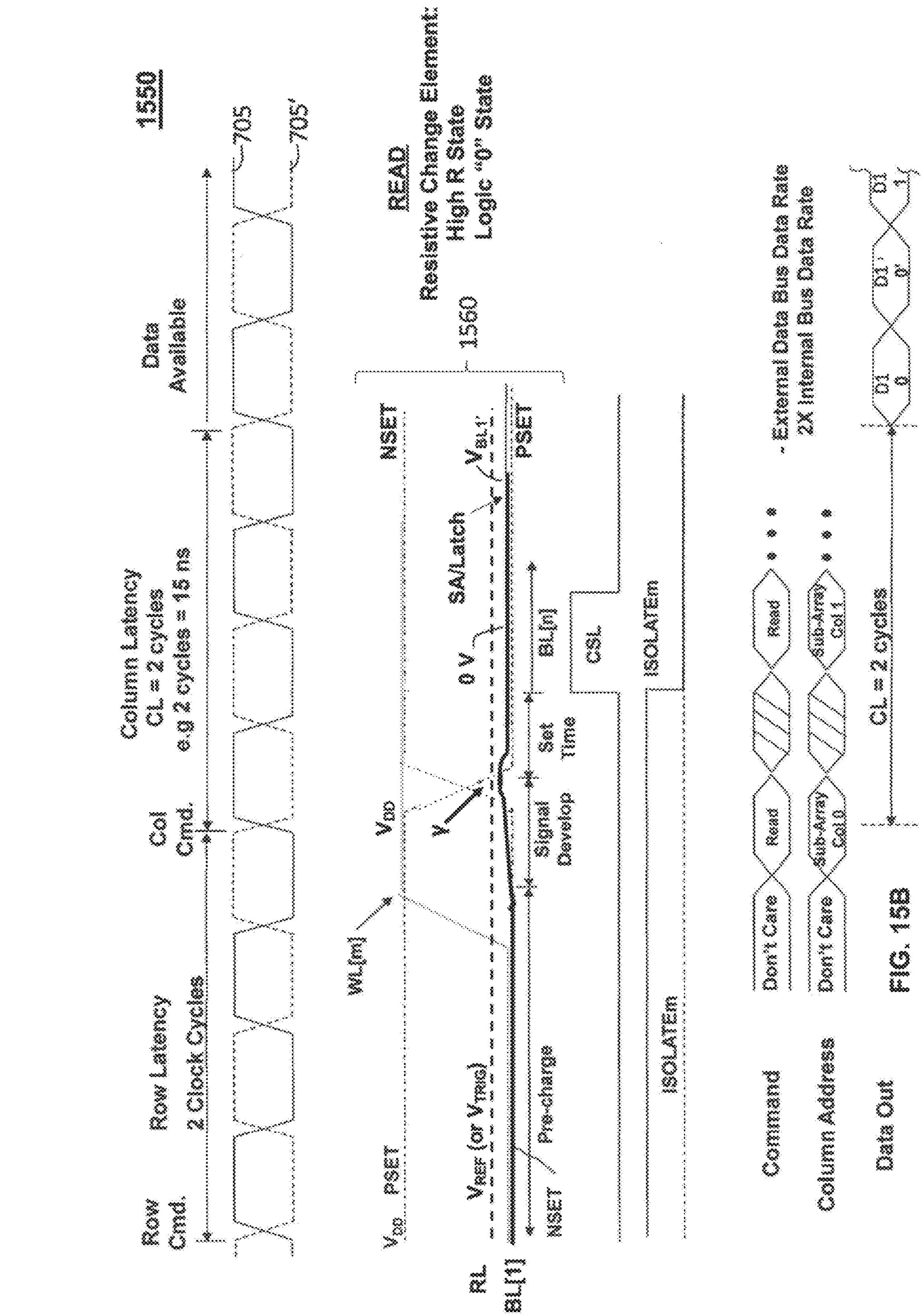
FIG. 15B is a waveform timing diagram illustrating an exemplary bit line charge READ timing diagram performed on a resistive change element in a high resistance state within the open memory architecture schematic corresponding to FIG. 13A.

Referring now to bit line charge READ timing diagram 1550 illustrated in FIG. 15B, sensing waveforms 1560 illustrate bit line charge sensing of a resistive change element in storage subarray 605-1 in a high resistance state $R_{HI}$ in electrical communication with array bit line BL[1]. Array bit line BL[1] is in electrical communication with bit line segment BL[1]' through isolation device $T_{ISB1}$ with gate voltage $V_{ISO}$=0.5 V and bit line segment BL[1]' is in electrical communication with terminal X1 of SA/Latch 635-1 as illustrated in open architecture schematic 1300 illustrated in FIG. 13A. Referring now to bit line charge READ timing diagram 1550 illustrated in FIG. 15B, signal development refers to the time interval in which a corresponding select line SL charges array bit line BL[1] and bit line segment BL[1]' through the selected resistive change element in resistance state $R_{HI}$. Time gamma (γ) represents the end of signal development and the onset of SA/Latch 635-1 set time interval. For a high resistance state $R_{HI}$, $V_{BL1}$ of array bit line BL[1] charge voltage is less than a preset reference voltage $V_{REF}$ in electrical communication with reference line 625. SA/Latch 635-1 terminal X1, and bit line segment BL[1]' in electrical communication with terminal X1, switch to $V_{BL0'}$=0 V. Isolation device $T_{ISB0}$ remains in a linear mode and array bit line BL[1] transitions to $V_{BL}1=V_{BL1'}$=0 V. A logic "0" voltage of zero volts, corresponding to high resistance state $R_{HI}$, is transmitted to bidirectional on-chip data bus line D1 and then to the external data bus.

Referring now to FIG. 13A and memory array 605, select line SL[0] is in electrical communication with the top electrodes TE of NV CNT switches SWx0 and SWx1 shown in storage subarray 605-0 and 605-1, respectively. Select line SL[1] is in electrical communication with the top electrodes TE of NV CNT switches SWx2 and SWx3 shown in storage subarray 605-0 and 605-1, respectively. Select line SL[2] is in electrical communication with the top electrodes TE of NV CNT switches SWx4 and SWx5 shown in storage subarray 605-0 and 605-1, respectively. Select line SL[3] is in electrical communication with the top electrodes TE of NV CNT switches SWx6 and SWx7 shown in storage subarray 605-0 and 605-1, respectively.

Bit line charge READ operations are performed with select lines SL, corresponding to selected word lines WL, switched to voltage $V_{SL}$. Referring to open architecture schematic 1300 illustrated in FIG. 13A, if word line WL[0] is selected, then cell select devices $T_{X0}$, and $T_{X1}$, in electrical communication with bit lines BL[0] and BL[1], respectively, are ON. Select line SL[0], corresponding to word line WL[0], is at voltage $V_{SL}$. Equilibration voltage $V_0$ is at zero volts. Bit lines BL[0] and BL[1] are discharged to zero volts when FET $T_{EQ}$ and FET $T_{EQB01}$ are activated. Alternatively, bit line drivers, such as bit line drivers 820 and 825 illustrated in prior art FIG. 8 and described further above, may be used to electrically connect bit lines BL[0] and BL[1], respectively, to zero volts (ground). Hence, bit lines BL[0] and BL[1] are held at zero volts at t=0, then released and charged by voltage $V_{SL}$ through SWx0 and SWx1, respectively, to BL voltage $V_{BL}$. SA/Latches 635-0 and 635-1 detect the resistance value of selected resistive change elements. For example, a low or high resistance state, $R_{LO}$ or $R_{HI}$, respectively, of each nonvolatile resistive change element is sensed by SA/latches 635-0 and 635-1, respectively, and temporarily stored as a corresponding logic state as described further below.

Whenever a row address selects a word line, a corresponding select line may also be activated. In a bit line charge READ operation, if word line WL[1] is selected, cell select devices $T_{X2}$ and $T_{X3}$ are turned ON, select line SL[1] is switched to $V_{SL}$. Equilibration voltage $V_0$ is at zero volts. Bit lines BL[0] and BL[1] are discharged to zero volts when FET $T_{EQ}$ and FET $T_{EQB01}$ are activated. Hence, bit lines BL[0] and BL[1] are at zero volts at t=0 and are then charged by voltage $V_{SL}$ through nonvolatile resistive change elements SWx2 and SWx3, respectively, to BL voltage $V_{BL}$. A low or high resistance state, $R_{LO}$ or $R_{HI}$, respectively, of each nonvolatile resistive change element is sensed by SA/latches 635-0 and 635-1, respectively, and temporarily stored as a corresponding logic state as described further below.

Whenever a row address selects a word line, a corresponding select line may also be activated. In a bit line charge READ operation, if word line WL[2] is selected, cell select devices $T_{X4}$ and $T_{X5}$ are turned ON, select line SL[2] is switched to $V_{SL}$. Equilibration voltage $V_0$ is at zero volts. Bit lines BL[0] and BL[1] are discharged to zero volts when FET $T_{EQ}$ and FET $T_{EQB01}$ are activated. Hence, bit lines BL[0] and BL[1] are at zero volts at t=0 and are then charged by voltage $V_{SL}$ through nonvolatile resistive change elements $SW_{X4}$ and $SW_{X5}$, respectively, to BL voltage $V_{BL}$. A low or high resistance state, $R_{LO}$ or $R_{HI}$, respectively, of each nonvolatile resistive change element is sensed by SA/latches 635-0 and 635-1, respectively, and temporarily stored as a corresponding logic state as described further below.

Whenever a row address selects a word line, a corresponding select line may also be activated. In a bit line charge READ operation, if word line WL[3] is selected, cell select devices $T_{X6}$ and $T_{X7}$ are turned ON, select line SL[3] is switched to $V_{SL}$. Equilibration voltage $V_0$ is at zero volts. Bit lines BL[0] and BL[1] are discharged to zero volts when FET $T_{EQ}$ and FET $T_{EQB01}$ are activated. Hence, bit lines BL[0] and BL[1] are at zero volts at t=0 and are then charged by voltage $V_{SL}$ through nonvolatile resistive change elements $SW_{X6}$ and $SW_{X7}$, respectively, to BL voltage $V_{BL}$. A low or high resistance state, $R_{LO}$ or $R_{HI}$, respectively, of each nonvolatile resistive change element is sensed by SA/latches 635-0 and 635-1, respectively, and temporarily stored as a corresponding logic state as described further below.

Figure 14B:
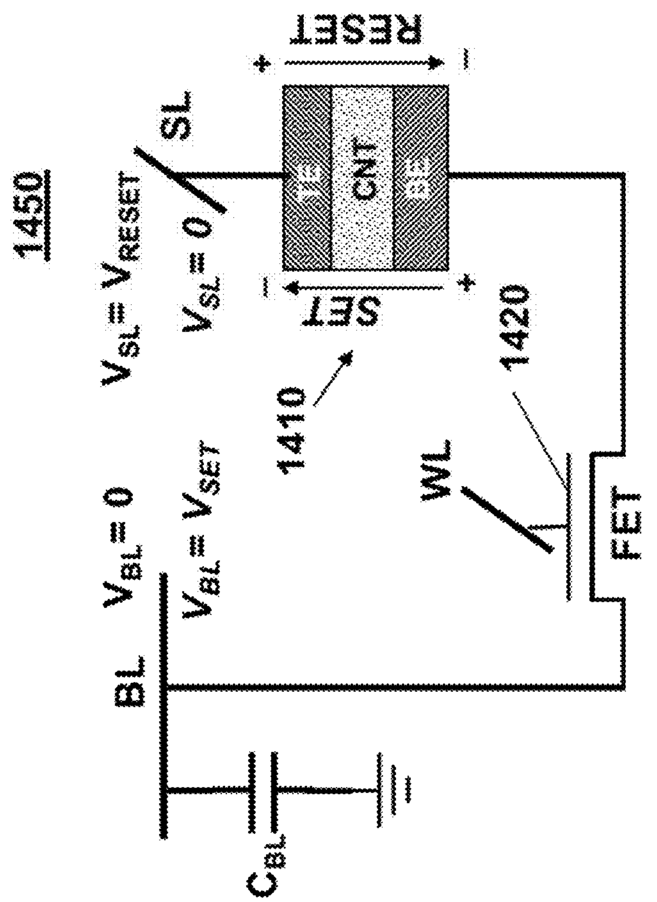
FIG. 14B is a simplified representation of a WRITE operation.
Figure 14A:
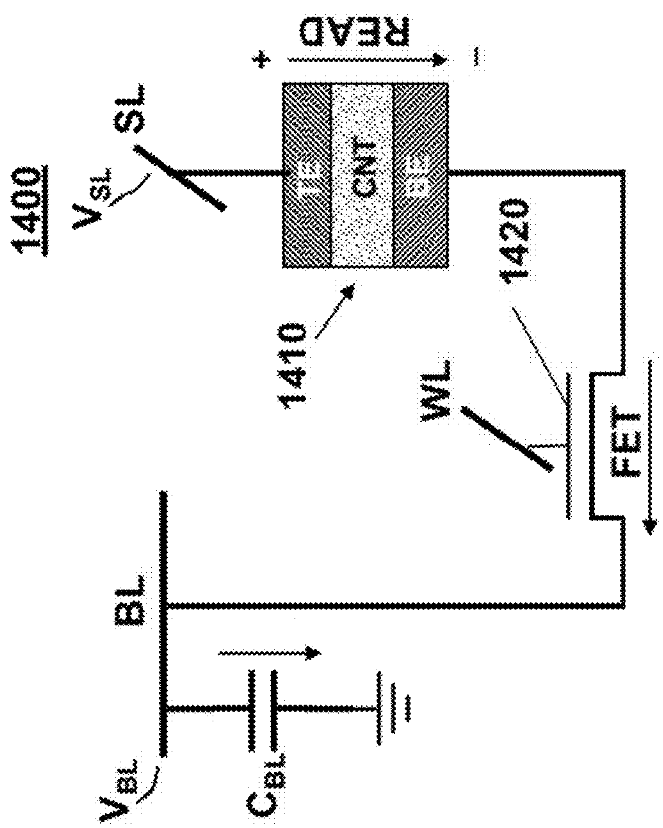
FIG. 14A is a simplified representation of a bit line charge READ operation.

Referring to FIGS. 14A-14E, BL charge READ operation 1400 illustrated in FIG. 14A shows select line voltage $V_{SL}$ applied to top electrode TE of resistive change element 1410, a CNT switch in this example, with READ current flowing through resistive change element 1410 and cell select FET 1420 to charge bit line capacitance $C_{BL}$. Resistive change element 1410 is representative of resistive change elements SWx0, SWx2, SWx4, and SWx6 in storage sub-array 605-0 illustrated in FIG. 13A and described further above. Resistive change element 1410 is also representative of resistive change elements SWx1, SWx3, SWx5, and SWx7 in storage sub-array 605-1 illustrated in FIG. 13A and described further above.

BL WRITE representations for SET and RESET operations are illustrated in WRITE operation 1450 illustrated in FIG. 14B. Voltage ranges for SET and RESET operations are listed in the parameter assumptions further below. Hence, in this example, the value of $V_{SL}$ applied to TE in BL charge READ operation 1400 needs to stay below $V_{RESET}$ to prevent disturbing the resistance value of the CNT switch during a READ operation. Also, the BL charge voltage $V_{BL}$ applied to BE in BL charge READ operation 1400 needs to stay below $V_{SET}$ to prevent disturbing the resistance value of the CNT switch during a READ operation.

Figure 14D:
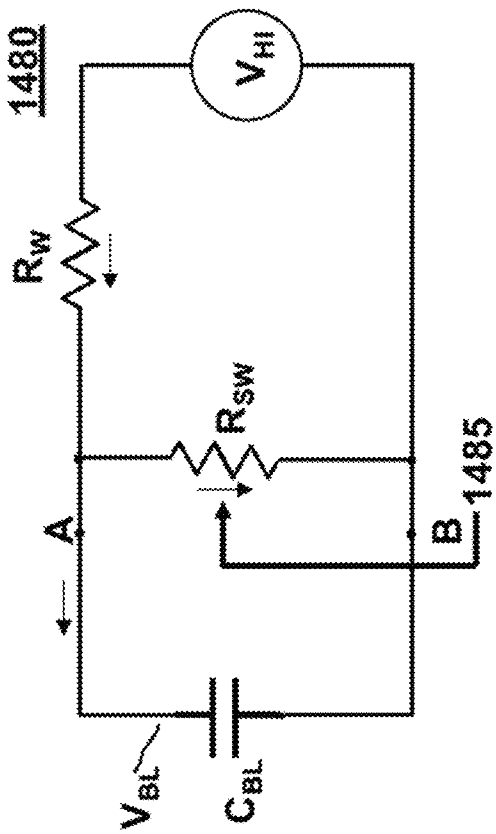
FIG. 14D is a WRITE equivalent circuit of the WRITE operation corresponding to FIG. 14B.
Figure 14C:
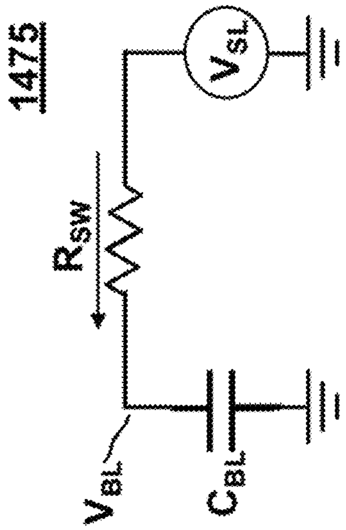
FIG. 14C is a READ equivalent circuit for a bit line charge READ operation corresponding to FIG. 14A.

READ Equivalent circuit 1475 illustrated in FIG. 14C is a circuit representation of BL charge READ operation 1400 shown in FIG. 14A and is used to calculate the bit line voltage as a function of time. READ Equivalent circuit 1475 is an RC circuit whose electrical response to applied voltage $V_{SL}$ may be calculated by:

$$V_{BL}=V_{SL}(1-e^{-t/\tau}) \quad \text{[EQ. 1]}$$

Where $\tau=R_{Sw}\times C_{BL}$.

In the BL charging examples used further below, the following parameters are assumed:

- Resistive change element low resistance state value $R_{SW}=R_{LO}=100$ kΩ, which represents a logic "1", and high resistance state value $R_{SW}=R_{HI}=2$ MΩ, which represents a logic "0";
- Bit line capacitance $C_{BL}=400$ fF;
- Signal development time t=4 ns; and
- SET voltage range=1-1.5 V and RESET voltage range=2-2.5 V.

These assumptions for the BL charge READ operation calculations shown further below, are similar to those for the BL charge calculations described further above with respect to FIG. 11A. Bit line voltage $V_{BL}$ in EQ. 1 corresponds to array bit line BL[0] in FIG. 11A and array bit lines BL[0] and BL[1] illustrated in open architecture schematic 1300 illustrated in FIG. 13A. During signal development t, array bit lines BL[0] and BL[1] and corresponding bit line segments BL[0]' and BL[1]', respectively, are in electrical communication and therefore at the same voltages.

Referring now to a bit line charge READ operation of a resistive change element in low resistance state $R_{LO}$ corresponding to a logic "1", a select line voltage $V_{SL}$ is applied to top electrode TE of resistive change element 1410, shown in FIG. 14A, in a low resistive state $R_{SW}=R_{LO}=100$ kΩ and the READ current flows through resistive change element 1410 and FET 1420 in the ON state to charge bit line BL. As described further above, $V_{BL}=0$ at the start of BL charging. Referring now to FIG. 14B, $V_{SL}$ used in these examples does not exceed 1.5 V, which is 0.5 volts below a minimum $V_{RESET}$ voltage of 2V applied to the TE during a RESET operation, so as not to disturb the stored resistance value $R_{SW}$ during the READ operation.

As described further above with respect to FIG. 11A, it is also necessary to ensure that array bit lines BL[0] and BL[1] remain below the minimum SET voltage of 1 V after SA/Latches 635-0 and 635-1 switch. Referring now to FIG. 13A and isolation devices $T_{ISB0}$ and $T_{ISB1}$, isolation gate voltage $V_{ISO}$ is set to $V_{ISO}=0.5$ V. During signal development time t, $V_{BL}$ for all selected bit lines, $V_{BL0}=V_{BL0'}$ and $V_{BL}1=V_{BL1'}$ in this example, are typically below 150 mV and these isolation devices are in a linear conductive state electrically connecting terminals (t1) and (t2). However, if as in this example, SA/latches 635-0 switches to a high voltage such as $V_{DD}=1$ V, then bit line segment BL[0]', in electrical communication with terminal (t2), switches to $V_{BL0'}=1$ V and isolation device $T_{ISB0}$ transitions to a saturated state and bit line BL[0] transitions to 0.3 V for a $T_{ISB0}$ threshold voltage of 0.2 V, which is 0.7 volts below the minimum SET voltage of 1 V. However, if SA/latch 635-1 switches to a low voltage (zero), $V_{BL1'}=0$ V and isolation device $T_{ISB1}$ remains in a linear state electrically connecting terminals (t1) and (t2). Hence, array bit line voltage $V_{BL1}$ transitions to $V_{BL1}=0$ V.

Also, limiting array bit line voltage amplitudes as described further above to 0.3 V, such as array bit line BL[0] to $V_{BL0}=0.3$ volts when corresponding bit line segments, such as bit line segment BL[0]' switch to $V_{BL0'}=1$ V, limits array bit line voltage transitions to 0.3 V which substantially reduces array power dissipation during a READ operation.

Referring now to bit line charge READ timing diagram 1500 illustrated in FIG. 15A, bit line voltage calculations shown further below include $V_{SL}$ switching from zero to 0.5 V; to 1.0 V; and to 1.5 V. Time constant $T=R_{LO}\times C_{BL}$. Therefore, $\tau$=100 kΩ×400 fF and $\tau$=40 ns. In this example, low resistance state $R_{SW}=R_{LO}$ is assumed in electrical communication with BL[0] and $V_{BL}=V_{BL0}$ in this example.

Referring now to EQ. 1, for $V_{SL}$=0.5 V, $\tau$=40 ns, and t=4 ns: $V_{BL0}=0.5\ (1-e^{-4/40})=(1-0.90)$. $V_{BL0}$=50 mV at t=4 ns, which is the end of signal development time γ as shown in FIG. 15A.

Referring now to EQ. 1, for $V_{SL}$=1.0 V, $\tau$=40 ns, and t=4 ns: $V_{BL0}=1.0\ (1-e^{-4/40})=1.0\ (1-0.90)$. $V_{BL0}$=100 mV at t=4 ns, which is the end of signal development time γ as shown in FIG. 15A.

Referring now to EQ. 1, for $V_{SL}$=1.5 V, T=40 ns, and t=4 ns: $V_{BL0}=1.5\ (1-e^{-4/40})=1.5\ (1-0.90)$. $V_{BL0}$=150 mV at t=4 ns, which is the end of signal development time γ as shown in FIG. 15A.

As described further above with respect to FIG. 13A and shown in by bit line charge READ timing diagram 1500 illustrated in FIG. 15A, during SA/Latch 635-0 set time, $V_{BL0'}$ switches to $V_{DD}$=1 V, isolation device $T_{ISB0}$ transitions to a saturation mode, and $V_{BL0}$ switches to 0.3 V.

Referring now to a bit line charge READ operation of a resistive change element in high resistance $R_{HI}$ state corresponding to a logic "0", a select line voltage $V_{SL}$ is applied to top electrode TE of resistive change element 1410, shown in FIG. 14A, in a high resistive state $R_{SW}=R_{HI}$=2 MΩ and the READ current flows through resistive change element 1410 and FET 1420 in the ON state to charge bit line BL. As described further above, $V_{BL}$=0 at the start of BL charging. Referring now to FIG. 14B, $V_{SL}$ used in these examples does not exceed 1.5 V, which is 0.5 volts below a minimum $V_{RESET}$ voltage of 2V also applied to the TE during a RESET operation, so as not to disturb the stored switch resistance value $R_{SW}$ during the READ operation.

Referring now to bit line charge READ timing diagram 1550 illustrated in FIG. 15B, bit line voltage calculations shown further below include $V_{SL}$ switching from zero to 0.5 V; to 1.0 V; and to 1.5 V. Time constant $\tau=R_{HI}\times C_{BL}$. Therefore, T=2 MΩ×400 fF and T=800 ns. In this example, high resistance state $R_{SW}=R_{HI}$ is assumed in electrical communication with BL[1].

Referring now to EQ. 1, for $V_{SL}$=0.5 V, T=800 ns, and t=4 ns: $V_{BL1}=0.5\ (1-e^{-4/800})=0.5\ (1-0.005)$. $V_{BL1}$=2.5 mV at t=4 ns, which is the end of signal development time γ as shown in FIG. 15B.

Referring now to EQ. 1, for $V_{SL}$=1.0 V, T=800 ns, and t=4 ns: $V_{BL1}=1.0\ (1-e^{-4/800})=1.0\ (1-0.005)$. $V_{BL1}$=5 mV at t=4 ns, which is the end of signal development time γ as shown in FIG. 15B.

Referring now to EQ. 1, for $V_{SL}$=1.5 V, T=800 ns, and t=4 ns: $V_{BL1}=1.5\ (1-e^{-4/800})=1.5\ (1-0.005)$. $V_{BL1}$=7.5 mV at t=4 ns, which is the end of signal development time γ as shown in FIG. 15B.

As described further above with respect to FIG. 13A and shown in by bit line charge READ timing diagram 1550 illustrated in FIG. 15B, during SA/Latch 635-1 set time, $V_{BL1'}$ switches to zero volts, isolation device $T_{ISB1}$ remains in a linear mode, and $V_{BL}1=V_{BL1'}$ also switches to zero volts.

As shown in the above calculations, the bit line signal voltage developed during signal development time γ=4 ns when sensing a high resistance state $R_{HI}$=2 MΩ is 2.5 mV, 5 mV, and 7.5 mV for $V_{SL}$=0.5 V, 1.0 V, and 1.5 V, respectively. Therefore, the reference voltage $V_{REF}$ applied to reference line RL 625 illustrated in FIGS. 13, 15A, and 15B may be set to $V_{REF}$=10 mV for the $V_{SL}$ voltage range of 0.5-1.5 V.

The double data rate (DDR2) timing operations described further above with respect to prior art FIGS. 7A and 7B correspond to the DDR2 operations described in FIGS. 15A and 15B, respectively.

Table 1570 illustrated in FIG. 15C summarizes and compares the bit line signal voltage developed in 4 ns when sensing a low resistance state $R_{LO}$ to a reference voltage $V_{REF}$=10 mV, which is higher than all bit line signal voltage developed in 4 ns when sensing a high resistance state $R_{HI}$. As shown in Table 1570, the SA/Latch input signal, when sensing a low resistance state $R_{LO}$, the difference voltage with respect to $V_{REF}$, is 40 mV for $V_{SL}$=0.5 V, 90 mV for $V_{SL}$=1.0 V, and 140 mV for $V_{SL}$=1.5 V. All SA/Latch input signals shown in Table 1570 illustrated in FIG. 15C can be sensed using presently available CMOS technologies in the semiconductor industry.

In the examples described further above, for purposes of comparing signal levels for bit line charge and bit line discharge READ operation methods, a signal development time of t=4 ns for both charge and discharge READ methods was used. However, as described further above, in the bit line discharge READ method, the BL voltage applied to the bottom electrode BE of the resistive change element is constrained to approximately 0.5 V to avoid disturbing the stored resistance value, since the minimum $V_{SET}$ voltage applied to BE is approximately 1 V as described further above with respect to prior art FIGS. 6, 7A, and 7B. However, as described further above, in the bit line charge READ method, a select voltage $V_{SL}$ is applied to a corresponding select line and the top electrode TE of the resistive change element and is constrained to approximately 1.5 V to avoid disturbing the stored resistance value, since the minimum $V_{RESET}$ voltage applied to TE is approximately 2 V as described further above with respect to FIGS. 13A, 15A, and 15B.

At this point in the specification, the larger (greater) bit line signal using the bit line charge READ operation may be leveraged for faster memory performance. The bit line charge READ method enables a substantially faster READ operation because a higher voltage may be used without disturbing the stored resistance value of the resistive change element as shown below.

Referring to EQ. 1, for a signal development time t=3 ns, $V_{BL}=1.5\ (1-e^{-3/40})$; $V_{BL}$=105 mV.

Referring to EQ. 1, for a signal development time t=2 ns, $V_{BL}=1.5\ (1-e^{-2/40})$; $V_{BL}$=75 mV.

Referring to EQ. 1, for a signal development time t=1.5 ns, $V_{BL}=1.5\ (1-e^{-1.5/40})$; $V_{BL}$=60 mV.

Referring to EQ. 1, for a signal development time t=1 ns, $V_{BL}=1.5\ (1-e^{1/40})$; $V_{BL}$=38 mV.

Referring now to table 1570 illustrated in FIG. 15C, bit line charge READ operations are compatible with READ times in the range of 3 to 1 ns, which is substantially faster than READ times for bit line discharge READ operations.

Referring now to voltage shifter/drivers 620 and write select FETs 610, for example, voltage shifter/driver 620-0 shown in open architecture schematic 1300 illustrated in FIG. 13A in a WRITE operation, and WRITE equivalent circuit 1480 illustrated in FIG. 14D, $V_{HI}$ is the write voltage, 1.6 V in this example, and $R_W$ is the series resistance of voltage shifter/driver 620-0 FET $T_{VS1}$ channel resistance and the write select FET $T_{WR0}$ channel resistance, assumed to be approximately equal to 1 kΩ. Isolation transistor $T_{ISB0}$ is in an OFF state.

In operation, as described further above in write timing diagram 980 shown in prior art FIG. 9B, a RESET-before-WRITE operation is performed for selected 1T, 1R cells. Therefore, the resistive change element is in a high resistance state $R_{HI}$=2 MΩ in this example. In a logic "1" write operation, a logic signal voltage of $V_{DD}$, 1 V for example, on bidirectional on-chip data bus line D0 is applied to terminal X1 of SA/Latch 635-0 by bit line segment BL[0]', turning FET $T_{SA1}$ OFF and activating FET $T_{SA3}$, thereby electrically connecting terminal X2 to zero volts, which turns $T_{SA2}$ ON and $T_{SA4}$ OFF. Terminals X1 and X2 drive voltage shifter/driver 620-0 used in WRITE operations. Terminal X1 at voltage $V_{DD}$ turns $T_{VS3}$ ON, which applies X2 zero voltage to the gate of $T_{VS1}$, electrically connecting output $O_{VS}$ to voltage $V_{HI}$, which in example is at $V_{HI}$=1.6 Volts to allow for voltage drops and ensure reaching the maximum $V_{SET}$ value of 1.5 V across the resistive change element terminals. If the selected resistive change element has $V_{SET}$ range of 1-1.5 V, then $V_{WRITE}$=$V_{SET}$=1.5 V across the resistive change element terminals. $V_{HI}$ drives array bit line BL[0] in storage subarray 605-0 through the FET channel resistances of FET $T_{VS1}$ and write select FET $T_{WR0}$, with a combined resistance $R_W$=1 kΩ in this example.

Figure 14E:
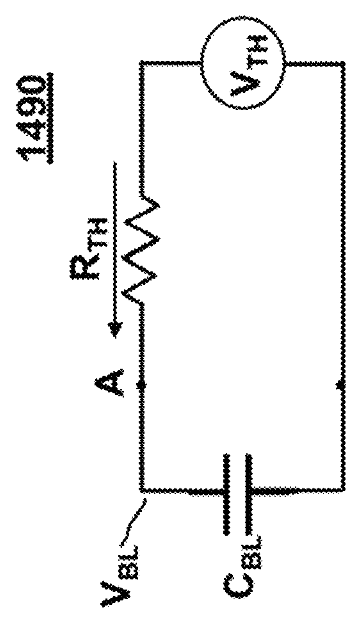
FIG. 14E is a Thevenin equivalent circuit of the WRITE equivalent circuit corresponding to FIG. 14D.

Referring now to WRITE equivalent circuit 1480 illustrated in FIG. 14D and network 1485 in electrical communication with terminals A-B, Thevenin equivalent circuit 1490 illustrated in FIG. 14E is derived from network 1485. When calculating Thevenin voltage VIE and Thevenin resistance $R_{TH}$, network 1485 is treated as if disconnected from bit line capacitance $C_{BL}$. Thevenin voltage VIE is the voltage across open circuit terminals A-B and may be expressed as:

$$V_{TH}=V_{HI}[R_{SW}/(R_{SW}+R_W)]$$

$$V_{TH}=1.6[2\times10^6/(2\times10^6+1\times10^3)];V_{TH}=1.6V$$

Thevenin resistance $R_{TH}$ between open terminals A-B may be expressed as:

$$R_{TH}=(R_{SW}\times R_W)/(R_{SW}+R_W)$$

$$R_{TH}=(2\times10^{6}\times1\times10^3)/(2\times10^6+1\times10^3);R_{TH}=1\ \text{k}\Omega$$

Therefore, $$V_{BL}=1.6(1-e^{-t/\tau_{TH}});$$

$$\tau_{TH}=R_{TH}\times C_{BL}=1\times10^3\times400\times10^{-15};\tau_{TH}=0.4\ \text{ns}$$

Calculating bit line voltage $V_{BL}$ at t=1 ns, $$V_{BL}=1.6(1-e^{-1/0.4});V_{BL}=1.6\times0.92\approx1.5V$$

Referring now voltage shifter/drivers 620-0 and 620-1 and write select FETs 610, for example, voltage shifter/driver 620-1 shown in open architecture schematic 1300 illustrated in FIG. 13A in a WRITE operation, and WRITE equivalent circuit 1480 illustrated in FIG. 14D, $V_{HI}$ is the write voltage, 1.6 V in this example, and $R_W$ is the series resistance of voltage shifter/driver 620-1 FET $T_{VS1}$ channel resistance and the write select FET $T_{WR1}$ channel resistance, assumed to be approximately equal to 1 kΩ. Isolation transistor $T_{ISB1}$ is in an OFF state. The operation of voltage shifter/driver 620-1 is same as described above with respect to voltage shifter/driver 620-0.

In summary, the combination of a bit line charge READ operation and a bit line WRITE operation, enables 1T, 1R cell memory data path speeds in 1-3 ns range.

Another way to leverage the substantially larger READ signals using bit line charge READ operations, is with standalone or embedded nonvolatile 1T, 1R cell cache memory operating at sub-nanosecond speeds. Cache memories are smaller, that is, have less bits, than main 1T, 1R cell memories. A way to increase 1T, 1R cell memory speeds for nonvolatile cache applications is to reduce the bit line capacitance $C_{BL}$ by reducing the number of bits per bit line. Bit line capacitance is approximately equal to the number of FET drain diffusions per bit line. Reducing the number of bits per bit line by a factor of 8, for example, reduces the bit line capacitance $C_{BL}$ in this example from 400 fF to 50 fF.

Referring now to FIG. 14C and EQ. 1, the bit line voltage $V_{BL}$ for a bit line charge READ operation at t=0.25 ns, or 250 ps may be calculated as follows:

$$V_{BL}=V_{SL}(1-e^{-t/\tau});V_{BL}=1.5(1-e^{-0.25/5});V_{BL}=75\ \text{mV}$$

$$\text{Where } \tau=R_{SW}\times C_{BL};\tau=100\times10^3\times50\times10^{-15};\tau=5\ \text{ns}$$

The ability to use a $V_{SL}$=1.5 volt in a bit line charge READ mode without resistive change element stored resistance value disturb, results in a substantial bit line voltage of 75 mV in a signal development time of 250 ps, which enables sub-nanosecond 1T, 1R cell cache memory operation. Assuming a sense amplifier response time of 0.5 ns, the combined cache READ speed is 750 ps.

As described further above, WRITE equivalent circuit 1480 illustrated in FIG. 14D and Thevenin equivalent circuit 1490 illustrated in FIG. 14E may be used to calculate cache WRITE speed as follows.

Thevenin voltage may be calculated as:

$$V_{TH}=V_{HI}\times[R_{SW}/(R_{SW}+R_W)];V_{TH}=1.6\times[2\times10^6/(2\times10^6+1\times10^3)];V_{TH}=1.6V$$

Thevenin resistance $R_{TH}$ may be calculated as:

$$R_{TH}=(R_{SW}\times R_W)/(R_{SW}+R_W);R_{TH}=(2\times10^{6}\times1\times10^3)/(2\times10^6+1\times10^3);R_{TH}=1\ \text{k}\Omega$$

$$\tau_{TH}=R_{TH}\times C_{BL}=1\times10^3\times50\times10^{-15};\tau_{TH}=0.05\ \text{ns}$$

Bit line voltage $V_{BL}$ may be calculated as follows:

$$V_{BL}=V_{TH}=1.6(1-e^{-0.25/0.05});V_{BL}=1.6\times0.99\approx1.6V$$

Assuming a SA/Latch speed of 0.5 ns in response to the incoming bidirectional on-chip data bus line pulse of amplitude $V_{DD}$, the cache WRITE time is approximately 0.25+0.5=0.75 or 750 ps.

In summary, the combination of a bit line charge READ operation and a bit line WRITE operation, enables picosecond 1T, 1R cell memory operation, for example a nonvolatile 1T, 1R cell cache memory data path speeds of approximately 750 ps.

As described further above with respect to FIG. 13A, in a READ operation example, isolation device $T_{ISB0}$ turns ON and a READ data path is formed between a selected resistive change element in storage subarray 605-0 and a terminal of a SA/Latch 635-0, which switches to $V_{DD}$ for a low resistance $R_{LO}$ value corresponding to a logic "1" and transmits $V_{DD}$ voltage to bidirectional on-chip data bus 1340 through bidirectional on-chip data bus coupling circuit 1325-0, which is then transmitted to an off-chip external data bus. If, however, a high resistance value $R_{HI}$ corresponding to a logic "0" had been stored, then SA/Latch 635-0 would have switched to zero volts, and zero volts would be transmitted to bidirectional on-chip data bus 1340 through bidirectional on-chip data bus coupling circuit 1325-0 and then to an off-chip external data bus.

However, as described further above with respect to FIG. 13A, in a WRITE operation example, an off-chip data bus transmits a logic "1" voltage of $V_{DD}$ to bidirectional on-chip data bus 1340, which is then transmitted to SA/Latch 635-0 through bidirectional on-chip data bus coupling circuit 1325-0 and SA/Latch temporarily stores the $V_{DD}$ voltage value. Isolation device $T_{ISB0}$ is turned OFF disconnecting SA/Latch 635-0 and storage subarray 605-0. Voltage shifter/driver 620-0, which is in electrical communication with SA/Latch 635-0, is activated and transmits an output voltage $O_{VS}$ to write select FET $T_{WR0}$ and then to a selected resistive change element. A $V_{WRITE}=V_{SET}=1.5$ V is applied across the selected resistive change element that results in the storage of a low resistance $R_{LO}$ corresponding to a logic "1" as described further above. However, if an off-chip data bus transmits a logic "0" voltage of zero volts to bidirectional on-chip data bus of 1340, which is then transmitted to SA/Latch 635-0 through bidirectional on-chip coupling circuit 1325-0, and SA/Latch 635-0 stores zero volts, voltage shifter/driver 620-0 output voltage $O_{VS}$ is zero, and a $V_{WRITE}=0$ V is applied across the selected resistive change element, which remains in the high resistance state $R_{HI}$ corresponding to a logic "0" from a prior RESET-before-WRITE operation.

Figure 13B:
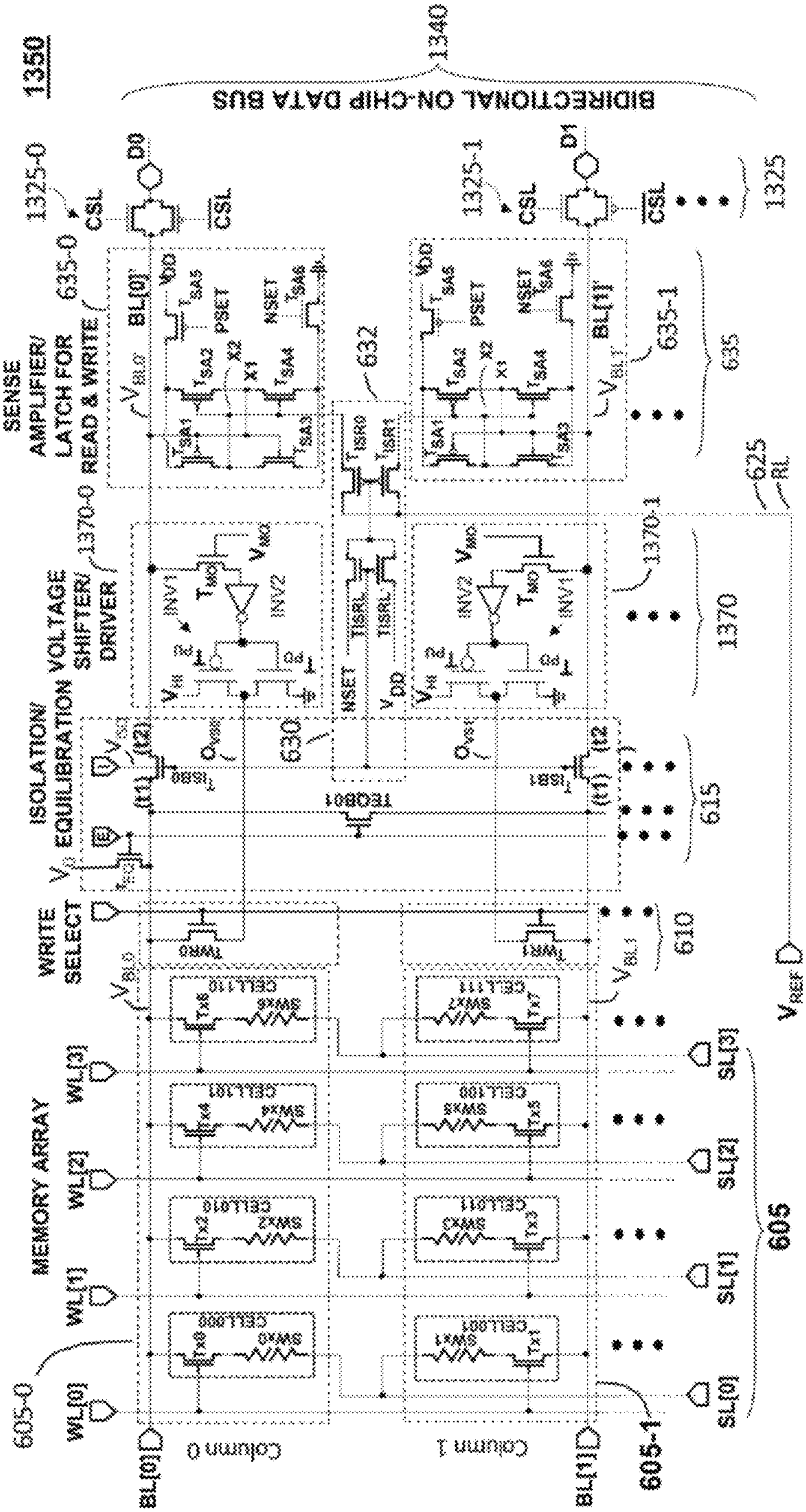
FIG. 13B shows an open architecture schematic corresponding to FIG. 13A, except for voltage shifter/drivers that have been replaced with a simpler circuit design.

Referring now to FIG. 13B, open architecture schematic 1350 is essentially the same as open architecture schematic 1300 illustrated in FIG. 13A, except that simplified voltage shifter/drivers 1370 replace voltage shifter/drivers 620 illustrated in FIG. 13A. Voltage shifter/driver 1370-0 replaces voltage shifter/driver 620-0 and voltage shifter/driver 1370-1 replaces voltage shifter/driver 620-1 in FIGS. 13B and 13A, respectively. Voltage shifter/drivers are used during WRITE operations.

Voltage shifter/drivers 1370-0 and 1370-1 illustrated in FIG. 13B use the same circuits and interconnections. A mode select FET $T_{MO}$ has a drain terminal in electrical communication with bit line segment BL[0]' for voltage shifter/driver 1370-0 and in electrical communication with bit line segment BL[1]' for voltage shifter/driver 1370-1, a source terminal in electrical communication with an input of inverter INV2 in series with inverter INV1, and a gate in electrical communication with mode select voltage $V_{MO}$ to activate FET $T_{MO}$ during a WRITE operation and deactivate FET $T_{MO}$ during a READ operation, with $V_{MO}=V_{DD}$ and 0 V for WRITE and READ operations, respectively. Two inverters in series are used, INV1 and INV2, to avoid voltage polarity inversion. Referring to voltage shifter/driver 1370-0, inverter INV1 includes a pullup FET $T_{PU}$ whose source terminal is in electrical communication with voltage $V_{HI}$ and drain terminal is in electrical communication with the common output node and a pulldown FET $T_{PD}$ whose drain terminal is also in electrical communication with the common output node and source terminal is in electrical communication with ground (zero volts). The gate terminals of FETs $T_{PU}$ and $T_{PD}$ are in electrical communication with each other and the output of inverter INV2. Referring to voltage shifter/driver 1370-0, common output node output $O_{VS0}$ is in electrical communication with write select FET $T_{WR0}$. Referring to voltage shifter/driver 1370-1, inverter INV1 includes a pullup FET $T_{PU}$ whose source terminal is in electrical communication with voltage $V_{HI}$ and drain terminal is in electrical communication with the common output node and a pulldown FET $T_{PD}$ whose drain terminal is also in electrical communication with the common output node and source terminal is in electrical communication with ground (zero volts). The gate terminals of FETs $T_{PU}$ and $T_{PD}$ are in electrical communication with each other and the output of inverter INV2. Referring to voltage shifter/driver 1370-1, common output node output $O_{VS1}$ is in electrical communication with write select FET $T_{WR1}$.

The operation of open architecture schematic 1350 illustrated in FIG. 13B is essentially the same as described further above with respect to open architecture schematic 1300 illustrated in FIG. 13A described further above for both READ and WRITE operations.

3D MSSCNV Memory with Multi-Switch Storage Cells Formed with Multiple Resistive Change Elements per Cell At this point in the specification, still another way to leverage the higher bit line charge READ signals is to increase memory density by replacing single resistive change element cells with multi-switch storage cells having multiple resistive change elements per cell to form nonvolatile 3D MSSC memories as described further below.

3D MSSC memories with multi-switch storage cells formed with multiple resistive change elements per cell are enabled by an array architecture with select lines approximately parallel to word lines and bit lines approximately orthogonal to and overpassing select lines and word lines. A 3D MSSC memory with multi-switch storage cells operation is similar to a 1T, 1R cell memory with 1T, 1R cells as described further above and below.

3D MSSC memories have the following characteristics and features:

- The same number of memory array cells for cells with multiple resistive change elements per cell as for single resistive change element cells;
- The same number of word and bit lines for cells with multiple resistive change elements per cell as for single resistive change element cells;
- The same number of word line drivers and sense amplifier/latches for cells with multiple resistive change elements per cell as for single resistive change element cells;
- The same bidirectional on-chip data bus for cells with multiple resistive change elements per cell as for single resistive change element cells;
- The same number of external drivers, receivers, and I/O drivers for cells with multiple resistive change elements per cell as for single resistive change element cells;
- 3D MSSC arrays are designed and operated to prevent sneak paths between other multi-switch storage cells, and therefore have no stored resistance disturbs from adjacent cells and stored data pattern within those cells. Consequently, RCE electrical characteristics (I-V curves) may be linear and/or nonlinear;
- READ and WRITE operations may be performed on one of the n resistive change elements in a multi-switch storage cell without disturbing the stored data in the remaining n−1 other resistive change elements. However, controlled parasitic currents may flow in the n−1 unselected resistive change elements within the cell;
- The data path is designed to operate between $V_{DD}$ and ground for all CMOS circuits, including the bidirectional on-chip data bus and sense amplifier/latches;
- 3D MSSC memory high speed operation is the same as for 1T,1R cell memory;
- The READ data path operates between $V_{DD}$ and ground;
- The WRITE data path is designed to isolate sense amplifier/latches from potentially higher WRITE voltages that are greater than $V_{DD}$. A voltage shifter/driver acts as a buffer that receives inputs from the sense amplifier/latches between $V_{DD}$ and ground and acts as a bit line driver that can operate at WRITE voltages greater than $V_{DD}$. In this case, the WRITE path between the SA/Latch and memory array is different from the READ path;

If the WRITE data path WRITE voltage is $V_{DD}$, then no voltage shifter/driver is required, and both the READ and WRITE paths between the SA/Latch and memory array may be the same. In this case, the SET voltage of the resistive change element is also $V_{DD}$ ($V_{SET}$=$V_{DD}$), where in these examples, $V_{DD}$=1 V;

Referring to prior art FIGS. 5A and 5B, with select lines parallel word lines, unselected cells have zero volts between resistive change element terminals, and zero volts applied to the source of cell select FETs. Word lines in electrical communication with gates of cell select FETs are at zero volts, and corresponding drains are in electrical communication with bit lines at zero volts during a RESET operation;

The number of select lines increases as the number of resistive change elements per cell increases. There is one additional select line for each resistive change element added to the cell;

When one select line driver is provided per select line the number of select line drivers increases as the number of select lines increases, which may be a problem because the number of select line drivers substantially increases the footprint (area) of the cell. However, this problem is addressed further below with a select line drive matrix approach in which one driver may be used for a group of n select lines, independent of the number of n select lines;

The bit line voltage level in a READ operation determines the number n of resistive change elements per cell that can be sensed by sense amplifier/latches as described further below;

High speed 3D MSSC memory operation is maintained by limiting signal development time to 4 ns for n=2 to 64 or more select lines;

Therefore, the select line voltage $V_{SL}$ applied to the top electrode of the selected resistive change element during a bit line charge READ operation needs to be as high as possible to maintain high performance. Hence, a relatively high RESET voltage is desirable to enable a relatively high select line voltage $V_{SL}$ during the READ bit line charge operations. Select line voltage $V_{SL}$ needs to be less than the RESET voltage $V_{RESET}$ not to disturb the resistance state of the resistive change element as described further above with respect to FIGS. 11A and 11B. In the examples used in this specification, $V_{RESET}$ is in the range of 2.0 to 2.5 V measured on fabricated resistive change elements. Applying a guard band of 0.5 V, $V_{SL}$ is 1.5 V or less in the examples described further below;

Referring now to prior art FIGS. 5A and 5B during a RESET operation, $V_{SL}$=$V_{RESET}$=2.75 V applied to select line SL of selected nonvolatile memory cell 500 with cell select FET ON results in a drain-to-source voltage of approximately 0.5 volts. For unselected nonvolatile memory cell 525 $V_{SL}$=$V_{RESET}$=0 which results in zero volts across the cell select FET in the OFF state. The low voltages across cell select FET terminals during the RESET voltage operation enables the cell select device to be the minimum area FET in the underlying CMOS technology, which is required for memory cell density;

RESET-before-WRITE operations work the same way for multi-switch storage cells and single-switch storage cells;

The initialization of resistive change elements in multi-switch storage cells works the same way as for single-switch storage cells except that a select line drive matrix approach replaces an initialization driver for each select line as described further below; and The n resistive change elements in a multi-switch storage cell can include at least one redundant resistive change element per cell.

Figure 16:
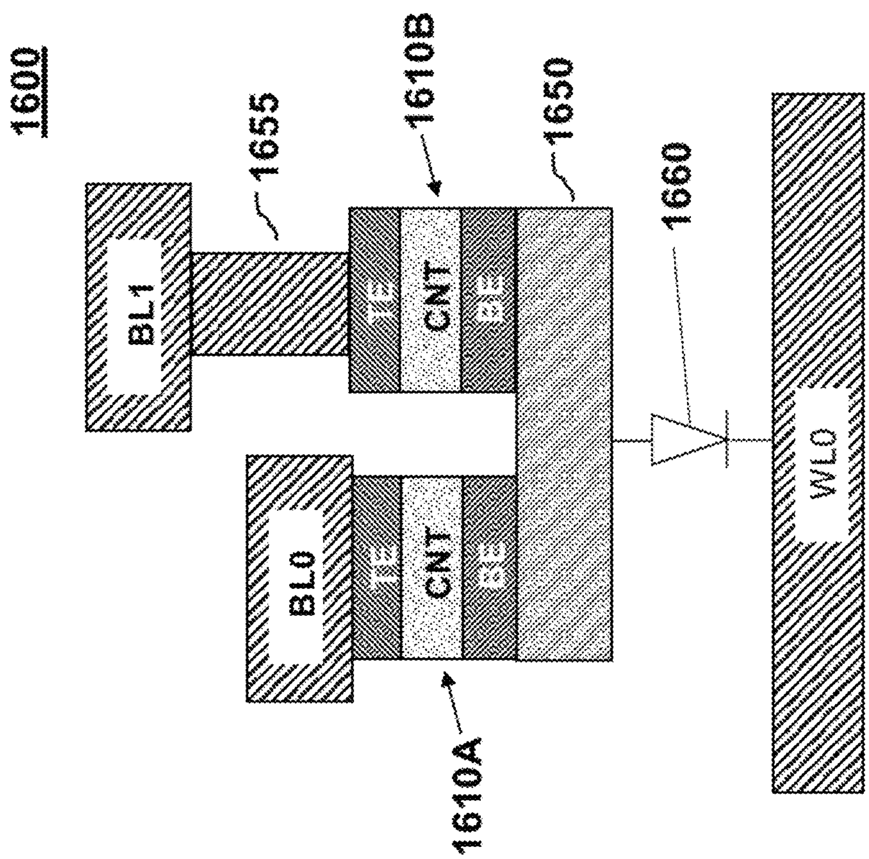
FIG. 16 is a prior art 3D memory cell with a pair of resistive change elements with bottom electrodes BE in electrical communication with each other and a cell select (steering) diode.

Referring now to U.S. Pat. No. 8,217,490 issued to Bertin, referring now to U.S. Pat. No. 10,546,859 issued to Bertin, and prior art FIG. 16. Prior art FIG. 16 shows a nonvolatile 3D memory cell 1600 with two nonvolatile resistive change elements, each formed with a CNT switch having a CNT fabric CNT, a top electrode TE, and a bottom electrode BE, with bottom electrodes BE of the CNT switches in electrical communication with each other and a cell select device node, in this example, a steering (cell select) diode node. Interconnecting bottom electrode conductor 1650 electrically connects bottom electrodes BE of resistive change elements 1610A and 1610B and the anode of diode 1660. Word line WL0 is in electrical communication with the cathode of diode 1660, bit line BL0 is in electrical communication with top electrode TE of resistive change element 1610A, and bit line BL1 is in electrical communication with top electrode TE of resistive change element 1610B through filled via 1655.

Figure 17:
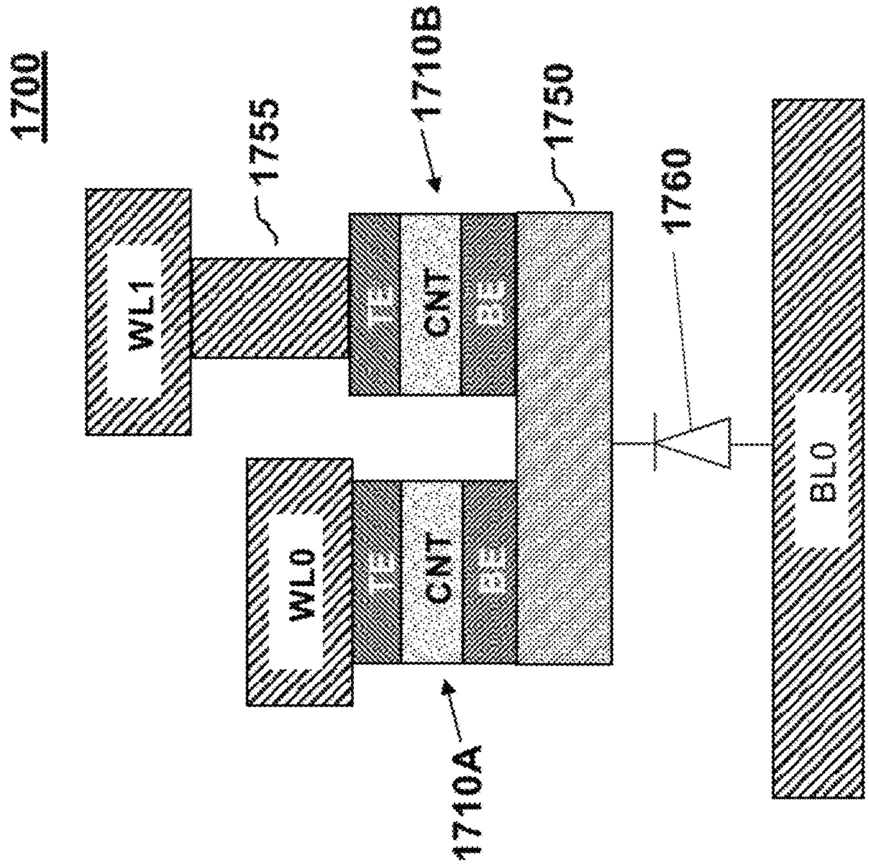
FIG. 17 is a prior art 3D memory cell with a pair of resistive change elements with bottom electrodes BE in electrical communication with each other and a cell select (steering) diode.

Referenced U.S. Pat. No. 8,217,490, teaches that the anode-to-pair-of bottom electrode BE may be replaced by a cathode-to-pair of bottom electrode BE connections as illustrated in prior art FIG. 17. Prior art FIG. 17 shows a nonvolatile 3D memory cell 1700 with two nonvolatile resistive change elements, each formed with a CNT switch having a CNT fabric CNT, a top electrode TE, and a bottom electrode BE, with bottom electrodes BE of the CNT switches in electrical communication with each other and a cell select device node, in this example, a steering (cell select) diode node. Interconnecting bottom electrode conductor 1750 electrically connects bottom electrodes BE of resistive change elements 1710A and 1710B and the cathode of diode 1760. Bit line BL0 is in electrical communication with the anode of diode 1760, word line WL0 is in electrical communication with top electrode TE of resistive change element 1710A, and word line WL1 is in electrical communication with top electrode TE of resistive change element 1710B through filled via 1755.

Referring now to prior art FIGS. 1, and 3D memory cells 1600 and 1700 shown in prior art FIGS. 16 and 17, respectively, 1 transistor, 1 resistive change element (1T, 1R) array cross section 100 shown in prior art FIG. 1 may be changed from a single-switch storage cell to a multi-switch storage cell with 1 transistor, 2 resistive change element (1T, 2R) array cross section by adding a second resistive change element with bottom electrode BE also in electrical communication with the cell select FET 105 source S and a second separate select line parallel to select line SL, in electrical communication with a second top electrode TE, and also parallel to the corresponding word line WL/G as illustrated further below. For example, resistive change elements 1610A and 1610B illustrated in prior art FIG. 16 and resistive change elements 1710A and 1710B illustrated in prior art FIG. 17, corresponding to resistive change elements 2110 and 2111 in electrical communication with select lines SL1 and SL2, respectively, as illustrated further below with respect to FIGS. 21A and 21B. FIGS. 3, 21A-21E and FIGS. 24-1 and 24-2 show examples of how multi-switch storage cells may be increased from 2 resistive change elements per cell to n resistive change elements per cell, where n in these examples may range from n=2 to n=64, although n greater than 64 may also be used.

The examples in FIGS. 21A and 21B, FIGS. 3, 21C-21E, and FIGS. 24-1 and 24-2 show how the teachings of prior art FIGS. 16 and 17 can be applied to single-switch storage cells shown in prior art FIG. 1 to form multi-switch storage cells for 3D MSSC arrays, in which select lines are parallel to word lines and bit lines are orthogonal to both word lines and select lines.

Figure 18A:
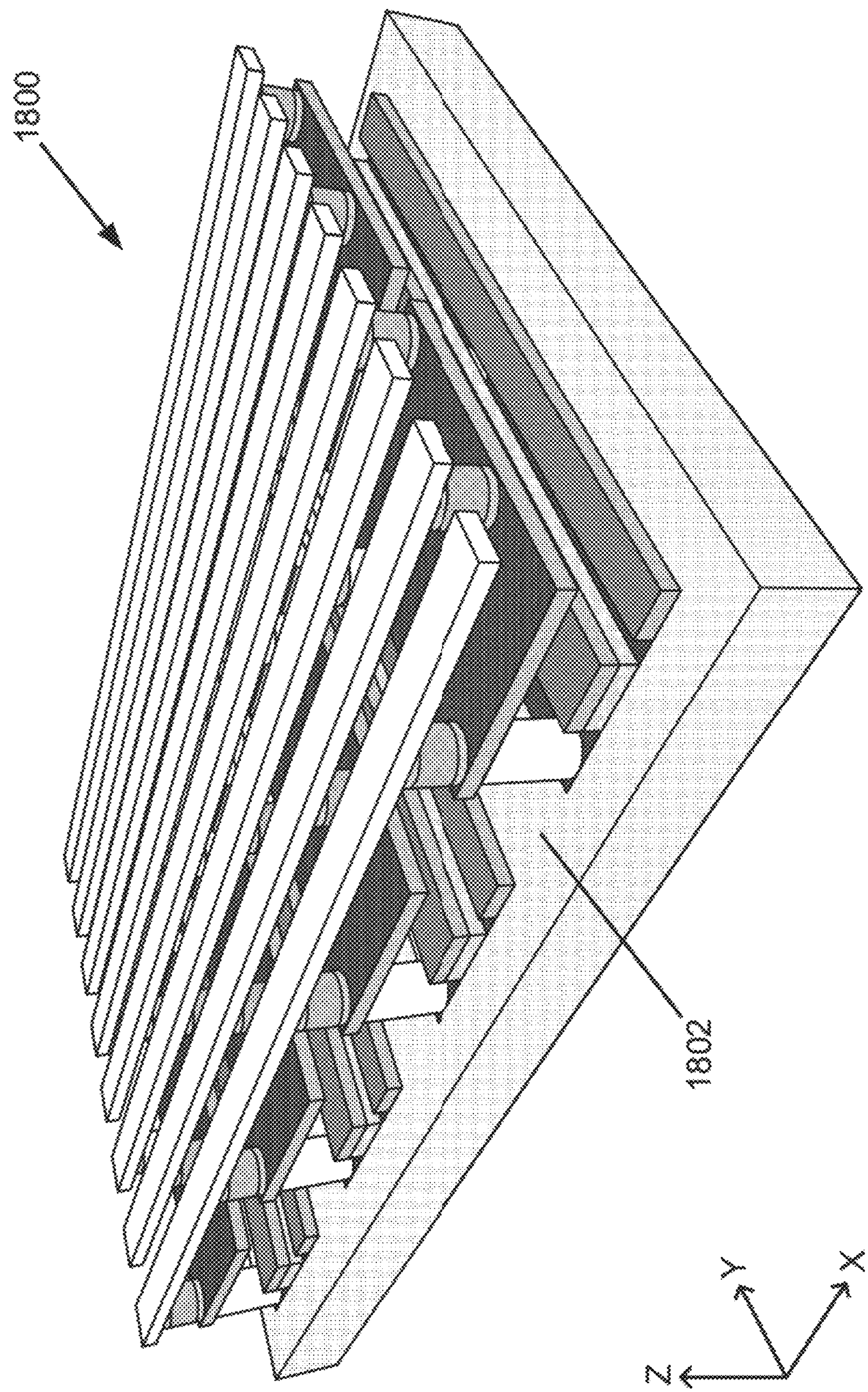
FIG. 18A shows a resistive change element array including a plurality of resistive change element cells and a plurality of selection devices arranged in a group of four resistive change element cells sharing one selection device configuration.
Figure 18B:
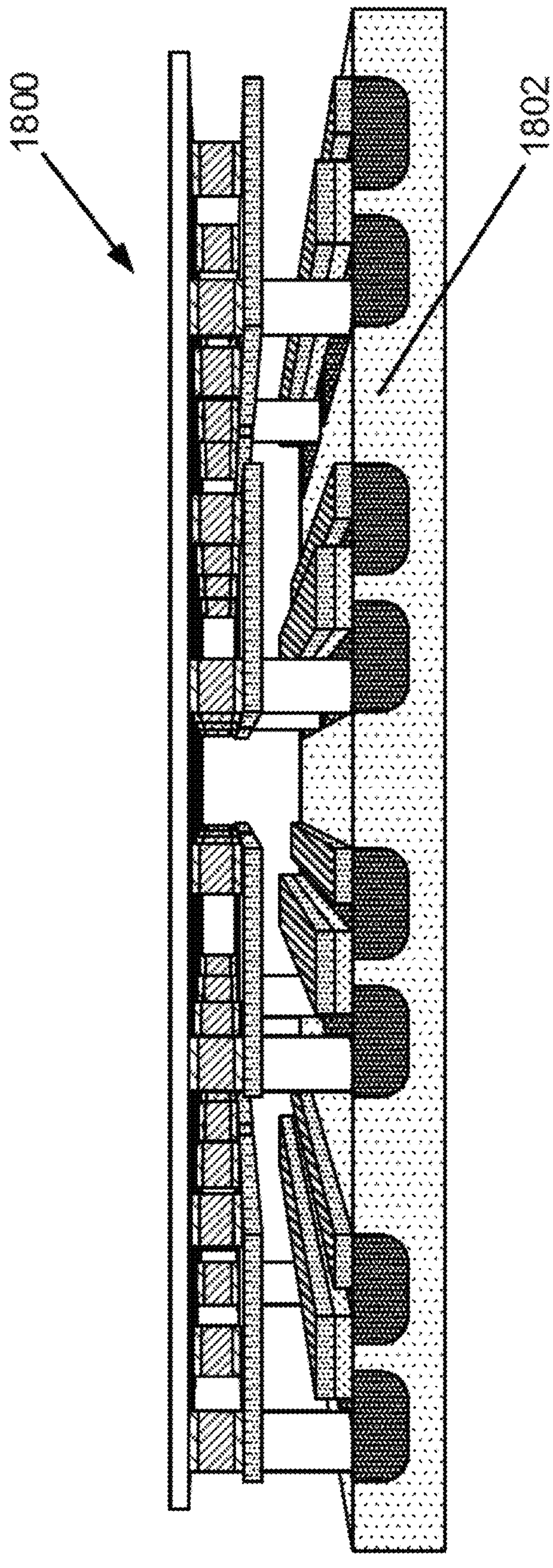
FIG. 18B shows a vertical cross-sectional view of the resistive change element array of FIG. 18A.

Referring now to U.S. Pat. No. 10,825,516 issued to Luo et al. and to prior art FIGS. 18A-18B. FIG. 18A illustrates a resistive change element array 1800 having a plurality of resistive change element cells and a plurality of selection devices arranged in a group of four resistive change element cells sharing one selection device configuration, also referred to as a 1T4R configuration. Each group of four resistive change element cells sharing one selection device is arranged in a one level layout above a selection device. Each resistive change element cell includes a bottom electrode, a nanotube fabric layer, and a top electrode. Each selection device includes a drain terminal, a source terminal, a gate dielectric, and a gate terminal. Each group of four resistive change element cells is in electrical communication with a selection device for that group of four resistive change element cells through a plate conductive structure and a column conductive structure. The resistive change element array 1800 also includes a plurality of source lines in electrical communication with top electrodes of resistive change element cells, a plurality of bit lines in electrical communication with source terminals of selection devices, and a plurality of word lines with each word line including gate terminals of selection devices as part of the word line. A substrate 1802 can be formed from a conductive material, a semiconductor material, or an insulating material as required by the needs of a specific application. FIG. 18B illustrates a vertical cross-sectional view of the resistive change element array 1800.

Resistive change elements in the exemplary 3D MSSC arrays illustrated in FIGS. 21A and 21B, FIGS. 3, 21C-21E, 21I, and FIGS. 24-1 and 24-2, are formed using a CNT switch such as resistive change element 310 as described further above with respect to FIG. 3. The CNT switch in these exemplary 3D MSSC arrays is a bidirectional switch to which a SET voltage in the range of 1-1.5 volts may be applied to bottom electrode BE with respect to top electrode TE, which causes the CNT switch resistance to change from a high resistance state $R_{HI}$ to a low resistance state $R_{LO}$. However, if the CNT switch resistance is already in a low resistance state $R_{LO}$, then the resistance is unchanged. If a RESET voltage in the range of 2-2.5 volts is applied to a top electrode TE relative to a bottom electrode BE, then the CNT switch resistance changes from a low resistance state $R_{LO}$ to a high resistance state $R_{HI}$. However, if the CNT switch resistance is already in a high resistance state $R_{HI}$, then the resistance is unchanged.

3D MSSC arrays may be formed with multi-switch storage cells having n=2 to n=64 or more switches with bottom electrodes BE in electrical communication with each other and a corresponding cell select device terminal such as, a drain of a FET, as illustrated further above. However, as shown further below, multi-switch storage cell READ signal levels require a relatively high select line voltage $V_{SL}$ for a bit line charge voltage, without disturbing the stored resistance values, to enable sufficient signal to SA/Latches while maintaining high speed operation, such as signal development in 4 ns for example as illustrated in FIGS. 29 and 30. Referring now to FIGS. 11B-1, 11B-2, and 11B-3, for multi-switch storage cells formed with CNT switches with a RESET voltage of 2.0-2.5 V and a guard band of 0.5 V, $V_{SL}$ is limited to 1.5 V. However, increasing the resistive change elements RESET voltage to 3-3.5 V, with a guard band of 0.5 V, would enable a bit line charge select line voltage of 2.5 V, resulting in substantially higher SA/Latch input voltages and accommodate larger numbers of resistive change elements in multi-switch storage cells.

Figure 19:
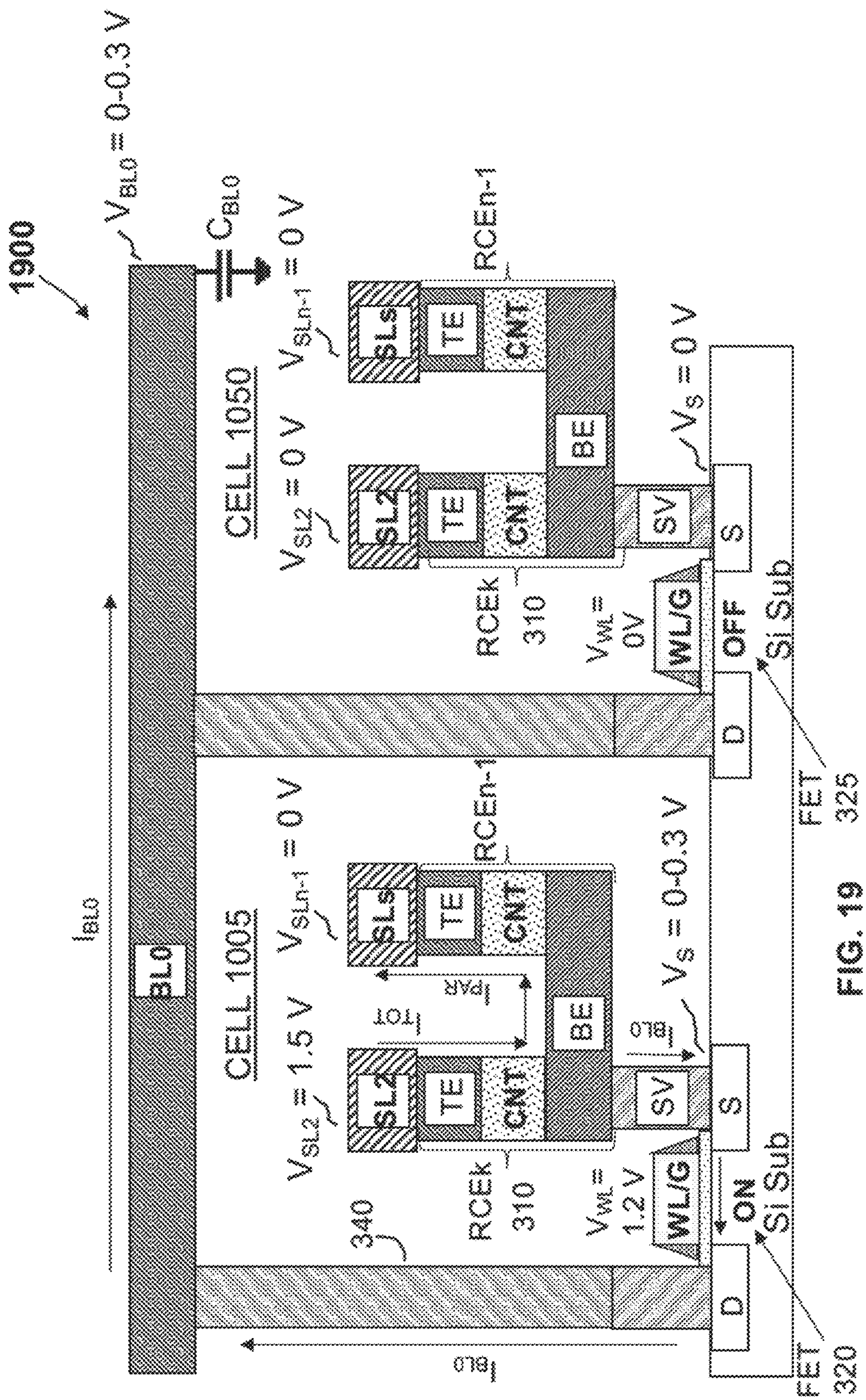
FIG. 19 is a cross sectional representation of a 3D MSSC memory bit line charge READ operation for a multi-switch storage cell array showing currents and voltages for a selected multi-switch storage cell and an unselected multi-switch storage cell for a memory architecture having select lines parallel to word lines and bit lines orthogonal to word lines and select lines.

FIG. 19 is a representation of a 3D MSSC memory READ operation 1900 corresponding to selected multi-switch storage cell 1005 and unselected multi-switch storage cell 1050 of the 3D MSSC array with select lines parallel to word lines illustrated in FIG. 10. Cell select FETs of selected multi-switch storage cells are in an ON conductive state and cell select FETs of unselected multi-switch storage cells are in a non-conductive OFF state.

Referring now to 3D MSSC memory READ operation 1900 of selected multi-switch storage cell 1005 illustrated in FIG. 19, select line voltage $V_{SL2}$=1.5 V is applied to top electrode TE of a resistive change element RCEk formed with CNT switch 310 and total current bar flows through the CNT fabric to the shared bottom electrode BE. Parasitic currents $I_{PAR}$ flow from shared bottom electrodes BE of multiple (n−1) resistive change elements, through the respective CNT fabrics to n−1 top electrodes TE, with each TE in electrical communication with one of n−1 select lines each in electrical communication with ground ($V_{SLn-1}$=0 V). Bit line current $I_{BL0}$ flows through cell select FET 320 and charges bit line BL0 capacitance $C_{BL0}$ as shown in FIG. 19 and in more detail in FIG. 10. Bit line charge calculations illustrated further below with n−1 resistive change elements RCEn-1 in parallel, with n=2 to n=64, and corresponding n−1 select lines in electrical communication with ground (zero volts) show that array bit line voltage $V_{BL0}$ is 0.3V or less at the end of a READ operation. The total parallel resistance RIP of the n−1 resistive change elements RCEn-1 in parallel may be calculated as $1/R_{TP}=1/R_{TP1}+1/R_{TP2}+\ldots+1/R_{TPk-1}+\ldots+1/R_{Tpk+1}+\ldots+1/R_{Tpn}$. All of the n−1 resistive change elements RCEn-1 in these examples are either in low resistance state $R_{L0}$=100 kΩ or high resistance state $R_{HI}$=2 MΩ.

Referring now to FIG. 11A, FIG. 11A shows that array bit line BL0 is in electrical communication with terminal (t1) of isolation device 1120 and terminal (t2) is in electrical communication with bit line segment BL0', which is in electrical communication with representative SA/Latch 1130 terminal. SA/Latch 1130 switches to $V_{BL0'}=V_{DD}$ for a low resistance state $R_{LO}$ and $V_{BL0'}$ for a high resistance state $R_{HI}$, where $V_{DD}$=1 V in this example. The gate of isolation device 1120 is in electrical communication with a gate voltage $V_G$=0.5 V and has a threshold voltage $V_{TH}$=0.2 V. When bit line segment voltage $V_{BL0'}$, and therefore terminal (t2), transitions to $V_{DD}$=1 V, then isolation device 1120 switches into a saturation operating mode and terminal (t1) and corresponding array bit line BL0 switch to $V_{BL0}$=0.3 V (0.5 V-0.2 V). However, if bit line segment switches to ground (zero volts), then isolation device 1120 remains in a linear operating mode and array bit line BL0 switches to $V_{BL0}$=0 V. Therefore, array bit line voltage $V_{BL0}$ switches between 0 and 0.3 V. Referring now to FIG. 19, with common bottom electrodes BE of the n−1 resistive change elements RCEn-1 at $V_{BL0}$=0.3 V and top electrodes TE in electrical communication with corresponding select lines at $V_{SLn-1}$=0, common bottom electrode voltage $V_{BL0}$=0.3 V is substantially below the minimum SET voltage of 1V for resistive change elements having a $V_{SET}$ range of 1-1.5 V. Hence, resistance states of resistive change elements in RCEn-1 are not disturbed. Therefore, there is no disturb of multi-switch storage cell 1005 illustrated in FIG. 19.

Referring now to 3D MSSC memory READ operation of the unselected multi-switch storage cell 1050 illustrated in FIG. 19, cell select FET 325 is in an OFF state with word line $V_{WL}$=0 V. Since select lines are parallel to corresponding word lines, when select line voltages $V_{SL2}$=0 V and $V_{SLn-1}$=0 V, representative of the other n−1 select line voltages in electrical communication with unselected resistive change elements, which results in zero volts at all terminals of the resistive change elements in unselected multi-switch storage cell 1050. Therefore, there is no disturb of unselected multi-switch storage cell 1050 illustrated in FIG. 19.

Figure 20:
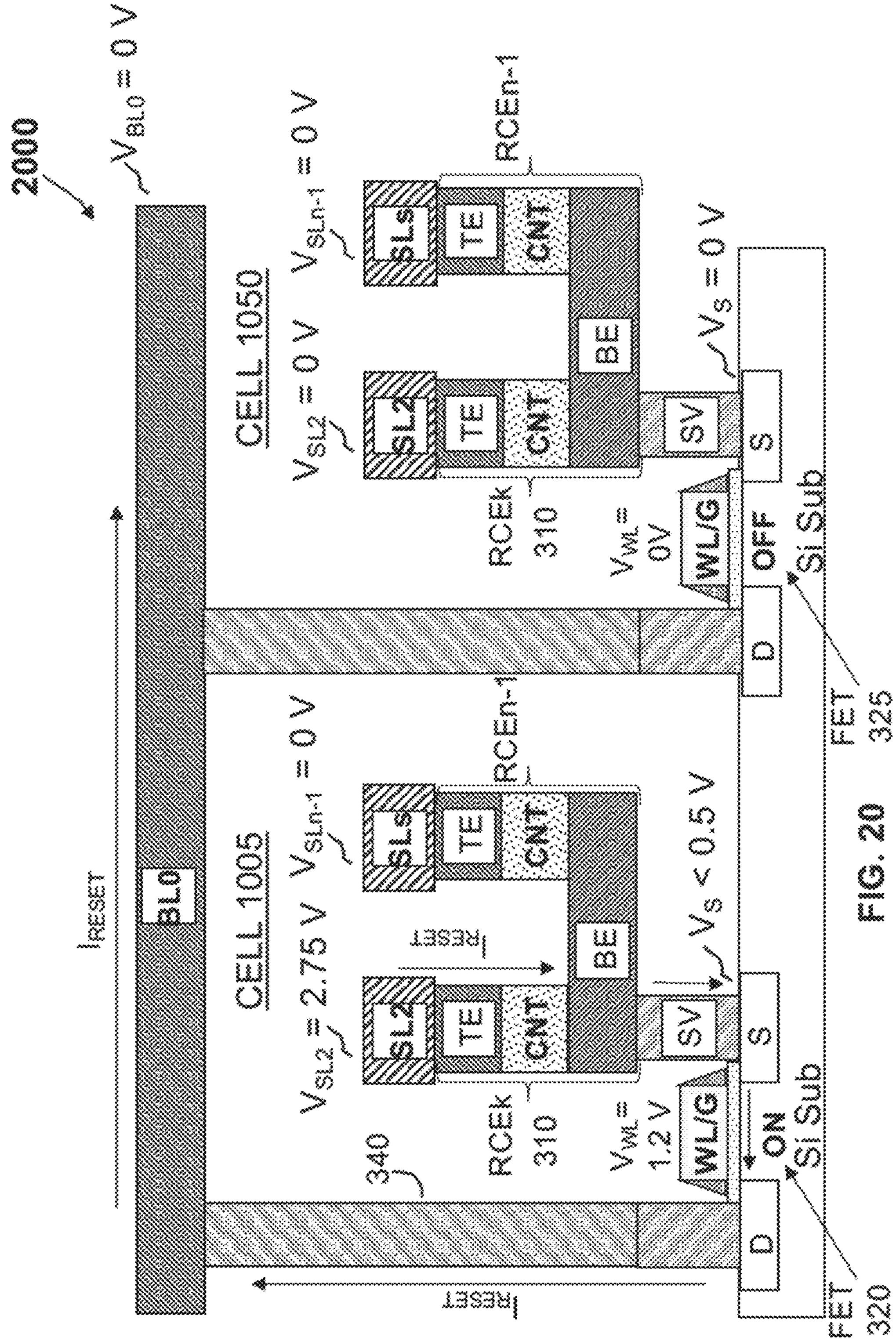
FIG. 20 is a cross sectional representation of a 3D MSSC memory RESET operation for a multi-switch storage cell array showing currents and voltages for a selected multi-switch storage cell and an unselected multi-switch storage cell for a memory architecture having select lines parallel to word lines and bit lines orthogonal to word lines and select lines.

FIG. 20 is a representation of a 3D MSSC memory RESET operation 2000 corresponding to selected multi-switch storage cell 1005 and unselected multi-switch storage cell 1050 of the 3D MSSC array with select lines parallel to word lines illustrated in FIG. 10.

Referring now to 3D MSSC memory RESET operation 2000 of selected multi-switch storage cell 1005 illustrated in FIG. 20, select line SL2 applies a RESET voltage $V_{RESET}=V_{SL2}-V_{BE}$ between top electrode TE and bottom electrode BE of resistive change element RCEk formed with CNT switch 310 and total current $I_{RESET}$ flows through the CNT fabric to the shared bottom electrode BE, causing the resistive state of the resistive change element RCEk to change from a low resistance state $R_{LO}$ to a high resistance state $R_{HI}$ or if the resistive change element RCEk is already in a high resistance state $R_{HI}$, then the resistance is unchanged. The select line voltage $V_{SL2}$ required to ensure a maximum RESET voltage $V_{RESET}$=2.5 V is calculated as follows. Assuming the resistive change element is in a low resistance state (corresponding, typically, to a logic "1" a SET state) $R_{LO}$=100 kΩ, the resistive change element switches to a high resistance state (corresponding, typically, to a logic "0" a RESET state) $R_{HI}$=2 MΩ. Cell select FET 320 is in an ON state, bit line BL0 voltage $V_{BL0}$=0 V, hence drain D is at $V_D$=0 V. The RESET switching time is typically a few nanoseconds. Therefore, the voltages and currents calculations are at before the transition to the high resistance state $R_{HI}$=2 MΩ, the RESET state. Assuming a cell select FET 320 ON channel resistance $R_{CH}$=10 kΩ, then the maximum common bottom electrode BE voltage occurs when the total parallel resistance $R_{TP}$ of the n−1 resistive change elements RCEn-1 is much greater than the channel resistance $R_{CH}$=10 kΩ, since $R_{TP}$ is electrically in parallel with $R_{CH}$, which lowers the total resistance between shared bottom electrode BE and $V_D$=0 V. The select line SL2 voltage $V_{SL2}$ to ensure a maximum RESET voltage $V_{RESET}$=2.5 V across the top and bottom electrodes of CNT switch 310 may be calculated using the series resistance network of resistive change element with $R_{LO}$=100 kΩ and cell select FET 320 channel resistance $R_{CH}$=10 kΩ as follows. $V_{SL2}-V_{BE}=V_{RESET}$=2.5 V. Using the series network, $V_{BE}=V_{SL2}\times(10\ k\Omega/(100\ k\Omega+10\ k\Omega))$, therefore, $V_{BE}$=0.09 $V_{SL2}$. Hence, $V_{SL2}-V_{BE}=V_{SL2}-0.09\ V_{SL2}$=2.5 V and $V_{SL2}$=2.75 V. Hence, a select line SL2 voltage of $V_{SL2}$=2.75 V is required to ensure a maximum RESET voltage of $V_{RESET}$=2.5 V across the terminals of CNT switch 310.

Since $V_{BE}$=0.09 $V_{SL2}$, then $V_{BE}$=0.09×2.75V and $V_{BE}$=0.25V, independent of the total parallel resistance value $R_{TP}$ of multi-switch storage cells RCEn-1. Therefore, 3D MSSC memory RESET operation 2000 does not disturb resistive change elements RCEn-1 of multi-switch storage cell 1005.

Referring now to the unselected multi-switch storage cell 1050 in the 3D MSSC memory RESET operation 2000 illustrated in FIG. 20, cell select FET 325 is in an OFF state with word line $V_{WL}$=0 V. Since select lines are parallel to corresponding word lines, when select line voltages $V_{SL2}$=0 V and $V_{SLN-1}$=0, representative of the other n−1 select line voltages in electrical communication with unselected resistive change elements, which results in zero volts at all terminals of the resistive change elements in unselected multi-switch storage cell 1050. Therefore, there is no disturb of multi-switch storage cell 1050 illustrated in FIG. 20.

Referring now to READ and RESET operations for 3D MSSC array architectures with select lines parallel to word lines illustrated in FIGS. 19 and 20, respectively: 3D MSSC memory READ operation 1900 illustrated in FIG. 19 does not disturb the stored resistance states of resistive change elements in unselected multi-switch storage cell 1050 and any other unselected multi-switch storage cell along bit line BL0, and 3D MSSC memory RESET operation 2000 illustrated in FIG. 20 does not disturb the stored resistance states of resistive change elements in unselected multi-switch storage cell 1050 and any other unselected multi-switch storage cell along bit line BL0.

The operational results described further above with respect to FIGS. 19 and 20 confirm the 3D MSSC array architectural approach in this specification of using the prior art 1T, 1R cell memory array architecture with select lines parallel to word lines as illustrated in prior art FIGS. 1, 2, 5A, and 5B and adding additional resistive change elements with bottom electrodes in electrical communication with each other and the source of the cell select FET for each cell, to generate a 3D MSSC array architecture with select lines parallel to word lines as illustrated in FIG. 3 and described further above and as illustrated in FIGS. 21A-21E, 21I, and FIGS. 24-1 and 24-2 and described further below.

3D MSSC NV Memory with Multi-Switch Storage Cells Formed with Multiple Resistive Change Elements Per Cell in a Bit Line Charge READ Mode At this point in the specification, implementations of additional multi-switch storage cells and corresponding memory arrays and memory functions are described further below.

3D MSSC memories are based on introducing multiple resistive change elements at each node of cell select devices, such as FETs. In these examples, FETs are used as cell select devices. The nonvolatile resistive change elements in the examples shown further below are based on CNT switches. However, the present disclosure is not limited to resistive change elements including CNT fabrics as resistive change materials and that the present disclosure is applicable to resistive change elements comprising another resistive change material such as other carbon allotropes such as Buckyball, graphene flakes, nanocapsules, and nanohorns. Additionally, the present disclosure is applicable to other types of resistive change elements such as phase change, metal oxide, and solid electrolyte.

In these examples, multi-switch storage cells are formed when the bottom electrodes (BE) of multiple CNT switches within a cell are all in electrical communication with the source of the cell select FET. Multiple CNT switches with bottom electrodes BE in electrical communication with the same FET source may be stacked one above the other in multiple layers (levels). Alternatively, multiple CNT switches may be placed within the same level with bottom electrodes BE in electrical communication with the same FET source. Alternatively, multiple CNT switches with bottom electrodes BE in electrical communication with the same FET source may be a combination of stacked CNT switches and CNT switches within the same level.

In the various configurations described above, and illustrated further below, the top electrode TE of each CNT switch in a multi-switch storage cell is in electrical communication with a separate select line SL. These separate select lines are all approximately parallel to each other and approximately parallel to the corresponding word line in electrical communication with the gate of the cell select FET with its source in electrical communication with the bottom electrodes BE of the multiple CNT switches in the multi-switch storage cell. The corresponding array bit line is approximately orthogonal to and overlying the word line and all the select lines in electrical communication with the top electrodes (TE) of the multiple CNT switches in the multi-switch storage cell. The bit line is in electrical communication with the drain of the corresponding cell select FET.

There is one word line electrical connection and one bit line electrical connection for each multi-switch storage cell, independent of the number of CNT switches in the multi-switch storage cell. Also, there is one select line electrical connection per CNT switch in a multi-switch storage cell for each multi-switch storage cell.

The 3D MSSC array architecture described further below is configured and functionally operated in such a way that no current flows between multi-switch storage cells. Such currents between cells are sometimes referred to as sneak path currents. The READ operation, with relatively small signal voltages, is especially sensitive to sneak path currents either leaving or entering the cell whose resistance state is being sensed. Sneak path currents can vary depending on the data stored in other cells within the memory array.

The multi-switch storage cells in 3D MSSC arrays described further below have no sneak path currents and therefore are not disturbed by data stored in other multi-switch storage cells within the 3D MSSC array. However, as described further below, within the same multi-switch storage cell, a select current flows in the selected CNT switch, while parasitic currents may flow in unselected CNT switches within each cell. However, these parasitic currents are predictable and can be calculated and are included when estimating the available READ sense voltage for the multi-switch storage cells for various examples of multi-switch storage cells described further below.

CNT switches in multi-switch storage cells forming 3D MSSC arrays have essentially the same electrical properties as those of CNT switches of 1T, 1R cells described further above. There are no special CNT switch electrical requirements for multi-switch storage cells because sneak path currents have been eliminated by design (architecture) and function (electrical operation) and select and parasitic currents within multi-switch storage cells are predictable (can be calculated) and reproducible. Consequently, RCE electrical characteristics (I-V curves) may be linear and/or nonlinear.

Multi-switch storage cells and 3D MSSC arrays with multi-switch storage cells may be compared with 1T, 1R cell memory arrays with 1T, 1R cells to evaluate the benefits of multiple resistive change elements per cell. A layout-efficient $6F^2$ 1T, 1R cell with SLs approximately parallel to corresponding WLs and BLs approximately orthogonal to and overlying WLs and SLs, illustrated and described further above with respect to FIGS. 1. 2, and 5A and 5B, may be compared with multi-switch storage cells and arrays based on effective cell area, also referred to as effective cell footprint. Dimension F shown in prior art FIG. 2 and shown in FIGS. 3, 21A-21E illustrated and described further below is the minimum allowed technology dimension.

Figure 21A:
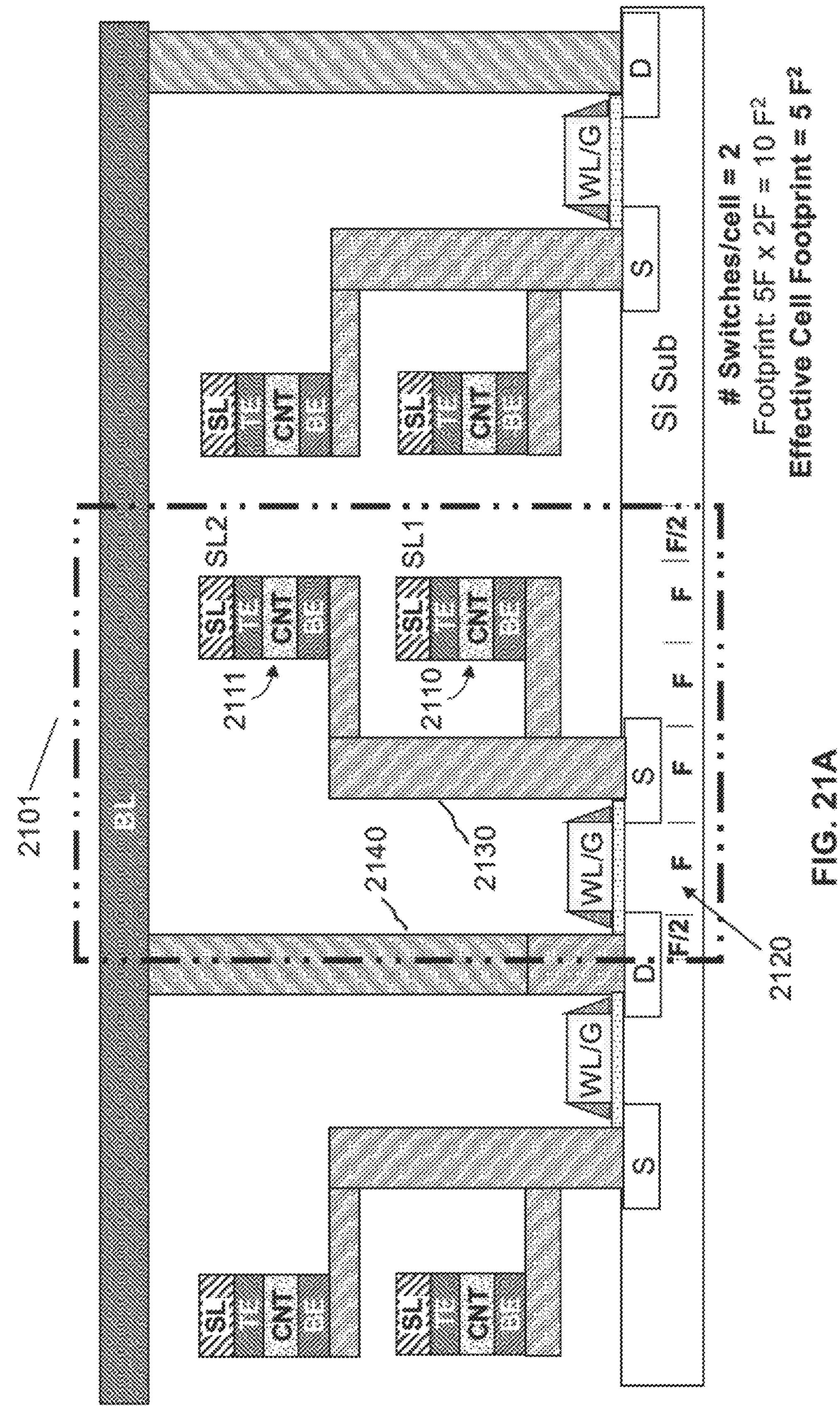
FIG. 21A is a cell cross section of multi-switch storage cells with 2 resistive change elements per cell, where the 2 resistive change elements are on two levels and both positioned between adjacent cells. The bottom electrodes BE of the 2 resistive change elements are in electrical communication with a source of a cell select FET and each top electrode TE is in electrical communication with a separate select line. A bit line is in electrical communication with drains of cell select FETs shown in FIG. 21A and word lines are in electrical communication with gates of cell select FETs shown in FIG. 21A. The word lines and the select lines are approximately parallel and the bit line is approximately orthogonal to and overlays both word lines and select lines.

Referring now to a cell cross section of multi-switch storage cell 2101 illustrated in FIG. 21A. Multi-switch storage cell 2101 shows a 3D 2-switch storage cell with a 2-high stack of first and second resistive change elements 2110, 2111 positioned in the region between adjacent cells. Each of the first and second resistive change elements 2110, 2111, CNT switches in this example, correspond to resistive change element 1410 illustrated in FIGS. 14A and 14B and described further above. Each of resistive change elements 2110, 2111 have a bottom electrode BE electrically connected to cell select FET 2120 source S by intracell wiring 2130. The FET 2120 gate is in electrical communication with a word line WL and FET 2120 drain D is in electrical communication with an approximately orthogonal bit line BL through BL stud 2140. Top electrode TE of first resistive change element 2110 is in electrical communication with select line SL1 and top electrode TE of second resistive change element 2111 is in electrical communication with select line SL2. Select lines SL1 and SL2 are approximately parallel to corresponding word line WL.

In order to accommodate intracell wiring 2130, multi-switch storage cell 2101 illustrated in FIG. 21A increased the footprint of the 1T, 1R cell from $3F\times2F=6F^2$ for a single resistive storage element illustrated in prior art FIG. 2 to $5F\times2F=10F^2$ for multiple resistive storage elements by increasing the cell size in the BL direction by 2F in order to accommodate intracell wiring 2130. The 2F cell size in the SL and WL direction remains the same. Therefore, the effective footprint of multi-switch storage cell 2101 is $5F^2$ ($10F^2/2$), compared with $6F^2$, and the cell footprint is reduced by approximately 17%. In other words, the 3D two resistive change element cell illustrated in FIG. 21A has an effective 1.2× smaller footprint than the single resistive change element cell illustrated in prior art FIG. 2. The operation of multi-switch storage cell 2101 is discussed further below.

Figure 21B:
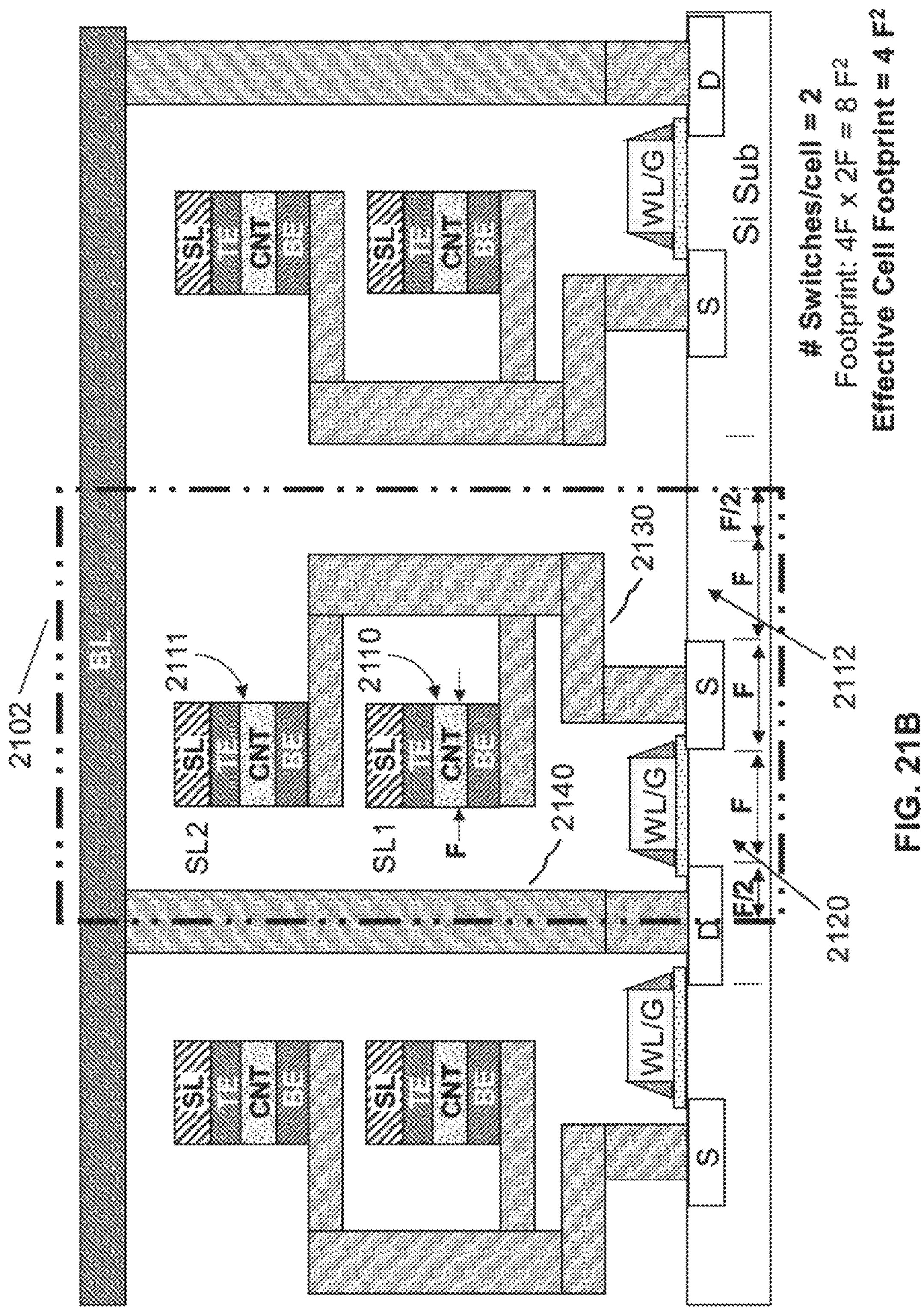
FIG. 21B is a cell cross section of multi-switch storage cells with 2 resistive change elements per cell, where the 2 resistive change elements are on two levels, and both positioned to partially overlay a gate and a source of a cell select FET. The bottom electrodes BE of the 2 resistive change elements are in electrical communication with a source of a cell select FET and each top electrode TE is in electrical communication with a separate select line. A bit line is in electrical communication with drains of cell select FETs shown in FIG. 21B and word lines are in electrical communication with to gates of cell select FETs shown in FIG. 21B. The word lines and the select lines are approximately parallel and the bit line is approximately orthogonal to and overlays both word lines and select lines.

Referring now to a cell cross section of multi-switch storage cell 2102 illustrated in FIG. 21B. Multi-switch storage cell 2102 shows a 3D 2-switch storage cell with a 2-high stack of first and second resistive change elements 2110, 2111 positioned partially above cell select FET 2120 gate and source S. Each of the first and second resistive change elements 2110, 2111, CNT switches in this example, correspond to resistive change element 1410 illustrated in FIGS. 14A and 14B and described above. Each of resistive change elements 2110, 2111 have a bottom electrode BE electrically connected to FET 2120 source S by intracell wiring 2130. The FET 2120 gate is in electrical communication with a word line WL and FET 2120 drain D is in electrical communication with an approximately orthogonal bit line BL through BL stud 2140. Top electrode TE of first resistive change element 2110 is in electrical communication with select line SL1 and top electrode TE of second resistive change element 2111 is in electrical communication with select line SL2. Select lines SL1 and SL2 are approximately parallel to corresponding word line WL.

In order to accommodate intracell wiring 2130, multi-switch storage cell 2102 illustrated in FIG. 21B increased the footprint of the 1T, 1R cell from $3F\times2F=6F^2$ for a single resistive storage element illustrated in prior art FIG. 2 to $4F\times2F=8F^2$ for multiple resistive storage elements by increasing the cell size with added space 2112 in the BL direction, in this example an increase by F in order to accommodate intracell wiring 2130. The cell area (footprint) of multi-switch storage cell 2102 is further illustrated by plan view 2100-6 illustrated in FIG. 21F. The 2F cell size in the SL and WL direction remains the same. Therefore, the effective footprint of multi-switch storage cell 2102 is $4F^2$ ($8F^2/2$), compared with $6F^2$ for the single resistive change element cell, and the cell footprint is reduced by approximately 33%. In other words, the 3D two resistive change element cell illustrated in FIG. 21B has an effective 1.5× smaller footprint than the single resistive change element cell illustrated in prior art FIG. 2.

Multi-switch storage cell 2102 illustrated in FIG. 21B is a modification of plan view 200 illustrated in prior art FIG. 2, a single resistive change element cell having a $6F^2$ layout area (footprint). Multi-switch storage cell 2102 is designed to accommodate multiple resistive change elements with a small increase in cell area (footprint) over the single resistive change element cell having a $6F^2$ layout area shown in FIGS. 1 and 2. The cell area (footprint) of multi-switch storage cell 2102 is further illustrated by plan view 2100-6 illustrated in FIG. 21F. However, with the introduction of multi-switch storage cells, up to 64 resistive change elements or more for example, an increase in current through cell select FET 2120 may be needed, which may be provided by increasing cell select FET 2120 width in the word line direction and thereby increasing cell size in the word line direction from 2F, as shown in plan view 2100-6, to 3F and 4F as shown in by plan views 2100-7 and 2100-8, as illustrated in FIGS. 21G and 21H, respectively, and described further below. The operation of multi-switch storage cell 2102 is discussed further below.

Figure 21C:
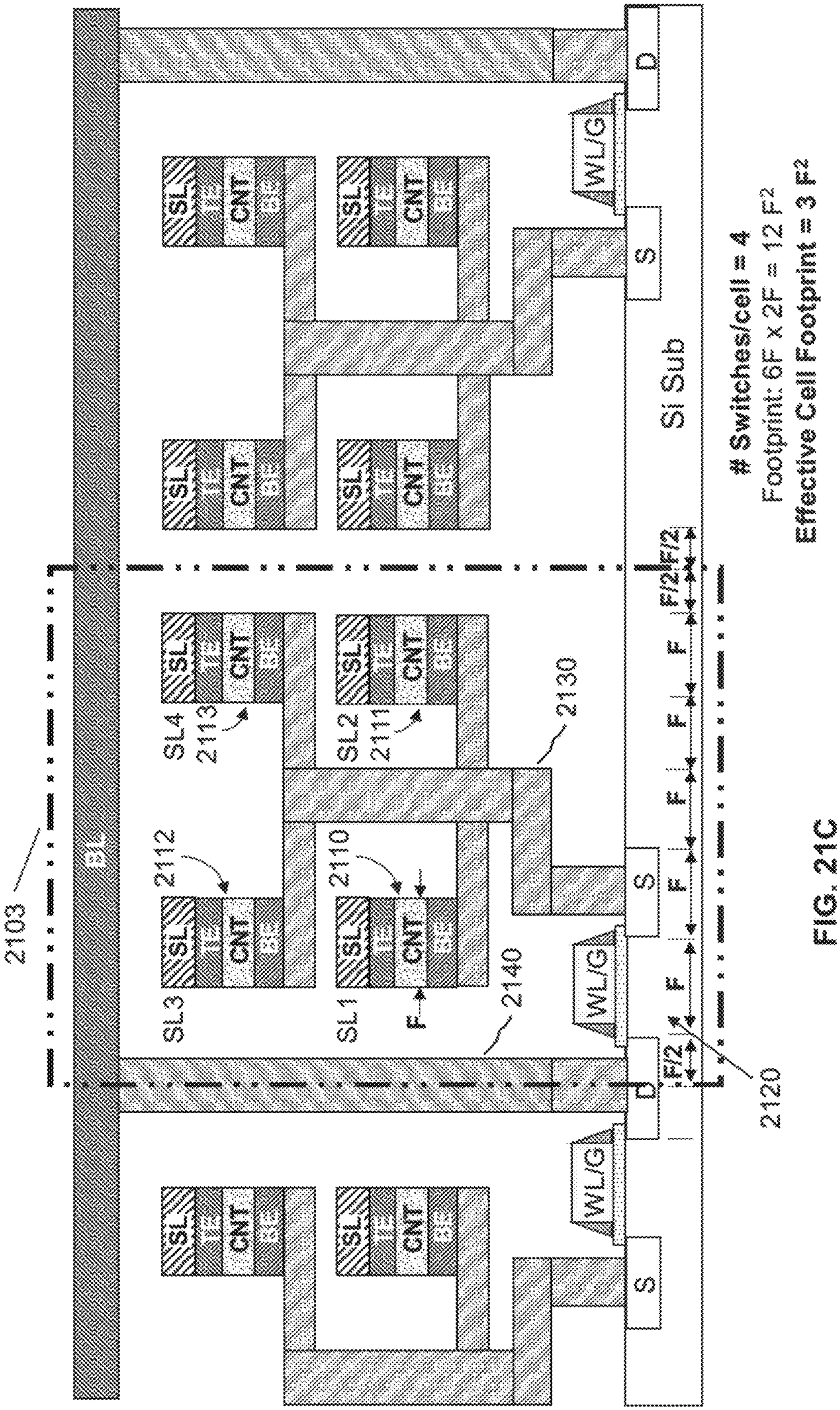
FIG. 21C is a cell cross section of multi-switch storage cells with 4 resistive change elements per cell, where the 4 resistive change elements are on two levels, two of which partially overlay a gate and a source of a cell select FET and two of which are positioned between adjacent cells. The bottom electrodes BE of the 4 resistive change elements are in electrical communication with a source of a cell select FET and each top electrode TE is in electrical communication with a separate select line. A bit line is in electrical communication with drains of cell select FETs shown in FIG. 21C and word lines are in electrical communication with gates of cell select FETs shown in FIG. 21C. The word lines and the select lines are approximately parallel and the bit line is approximately orthogonal to and overlays both word lines and select lines.

Referring now to a cell cross section of multi-switch storage cell 2103 illustrated in FIG. 21C. Multi-switch storage cell 2103 shows a 3D 4-switch storage cell with a 2-high stack of first, second, third, and fourth resistive change elements 2110, 2111, 2112, 2113 positioned partially above the cell select FET 2120 gate and source S and partially in the region between adjacent cells. Each of the first, second, third, and fourth resistive change elements 2110, 2111, 2112, 2113, CNT switches in this example, correspond to resistive change element 1410 illustrated in FIGS. 14A and 14B and described above. Each of the four resistive change elements 2110, 2111, 2112, 2113 have a bottom electrode BE electrically connected to FET 2120 source S by intracell wiring 2130. The FET 2120 gate is in electrical communication with a word line WL and FET 2120 drain D is in electrical communication with an approximately orthogonal bit line BL through BL stud 2140. Top electrode TE of first resistive change element 2110 is in electrical communication with select line SL1, top electrode TE of second resistive change element 2111 is in electrical communication with select line SL2, top electrode TE of third resistive change element 2112 is in electrical communication with select line SL3, and top electrode TE of fourth resistive change element 2113 is in electrical communication with select line SL4. Select lines SL1, SL2, SL3, and SL4 are approximately parallel to corresponding word line WL.

In order to accommodate intracell wiring 2130, multi-switch storage cell 2103 illustrated in FIG. 21C increased the footprint of the 1T, 1R cell from $3F\times2F=6F^2$ for a single resistive storage element illustrated in prior art FIGS. 2 to $6F\times2F=12F^2$ for multiple resistive change elements by increasing the cell size in the BL direction by 3F in order to accommodate intracell wiring 2130. The 2F cell size in the SL and WL direction remains the same. Therefore, the effective footprint of multi-switch storage cell 2103 is $3F^2$ ($12F^2/4$), compared with $6F^2$ for the single resistive change element cell, and the cell footprint is reduced by approximately 50%. In other words, the 3D resistive change element cell illustrated in FIG. 21C has an effective 2× smaller footprint than the single resistive change element cell illustrated in prior art FIG. 2. The operation of multi-switch storage cell 2103 is discussed further below.

Figure 21D:
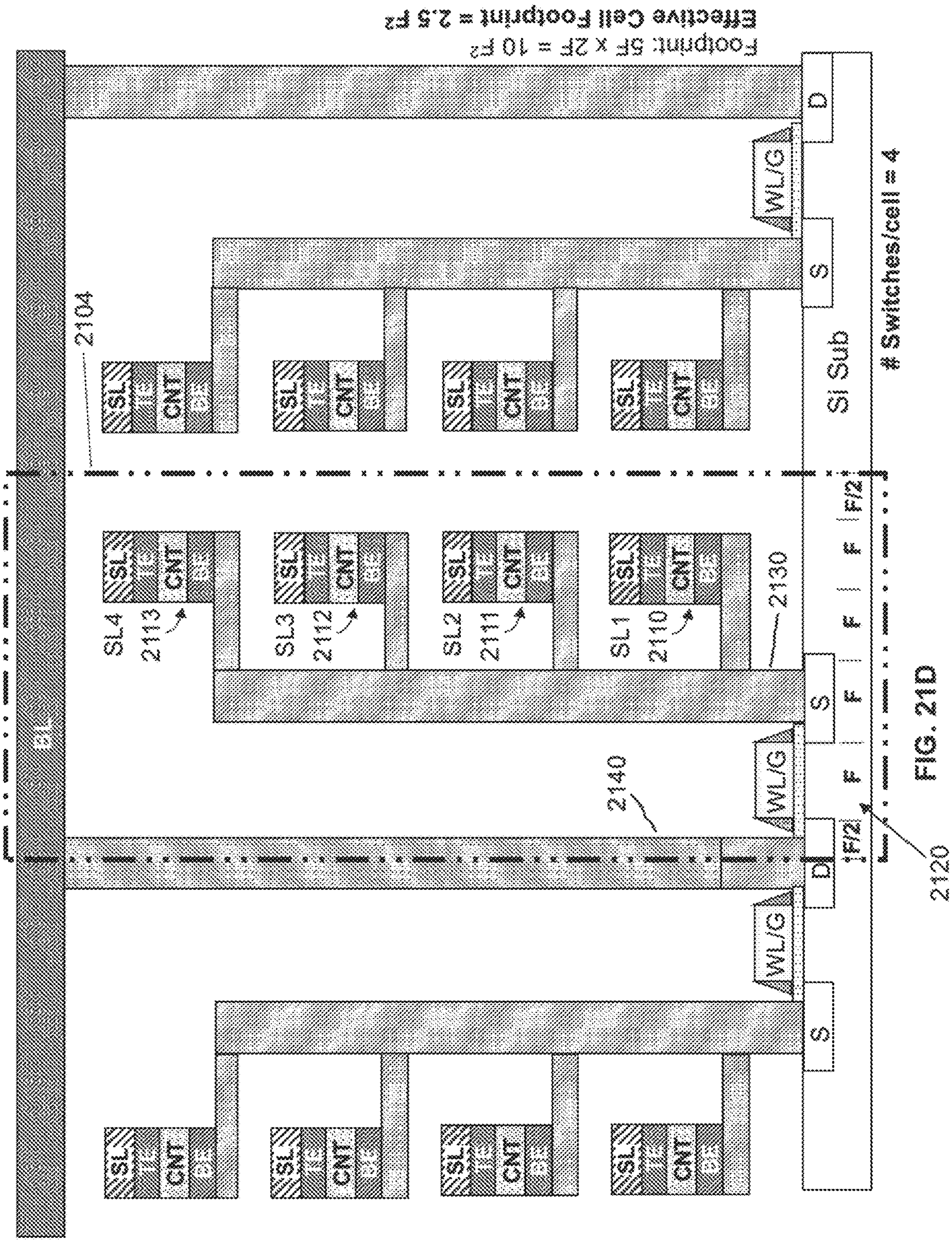
FIG. 21D is a cell cross section of multi-switch storage cells with 4 resistive change elements per cell, where the 4 resistive change elements are on four levels and all four are positioned between adjacent cells. The bottom electrodes BE of the 4 resistive change elements are in electrical communication with a source of a cell select FET and each top electrode TE is in electrical communication with a separate select line. A bit line is in electrical communication with drains of cell select FETs shown in FIG. 21D and word lines are in electrical communication with gates of cell select FETs shown in FIG. 21D. The word lines and the select lines are approximately parallel and the bit line is approximately orthogonal to and overlays both word lines and select lines.

Referring now to a cell cross section of multi-switch storage cell 2104 illustrated in FIG. 21D. Multi-switch storage cell 2104 shows a 3D 4-switch storage cell with a 4-high stack of first, second, third, and fourth resistive change elements 2110, 2111, 2112, 2113 positioned in the region between adjacent cells. Each of the first, second, third, and fourth resistive change elements 2110, 2111, 2112, 2113, CNT switches in this example, correspond to resistive change element 1410 illustrated in FIGS. 14A and 14B and described above. Each of the four resistive change elements 2110, 2111, 2112, 2113 have a bottom electrode BE electrically connected to cell select FET 2120 source S by intracell wiring 2130. The FET 2120 gate is in electrical communication with a word line WL and FET 2120 drain D is in electrical communication with to an approximately orthogonal bit line BL through BL stud 2140. Top electrode TE of first resistive change element 2110 is in electrical communication with select line SL1, top electrode TE of second resistive change element 2111 is in electrical communication with select line SL2, top electrode of third resistive change element 2112 is in electrical communication with select line SL3, and top electrode TE of fourth resistive change element 2110 is in electrical communication with select line SL4. Select lines SL1, SL2, SL3, and SL4 are approximately parallel to corresponding word line WL.

In order to accommodate intracell wiring 2130, multi-switch storage cell 2104 illustrated in FIG. 21D increased the footprint of the 1T, 1R cell from $3F\times2F=6F^2$ for a single resistive storage element illustrated in prior art FIG. 2 to $5F\times2F=10F^2$ for multiple resistive change elements by increasing the cell size in the BL direction by 2F in order to accommodate intracell wiring 2130. The 2F cell size in the SL and WL direction remains the same. Therefore, the effective footprint of multi-switch storage cell 2104 is $2.5F^2$ ($10F^2/4$), compared with $6F^2$, and the cell footprint is reduced by approximately 58%. In other words, the 3D four resistive change element cell illustrated in FIG. 21D has an effective 2.4× smaller footprint than the single resistive change element cell illustrated in prior art FIG. 2. The operation of multi-switch storage cell 2104 is discussed further below.

Figure 21E:
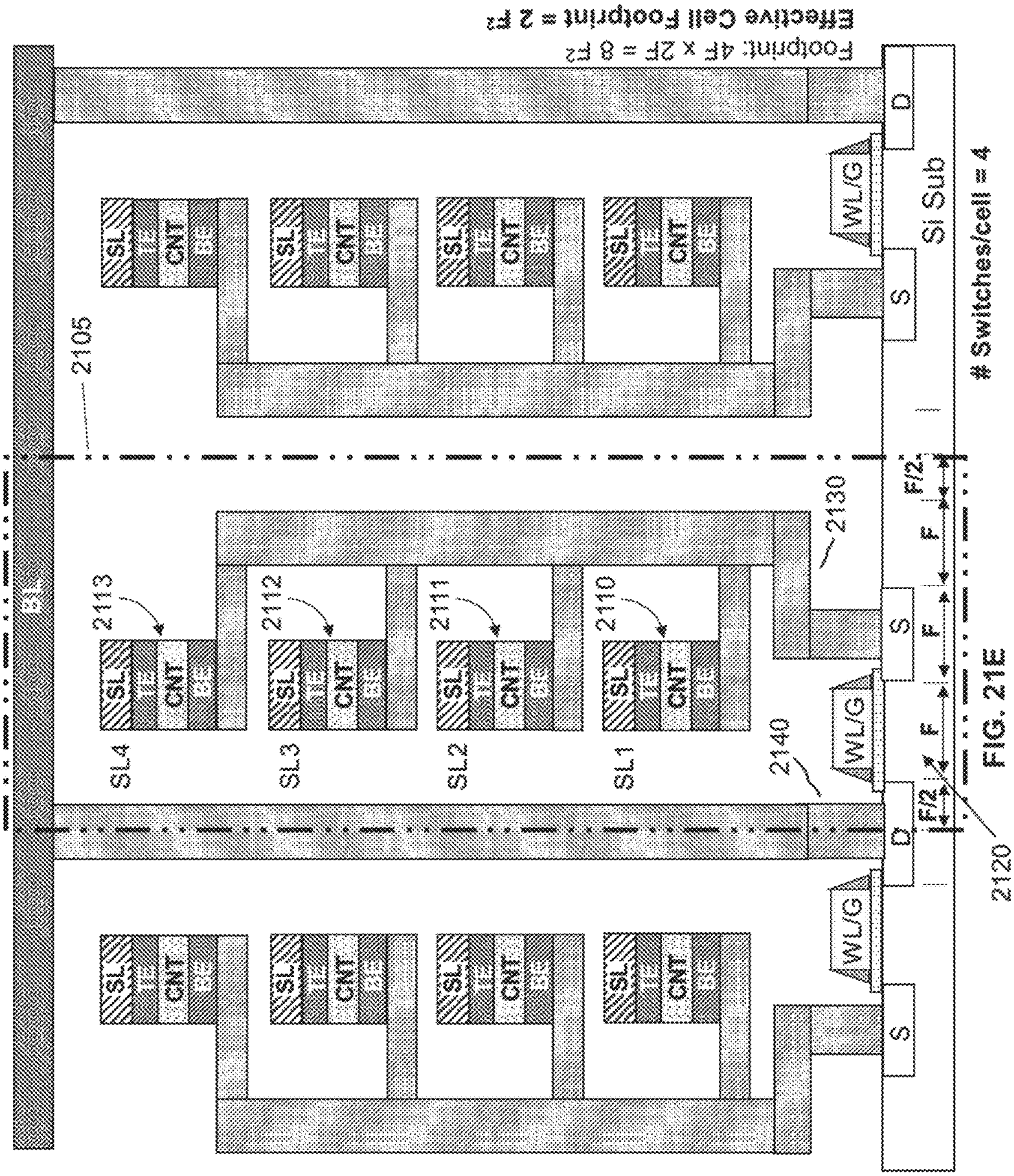
FIG. 21E is a cell cross section of multi-switch storage cells with 4 resistive change elements per cell, where the 4 resistive change elements are on four levels, and all four positioned to partially overlay a gate and a source of a cell select FET. The bottom electrodes BE of the 4 resistive change elements are in electrical communication with a source of a cell select FET and each top electrode TE is in electrical communication with a separate select line. A bit line is in electrical communication with drains of cell select FETs shown in FIG. 21E and word lines are in electrical communication with gates of cell select FETs shown in FIG. 21E. The word lines and the select lines are approximately parallel and the bit line is approximately orthogonal to and overlays both word lines and select lines.

Referring now to a cell cross section of multi-switch storage cell 2105 illustrated in FIG. 21E. Multi-switch storage cell 2105 shows a 3D 4-switch storage cell with a 4-high stack of first, second, third, and fourth resistive change elements 2110, 2111, 2112, 2113 positioned partially above the cell select FET 2120 gate and source S. Each of the first, second, third, and fourth resistive change elements 2110, 2111, 2112, 2113, CNT switches in this example, correspond to resistive change element 1410 illustrated in FIGS. 14A and 14B and described above. Each of the four resistive change elements 2110, 2111, 2112, 2113 have a bottom electrode BE electrically connected to FET 2120 source S by intracell wiring 2130. The FET 2120 gate is in electrical communication with a word line WL and FET 2120 drain D is in electrical communication with an approximately orthogonal bit line BL through BL stud 2140. Top electrode TE of first resistive change element 2110 is in electrical communication with select line SL1, top electrode TE of second resistive change element 2111 is in electrical communication with select line SL2, top electrode of third resistive change element 2112 is in electrical communication with select line SL3 and top electrode TE of fourth resistive change element 2110 is in electrical communication with select line SL4. Select lines SL1, SL2, SL3, and SL4 are approximately parallel to corresponding word line WL.

In order to accommodate intracell wiring 2130, multi-switch storage cell 2105 illustrated in FIG. 21E increased the footprint of the 1T, 1R cell from 3F×2F=6F$^2$ for a single resistive storage element illustrated in prior art FIG. 2 to 4F×2F=8F$^2$ for multiple resistive storage elements by increasing the cell size in the BL direction by F in order to accommodate intracell wiring 2130. The 2F cell size in the SL and WL direction remains the same. Therefore, the effective footprint of multi-switch storage cell 2105 is 2F$^2$ (8F$^2$/4), compared with 6F$^2$, and the cell footprint is reduced by approximately 67%. In other words, the 3D four resistive change element cell illustrated in FIG. 21E has an effective 3× smaller footprint than the single resistive change element cell illustrated in prior art FIG. 2. The operation of multi-switch storage cell 2105 is discussed further below.

Figure 21F:
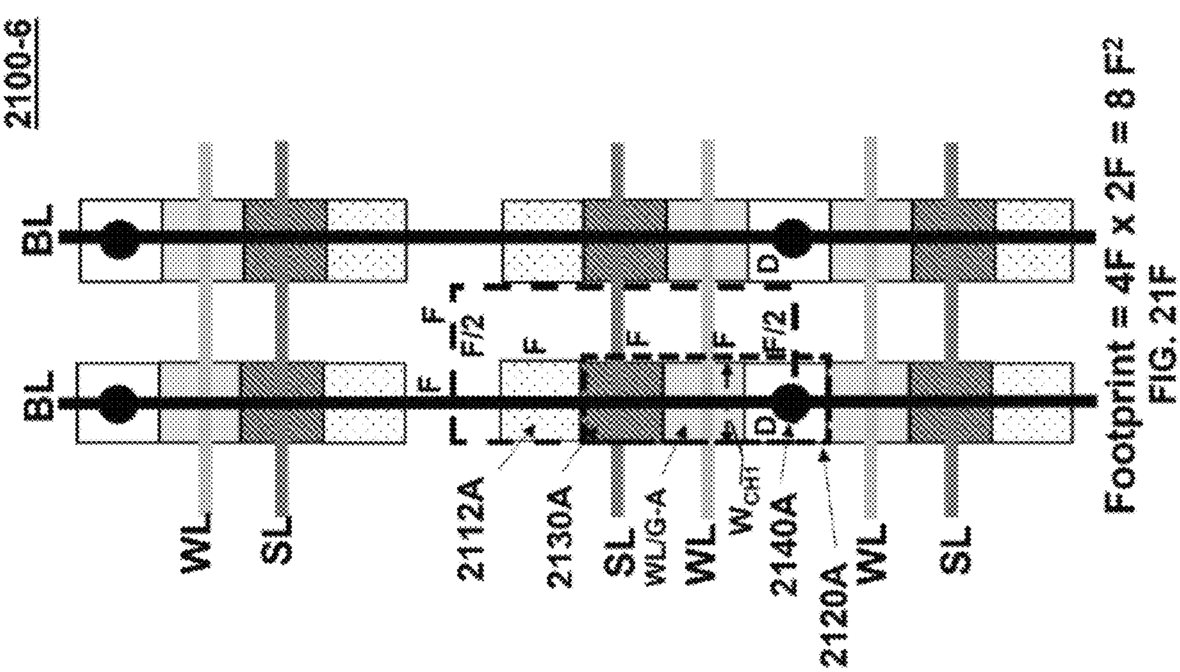
FIG. 21F is a cell and array layout plan view corresponding to a cross sectional view of multi-switch storage cells corresponding to FIG. 21B, with a 4F dimension along the bit line direction and a 2F dimension along the word line direction.
Figure 21G:
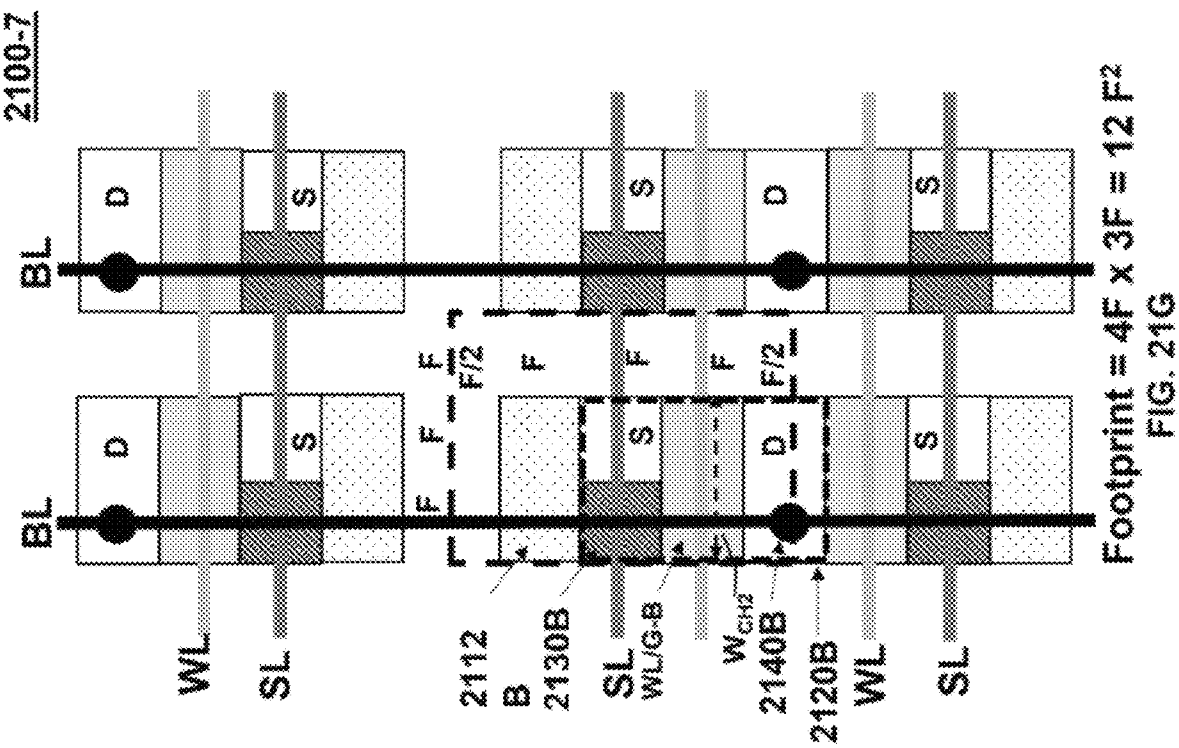
FIG. 21G is a cell and array layout plan view corresponding to a cross sectional view of multi-switch storage cells corresponding to FIG. 21F, with a 4F dimension along the bit line direction and a 3F dimension along the word line direction.
Figure 21H:
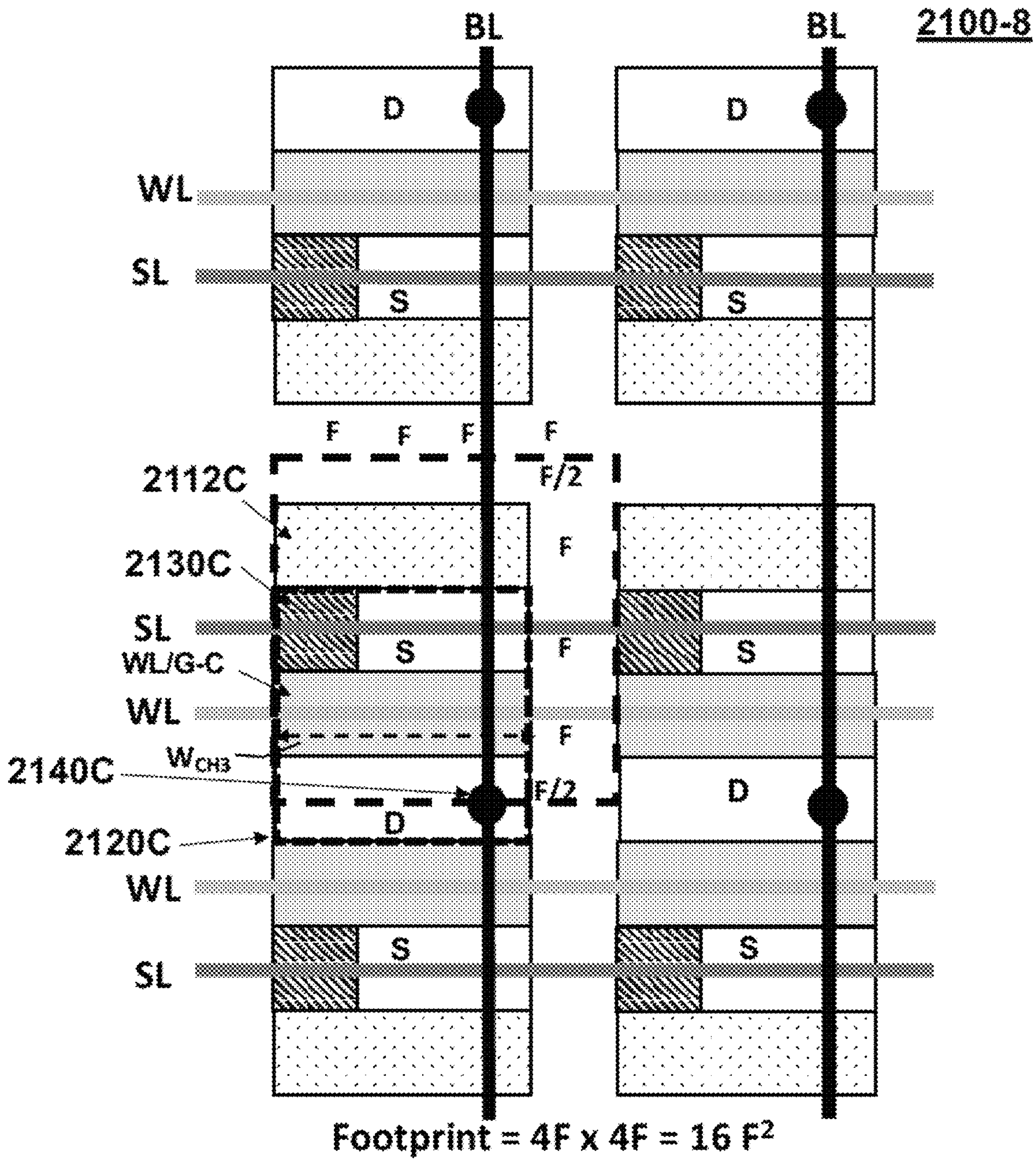
FIG. 21H is a cell and array layout plan view corresponding to a cross sectional view of multi-switch storage cells corresponding to FIG. 21F, with a 4F dimension along the bit line direction and a 4F dimension along the word line direction.
Figure 21I:
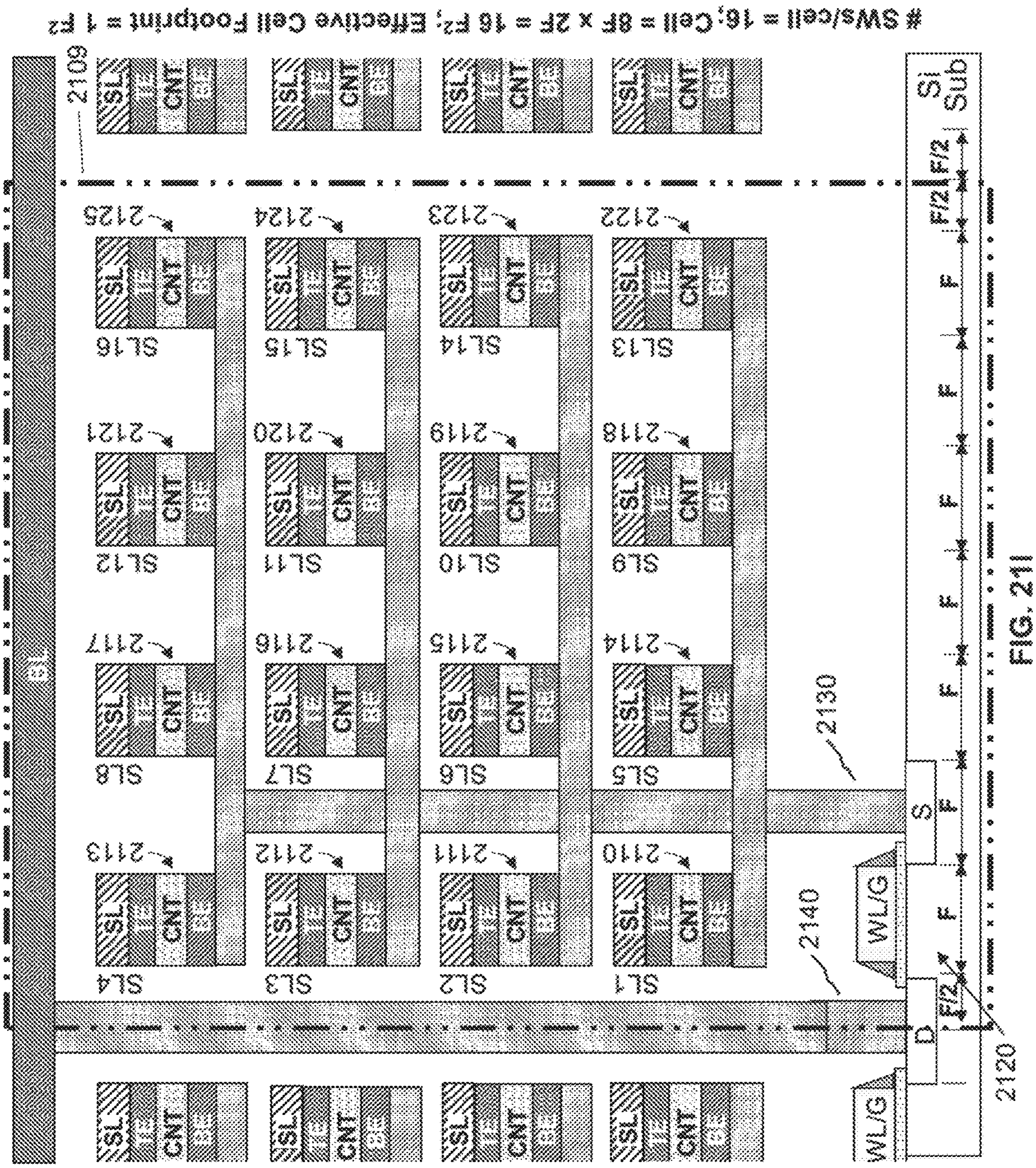
FIG. 21I is a cell cross section of a multi-switch storage cell with 16 resistive change elements per cell, where the 16 resistive change elements are on four levels and all four positioned to partially overlay the gate and source of the cell select FET. The bottom electrodes BE of the 16 resistive change elements are in electrical communication with a source of a cell select FET and each top electrode TE is in electrical communication with a separate select line. The bit line and word line are in electrical communication with the cell select FET drain and gate, respectively. The word line and 16 select lines are approximately parallel and the bit line is approximately orthogonal to and overlays both word and select lines.

Referring now to a cell cross section of multi-switch storage cell 2109 illustrated in FIG. 21I. Multi-switch storage cell 2109 shows a 3D 16-switch storage cell with a 4-high stack of first, second, third, and fourth levels with four resistive change elements per level positioned partially above and adjacent to the cell select FET 2120 gate and source S. Each of first through sixteenth resistive change elements 2110-2125, a CNT switches in this example, correspond to resistive change element 1410 illustrated in FIGS. 14A and 14B described further above. Each of the first through sixteenth resistive change elements 2110-2125 have a bottom electrode BE electrically connected to FET 2120 source S by intracell wiring 2130. The FET 2120 gate is in electrical communication with a word line WL and FET 2120 drain D is in electrical communication with an approximately orthogonal bit line BL through BL stud 2140. Top electrode TE of first resistive change element 2110 is in electrical communication with select line SL1, top electrode of second resistive change element 2111 is in electrical communication with select line SL2, top electrode of third resistive change element 2112 is in electrical communication with select line SL3, top electrode TE of fourth resistive change element 2113 is in electrical communication with select line SL4, top electrode TE of fifth resistive change element 2114 is in electrical communication with select line SL5, top electrode TE of sixth resistive change element 2115 is in electrical communication with select line SL6, top electrode TE of seventh resistive change element 2116 is in electrical communication with select line SL7, top electrode TE of eighth resistive change element 2117 is in electrical communication with select line SL8, top electrode TE of ninth resistive change element 2118 is in electrical communication with select line SL9, top electrode TE of tenth resistive change element 2119 is in electrical communication with select line SL10, top electrode TE of eleventh resistive change element 2120 is in electrical communication with select line SL11, top electrode TE of twelfth resistive change element 2121 is in electrical communication with select line SL12, top electrode TE of thirteenth resistive change element 2122 is in electrical communication with select line SL13, top electrode TE of fourteenth resistive change element 2123 is in electrical communication with select line SL14, top electrode TE of fifteenth resistive change element 2124 is in electrical communication with select line SL15, and top electrode TE of sixteenth resistive change element 2125 is in electrical communication with select line SL16. Select lines SL1, SL2, SL3, SL4, SL5, SL6, SL7, SL8, SL9, SL10, SL11, SL12, SL13, SL 14, SL15, and SL16 are approximately parallel to corresponding word line WL.

In order to accommodate intracell wiring 2130, multi-switch storage cell 2109 illustrated in FIG. 21I increased the footprint of the 1T, 1R cell from 3F×2F=6F$^2$ for a single resistive storage element illustrated in prior art FIG. 2 to 8F×2F=16F$^2$ for multiple resistive storage elements by increasing the cell size in the BL direction by 5F in order to accommodate intracell wiring 2130. The 2F cell size in the SL and WL direction remains the same. Therefore, the effective footprint of multi-switch storage cell 2109 is 1F$^2$ (16F$^2$/16), compared with 6F$^2$, and the cell footprint is reduced by approximately 83%. In other words, the 3D sixteen resistive change element cell illustrated in FIG. 21I has an effective 6× smaller footprint than the single resistive change element cell illustrated in prior art FIG. 2. The operation of multi-switch storage cell 2109 is discussed further below.

As described further above with respect to multi-switch storage cell 2102 illustrated in FIG. 21B and referring now to corresponding cell and array layout plan view 2100-6 illustrated in FIG. 21F, added space 2112A corresponds to added space 2112 illustrated in FIG. 21B. Intracell wiring 2130A corresponds to the portion of intracell wiring 2130 in contact with cell select FET 2120 source S and BL stud 2140A corresponds to the portion of BL stud 2140 in contact with drain D. Cell select FET 2120A corresponds to cell select FET 2120 and has a channel width Wan, where Wan equals the minimum dimension F. Cell select FET 2120A gate WL/G-A corresponds to gate WL/G of corresponding FET 2120. The cell area is 4F×2F=8F$^2$. Array lines WL, SL, and BL are shown as lines for purposes of clarity. However, WL, SL, and BL have a width of approximately F.

Referring now to multi-switch storage cell 2102 illustrated in FIG. 21B and cell and array layout plan view 2100-7 illustrated in FIG. 21G. Intracell wiring 2130B corresponds to the portion of intracell wiring 2130 in contact with cell select FET 2120 source S and BL stud 2140B corresponds to the portion of BL stud 2140 in contact with drain D. Cell select FET 2120B, corresponding to FET 2120, is shown having a gate width $W_{CH2}$ equal to 2F in the word line direction, which is twice as wide as the gate width of cell select FET 2120A, in order to be able to conduct approximately twice the current at approximately the same drain-to-source voltage. Cell select FET 2120B source S and drain D are also 2F, which is twice as wide as those of cell select FET 2120A, as is added space 2112B, also approximately equal to 2F, twice as wide as added space 2112A. FIG. 21G shows a gate width of approximately 2F. The cell area is 4F×3F=12 F$^2$. However, if the current only requires an increase of approximately 50%, for example, then $W_{CH2}$ will have a gate width of 1.5 F and the cell footprint will be 4F×2.5F=10 F$^2$.

Referring now to multi-switch storage cell 2102 illustrated in FIG. 21B and cell and array layout plan view 2100-8 illustrated in FIG. 21H. Intracell wiring 2130C corresponds to the portion of intracell wiring 2130 in contact with cell select FET 2120 source S and BL stud 2140C corresponds to the portion of BL stud 2140 in contact with drain D. Cell select FET 2120C, corresponding to FET 2120, is shown having a gate width Wan equal to 3F in the word line direction, which is three times as wide as the gate width of cell select FET 2120A, in order to be able to conduct approximately three times the current at approximately the same drain-to-source voltage. Cell select FET 2120C source S and drain D are also 3F, which is three times as wide as those of cell select FET 2120A, as is added space 2112C, also approximately equal to 3F, three times as wide as added space 2112A. FIG. 21H shows a gate width of approximately 3F. The cell area is 4F×4F=16 $F^2$. However, if the current only requires an increase of approximately 25% greater than $W_{CH2}$, then Wan will have a gate width of 2.5 F and the cell footprint will be 4F×3.5F=14 $F^2$.

Referring now to FIG. 21H, with a cell width of 4F in the word line direction, bit line BL having a width F and a separation F from intracell wiring 2130C, may now be placed above the word line WL and below the first level of resistive change elements in the multi-switch cell. Therefore, for multi-switch cells of having widths of 4F or greater in the word line direction are not required to have bit lines BL overpassing select lines S. The architecture of cell and array layout plan view 2100-8 illustrated in FIG. 21H may be described as select lines SL approximately parallel to word lines WL with bit lines BL approximately orthogonal to WLs and SLs, and overpassing word lines WL.

Figure 22:
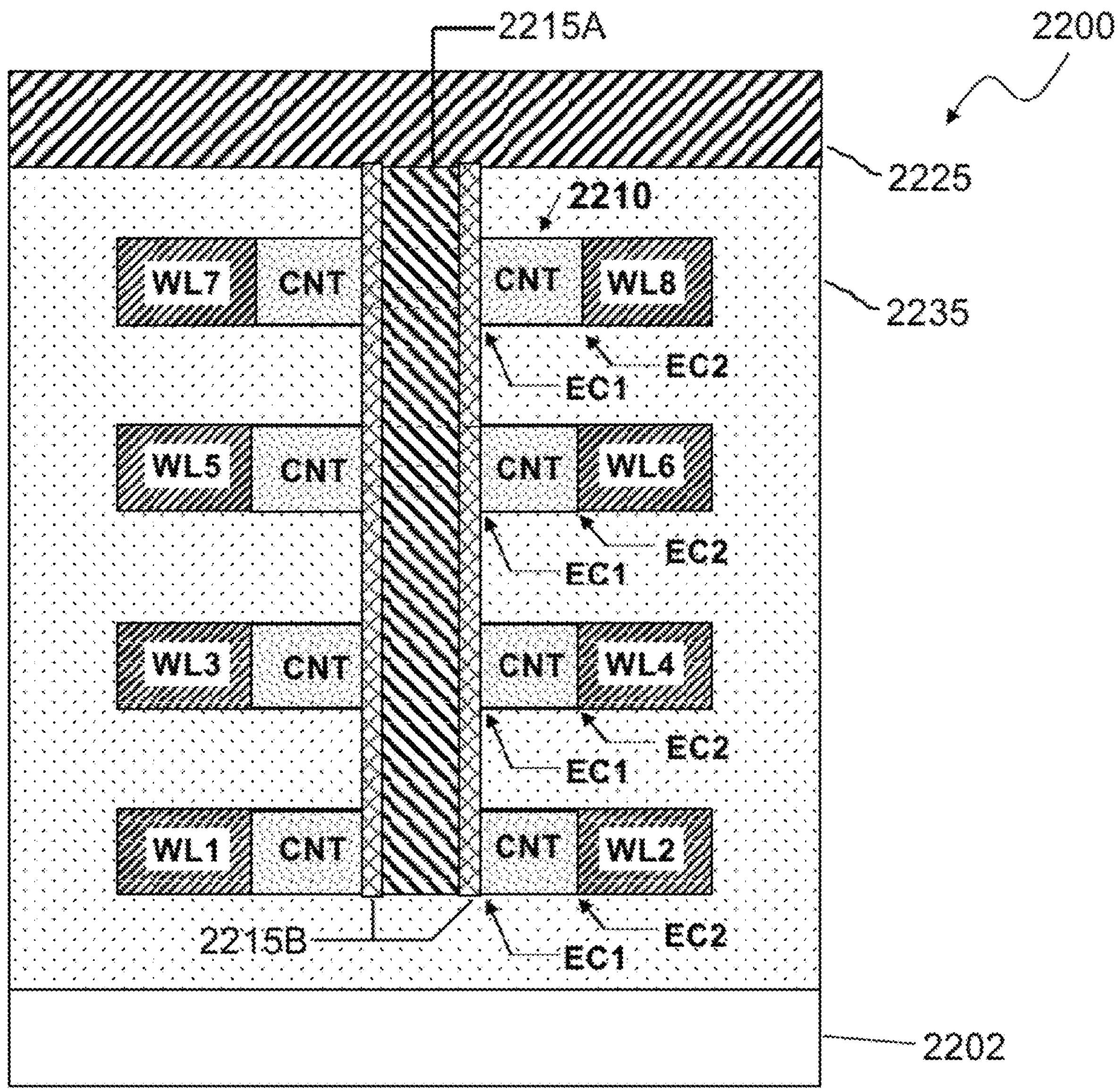
FIG. 22 is a prior art 3D cross point cell cross section with 8 resistive change elements per cell, on four levels. Each resistive change element has a first end contact formed by a CNT fabric in contact with a vertical bit line segment and a second end contact in contact with a corresponding word line. The first end contact of all 8 resistive change elements are in contact with the vertical bit line segment, which is in electrical communication with an array line. The second contact of each of the 8 resistive change elements are in contact with a separate word line.

An example of a 3D cross point cell with multiple resistive change elements is illustrated in U.S. Pat. No. 9,917,139 issued to Bertin. Prior art FIG. 22 illustrates 3D cross point cell 2200 formed with resistive change elements formed with corresponding CNT switches. 3D cross point cell 2200 includes 8 resistive change elements on four levels. Each resistive change element of the 3D cross point cell 2200 has the same structure, and thus, the discussion below of resistive change element 2210 is applicable to each resistive change element of the 3D cross point cell 2200. Resistive change element 2210, formed with a corresponding CNT switch, includes a CNT fabric CNT with a first end contact EC1 and a second end contact EC2. End contacts may be formed by CNT fabric in direct contact with an array line, such as end contact EC2 in contact with word line WL8 for example. Alternatively, end contacts, such as end contact EC1, may be formed by an optional contact material, such as optional contact liner 2215B for example, to achieve desired contact properties to the CNT fabric, and to an array line such as vertical bit line segment 2215A, which is in electrical communication with array wire 2225. Insulator 2235 fills in the region between bit line BL and substrate 2202.

Figure 23:
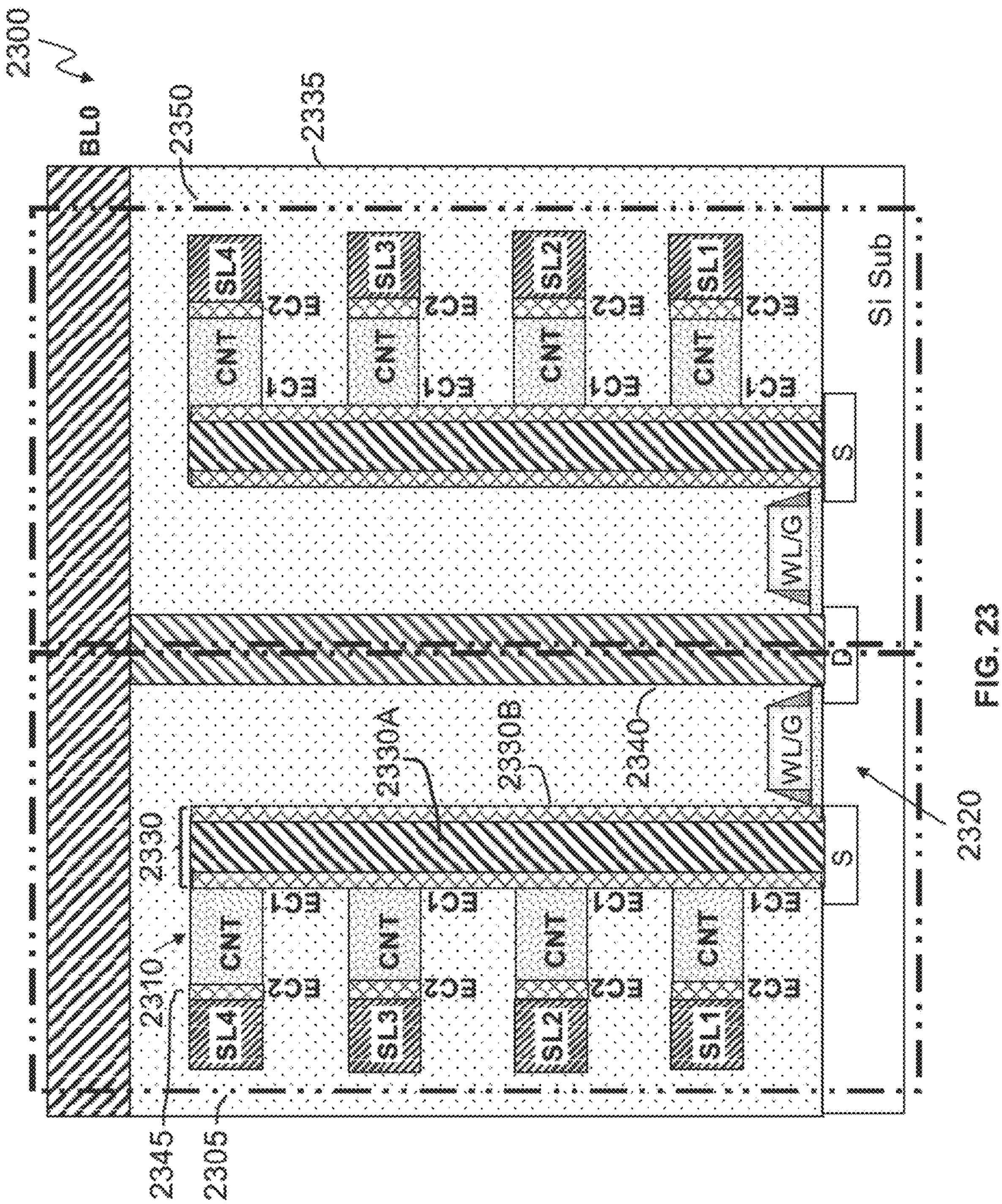
FIG. 23 is a cell cross section of a 3D MSSC array with multi-switch storage cells having 4 resistive change elements per cell, on four levels. Each resistive change element has a first end contact formed by a CNT fabric in contact with a cell stud and a second end contact in electrical communication with a corresponding select line. The first end contact of all 4 resistive change elements are in contact with the cell stud, which is in electrical communication with the source of the cell select FET. The second contact of each of the 4 resistive change elements is in electrical communication with a separate select line. The gate of the cell select FET is in electrical communication with a word line approximately parallel to the select lines and a bit line orthogonal to the word line and select lines is in electrical communication with the drain of the cell select FET.

Referring now to 3D MSSC array 2300 illustrated in FIG. 23 and 3D MSSC array 300 illustrated in FIG. 3, resistive change elements 310 may be replaced with resistive change elements 2310. Each resistive change element of the multi-switch storage cell 2305 has the same structure as resistive change element 2310, and thus, the discussion of resistive change element 2310 above and below is applicable to each resistive change element of the multi-switch storage cell 2305. Resistive change element 2310 includes a CNT fabric CNT with a first end contact EC1 and a second end contact EC2 similar in structure to resistive change element 2210 illustrated in prior art FIG. 22. However, resistive change element 2310 electrical characteristics correspond to those described further above with respect to FIGS. 3, 10, and 11A and 11B, for example. The second end contact EC2 of resistive change element 2310 is in contact with a second side surface of a CNT fabric CNT and the first end contact EC1 of resistive change element 2310 is in contact with a first side surface of the CNT fabric CNT. Element 2310 is referred to as a CNT switch and a resistive change element in this application.

FIG. 23 illustrates 3D MSSC array 2300 formed with multi-switch storage cells and an array architecture in which select lines are approximately parallel to word lines and bit lines are approximately orthogonal to and overpassing select lines and word lines. Multi-switch storage cell 2305 includes a cell select FET 2320, four resistive change elements 2310 that are stacked and interconnected, and a cell stud 2330. 3D MSSC memory array 2300 is formed with multi-switch storage cells 2305 at each word line-bit line intersection and corresponding array interconnections. Multi-switch storage cell 2350 is a mirror image of multi-switch storage cell 2305. In this example, multi-switch storage cells are formed with 4 layers of CNT switches and corresponding array interconnections. Cell stud 2330 electrically connects CNT switch first end contacts EC1 together and to the source S of the underlying cell select FET 2320. Cell stud 2330 may be formed using trench etch and fill tools available in the semiconductor industry. Cell stud 2330 may include an optional contact liner 2330B and inner filled via 2330A. End contact EC1 may be formed by contact to optional contact liner 2330B for example, to achieve desired contact properties to a first side surface of the CNT fabric, which is in electrical communication with filled via 2330A. Alternatively, end contact EC1 may be formed by direct contact between a first side surface of the CNT fabric and filled via 2330A. Separate select lines SL1, SL2, SL3, and SL4, are each in electrical communication with a second end contact EC2 of one of the four stacked CNT switches and multiple second end contacts of CNT switches in other multi-switch storage cells along the word line direction. As shown in FIG. 23 with respect to resistive change element 2310, end contact EC2 may be formed by optional contact material 2345 for example, to achieve desired contact properties to a second side surface of the CNT fabric, which is in electrical communication with select line SL4. Alternatively, end contact EC2 may be formed by direct contact between the second side surface of the CNT fabric and a select line such as between the second side surface of the CNT fabric of resistive change element 2310 and select line SL4. Bit line BL0 is in electrical communication with the drain of cell select FET 2320 through bit line stud 2340. Each multi-switch storage cell along the word line direction is in electrical communication with a corresponding bit line BL, which is orthogonal to the word line WL/G in each cell and orthogonal to the select lines SL1, SL2, SL3, and SL4. Insulator 2335 fills in the region between bit line BL0 and the silicon substrate Si Sub.

Referring now to FIG. 23, 3D MSSC array 2300 operation is essentially the same as described with respect to FIGS. 3, 10, 11A-11E. Interconnections of the resistive change elements 2310 may be in other 3D MSSC array configurations, such as those illustrated in FIGS. 21A-21E. READ, WRITE, and RESET-before-WRITE operations using 3D MSCC array 2300 are the same as those described with respect to 3D MSSC arrays illustrated in FIGS. 3, 10, 21A-21E.

At this point in the specification, multi-switch storage cell array schematic representations, 3D MSSC memory open architecture schematics, and multi-switch cell equivalent circuit models are used to quantify READ and WRITE operations.

Referring now to open architecture schematic 1300 illustrated in FIG. 13A, and storage subarrays 605-0 and 605-1 having storage cell schematics with a single resistive change element per cell, each of these cells may be replaced by any of the multi-switch storage cells illustrated in FIGS. 3 and 21A-21E, while maintaining the same word lines and bit lines shown in FIG. 13A. However, the number of select lines per storage cell increases to a select line for each resistive change element in the multi-switch storage cells as illustrated in FIGS. 3, and 21A-21E. These multi-switch storage cells are a representation of some possible configurations. However, there are substantially more possible multi-switch storage cell configurations, illustrated schematically and described further below with respect to multi-switch storage cell memory array schematic 2400 illustrated in FIGS. 24-1 and 24-2.

Referring now to storage subarrays 605-0 and 605-1 shown in FIG. 13A having single resistive change element cells, subarray 605-0 and 605-1 density may be increased by more than an order of magnitude, without technology scaling to smaller dimensions, by replacing these cells with multi-switch storage cells as illustrated schematically and described further below with respect to FIGS. 24-1 and 24-2.

Referring now to storage subarray 605-0 illustrated in FIG. 13A, single resistive change element cells CELL000, CELL010, CELL101, and CELL110, may be replaced by multi-switch storage cells CELLy000, CELLy010, CELLy101, and CELLy110, respectively, to form a subset of schematic representation of multi-switch storage cell memory array 2400. Cell select FETs $T_{X0}$ in electrical communication with WL[0] and BL[0], $T_{X2}$ in electrical communication with WL[1] and BL[0], $T_{X0}$ in electrical communication with WL[2] and BL[0], and $T_{X6}$ in electrical communication with WL[3] and BL[0], as illustrated in storage subarray 605-0, correspond to cell select FETs Ty0 in electrical communication with WL[0] and BL[0], Ty2 in electrical communication with WL[1] and BL[0], Ty4 in electrical communication with WL[2] and BL[0], and Ty6 in electrical communication with WL[3] and BL[0], respectively, as illustrated in schematic representation of multi-switch storage cell memory array 2400.

Figures 1, 24:
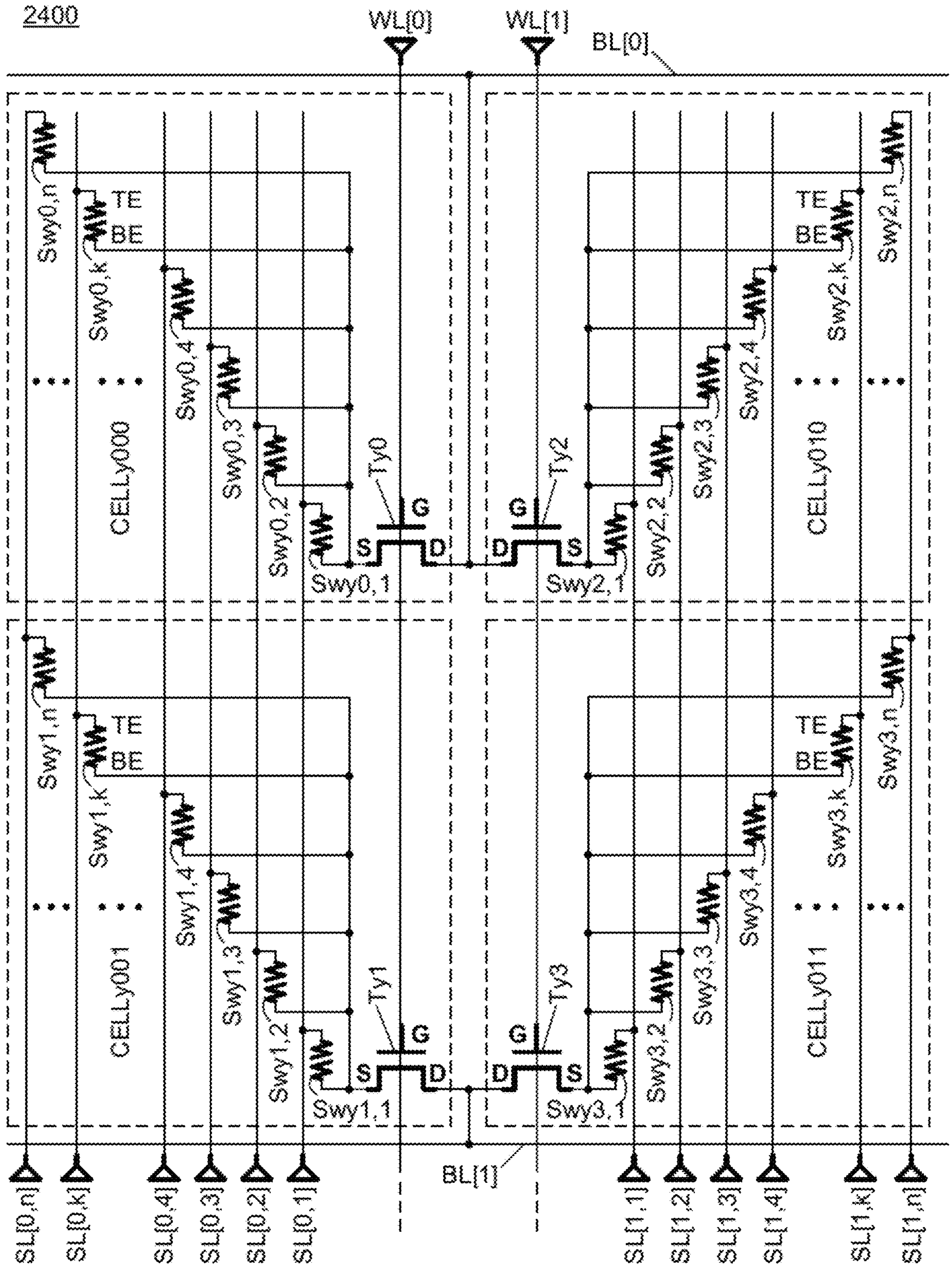
Figures 2, 24:
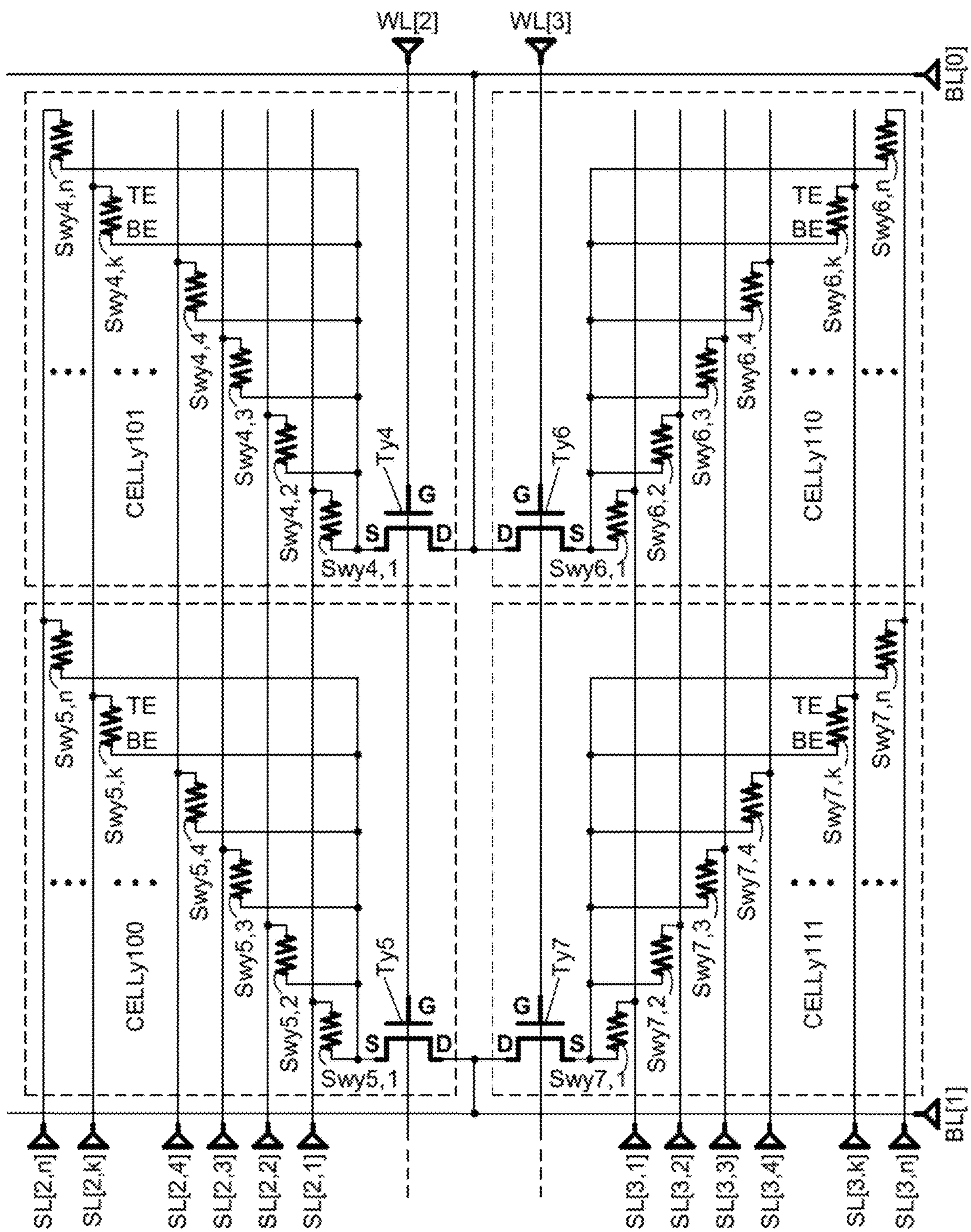

Referring now to CELL000 of storage subarray 605-0 illustrated in FIG. 13A and CELLy000 of schematic representation of multi-switch storage cell memory array 2400 illustrated in FIGS. 24-1 and 24-2, resistive change element SWx0 in electrical communication with select line SL[0] is replaced by resistive change element switches SWy0,1 in electrical communication with select line SL[0,1]; SWy0,2 in electrical communication with select line SL[0,2]; SWy0,3 in electrical communication with select line SL[0,3]; SWy0,4 in electrical communication with select line SL[0,4]; SWy0,k in electrical communication with select line SL[0,k]; . . . SWy0,n in electrical communication with select line SL[0,n], where k is representative of any switch number within a multi-switch storage cell, 1 represents a first resistance switch, and n represents a last resistance switch of each multi-switch storage cell.

Referring now to CELL010 of storage subarray 605-0 illustrated in FIG. 13A and CELLy010 of schematic representation of multi-switch storage cell memory array 2400 illustrated in FIGS. 24-1 and 24-2, resistive change element switch SWx2 in electrical communication with select line SL[1] is replaced by resistive change element switches SWy2,1 in electrical communication with select line SL[1,1]; SWy2,2 in electrical communication with select line SL[1,2]; SWy2,3 in electrical communication with select line SL[1,3]; SWy2,4 in electrical communication with select line SL[1,4]; . . . SWy2,k in electrical communication with select line SL[1,k]; . . . SWy2,n in electrical communication with select line SL[1,n], where k is representative of any switch number within a multi-switch storage cell, 1 represents a first resistance switch, and n represents a last resistance switch of each multi-switch storage cell.

Referring now to CELL101 of storage subarray 605-0 illustrated in FIG. 13A and CELLy101 of schematic representation of multi-switch storage cell memory array 2400 illustrated in FIGS. 24-1 and 24-2, resistive change element switch SWx4 in electrical communication with select line SL[2] is replaced by resistive change element switches SWy4,1 in electrical communication with select line SL[2,1]; SWy4,2 in electrical communication with select line SL[2,2]; SWy4,3 in electrical communication with select line SL[2,3]; SWy4,4 in electrical communication with select line SL[2,4]; . . . SW4,k in electrical communication with select line SL[2,k]; . . . SWy4,n in electrical communication with select line SL[2,n], where k is representative of any switch number within a multi-switch storage cell, 1 represents a first resistance switch, and n represents a last resistance switch of each multi-switch storage cell.

Referring now to CELL110 of storage subarray 605-0 illustrated in FIG. 13A and CELLy110 of schematic representation of multi-switch storage cell memory array 2400 illustrated in FIGS. 24-1 and 24-2, resistive change element switch SWx6 in electrical communication with select line SL[3] is replaced by resistive change element switches SWy6,1 in electrical communication with select line SL[3,1]; SWy6,2 in electrical communication with select line SL[3,2]; SWy6,3 in electrical communication with select line SL[3,3]; SWy6,4 in electrical communication with select line SL[3,4]; . . . SWy6,k in electrical communication with select line SL[3,k]; . . . SWy6,n in electrical communication with select line SL[3,n], where k is representative of any switch number within a multi-switch storage cell, 1 represents a first resistance switch, and n represents a last resistance switch of each multi-switch storage cell.

Referring now to storage subarray 605-1 illustrated in FIG. 13A, single resistive change element cells CELL001, CELL011, CELL100, and CELL111, may be replaced by multi-switch storage cells CELLy001, CELLy011, CELLy100, and CELLy111, respectively, to form a subset of schematic representation of multi-switch storage cell memory array 2400. Cell select FETs $T_{X1}$ in electrical communication with WL[0] and BL[1], $T_{X3}$ in electrical communication with WL[1] and BL[1], $T_{X5}$ in electrical communication with WL[2] and BL[1], and $T_{X7}$ in electrical communication with WL[3] and BL[1], as illustrated in storage subarray 605-1, correspond to cell select FETs Ty1 in electrical communication with WL[0] and BL[1], Ty3 in electrical communication with WL[1] and BL[1], Ty5 in electrical communication with WL[2] and BL[1], and Ty7 in electrical communication with WL[3] and BL[1], respectively, as illustrated in schematic representation of multi-switch storage cell memory array 2400.

Referring now to CELL001 of storage subarray 605-1 illustrated in FIG. 13A and CELLy001 of schematic representation of multi-switch storage cell memory array 2400 illustrated in FIGS. 24-1 and 24-2, resistive change element switch SWx1 in electrical communication with select line SL[0] is replaced by resistive change element switches SWy1,1 in electrical communication with select line SL[0,1]; SWy1,2 in electrical communication with select line SL[0,2]; SWy1,3 in electrical communication with select line SL[0,3]; SWy1,4 in electrical communication with select line SL[0,4]; . . . SWy1,k in electrical communication with select line SL[0,k]; . . . SWy1,n in electrical communication with select line SL[0,n], where k is representative of any switch number within a multi-switch storage cell, 1 represents a first resistance switch, and n represents a last resistance switch of each multi-switch storage cell.

Referring now to CELL011 of storage subarray 605-1 illustrated in FIG. 13A and CELLy011 of schematic representation of multi-switch storage cell memory array 2400 illustrated in FIGS. 24-1 and 24-2, resistive change element switch SWx3 in electrical communication with select line SL[1] is replaced by resistive change element switches SWy3,1 in electrical communication with select line SL[1,1]; SWy3,2 in electrical communication with select line SL[1,2]; SWy3,3 in electrical communication with select line SL[1,3]; SWy3,4 in electrical communication with select line SL[1,4]; . . . SWy3,k in electrical communication with select line SL1,k]; . . . SWy3,n in electrical communication with select line SL[1,n], where k is representative of any switch number within a multi-switch storage cell, 1 represents a first resistance switch, and n represents a last switch of each multi-switch storage cell.

Referring now to CELL100 of storage subarray 605-1 illustrated in FIG. 13A and CELLy100 of schematic representation of multi-switch storage cell memory array 2400 illustrated in FIGS. 24-1 and 24-2, resistive change element switch SWx5 in electrical communication with select line SL[2] is replaced by resistive change element switches SWy5,1 in electrical communication with select line SL[2, 1]; SWy5,2 in electrical communication with select line SL[2,2]; SWy5,3 in electrical communication with select line SL[2,3]; SWy5,4 in electrical communication with select line SL[2,4]; SWy5,k in electrical communication with select line SL2,k]; SWy5,n in electrical communication with select line SL[2,n], where k is representative of any switch number within a multi-switch storage cell, 1 represents a first resistance switch, and n represents a last resistance switch of each multi-switch storage cell.

Referring now to CELL111 of storage subarray 605-1 illustrated in FIG. 13A and CELLy111 of schematic representation of multi-switch storage cell memory array 2400 illustrated in FIGS. 24-1 and 24-2, resistive change element switch SWx7 in electrical communication with select line SL[3] is replaced by resistive change element switches SWy7,1 in electrical communication with select line SL[3, 1]; SWy7,2 in electrical communication with select line SL[3,2]; SWy7,3 in electrical communication with select line SL[3,3]; SWy7,4 in electrical communication with select line SL[3,4]; SWy7,k in electrical communication with select line SL3,k]; SWy7,n in electrical communication with select line SL[3,n], where k is representative of any switch number within a multi-switch storage cell, 1 represents a first resistance switch, and n represents a last resistance switch of each multi-switch storage cell.

In summary, all select lines shown in FIGS. 24-1 and 24-2 are in electrical communication with the top electrode TE of corresponding resistive change elements in corresponding multi-switch storage cells, and all bottom electrodes BE of resistive change elements within each multi-switch storage cell, are in electrical communication with each other and a source of the corresponding cell select FET.

At this point in the specification, select lines charge corresponding bit lines in READ operations of representative cells in multi-switch storage cell memory array 2400 illustrated in FIGS. 24-1 and 24-2 as described further below. In the READ operation examples described further below, the operation of representative cells CELLy000 and CELLy001 for n=2, 4, 8, 16, 32, and 64 resistive change elements per cell is illustrated and described.

Figure 25A:
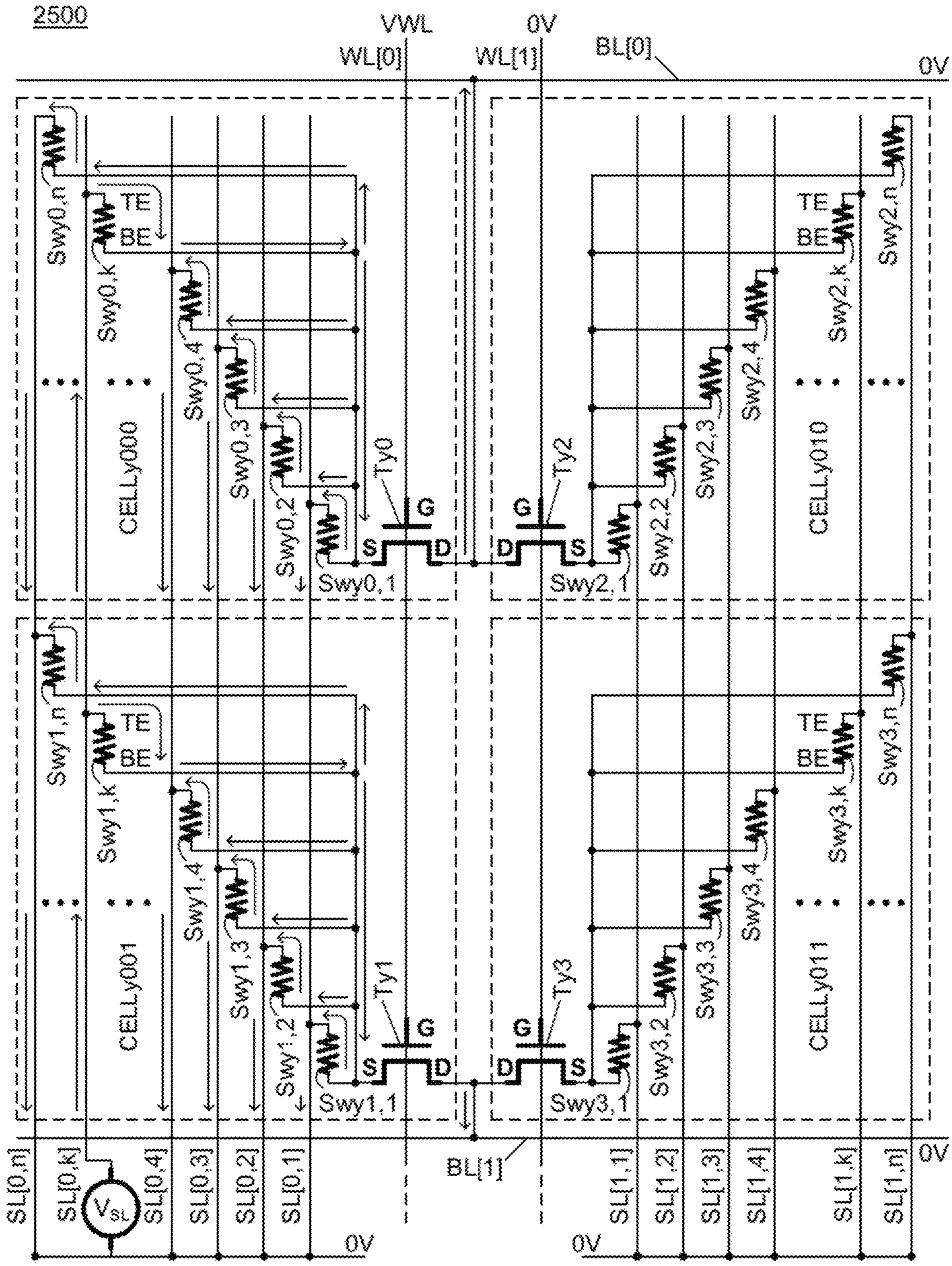
FIG. 25A corresponds to the schematic representation of FIG. 24-1 in a READ operating mode in which a select line voltage is applied to a selected resistive change element in each selected multi-switch storage cell that charges a corresponding bit line at different rates determined by the stored resistance value. Each of the unselected resistive change elements have the corresponding select line in electrical communication with ground.

Referring now to multi-switch storage cell array READ operation 2500 illustrated in FIG. 25A, in these examples, representative word line WL[0] is driven to word line voltage $V_{WL}$ and activates cell select FETs Ty0 in cell CELLy000 and FET Ty1 in cell CELLy001, electrically connecting bit line BL[0] with the corresponding source of cell select FET Ty0 and bit line BL[1] with the corresponding source of cell select FET Ty1, respectively.

Corresponding select line voltage $V_{SL}$ is applied to corresponding representative select line SL[0,k], which is in electrical communication with the top electrode TE of resistive change elements SWy0,k of CELLy000 and SWy1,k of CELLy001 as shown in FIG. 25A. All other corresponding select lines SL[0,1], SL[0,2], SL[0,3], SL[0, 4], SL[0,k−1], SL[0,k+1], . . . , SL[0,n] are in electrical communication with corresponding top electrodes TE of corresponding resistive change elements and are at zero volts. The bottom electrodes BE of all resistive change elements within each cell are in electrical communication with each other and the corresponding cell select FET. Referring now to cell CELLy000, bottom electrode BE of SWy0,1, SWy0,2, SWy0,3, SWy0,4, . . . , SWy0,k−1, SWy0,k, SWy0,k+1, . . . , SWy0,n are all in electrical communication with each other and the source of cell select FET Ty0, whose drain is in electrical communication with array bit line BL[0]. Referring now to cell CELLy001, bottom electrode BE of SWy1,1, SWy1,2, SWy1,3, SWy1,4, . . . SWy1,k−1, SWy1,k, SWy1,k+1, . . . SWy1,n are all in electrical communication with each other and the source of cell select FET Ty1, whose drain is in electrical communication with array bit line BL[1].

Referring now to multi-switch storage cell READ operation 2515 illustrated in FIG. 25B, multi-switch storage cell array READ operation 2500 illustrated in FIG. 25A, and 3D MSSC memory open architecture schematics 2600 and 2620, illustrated in FIGS. 26A and 26B, respectively, multi-switch storage cell arrays require the ability to prevent a SA/Latch switched to voltage $V_{DD}$ from appearing on array bit lines within the memory array as described further below.

Figure 25B:
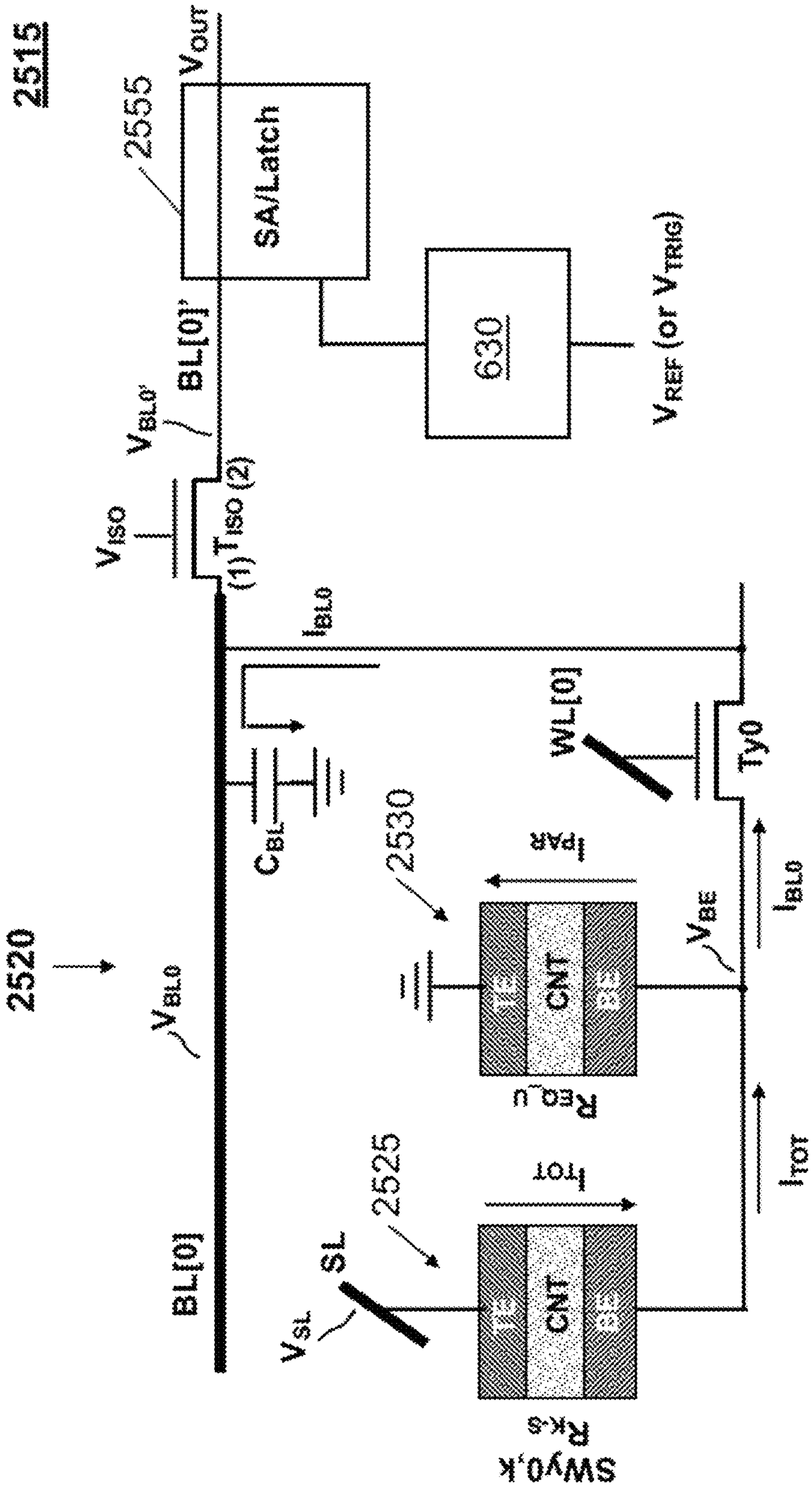
FIG. 25B is a representation of a multi-switch storage cell READ operation corresponding to celly000 illustrated in FIG. 25A.
Figure 26A:
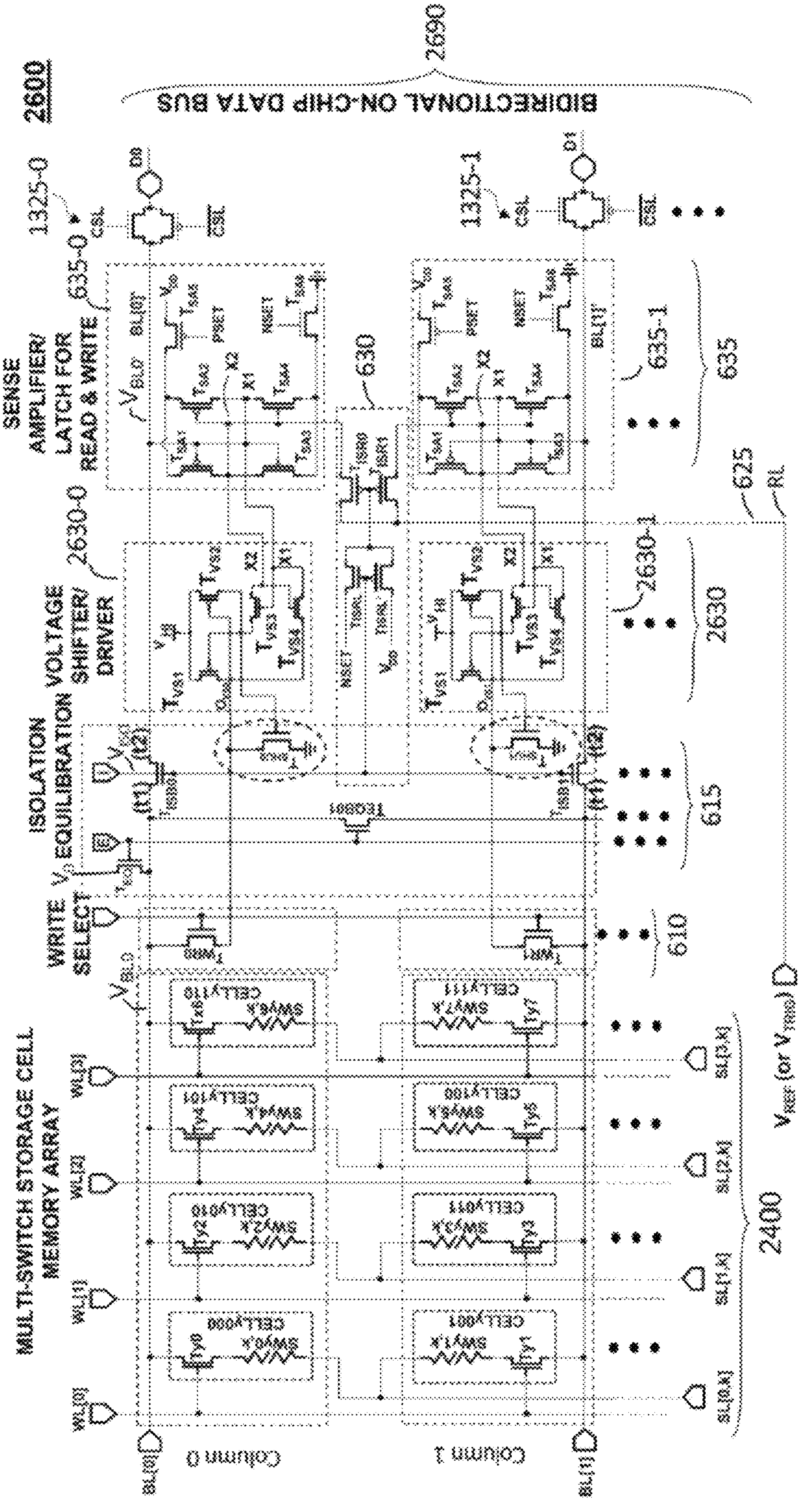
FIG. 26A is a 3D MSSC memory open architecture schematic in which the single-switch storage cell array corresponding to FIG. 13A is replaced by the multi-switch storage cell memory array corresponding to FIGS. 24-1 and 24-2. A shunt FET device is added to each voltage shifter/driver corresponding to FIG. 13A, the shunt FET is in electrical communication with the voltage shifter/driver output and ground, with gate controlled by the corresponding voltage shifter/driver.
Figure 26B:
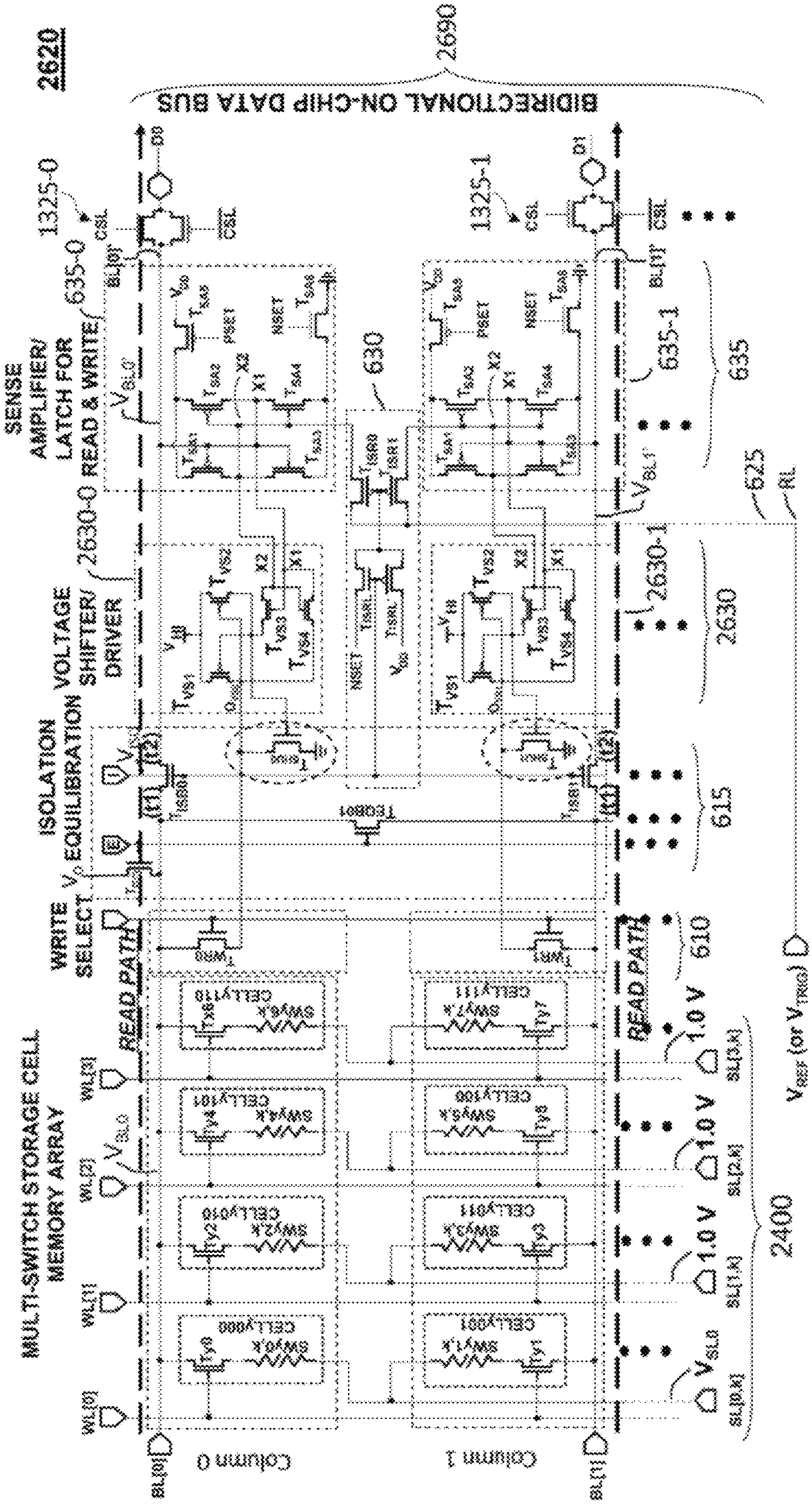
FIG. 26B is a 3D MSSC memory READ operation corresponding to 3D MSSC memory open architecture schematic illustrated in FIG. 26A, showing the current flow paths in a 3D MSSC memory bit line charge READ operations.

Multi-switch storage cell array 2520 illustrated in FIG. 25B corresponds to CELLy000 shown in FIGS. 25A, 26A, and 26B, where these arrays are in a multi-switch storage cell array READ operating mode. Selected resistive change element 2525, having resistance $R_{K\_S}$ with top electrode TE in electrical communication with select line SL, corresponds to resistive change element SWy0,k in CELLy000, with top electrode TE in electrical communication with select line SL[0,k], where select lines SL and SL[0,k] have select line voltage $V_{SL}$ applied during a bit line charge READ operation as described further above.

Unselected equivalent resistor $R_{EQ\_U}$ 2530 is the resistance of all unselected resistive change elements in parallel except for the SWy0,k, which is the selected resistive change element whose resistance state is being READ by applying $V_{SL}$ to select line SL[0,k]. Referring now to FIG. 25A, CELLy000, resistive change elements SWy0,1, SWy0,2, . . . , SWy0,k−1, SWy0,k+1, . . . , SWy0,n top electrodes TE are in electrical communication with SL[0,1], SL[0,2], . . . , SL[0,k−1], SL[0,k+1], . . . , SL[0,n], respectively, all of which are in electrical communication with ground (zero Volts) during a READ operation. The bottom electrodes BE of all n resistive change elements are in electrical communication with each other and the cell select FET Ty0 source, as illustrated in FIGS. 25A and 25B. Hence, the resistance values of all unselected resistive change elements in parallel corresponding to unselected equivalent resistor $R_{EQ\_U}$ are unchanged. The value of $R_{EQ\_U}$ is as follows:

$$1/R_{EQ\_U}=1/R_1+1/R_2+ \ldots +1+1R_{K+1}+ \ldots 1+R_N$$

Referring now to multi-switch storage cell READ operation 2515 illustrated in FIG. 25B, array bit line BL[0] voltage $V_{BL0}$ is zero Volts at time t=0. Word line WL[0] gate voltage is activated turning cell select FET Ty0 ON electrically connecting bottom electrode BE voltage $V_{BE}$ to array bit line BL[0], and at t=0+, charge current flows through selected resistive change element 2525, all bottom electrodes are at voltage $V_{BE}$, in-cell parasitic current flows to ground through unselected equivalent resistor $R_{EQ\_U}$ 2530, and current $I_{BL0}$ flows into array bit line BL[0] charging array bit line BL[0] capacitance $C_{BL}$ to $V_{BL0}=V_{BE}$. The select line voltage $V_{SL}$ used in this example is in the range of 1-1.5 V for 3-4 ns and the maximum array bit line BL[0] voltage $V_{BL0}$ is less than 0.14V (140 mV) as illustrated by tables shown in FIGS. 28A-28I, which is applied to terminal (1) of isolation device $T_{ISO}$. Gate voltage $V_{ISO}$ turns isolation device $T_{ISO}$ ON and electrically connects terminal (1), in electrical communication with array bit line BL[0], and terminal (2), in electrical communication with bit line segment BL[0]'. Bit line segment BL[0]' is in electrical communication with a first input terminal of SA/Latch 2555. Reference line interface circuit 630, described further above, is in electrical communication with a second terminal of SA/Latch 2555. SA/Latch 2555 corresponds to SA/Latch 635-0 and isolation device $T_{ISO}$ corresponds to isolation device $T_{ISB0}$ illustrated in FIGS. 26A and 26B.

As described further below with respect to 3D MSSC memory bit line charge READ timing diagram 1580 illustrated in FIG. 15D, a resistive change element in a low resistance state $R_{LO}$ within a multi-switch storage cell in a 3D MSSC array formed with multiple MSSCs, after a signal development time interval gamma (γ), bit line BL[0] is charged to a voltage value higher than of a reference signal $V_{REF}$, and during the SA/Latch set time interval, bit line segment BL[0]' switches to voltage $V_{DD}$ corresponding to a logic "1" state. In this example, $V_{DD}$ is equal to 1 V.

As described further below with respect to 3D MSSC memory bit line charge READ timing diagram 1590 illustrated in FIG. 15E, a resistive change element in a high resistance state $R_{HI}$ within a multi-switch storage cell in a 3D MSSC array formed with multiple MSSCs, after a signal development time interval gamma (γ), bit line BL[0] is charged to a voltage value lower than of a reference signal $V_{REF}$, and during the SA/Latch set time interval, bit line segment BL[0]' switches to voltage of zero volts corresponding to a logic "0" state.

Referring now to multi-switch storage cell READ operation 2515 illustrated in FIG. 25B, the voltage on array bit line BL[0] needs to be limited to the minimum resistive change element SET voltage minus a guard band voltage. In this example, as described further above and illustrated with respect to FIG. 14B, the SET voltage $V_{SET}$ is in the range of 1-1.5 V (RESET voltage $V_{RESET}$ is in the range of 2-2.5 V) and the guard band voltage is assumed to be 0.5 V. Therefore, terminal (1) of isolation device $T_{ISO}$, in electrical communication with array bit line BL[0] and bottom electrodes BE of all resistive change elements through cell select device Ty0, drives $V_{BE}$ to voltage $V_{BL0}$. $V_{BE}$ needs to be 0.5 Volts or less during the multi-switch storage READ operation so as not to disturb the resistance state of any of the unselected resistive change elements having top electrodes TE in electrical communication with ground (zero volts). Terminal (1), corresponding array bit line BL[0], and bottom electrode voltage $V_{BE}$ can be limited to no more than 0.5 volts as follows.

Isolation device $T_{ISO}$ may be turned to an ON state electrically connecting terminals (1) and (2) with a gate voltage $V_{ISO}$=0.5 volts, for example. Since the maximum array bit line BL[0] voltage during signal development is <0.14 V, isolation device $T_{ISO}$ is in a linear operating region, and bit line segments $V_{BL0'}=V_{BL0}<0.14$ V.

However, after signal development time and during the set time interval, if SA/Latch 2555 in electrical communication with bit line segment BL[0]', switches to $V_{DD}$ and $V_{BL0'}=V_{DD}$. Since terminal (2) at $V_{BL0'}$ is greater than gate voltage $V_{ISO}$, isolation device $T_{ISO}$ is in saturation. Therefore, the voltage on terminal (1) is $V_{ISO}$−Vth. Assuming $V_{DD}$=1 V and Vth=0.2 V, then terminal (1), $V_{BL0}$, and $V_{BE}$ are at 0.3 V. Therefore, the stored resistance value of the resistive change elements forming unselected equivalent resistor $R_{EQ\_U}$ 2530 are not disturbed.

Alternatively, if SA/Latch 2555 in electrical communication with bit line segment BL[0]' switches to zero volts (ground), then isolation device $T_{ISO}$ remains in the linear region, terminal (t2) in electrical communication with terminal (t1) switches to zero volts, and corresponding bit line $V_{BL0}$ and $V_{BE}$ are at zero volts. Therefore, $V_{BL0}$ and $V_{BE}$ are at 0.3 V or 0 V after SA/Latch 2525 switches.

Referring now to 3D MSSC memory open architecture schematic 2600 illustrated in FIG. 26A, multi-switch storage cell memory array 2400 illustrated in FIGS. 24-1 and 24-2, and open architecture schematic 1300 illustrated in FIG. 13A, 3D MSSC memory open architecture schematic 2600 illustrated in FIG. 26A shows a multi-switch data path. 3D MSSC memory open architecture schematic 2600 corresponds to open architecture schematic 1300 with the following differences. First, single-switch storage cell memory array 605 is replaced by multi-switch storage cell memory array 2400. Second, each voltage shifter/driver output $O_{VS}$ is in electrical communication with to a shunt FET device used during WRITE operations as described further below. FIG. 26A shows shunt FET $T_{SHU0}$ in electrical communication with voltage shifter/driver 2630-0, with a drain terminal in electrical communication with output $O_{VS0}$, a source terminal in electrical communication with ground, and a gate terminal in electrical communication with FET $T_{VS1}$, FET $T_{VS2}$, and FET $T_{VS3}$. FIG. 26A shows shunt FET $T_{SHU1}$ in electrical communication with voltage shifter/driver 2630-1, with a drain terminal in electrical communication with output $O_{VS1}$, a source terminal in electrical communication with ground, and a gate terminal in electrical communication with FET $T_{VS1}$, FET $T_{VS2}$, and FET $T_{VS3}$. Third, in a READ operation, bit line voltages, such as voltages on bit lines BL[0] and BL[1], may be compared to a reference voltage $V_{REF}$ applied to a reference line, such as reference line 625 illustrated in FIG. 26A. However, for cell level data processing operations described further below, a trigger voltage $V_{TRIG}$ may be applied to the reference line instead as described further below.

Referring now to multi-switch storage cell memory array 2400 array as shown in FIG. 26A, resistive change element k in each multi-switch storage cell, such as CELLy000 for example, represents the resistive change elements in a corresponding multi-switch storage cell in FIGS. 24-1 and 24-2. As described further above, k represents any resistive change element between 1 and n. For all multi-switch storage cells in electrical communication with a select line, such as select line SL[1,k] for example, the value of k is the same for all selected resistive change elements corresponding to the same parallel word line, a first word line for example. However, for any other select lines corresponding to another word line, a second word line for example, the value of k may be different than for the resistive change elements corresponding to the first word line. However, all resistive change elements corresponding to the second word line must be the same.

Referring now to open architecture schematic 1300 illustrated in FIG. 13A and 3D MSSC memory open architecture schematic 2600 illustrated in FIG. 26A, the data path operation is essentially the same for selected resistive change elements. Multi-switch storage cell memory array 2400 corresponds to memory array 605, bidirectional on-chip data bus 2690 corresponds to bidirectional on-chip data bus 1340. The circuits are essentially the same and operate in the same manner described further above. However, for multi-switch storage cell memory array 2400 unselected resistive change elements may affect the amplitude of the signal level on the bit lines, such as BL[0] and BL[1] as described further below with respect to multi-switch storage cell array READ operation 2500 illustrated in FIG. 25A and multi-switch cell equivalent circuit 2700 illustrated in FIG. 27A. Also, gate voltage $V_{ISO}$ applied to isolation devices such as $T_{ISB0}$ and $T_{ISB1}$ need to be limited to no more than 0.5 V during READ operations, as described further above with respect to FIG. 25B.

Referring now to 3D MSSC memory open architecture READ operation 2620 illustrated in FIG. 26B and multi-switch storage cell array READ operation 2500 in FIG. 25A, the READ signal generated in multi-switch storage cell CELLy000 illustrated in FIG. 25A is based on a combination of selected resistive change element SWy0,k and all unselected resistive change elements, each having a bottom electrode BE in electrical communication with the source of activated (ON) cell select FET Ty0. The resulting READ signal is transmitted to array bit line BL[0] in electrical communication with the drain of cell select FET Ty0. Referring now to FIG. 26B, the READ signal follows the READ PATH along array bit line BL[0] to bit line segment BL[0]' to SA/Latch 635-0. As explained further below, if selected resistive change element SWy0,k is in a low resistance state $R_{LO}$, then SA/Latch 635-0 output X1 in electrical communication with bit line segment BL[0]' switches to $V_{DD}$, 1 V for example. Since isolation device $T_{ISB0}$ has a gate voltage of 0.5 V during a READ operation, then array bit line BL[O] voltage is limited to 0.3 V (0.5 V-0.2 V) if the threshold voltage of $T_{ISB0}$ is 0.2 V. However, if resistive change element SWy0,k is in a high resistance state $R_{HI}$, then SA/Latch output X1 in electrical communication with bit line segment BL[0]' switches to 0 V, and array bit line BL[0] goes to zero volts. SA/Latch 635-0 output is transmitted to bidirectional on-chip data bus line D0 of bidirectional on-chip data bus 2690 by data bus coupling circuit 1325-0.

Referring now to 3D MSSC memory open architecture READ operation 2620 illustrated in FIG. 26B and multi-switch storage cell array READ operation 2500 in FIG. 25A, the READ signal generated in multi-switch storage cell CELLy001 illustrated in FIG. 25A is based on a combination of selected resistive change element SWy1,k and all unselected resistive change elements, each having a bottom electrode BE in electrical communication with the source of activated (ON) cell select FET Ty1. The resulting READ signal is transmitted to array bit line BL[1] in electrical communication with the drain of cell select FET Ty1. Referring now to FIG. 26B, the READ signal follows the READ PATH along array bit line BL[1] to bit line segment BL[1]' to SA/Latch 635-1. As explained further below, if selected resistive change element SWy1,k is in a low resistance state $R_{LO}$, then SA/Latch 635-1 output X1 in electrical communication with bit line segment BL[1]' switches to $V_{DD}$, 1 V for example. Since isolation device $T_{ISB1}$ has a gate voltage of 0.5 V during a READ operation, then array bit line BL[1] is limited to 0.3 V (0.5 V-0.2 V) if the threshold voltage of $T_{ISB1}$ is 0.2 V. However, if resistive change element SWy1,k is in a high resistance state $R_{HI}$, then SA/Latch output X1 in electrical communication with bit line segment BL[1]' switches to 0 V and array bit line BL[1] goes to zero volts. SA/Latch 635-1 output is transmitted to bidirectional on-chip data bus line D1 of bidirectional on-chip data bus 2690 by data bus coupling circuit 1325-1.

Bit line READ charging voltages $V_{BL}$ for bit lines BL[0] and BL[1] may be calculated as described further below. As illustrated in multi-switch storage cell array READ operation 2500 illustrated in FIG. 25A and cell cross sections shown in corresponding multi-switch storage cell 2101, 2102, 2103, 2104, 2105, and 2109, respectively, shown in FIGS. 21A, 21B, 21C, 21D, 21E, and 21I, respectively, there are numerous combinations of resistive change element switch stored values, each in a low resistive state $R_{SW}=R_{LO}$ value or in a high resistance state $R_{SW}=R_{HI}$. For a multi-switch storage cell with 16 resistive change elements, for example, there are 65,536 possible switch resistance combinations, for a cell with 32 resistive change elements, there are approximately $4.3\times10^9$ switch resistance combinations, and for a cell with 64 resistors, there are approximately $1.8\times10^{19}$ combinations. These combinations are for two possible resistance states corresponding a single logic “1” or “0” state. However, if each resistive change element stores 4 resistance states corresponding to two logic states per switch, the number of possible combinations is still greater.

Fortunately, it is not necessary to calculate bit line charge voltage values for all these combinations. Instead, what is needed is to calculate the maximum and minimum possible bit line voltages $V_{BL}$ when the resistive change element resistance value is $R_{SW}=R_{LO}$ and $R_{SW}=R_{HI}$.

Figure 27B:
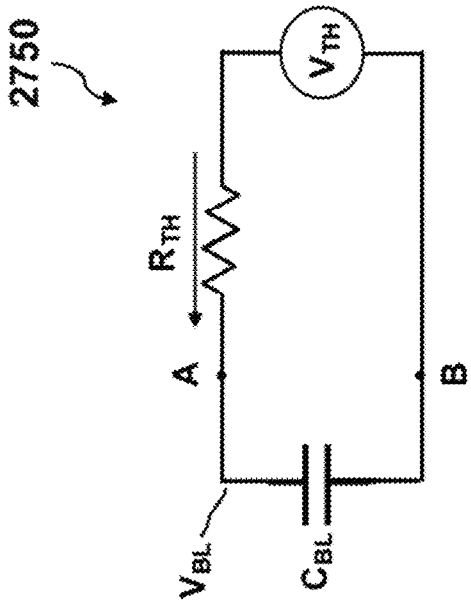
FIG. 27B is a Thevenin equivalent circuit schematic of the circuit schematic corresponding to FIG. 27A.
Figure 27A:
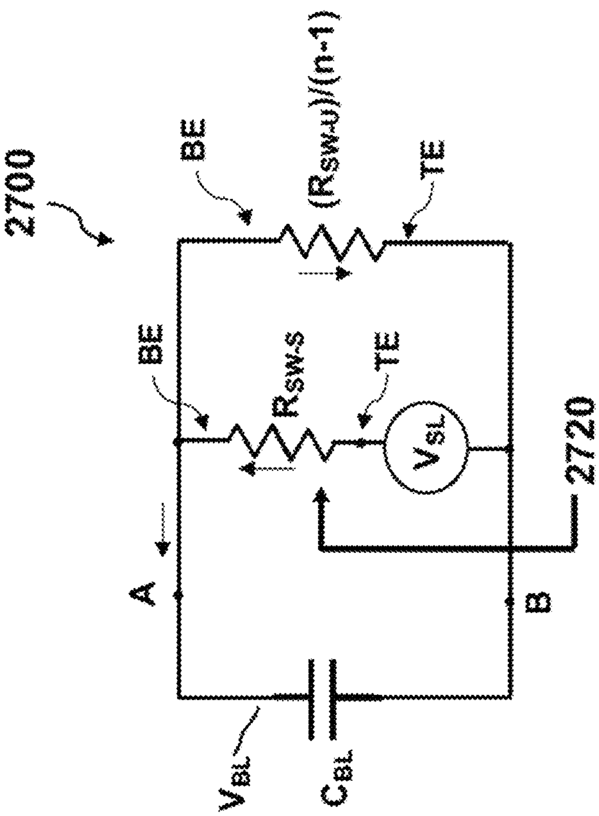
FIG. 27A is a multi-switch storage cell equivalent circuit for calculating the bit line charge voltage for a READ operation for one selected resistive change element, without disturbing the stored resistance state in the selected resistive change element and the stored resistance state in each of the unselected resistive change elements.

Referring now to multi-switch storage cell equivalent circuit 2700 illustrated in FIG. 27A and multi-switch storage cell array READ operation 2500 illustrated in FIG. 25A, if representative switch SWy0,k in cell CELLy000 is selected and is in a low resistance state $R_{LO}$, the maximum BL[0] voltage $V_{BL\text{-}0MAX}$ may be calculated if all unselected n−1 switches in cell CELLy000 are in a high resistance state $R_{HI}$. However, if representative switch SWy0,k is selected and is in a low resistance state $R_{LO}$, the minimum BL[0] voltage $V_{BL\text{-}0MIN}$ may be calculated if all unselected n−1 switches in cell CELLy000 are in a low resistance state $R_{LO}$.

Referring now to multi-switch storage cell equivalent circuit 2700 illustrated in FIG. 27A and multi-switch storage cell array READ operation 2500 illustrated in FIG. 25A, if representative switch SWy1,k in cell CELLy001 is selected and is in a high resistance state $R_{HI}$, the maximum BL[1] voltage $V_{BL\text{-}1MAX}$ may be calculated if all unselected n−1 switches in cell CELLy001 are in a high resistance state $R_{HI}$. However, if representative switch SWy1,k is selected and is in a high resistance state $R_{HI}$, the minimum BL[1] voltage $V_{BL\text{-}1MIN}$ may be calculated if all unselected n−1 switches in cell CELLy001 are in a low resistance state $R_{LO}$.

In the maximum and minimum examples described above, the selected representative switch for cell CELLy000 was in a low resistance state $R_{LO}$ and the selected representative switch for cell CELLy001 was in a high resistance state $R_{HI}$. However, the selected representative switch for cell CELLy000 may instead be in a high resistance state $R_{HI}$ and the selected representative switch for cell CELLy001 may instead be in a low resistance state $R_{LO}$.

Referring now to FIG. 27A, multi-switch storage cell equivalent circuit 2700 illustrated in FIG. 27A is an electrical representation of the operation of any selected resistive change element in a multi-switch storage cell in any array of multi-switch storage cells interconnected to form a 3D MSSC array. For example, selected resistive change elements in the multi-switch storage cells described further above in multi-switch storage cell array READ operation 2500 illustrated FIG. 25A. Multi-switch storage cell equivalent circuit 2700 illustrated in FIG. 27A may be used, as described further below, to calculate bit line signal voltages for any selected resistive change element in a multi-switch storage cell array READ operation 2500 for any time interval during a READ operation, including maximum and minimum bit line signal voltages to SA/Latch inputs during and at the end of a signal develop time gamma (γ) as illustrated in FIGS. and 15E and described further below.

Bit line signal calculations can be simplified by using a Thevenin equivalent circuit 2750, illustrated in FIG. 27B, representation of multi-switch storage cell equivalent circuit 2700. Thevenin equivalent circuit 2750 is in electrical communication with terminals A and B and in electrical communication with bit line capacitance $C_{BL}$ across terminals A and B. Bit line voltage $V_{BL}$ appears across terminals A and B as shown in FIG. 27B.

Thevenin equivalent circuit 2750 may be derived by isolating circuit 2720 between terminals A and B as illustrated in FIGS. 27A and 27B. As described further below, the Thevenin equivalent circuit voltage $V_{TH}$ may be calculated as the open circuit voltage between terminals A and B of circuit 2720. As described further below, the Thevenin equivalent circuit resistance $R_{TH}$ may be calculated by replacing voltage source $V_{SL}$ by a short circuit. $R_{TH}$ may be calculated as the parallel resistance of the selected switch resistance $R_{SW\text{-}S}$, which may be low or high resistance $R_{LO}$ or $R_{HI}$, respectively, and the parallel resistance value of the remaining unselected resistive change elements. The parallel resistance value of the remaining unselected resistive change elements when each of the remaining unselected resistive change elements has the same resistance value can be calculated by $(R_{SW\text{-}U})/(n-1)$, where $R_{SW\text{-}U}$ is the resistance value of each of the remaining unselected resistive change elements and n is the number of resistive change elements in the multi-switch storage cell. The resistance value of $R_{SW\text{-}U}$ may be highest if the resistance value of each of the unselected resistive change elements in parallel is at a high resistance $R_{HI}$, such as when calculating the maximum bit line signal voltage. The resistance value of $R_{SW\text{-}U}$ may be lowest if the resistance value of each of the unselected resistive change elements in parallel is at a low resistance value $R_{LO}$, such as when calculating the minimum bit line signal voltage.

Bit line signal voltages for various combinations of low and high resistance values of unselected switches may be calculated. However, this is not necessary when calculating the minimum and maximum bit line signal voltage to SA/Latch inputs for signal sensing and to ensure that voltage levels do not disturb the nonvolatile stored resistance values of resistive change elements as described further below.

Referring now to FIG. 14C and EQ. 1, as described further above, READ equivalent circuit 1475 was used to calculate bit line voltage $V_{BL}$ for single-switch resistive change element cells. Comparing multi-switch storage cell Thevenin equivalent circuit 2700 illustrated in FIG. 27A and corresponding Thevenin equivalent circuit 2750 illustrated in FIG. 27B with single-switch READ equivalent circuit 1475, illustrated in FIG. 14C, Thevenin voltage VIE and Thevenin resistance $R_{TH}$ correspond to $V_{SL}$ and $R_{SW}$, respectively:

$$V_{BL}=V_{TH}(1-e^{-t/\tau_{TH}}) \quad \text{[EQ. 2]}$$

$$\text{Where } \tau_{TH}=R_{TH}\times C_{BL} \quad \text{[EQ. 3]}$$

Thevenin voltage $V_{TH}$ may be calculated using EQ. 4:

$$V_{TH}=([R_{SW\text{-}U}/(n-1)]/[R_{SW\text{-}S}+R_{SW\text{-}U}/(n-1)])V_{SL} \quad \text{[EQ. 4]}$$

Thevenin resistance $R_{TH}$ may be calculated using EQ. 5:

$$R_{TH}=[R_{SW\text{-}S}\times R_{SW\text{-}U}/(n-1)]/[R_{SW\text{-}S}+R_{SW\text{-}U}/(n-1)] \quad \text{[EQ. 5]}$$

In the BL charging examples used further below, the following parameters are assumed:

- Resistive change element low resistance state value $R_{SW}=R_{LO}=100$ kΩ, which represents a logic "1", and high resistance state value $R_{SW}=R_{HI}=2$ MΩ, which represents a logic "0";
- Bit line capacitance $C_{BL}=400$ fF;
- Signal development time t=4 ns; and
- SET voltage range=1-1.5 V and RESET voltage range=2-2.5 V.

In operation, calculations of bit line voltages $V_{BL}$ as a function of applied select line voltages $V_{SL}$ for multi-switch storage cell array READ operation 2500 illustrated in FIG. 25A, may be calculated using EQs. 2, 3, 4, and 5, and the results of these calculations $V_{BL}$ are summarized in FIGS. 28A-28I further below. READ multi-switch storage cell array bit line BL voltages in Table 2800-1 illustrated in FIG. 28A shows BL voltages $V_{BL}$ for multi-switch storage cells with n=2 switches. Results are summarized in four rows. Rows 1 and 2 show bit line voltage $V_{BL}$ for selected resistive change elements in a low resistance state $R_{SW\text{-}S}=100$ kΩ. The top electrode of the selected resistive change element is in electrical communication with a select line at voltage $V_{SL}$ and the top electrode of each of the unselected resistive change elements is in electrical communication with a corresponding select line at zero volts as described further above. In the examples described further below, $V_{SL}=1$ V is used in n=2 to n=8 resistive change elements per multi-switch storage cell, and $V_{SL}=1$V and 1.5 V are shown for n=16, 32, and 64 resistive change elements per multi-switch storage cell.

In row 1, unselected switches (in this example, 1 unselected switch) are in a high resistance state $R_{SW\text{-}U}=2$MΩ, resulting in the highest charged bit line BL voltage. Bit line voltage $V_{BL}$ appears at the bottom electrode of all resistive change elements in multi-switch storage cells and is compared with the WRITE SET voltage, illustrated in FIG. 14B, with a minimum SET voltage of 1 V to ensure no resistive change element resistance state value is disturbed during a READ operation.

In row 2, unselected switches (in this example, 1 unselected switch) are in a low resistance state $R_{SW\text{-}U}=100$ kΩ, resulting in the lowest charged bit line BL voltage. SA/Latches are designed to switch to a positive state for selected low resistance state $R_{SW\text{-}S}=100$ kΩ with the lowest charged bit line voltage $V_{BL}$ because reference line voltage $V_{REF}$ is chosen to be less than this minimum value.

Rows 3 and 4 show bit line voltage $V_{BL}$ for selected resistive change elements in a high resistance state $R_{SW\text{-}S}=2$ MΩ. The top electrode of the selected resistive change element is in electrical communication with a select line at voltage $V_{SL}$ and the top electrode of each of the unselected resistive change elements is in electrical communication with a select line at zero volts as described further above.

In row 3, unselected switches (in this example, 1 unselected switch) are in a high resistance state $R_{SW\text{-}U}=2$MΩ, resulting in the highest charged bit line BL voltage, which is much lower than the maximum and minimum bit line voltages of rows 1 and 2, respectively. SA/Latches are designed to switch to a zero state even with the selected highest resistance state $R_{SW\text{-}S}=2$ MΩ because reference line voltage $V_{REF}$ is chosen to be greater than this maximum value.

In row 4, unselected switches (in this example, 1 unselected switch) are in a low resistance state $R_{SW\text{-}U}=100$ kΩ, resulting in the lowest bit line BL voltage. SA/Latches also switch to zero voltage as described above with respect to row 3 because the BL voltage is even lower.

READ operational results for multi-switch storage cells having n=4, 8, 16, 32, and 64 resistive change elements may be calculated using the same method described further above with respect to n=2 and READ multi-switch storage cell array bit line BL voltage results. READ bit line voltage calculations are summarized and described in tables as follows.

READ multi-switch storage cell array BL voltages tables for n=2, 4, and 8 are shown for SL voltage $V_{SL}$=1 V and shown in Table 2800-1 in FIG. 28A, Table 2800-2 in FIG. 28B, and Table 2800-3 in FIG. 28C. READ multi-switch storage cell array BL voltages for n=16, 32, and 64 are shown for SL voltage $V_{SL}$=1 V and for $V_{SL}$=1.5 V. For multi-switch storage cells having n=16 resistive change elements, results of calculations are summarized in READ multi-switch storage cell array BL voltages Table 2800-4 illustrated in FIG. 28D and Table 2800-5 illustrated in FIG. 28E, for $V_{SL}$=1 V and $V_{SL}$=1.5 V, respectively. For multi-switch storage cells having n=32 resistive change elements, results of calculations are summarized in READ multi-switch storage cell array BL voltages Table 2800-6 illustrated in FIG. 28F and Table 2800-7 illustrated in FIG. 28G, for $V_{SL}$=1 V and $V_{SL}$=1.5 V, respectively. For multi-switch storage cells having n=64 resistive change elements, results of calculations are summarized in READ multi-switch storage cell array BL voltages Table 2800-8 illustrated in FIG. 28H and Table 2800-9 illustrated in FIG. 28I, for $V_{SL}$=1 V and $V_{SL}$=1.5 V, respectively.

Referring now to row 1 of FIGS. 28A-28I, row 1 shows the maximum bit line READ voltage which occurs when the selected resistive change element is in a low resistance state $R_{LO}$ corresponding to a logic "1" state and each of the n−1 unselected resistive change elements in parallel is in a high resistance state $R_{HI}$ corresponding to logic "0" state. Referring now to FIG. 28E, row 1 with $V_{BL}$=137.6 milli-volts is the highest READ bit line voltage in any of the tables in FIGS. 28A-28I. Comparing $V_{BL}$=137.6 milli-volts with a $V_{SET}$=1-1.5 V range described further above, the highest bit line voltage is more than 0.8 volts less than the lowest $V_{SET}$ voltage $V_{SET}$=1 V. Therefore, stored resistance values of resistive change elements are not disturbed during a READ operation of multi-switch storage cells.

Referring now to row 2 of FIGS. 28A-28I, row 2 shows the minimum READ multi-switch storage cell array BL voltage $V_{BL}$ available for a low resistance state of a selected resistive change element when performing a READ operation on a selected multi-switch storage cell. In these examples, the selected multi-switch storage cell includes 1 selected resistive change element in a low resistance state $R_{LO}$ corresponding to a logic "1" state and n−1 unselected resistive change elements in low resistance states $R_{LO}$. $V_{BL}$ is a function of the select line SL bit line charge voltage and the total number of resistive change elements n.

Referring now to row 3 of FIGS. 28A-28I, row 3 shows the maximum READ multi-switch storage cell array BL voltage $V_{BL}$ available for a high resistance state of a selected resistive change element when performing a READ operation on a selected multi-switch storage cell. In these examples, the selected multi-switch storage cell includes 1 selected resistive change element in a high resistance state $R_{HI}$ corresponding to a logic "0" state and n−1 unselected resistive change elements in high resistance states $R_{HI}$. $V_{BL}$ is a function of the select line SL bit line charge voltage and the total number of resistive change elements n.

Referring now to row 4 of FIGS. 28A-28I, row 4 shows the minimum READ multi-switch storage cell array BL voltage $V_{BL}$ available when performing a READ operation on a selected multi-switch storage cell. In these examples, the selected multi-switch storage cell includes 1 selected resistive change element in a high resistance state $R_{HI}$ corresponding to a logic "0" state and n−1 unselected resistive change elements in low resistance states $R_{LO}$. $V_{BL}$ is a function of the select line SL bit line charge voltage and the total number of resistive change elements n. Row 4 has the lowest READ bit line voltage $V_{BL}$ for all values of the number of resistive change elements n.

Referring now to multi-switch storage cell array READ operation 2500 illustrated in FIG. 25A and corresponding 3D MSSC memory open architecture schematic 2600 illustrated in FIG. 26A, the READ bit line voltage $V_{BL}$ shown in row 2 corresponds to the array bit line BL[0] READ voltage for a stored low resistance state $R_{LO}$ (logic "1"), and the READ bit line voltage $V_{BL}$ shown in row 3 corresponds to the array bit line voltage BL[1] READ voltage for a stored high resistance state $R_{HI}$ (logic "0").

In these examples, READ bit line voltage $V_{BL}$ shown in row 2 or row 3 is in electrical communication with one terminal of a corresponding SA/Latch. The other terminal of the SA/Latch is in electrical communication with a reference voltage $V_{REF}$ as described further above with respect to FIG. 26A. In the examples shown in FIGS. 28A-28I, row 2 always corresponds to a stored low resistance state Rix) (logic "1") and row 3 always corresponds to a stored high resistance state $R_{HI}$ state (logic "0"). Therefore, as described further above the READ bit line voltage $V_{BL}$ in row 2 is always a higher value than $V_{BL}$ in row 3. Therefore, reference voltage $V_{REF}$ is selected to be less than $V_{BL}$ in row 2 and greater than $V_{BL}$ in row 3. With respect to these examples and referring to FIG. 26B, BL[0] bit line voltage corresponds to the higher $V_{BL}$ shown in row 2 and BL[1] bit line voltage corresponds to the lower $V_{BL}$ shown in row 3. However, BL[0] can be in electrical communication with a high resistance state $R_{HI}$ (logic "0") that corresponds to row 3 and BL[1] can be in electrical communication with a low resistance state Rix) (logic "1") that corresponds to row 2.

Figure 15D:
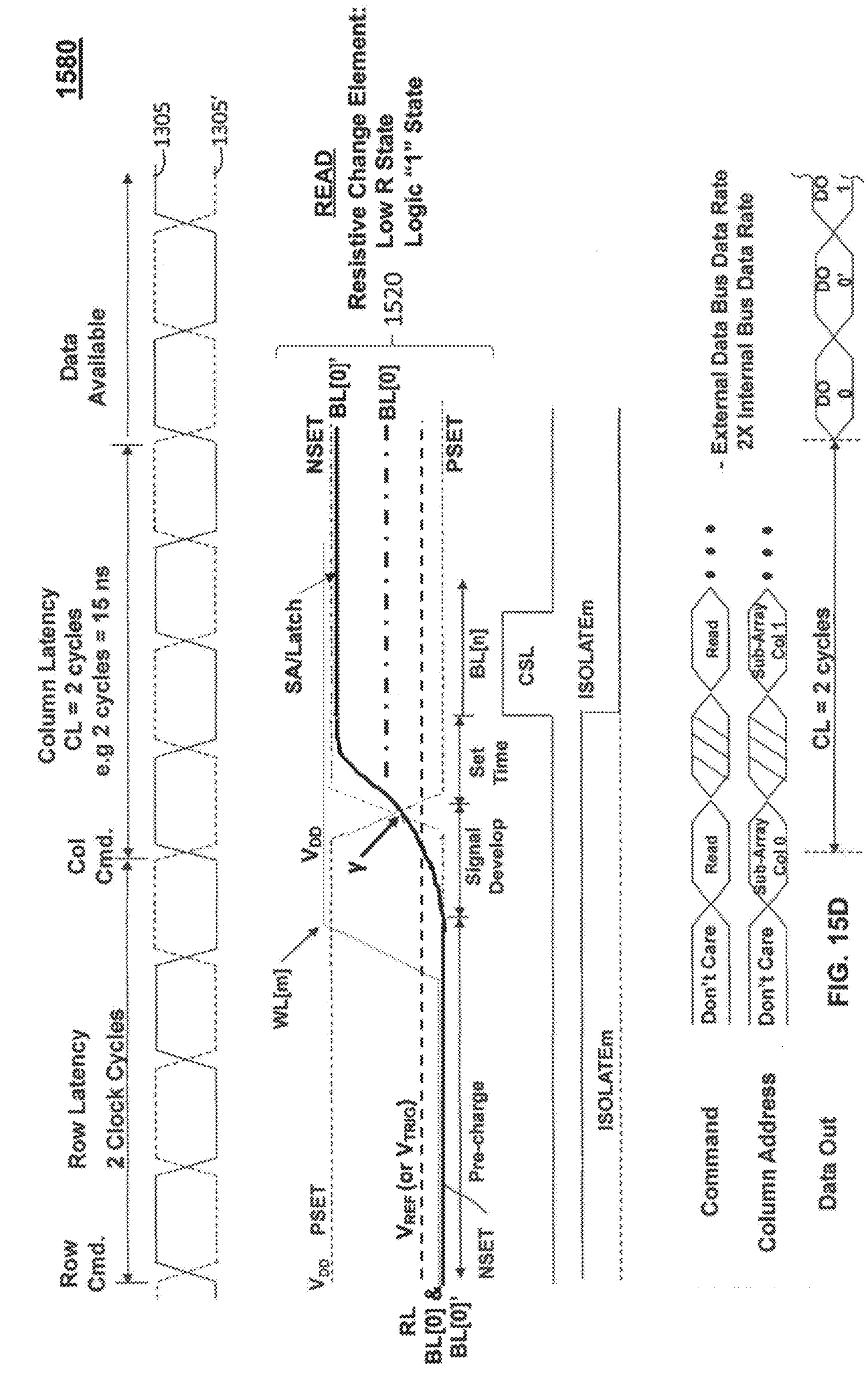
FIG. 15D is a waveform timing diagram illustrating an exemplary 3D MSSC memory bit line charge READ timing diagram performed on a multi-switch storage cell formed with resistive change elements with bottom electrodes in electrical communication with each other and a common cell select device source. The one selected resistive change element is in a low resistance state within the 3D MSSC memory open resistance architecture schematic corresponding to FIGS. 26A & 26B.
Figure 15E:
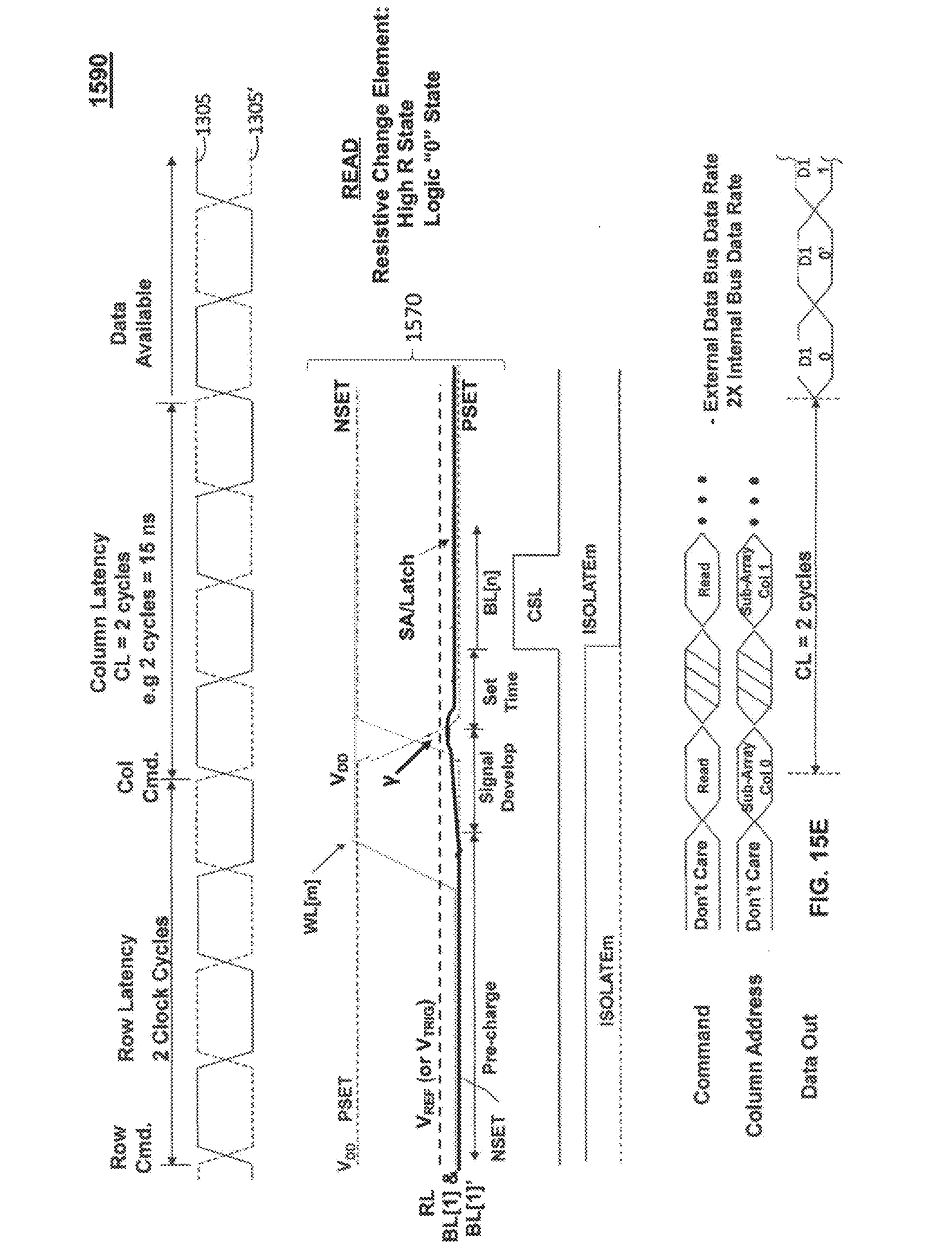
FIG. 15E is a waveform timing diagram illustrating an exemplary 3D MSSC memory bit line charge READ timing diagram performed on a multi-switch storage cell formed with resistive change elements with bottom electrodes in electrical communication with each other and a common cell select device source. The one selected resistive change element is in a high resistance state within the 3D MSSC memory open resistance architecture schematic corresponding to FIGS. 26A & 26B.

Referring now to multi-switch storage cell READ operation 2515 illustrated in FIG. 25B, 3D MSSC memory open architecture schematic READ operation 2620 illustrated in FIG. 26B, and 3D MSSC memory bit line charge READ timing diagrams 1580 for a BL[0] low resistive state Rix) and 3D MSSC memory bit line charge READ timing diagram 1590 for a BL[1] high resistive state $R_{HI}$ illustrated in FIGS. 15D and 15E, respectively, the waveforms for low resistive state $R_{LO}$ READ timing diagram for multi-switch storage cell arrays illustrated in FIG. and single resistive change element cells illustrated in FIG. 15A are similar. Comparing READ diagrams in FIGS. 15D and 15A, array bit line BL[0] and bit line segment BL[0]' are at the same voltage during signal development time. During and after the set time interval, bit line segment BL[0]' switches to voltage $V_{DD}$=1 V in both cases, and array bit line BL[0] switches to a voltage no greater than 0.3 V. This is because the gate of isolation device $T_{ISB0}$ is at 0.5 V and goes into saturation as explained further above. Therefore, with a threshold voltage Vth=0.2 V, V-0.2 V results in an array bit line voltage of $V_{BL0}$=0.3 V.

Waveforms for high resistive state $R_{HI}$ READ timing diagram for multi-switch storage cell arrays illustrated in FIG. 15E are essentially the same as those for single resistive change element cells illustrated in FIG. 15B for reasons described above with respect to FIG. 25B. Comparing READ diagrams in FIGS. 15E and 15B and discussing bit line voltage with respect to multi-switch storage cell array 2520 shown in FIG. 25B, array bit line BL[0] and bit line segment BL[0]' are at the same voltage during signal development time and remain the same during and after the set time interval because SA/Latch 2555 switches to a zero voltage state and bit line segment BL[0]' is at $V_{BL0'}$=0 V. Therefore, isolation device $T_{ISB0}$ remains in a linear operating region, $V_{BL0}$=$V_{BL0'}$, $V_{BE}$=0 V and the resistance states of resistive change elements in multi-switch storage cell array 2520 are not disturbed.

For multiple-switch storage cells, when reading a low stored resistance value $R_{LO}$ during the signal development time interval, the array bit line BL[0] READ voltage amplitude $V_{BL}$ drops significantly as the number n of resistive change elements increases, as illustrated in the tables shown in FIGS. 28A-28I and in SA/Latch input voltage table 2900 illustrated in FIG. 29. However, when reading a high stored resistance value $R_{HI}$ during the signal development time interval, the array bit line BL[1] READ voltage amplitude $V_{BL}$ drop as the number n of resistive change elements increases is relatively small. Note that array bit line BL[0] and array bit line BL[1] may also be referred to as BL[0] and BL[1], respectively.

Referring now to SA/Latch input voltage tables 2900 and 3000 illustrated in FIGS. 29 and 30, respectively, values for minimum bit line voltage $V_{BL}$ for low resistive state $R_{LO}$ correspond to row 2 of tables 2800-1 to 2800-9 and values for maximum bit line voltage $V_{BL}$ for high resistive state $R_{HI}$ correspond to row 3 of tables 2800-1 to 2800-9. The reference voltage $V_{REF}$ value may be chosen based on data path simulations for selected technologies with corresponding dimensional and electrical layout and device characteristics, parameter extraction, and models as is well known in the semiconductor industry. 3D MSSC memories may be fabricated with multi-switch storage cells added to any generation of CMOS technology.

In the absence of a specific CMOS technology, $V_{REF}$ is chosen in two ways, illustrated in SA/Latch input voltage tables 2900 and 3000, respectively. First with respect to table 2900 illustrated in FIG. 29 and referring to 3D MSSC memory bit line charge READ timing diagram in FIG. 15E, $V_{REF}$ was chosen as 15 mV, to be substantially above the low READ BL voltage $V_{BL}$ of BL[1], corresponding to row 3, assuming that the low signal voltage plus any noise signal would not exceed the $V_{REF}$=15 mV value shown in FIG. 29.

Next, with respect to table 3000 illustrated in FIG. 30 and referring to 3D MSSC memory bit line charge READ timing diagrams in FIGS. 15D for BL[0] and 15E for BL[1], $V_{REF}$ voltage is positioned between READ bit line voltages $V_{BL}$ for BL[0] and BL[1]. Referring to 3D MSSC memory open architecture schematic 2600 illustrated in FIG. 26A, the input to SA/Latch 635-0 is shown as a positive voltage relative to $V_{REF}$ and the input voltage to SA/Latch 635-1 is shown as a negative voltage with respect to $V_{REF}$.

Referring now to SA/Latch input voltage table 2900 illustrated in FIG. 29, for multi-switch storage cells with n=16 resistive change elements, the maximum cell current flow and the maximum select line current may be calculated as follows.

The maximum cell current occurs at t=0+ when the array bit line is discharged to 0 volts and when the selected and unselected resistive change elements are at a low resistance value $R_{LO}$=100 kΩ. For a multi-switch storage cell having n=16 resistive change elements with each resistive change element having a low resistance value $R_{LO}$=100 kΩ and $V_{SL}$=1 V, the maximum cell current is 9.6 μA. The maximum select line current may be calculated by multiplying the maximum cell current and the number of multi-switch storage cells activated by a corresponding word line and a corresponding select line. For 64 multi-switch storage cells activated by a corresponding word line and a corresponding select line with each multi-switch storage cell having n=16 resistive change elements with each resistive change element having a low resistance value $R_{LO}$=100 kΩ and $V_{SL}$=1 V, the maximum select line driver current required is 9.6 μA×64=614 uA. For 128 multi-switch storage cells activated by a corresponding word line and a corresponding select line with each multi-switch storage cell having n=16 resistive change elements with each resistive change element having a low resistance value $R_{LO}$=100 kΩ and $V_{SL}$=1 V, the maximum select line driver current required is 9.6 μA×128=1.23 mA. For 256 multi-switch storage cells activated by a corresponding word line and a corresponding select line with each multi-switch storage cell having n=16 resistive change elements with each resistive change element having a low resistance value $R_{LO}$=100 kΩ and $V_{SL}$=1 V, the maximum select line driver current required is 9.6 μA×256=2.46 mA.

For a multi-switch storage cell having n=16 resistive change elements with each resistive change element having a low resistance value $R_{LO}$=100 kΩ and $V_{SL}$=1.5 V, the maximum cell current is 14.4 μA. For 64 multi-switch storage cells activated by a corresponding word line and a corresponding select line with each multi-switch storage cell having n=16 resistive change elements with each resistive change element having a low resistance value $R_{LO}$=100 kΩ and $V_{SL}$=1.5 V, the maximum select line driver current required is 14.4 μA×64=922 uA. For 128 multi-switch storage cells activated by a corresponding word line and a corresponding select line with each multi-switch storage cell having n=16 resistive change elements with each resistive change element having a low resistance value $R_{LO}$=100 kΩ and $V_{SL}$=1.5 V, the maximum select line driver current required is 14.4 μA×128=1.84 mA. For 256 multi-switch storage cells activated by a corresponding word line and a corresponding select line with each multi-switch storage cell having n=16 resistive change elements with each resistive change element having a low resistance value $R_{LO}$=100 kΩ and $V_{SL}$=1.5 V, the maximum select line driver current required is 14.4 μA×256=3.69 mA.

The best approach to SA/Latch design and reference level setting is best determined for a specific CMOS technology based on the physical layout ground rules, electrical characteristics, electrical models, and simulation tools.

Referring now to multi-switch storage cell READ operation 2515 illustrated in FIG. 25B, READ multi-switch storage cell array bit line voltage tables shown in FIGS. 28A-28I assume that the channel resistance of cell select FET Ty0 is substantially smaller than the unselected equivalent resistor REQ_U 2530 illustrated in FIG. 25B. However, as the number of unselected RCEs increases this results in a decrease in the resistance value of REQ_U resistance. The effect of channel resistance values $R_{CH}$ on the READ bit line voltage have been calculated for $R_{CH}$=1 kΩ, 2 kΩ, and 5 kΩ resistance values. Referring now to a method of calculating bit line charge READ voltage amplitude 1200 and Thevenin equivalent circuit 1215 illustrated in FIG. 12B, circuit 1215 is modified by adding the $R_{CH}$ value to the Thevenin equivalent resistance $R_{TH}$ ($R_{TH}$+$R_{CH}$) and calculating a new bit line charge time constant $\tau=(R_{TH}+R_{CH})\times C_{BL0}$. The bit line voltage $V_{BL0}$ may be calculated by replacing $\tau_{TH}$ with $\tau$ resulting in $V_{BL0}=V_{TH}(1-e^{-/\tau})$ which may be used to calculate a modified READ timing diagram corresponding to READ timing diagram 1225 illustrated in FIG. 12C.

By way of example, the effects of channel resistance Rai values on READ bit line voltages were calculated for READ multi-switch storage cell array bit line voltage in table 2800-5 illustrated in FIG. 28E for $V_{SET}$=1-1.5 V and $V_{RESET}$=2-2.5 V, and summarized in modified READ multi-switch storage cell array bit line voltage table 2800-10 illustrated in FIG. 28J for n=16 RCEs.

Table 2800-10 shows a subset of Table 2800-5 values corresponding to row 2 $R_{LO}$ and row 3 $R_{HI}$ values, with $R_{CH}$=0 reflecting a negligible cell select FET channel resistance effect. In the first example, READ 1, the effects of $R_{CH}$=1 kΩ and 2 kΩ are a relatively small reduction in bit line voltage. $R_{CH}$=5 kΩ results in a substantially greater bit line voltage reduction, but still well within the SA/Latch ability to detect the READ voltage.

In the second example, READ 2, the effect of increasing the signal development time from 4 ns to 5 ns on bit line voltage is shown. In this example, the increase of 1 ns compensates for the effects of $R_{CH}$=1 kΩ and 2 kΩ values, and the READ bit line voltage reduction for $R_{CH}$=5 kΩ is significantly reduced.

In the third example, READ 3, the effect of increasing the select line voltage to 2.5 V with the signal development time remaining at 4 ns is shown. In this example, the RESET voltage is increased to $V_{RESET}$=3-3.5 V so that the select line voltage of 2.5 V does not disturb resistive states of resistive change elements. Additionally, the select line parallel to word line architecture limits the cell select FET terminal voltages to $V_{SETMAX}$=1.5 V as described further above. The third example shows that the bit line voltage remains substantially above the bit line voltage for the first and second examples for $R_{CH}$=1 kΩ, 2 kΩ, and 5 kΩ cell select FET channel resistance values.

3D MSSC NV Memory with Multi-Switch Storage Cell Formed with Multiple Resistive Change Elements per Cell in a WRITE Mode At this point in the specification, WRITE operations for 3D MSSC memory open architecture schematic 2600 illustrated in FIG. 26A are described further below. Referring now to corresponding open 3D MSSC memory open architecture WRITE operation 2640 illustrated in FIG. 26C, WRITE signals from bidirectional on-chip data bus 2690 are transmitted to SA/Latch 635-0 from bidirectional on-chip data bus line D0 by data bus coupling circuit 1325-0 and to SA/Latch 635-1 from bidirectional on-chip data bus line D1 by data bus coupling circuit 1325-1. As described further above with respect to select line SL parallel to word line WL architectures, a RESET-before-WRITE timing approach is used as shown in WRITE timing diagram 980 illustrated in prior art FIG. 9B. The RESET-before-WRITE timing approach described further above for 1T, 1R cell memories may also be used for 3D MSCC memories as described further below.

Figure 31:
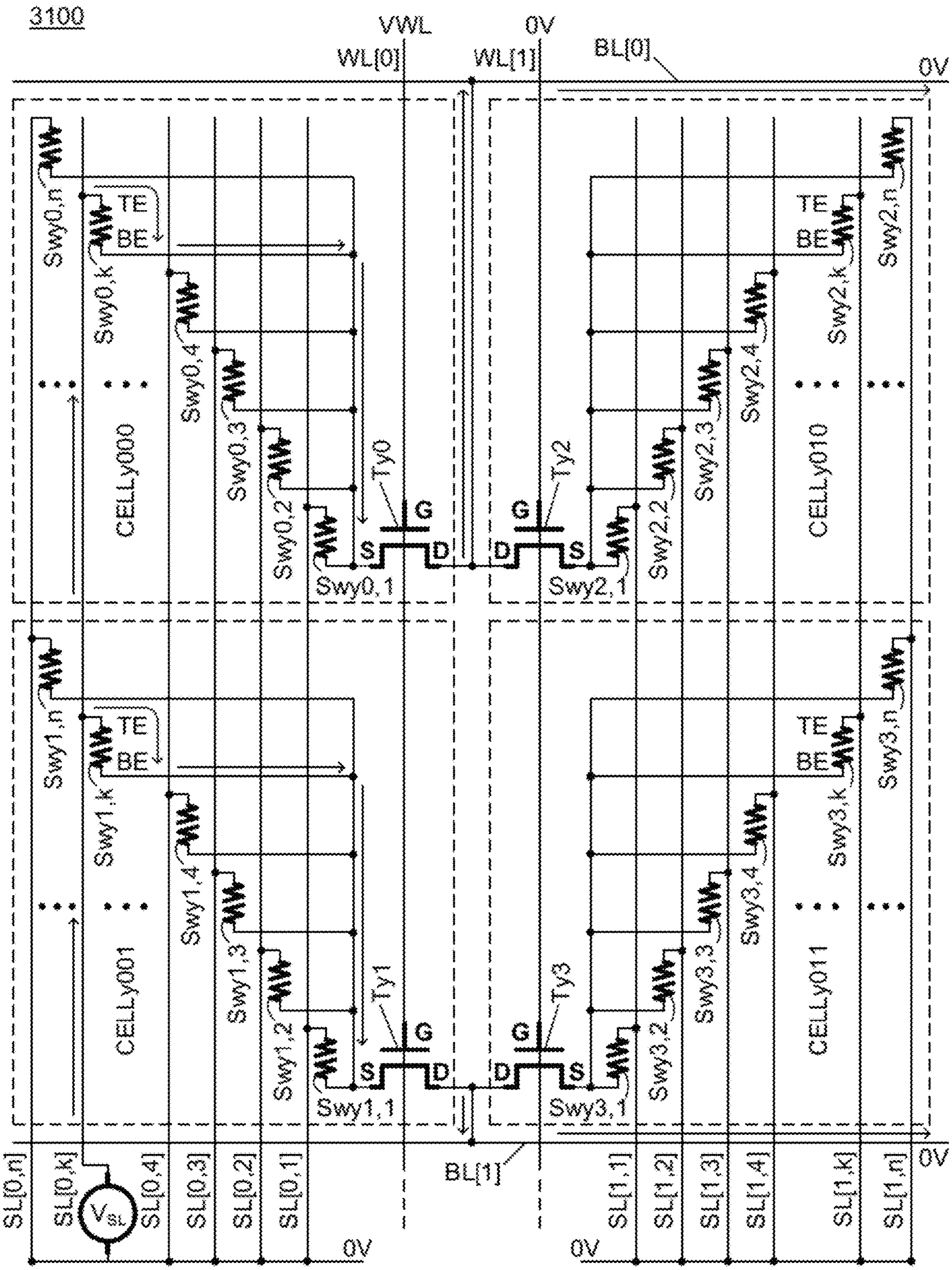
FIG. 31 corresponds to the 3D MSSC array in FIG. 24-1 and is a schematic representation of a multi-switch storage cell array, with a select line voltage shown for a RESET-before-WRITE operation of one selected resistive change element in each multi-switch storage cell along the selected word line.

Referring now to 3D MSSC memory RESET-before-WRITE operation 3100 illustrated in FIG. 31, bit lines BL[0] and BL[1] are held at $V_{BL}$=0 V. One approach may be to hold bit lines BL[0] and BL[1] at $V_{BL}$=0 by setting equilibration voltage $V_0$ shown in 3D MSSC memory open architecture schematic 2600 illustrated in FIG. 26A to zero volts. Alternatively, bit line drivers, such as bit line drivers 820 and 825 illustrated in prior art FIG. 8 and described further above, may be used to electrically connect bit lines BL[0] and BL[1], respectively, to zero volts (ground). Unselected select lines shown in FIG. 31, such as select lines SL[0,1], SL[0,2], SL[0,3], SL[0,4], SL[0,n] may be in electrical communication with zero volts. Then, representative select line SL[0,k] voltage $V_{SL}$ may be driven to RESET voltage $V_{RESET}$ of 2.75 V. $V_{RESET}$ voltage is applied to resistive change element SWy0,k in cell CELLy000 and current flows through cell select FET Ty0 to array bit line BL[0]. If resistive change element SWy0,k is in a low resistance state $R_{LO}$, then it switches to a high resistance RESET state $R_{HI}$. However, if resistive change element SWy0,k is in a high resistance state $R_{HI}$, no resistance change occurs. All other resistive change elements in cell CELLy000 have zero volts across them and no current flows through them.

Representative select line SL[0,k] voltage $V_{SL}$ driven to RESET voltage $V_{RESET}$ of 2.75 V is also applied to resistive change element SWy1,k in cell CELLy001 and current flows through cell select FET Ty1 to array bit line BL[1]. If resistive change element SWy1,k is in a low resistance state $R_{LO}$, then it switches to a high resistance RESET state $R_{HI}$. However, if resistive change element SWy1,k is in a high resistance state $R_{HI}$, no resistance change occurs. All other resistive change elements in cell CELLy001 have zero volts across them and no current flows through them.

Although representative bit lines BL[0] and BL[1] are described in this example, all bit lines intersecting select line SL[0,k] are at zero volts, and a resistive change element in each multi-switch storage cell along select line SL[0,k] is RESET from low resistance $R_{LO}$ to a high resistance state $R_{HI}$, or remains in high resistance state $R_{HI}$.

The maximum select line current flow per multi-switch storage cell for a RESET-before-WRITE operation occurs with the resistive change element resistance value is $R_{LO}$=100 kΩ and is equal to 25 uA. For 256 bits per selected word line and corresponding select line, the select line driver needs to provide 6.4 mA at 2.5 V. The RESET time to transition from a low resistance state $R_{LO}$=100 kΩ to a high resistance state $R_{HI}$=2MΩ is typically a few nanoseconds, after which the set line current flow drops by more than a factor of ten.

Figure 32:
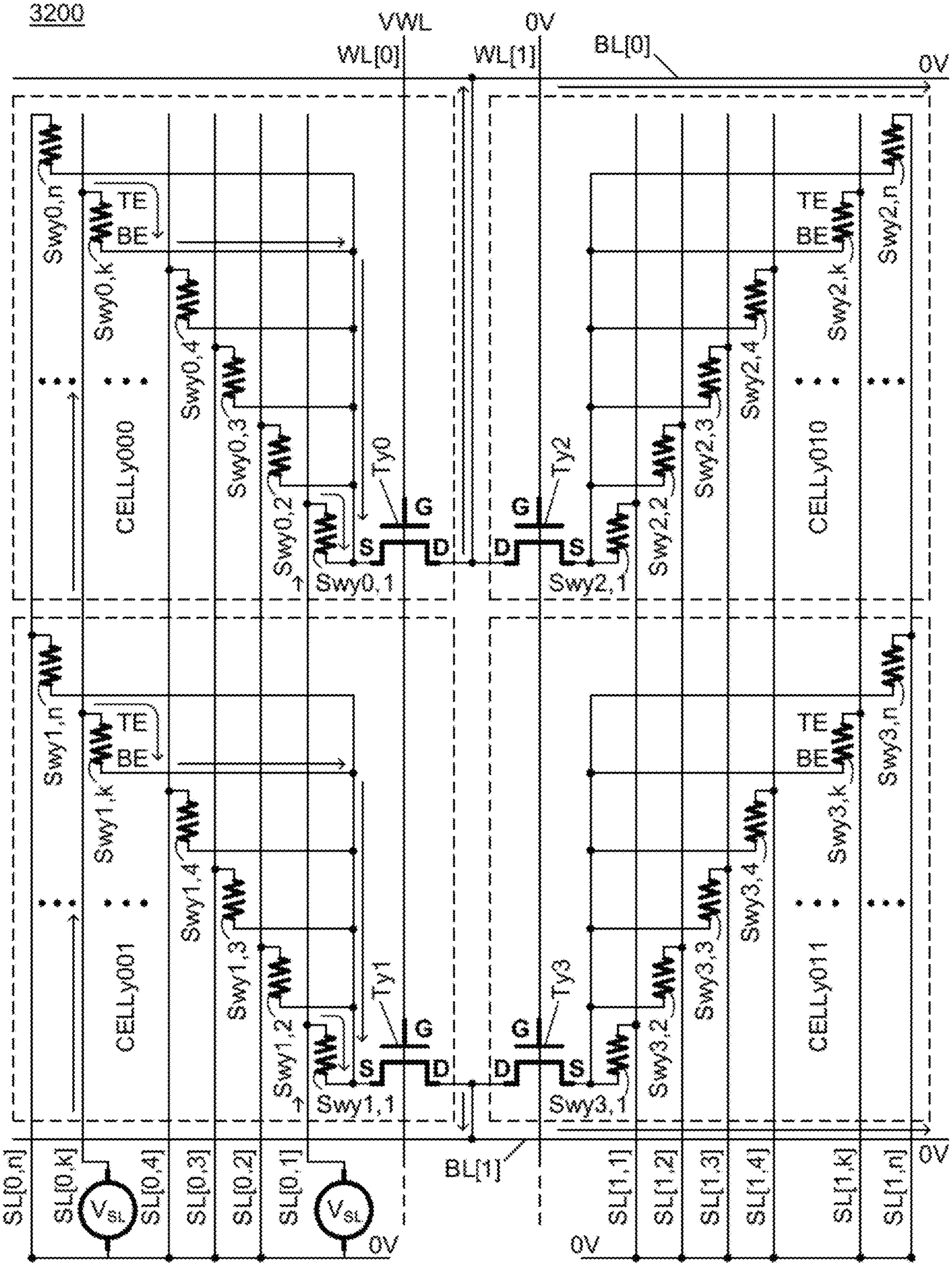
FIG. 32 corresponds to FIG. 31, except that two resistive change elements per cell are RESET at the same time by a select line voltage applied to two select lines.

In some WRITE operations, data from the bidirectional on-chip data bus may be stored in two resistive change elements in the same multi-switch storage cell. The TE of each resistive change element is in electrical communication with a different select line. These data arrive at different times. However, it is possible to perform two RESET operation at essentially the same time. Referring now to FIG. 32, 3D MSSC memory RESET-before-WRITE operation 3200 shows select lines, SL[0,1] and representative select line SL[0,k] performing a RESET operation at approximately the same time. Although two RESET operations are shown in FIG. 32, any number of RESET operations, including a RESET operation of all resistive change elements in the multi-switch storage cell, may occur at approximately the same time.

In a WRITE operation, data bus lines of the bidirectional on-chip data bus drive corresponding SA/Latches to a logic “1” or a logic “0” as described further above with respect to WRITE timing diagram 980 illustrated in prior art FIG. 9B. Timing diagram 980 applies to a selected resistive change element in a multi-switch storage cell just as it applies to single resistive change element cells as described further above with respect to prior art FIG. 9B. As described further above with respect to timing diagram 980, a logic “1” results in a pulse of amplitude $V_{DD}$ on corresponding data lines and a logic “0” results in zero volts (no pulse). During WRITE operations, a reference voltage is not needed, and reference line interface circuit 630 described further above disconnects reference voltage $V_{REF}$ of reference line 625 from SA/latches. Referring now to voltage shifter/driver 2630-0 output voltage $O_{VS0}$ shown in 3D MSSC memory open architecture WRITE operation 2640 illustrated in FIG. 26C, for multi-switch storage cells with n=2 resistive change elements, the low resistance values of two parallel resistive change elements have a combined low resistance of 50 kΩ or higher, which is so much greater than the series FET channel resistances of FET $T_{VS1}$ and $T_{WR0}$, that the WRITE voltage applied to the array bit line BL[0] in multi-switch storage cell memory array 2400 illustrated in FIG. 26C is essentially the same as output voltage $O_{VS0}$, and $O_{VS0}$ is essentially equal to $V_{HI}$.

However, for multi-switch storage cells with n=16, 32, and 64 resistive change elements, low resistance values of parallel resistive change elements may have a combined resistance much lower than a low resistance of $R_{LO}$=100 kΩ. For example, in multi-switch storage cells with n=16, for example, having one selected resistive change element and 15 unselected resistive change elements, the parallel combination of 15 unselected resistive change elements all with low resistance $R_{LO}$=100 kΩ results in a 6.7 kΩ resistance in parallel with the selected resistive change element.

For multiple-switch storage cells, the WRITE bit line voltage needs to allow for voltage drops between $V_{HI}$ and BL[0] when current passes through FETs $T_{VS1}$ and $T_{WR0}$ in series as described further below. The WRITE voltage on array bit line BL[0] for a logic "1" WRITE operation is therefore referred to as $V_{BL}=V_{W-LOG1}$, and for a logic "0" WRITE operation the WRITE voltage on array bit line BL[1] is shown as $V_{BL}=V_{W-LOG0}$ as shown in multi-switch storage cell array WRITE operation 3300 illustrated in FIG. 33.

Figure 26C:
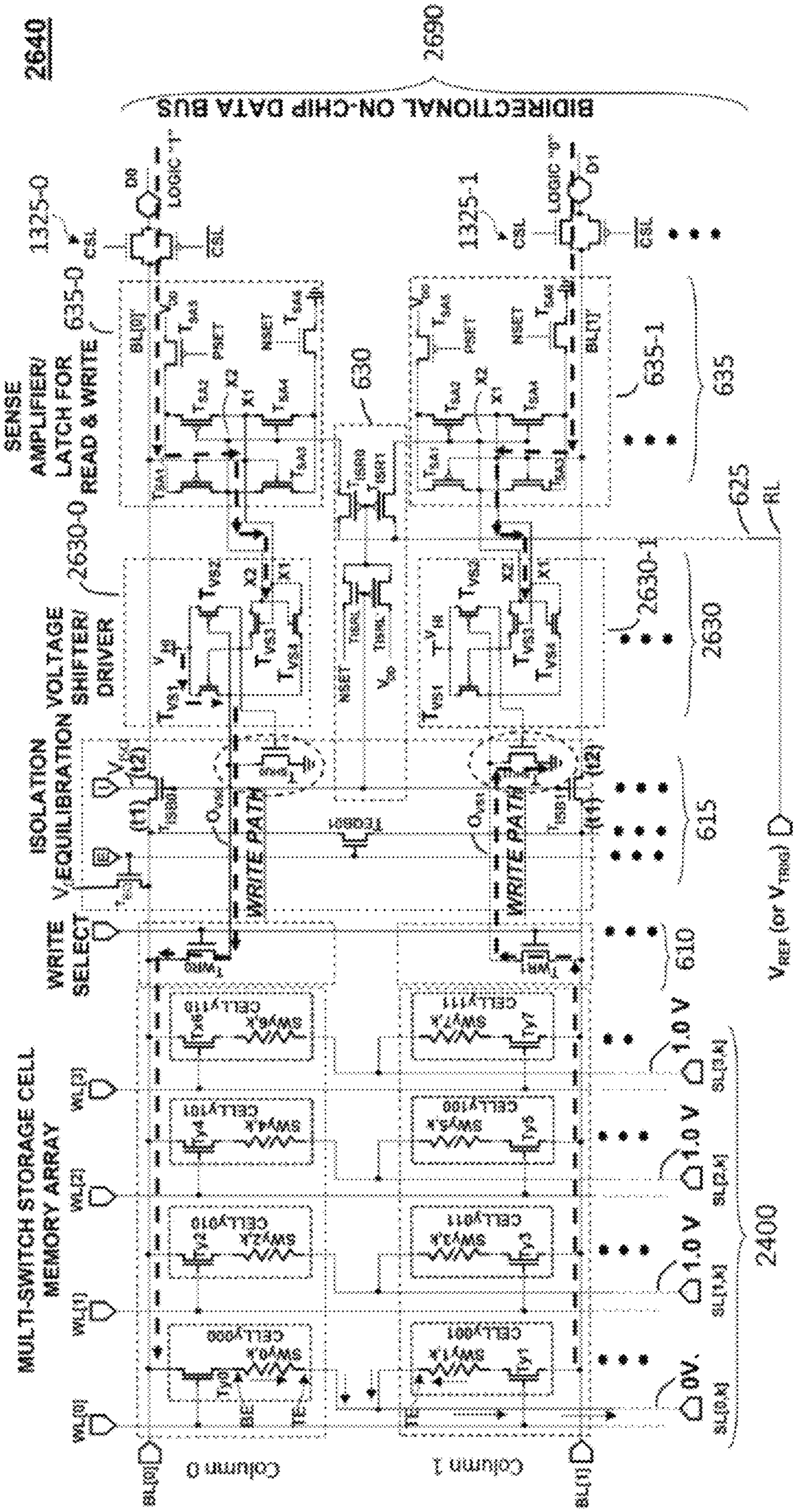
FIG. 26C is a 3D MSSC memory WRITE operation corresponding to 3D MSSC memory open architecture schematic illustrated in FIG. 26A, showing the current flow paths in 3D MSSC memory WRITE operations.
Figure 33:
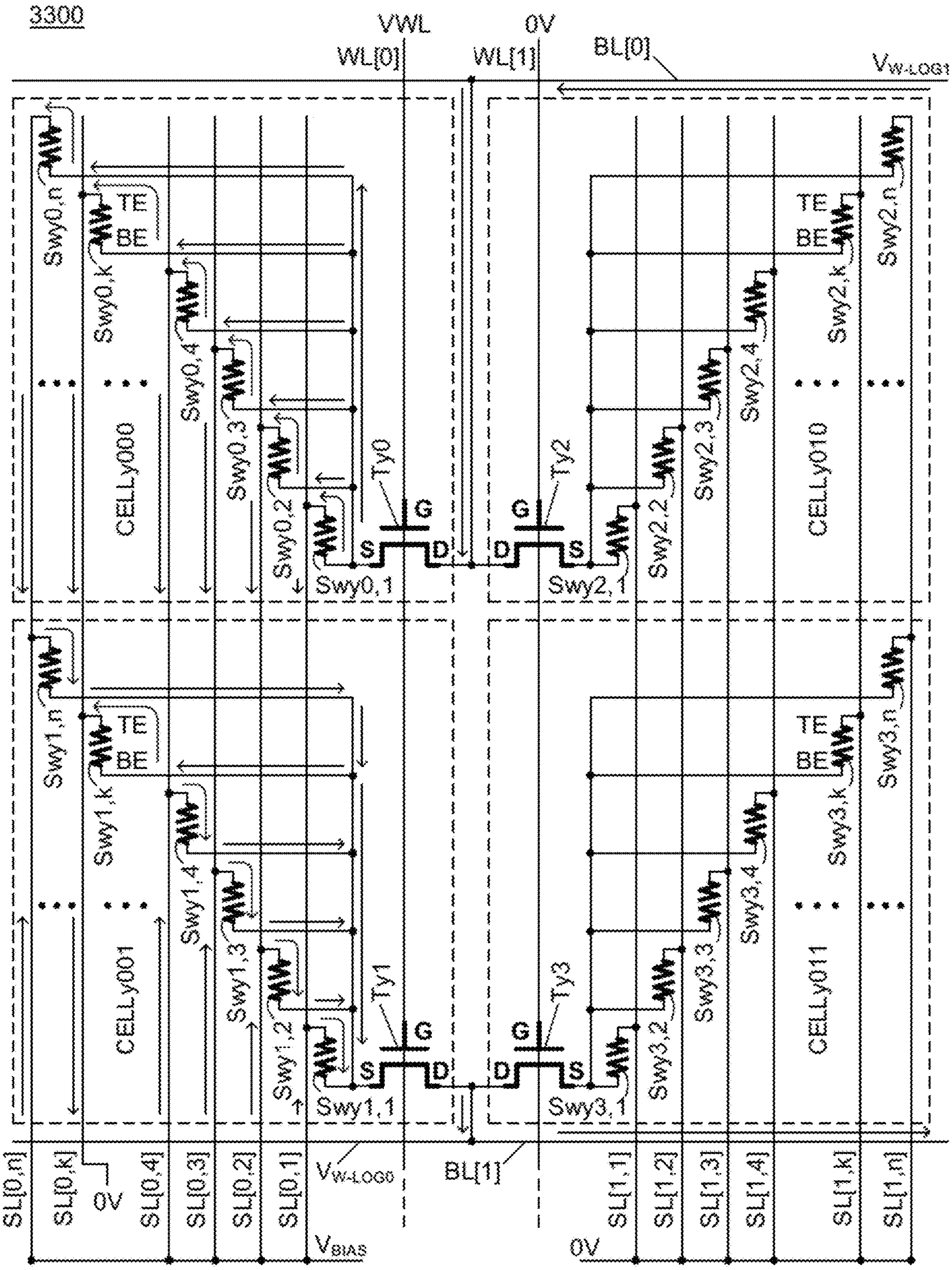
FIG. 33 corresponds to the 3D MSSC array in FIG. 24-1 and is a schematic representation of a multi-switch storage cell array, with voltages shown for a logic "1" WRITE operation and a logic "0" WRITE operation.

Referring now to 3D MSSC memory open architecture WRITE operation 2640 illustrated in FIG. 26C and multi-switch storage cell array WRITE operation 3300 illustrated in FIG. 33, bidirectional on-chip data bus line D0 receives a logic "1" input as a pulse of amplitude $V_{DD}$, 1 V for example. In this example, logic "1" input may be stored as low resistance state $R_{LO}$ in selected resistive change element (switch) SWy0,k. Resistive change element SWy0,k is in high resistance state $R_{HI}$ because of a preceding RESET-before-WRITE operation as described further above with respect to 3D MSSC memory RESET-before-WRITE operation 3100 illustrated in FIG. 31. Hence, voltage shifter/driver 2630-0 applies a WRITE voltage VH1 through voltage shifter/driver FET $T_{VS1}$ and write select FET $T_{WR0}$ to the array bit line BL[0] shown in multi-switch storage cell memory array 2400 illustrated in FIG. 26C, which is applied to resistive change element SWy0,k in CELLy000. Referring now to multi-switch storage cell array WRITE operation 3300 illustrated in FIG. 33, top electrode TE of resistive change element SWy0,k in CELLy000 is in electrical communication with representative select line SL[0,k], which is at zero volts (grounded), and has bottom electrode BE in electrical communication with array bit line BL[0] through cell select FET Ty0. WRITE voltage $V_{BL}=V_{W-LOG1}$ on array bit line BL[0] appears across the bottom electrode BE and top electrode TE of switch SWy0,k, which then transitions from high resistance state $R_{HI}$ to low resistance state $R_{LO}$ with current flowing between bottom electrode BE and top electrode TE.

Referring now to multi-switch storage cell array WRITE operation 3300 illustrated in FIG. 33 and multi-switch storage cell CELLy000, bottom electrode BE of unselected resistive change elements SWy0,1; SWy0,2; SWy0,3; SWy0,4; SWy0,n are also in electrical communication with the source of cell select FET Ty0 and also in electrical communication with array bit line BL[0] through cell select FET Ty0. WRITE disturb is prevented in these unselected resistive change elements by electrically connecting select lines in electrical communication with the top electrodes TE to voltage $V_{SL}=V_{BIAS}$. The TE of unselected resistive change element SWy0,1 is in electrical communication with select line SL[0,1], which is in electrical communication with bias voltage $V_{BIAS}$; TE of unselected resistive change element SWy0,2 is in electrical communication with select line SL[0,2], which is in electrical communication with bias voltage $V_{BIAS}$; TE of unselected resistive change element SWy0,3 is in electrical communication with select line SL[0,3], which is in electrical communication with bias voltage $V_{BIAS}$; TE of unselected resistive change element SWy0,4 is in electrical communication with select line SL[0,4], which is in electrical communication with bias voltage $V_{BIAS}$; TE of unselected resistive change element SWy0,n is in electrical communication with select line SL[0,n], which is in electrical communication with bias voltage $V_{BIAS}$. The voltage difference between TE and BE of each of the unselected switches is $V_{W-LOG1}-V_{BIAS}$, where the voltage difference is sufficiently small not to disturb stored resistive states. The direction of current flow during a logic "1" WRITE operation is from the source terminal of FET $T_{VS1}$ in electrical communication with VFR, through FET $T_{VS1}$ and write select FET $T_{WR0}$, in series, to multi-switch storage memory array 2400 array bit line BL[0], and into the bottom electrodes BE of all resistive change elements in multi-storage cell CELLy000 shown in FIG. 33. The FET channel resistance of FET $T_{VS1}$ and $T_{WR0}$ in series is referred to as $R_W$.

In calculations of switching voltages as described further below with respect to multi-switch storage cell equivalent circuit 3400 illustrated in FIG. 34A, WRITE voltage $V_{BL}=V_{W-LOG1}$ is calculated to ensure that WRITE voltage $V_{BL}=V_{W-LOG1}$ is sufficiently high across the bottom electrode BE—top electrode TE of selected resistive change element SWy0,k shown in cell CELLy000 to meet or exceed the maximum SET voltage requirement, 1.5 volts in this example, including the presence of n−1 unselected resistance values $R_{SW-U}$. Therefore, voltage shifter/driver 2630-0 voltage $V_{HI}$ is typically at a higher voltage than the maximum required SET voltage $V_{SET}$ to ensure at least the maximum SET voltage across the bottom electrode BE—top electrode TE of selected resistive change element SWy0,k in the presence of any combination of nonvolatile stored resistance values in the n−1 unselected resistive change elements in cell CELLy000.

Multi-switch storage cell CELLy000 unselected resistance values $R_{SW-U}$ are the same as described further above and minimum and maximum values of $R_{SW-U}/(n-1)$ are calculated in the same way. Minimum $R_{SW-U}/(n-1)$ low resistance state correspond with $R_{SW-U}$ resistance values being low resistance values $R_{LO}$ and $R_{SW-U}/(n-1)$ high resistance state correspond with $R_{SW-U}$ resistance values being high resistance values $R_{HI}$.

In a logic "1" operation, voltage shifter/driver 2630-0, shown in 3D MSSC memory open architecture WRITE operation 2640 illustrated in FIG. 26C, buffers SA/Latch 635-0 from multi-switch storage cell memory array 2400 WRITE voltage requirements, enabling SA/Latch 635-0 to operate between $V_{DD}$ and zero (ground) voltage, where $V_{DD}$ is 1 V in this example. Typically, voltage shifter/driver 2630-0 drives the array bit line BL[0] section of multi-switch storage cell memory array 2400 substantially above the $V_{DD}$ voltage of SA/Latch 635-0 to sufficiently high WRITE bit line voltage $V_{BL}=V_{W-LOG1}$, which is typically in excess of the maximum SET voltage $V_{SET}$, 1.5 V in this example, as shown and described further below with respect to FIGS. 34A, 34B, and 34C.

In operation, referring to 3D MSSC memory open architecture WRITE operation 2640 illustrated in FIG. 26C, bidirectional on-chip data bus line D0 drives data bus coupling circuit 1325-0, which drives SA/Latch 635-0 node X1 to voltage $V_{DD}$, 1 V in this example. Node X2 switches to 0 V. Voltage shifter/driver 2630-0 FET $T_{VS3}$ is turned ON and zero volts is applied to the gate of FET $T_{VS1}$, which turns ON FET $T_{VS1}$ such that voltage $V_{HI}$ is applied through FETs $T_{VS1}$ and $T_{WR0}$ in series. $V_{HI}$ voltage is sufficiently high that array bit line BL[0] WRITE voltage $V_{BL}=V_{W\text{-}LOG1}$ is equal to or greater than the maximum SET voltage as described further below.

Referring now to 3D MSSC memory open architecture WRITE operation 2640 illustrated in FIG. 26C and multi-switch storage cell array WRITE operation 3300 illustrated in FIG. 33, bidirectional on-chip data bus line D1 receives a logic "0" input as zero volts (no pulse). In this example, logic "0" input may be stored as high resistance state $R_{HI}$ in selected resistive change element SWy1,k. Resistive change element SWy1,k is in a high resistance state $R_{HI}$ because of a preceding RESET-before-WRITE operation as described further above with respect to 3D MSSC memory RESET-before-WRITE operation 3100 illustrated in FIG. 31. Hence, voltage shifter/driver 2630-1 applies a WRITE voltage of zero through write select FET $T_{WR0}$ to the array bit line BL[1] shown in multi-switch storage cell memory array 2400 illustrated in FIG. 26C, which is applied to resistive change element SWy1,k in CELLy001. Referring now to multi-switch storage cell array WRITE operation 3300 illustrated in FIG. 33, resistive change element SWy1,k in CELLy001 has top electrode TE in electrical communication with representative select line SL[0,k], which is at zero volts (grounded), and has bottom electrode BE in electrical communication with array bit line BL[1] through cell select FET Ty1, which is at approximately zero volts. Therefore, the voltage across the terminals BE-TE of resistive change element SWy1,k is approximately zero volts and resistive change element SWy1,k remains in a high resistance state $R_{HI}$.

Referring now to multi-switch storage cell array WRITE operation 3300 illustrated in FIG. 33 and multi-switch storage cell CELLy001, bottom electrodes BE of unselected resistive change elements SWy1,1; SWy1,2; SWy1,3; SWy1,4; SWy1,n are also in electrical communication with the source of cell select FET Ty1 and also in electrical communication with array bit line BL[1] through cell select FET Ty1. The WRITE disturb preventative voltage $V_{BIAS}$ described further above with respect to a WRITE logic "1" operation is applied to these unselected resistive change elements by electrically connecting select lines SL in electrical communication with the top electrodes TE to voltage $V_{SL}=V_{BIAS}$, since either BL[0], BL[1], or any other bit line along a selected word line can receive a logic "1" or logic "0" input. The TE of unselected resistive change element SWy1,1 is in electrical communication with select line SL[0,1], which is in electrical communication with bias voltage $V_{BIAS}$; TE of unselected resistive change element SWy1,2 is in electrical communication with select line SL[0,2], which is in electrical communication with bias voltage $V_{BIAS}$; TE of unselected resistive change element SWy1,3 is in electrical communication with select line SL[0,3], which is in electrical communication with bias voltage $V_{BIAS}$; TE of unselected resistive change element SWy1,4 is in electrical communication with select line SL[0,4], which is in electrical communication with bias voltage $V_{BIAS}$; . . . TE of unselected resistive change element SWy1,n is in electrical communication with select line SL[0,n], which is in electrical communication with bias voltage $V_{BIAS}$. The voltage difference between TE and BE of each of the unselected switches is approximately $V_{BIAS}$, where the voltage difference is sufficiently small not to disturb stored resistive states. Because of the voltage polarity of $V_{BIAS}$, the direction of current flow during a logic "0" WRITE operation is from the bottom electrodes BE of the unselected resistive change elements, through cell select FET Ty1, to multi-switch storage memory array 2400 array bit line BL[1], through write select FET $T_{WR1}$, to the drain of shunt FET $T_{SHU1}$, to ground (zero volts) as shown in FIG. 33 and FIG. 26C. The FET channel resistance of $T_{WR1}$ and $T_{SHU1}$ in series is approximately the same as the FET channel resistance $T_{WR0}$ and $T_{VS1}$ described further above and is also referred to as $R_W$. The channel resistance of shunt FET $T_{SHU1}$ is more than 2 orders of magnitude less resistive than the series channel resistances of FET $T_{VS4}$, $T_{SA4}$, and $T_{SA6}$ to ground. Therefore, shunt FET $T_{SHUN1}$ in electrical communication with $O_{VS1}$ of voltage shifter/driver 2630-1 and ground buffers SA/Latch 635-1 from current flow in bit line BL[1] caused by voltage $V_{BIAS}$ in multi-switch storage cell memory array 2400 shown in FIG. 26C.

In calculations of switching voltages as described further below with respect to multi-switch storage cell equivalent circuit 3500 illustrated in FIG. 35A, voltage $O_{VS1}$ is held at approximately zero volts by shunt FET $T_{SHU1}$. Bias voltage $V_{BIAS}$ is selected to be low enough so that a voltage across the BE-TE terminals of resistive change element SWy1,k shown in cell CELLy001 remains substantially below the minimum SET voltage, 1 volt in this example, including the presence of n−1 unselected resistance values $R_{SW\text{-}U}$. Cell CELLy001 unselected resistance values $R_{SW\text{-}U}$ are the same as described further above and minimum and maximum values of $R_{SW\text{-}U}/(n-1)$ are calculated in the same way. Minimum $R_{SW\text{-}U}/(n-1)$ low resistance state correspond with $R_{SW\text{-}U}$ resistance values $R_{LO}$ and maximum $R_{SW\text{-}U}/(n-1)$ high resistance state correspond with $R_{SW\text{-}U}$ resistance values $R_{HI}$.

In a logic "0" operation, shunt FET $T_{SHU1}$ electrically connects output $O_{VS1}$ of voltage shifter 2630-1 to ground as shown in 3D MSSC memory open architecture WRITE operation 2640 illustrated in FIG. 26C, which buffers SA/Latch 635-1 from current flow in array bit line BL[1] caused by voltage $V_{BIAS}$ from multi-switch storage cell memory array 2400, enabling SA/Latch 635-1 to operate between $V_{DD}$ and zero (ground) voltage, where $V_{DD}$ is 1 V in this example. Selected resistive change element switch SWy1,k in cell CELLy001 remains unchanged in a high resistance state $R_{HI}$, as shown and described further below with respect to FIGS. 35A, 35B, and 35C.

In operation, referring to 3D MSSC memory open architecture WRITE operation 2640 illustrated in FIG. 26C, bidirectional on-chip data bus line D1 drives data bus coupling circuit 1325-1, which drives SA/Latch 635-1 node X1 to voltage zero. Node X2 switches to $V_{DD}$, 1 volt in this example. Voltage shifter/driver 2630-1 FET $T_{VS4}$ is turned ON and zero volts is applied to the gate of FET $T_{VS2}$, which turns ON FET $T_{VS2}$, turning OFF FET $T_{VS1}$, such that WRITE voltage $O_{VS1}$=0 V. The gate of shunt FET $T_{SHU1}$ is in electrical communication with VH1 through FET $T_{VS2}$ and drives output $O_{VS1}$ to approximately zero volts. Shunt FET $T_{SHU1}$ is turned ON with a channel resistance more than 100 times less than the series channel resistances of $T_{VS4}$, $T_{SA4}$, and $T_{SA6}$, to ground such that SA/Latch 635-1 is sufficiently buffered and is not disturbed, as described further below.

Figure 34A:
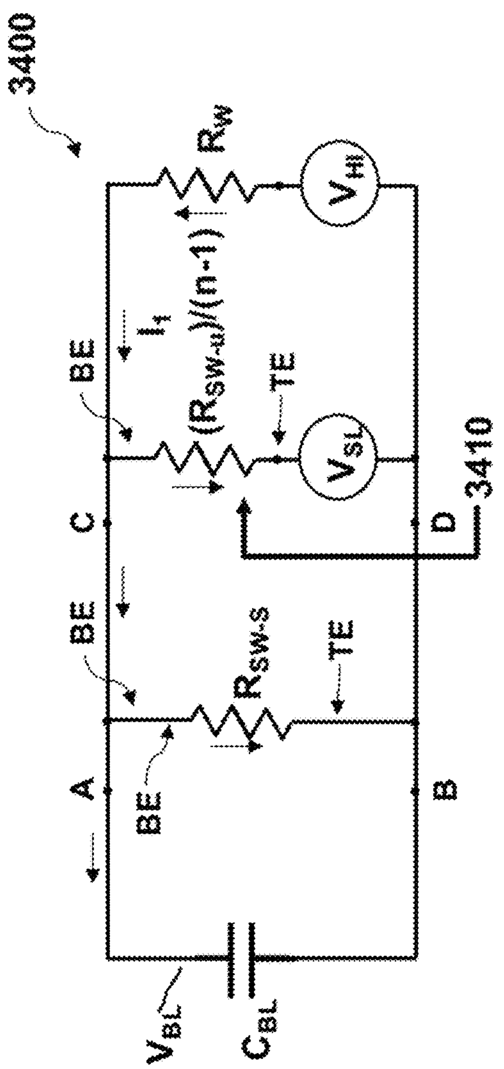
FIG. 34A is a simplified representation of a multi-switch storage cell equivalent circuit for a logic "1" WRITE operation that results in a low resistance stored state in a selected resistive change element.

Referring now to FIG. 34A, multi-switch storage cell equivalent circuit 3400 illustrated in FIG. 34A is an electrical representation of a logic "1" WRITE operation of any selected resistive change element in a multi-switch storage cell in any array of multi-switch storage cells interconnected to form a 3D MSSC array. For example, 3D MSSC memory open architecture WRITE operation 2640 illustrated in FIG. 26C and selected resistive change elements in the multi-switch storage cells described further above in multi-switch storage cell array WRITE operation 3300 illustrated FIG. 33 showing both logic "1" and logic "0" WRITE operations. Multi-switch storage cell equivalent circuit 3400 illustrated in FIG. 34A may be used, as described further below, to calculate bit line signal voltages for a logic "1" WRITE operation for any selected resistive change element in a multi-switch storage cell array WRITE operation 3300 for any time interval during a WRITE operation, including maximum and minimum bit line signal voltages as described further below.

Multi-switch storage cell equivalent circuit 3400 illustrated in FIG. 34A is a circuit representation of WRITE operation 1450 illustrated in FIG. 14B and is used to calculate the bit line voltage $V_{BL}$ as a function of time as shown by EQs. 6 and 7. Multi-switch storage cell equivalent circuit 3400 is an RC circuit representation of a logic "1" WRITE operation whose electrical response to voltage shifter/driver voltage VH1 and select line voltage $V_{SL}$, shown in FIGS. 26C and 33, may be calculated using Thevenin equivalent circuit 3450 illustrated in FIG. 34C, having Thevenin voltage $V_{TH1}$ and Thevenin resistance $R_{TH1}$:

$$V_{BL}=V_{TH1}(1-e^{-t/\tau TH1}) \quad \text{[EQ. 6]}$$

$$\text{Where } \tau_{TH}1=R_{TH1}\times C_{BL}. \quad \text{[EQ. 7]}$$

Figure 34B:
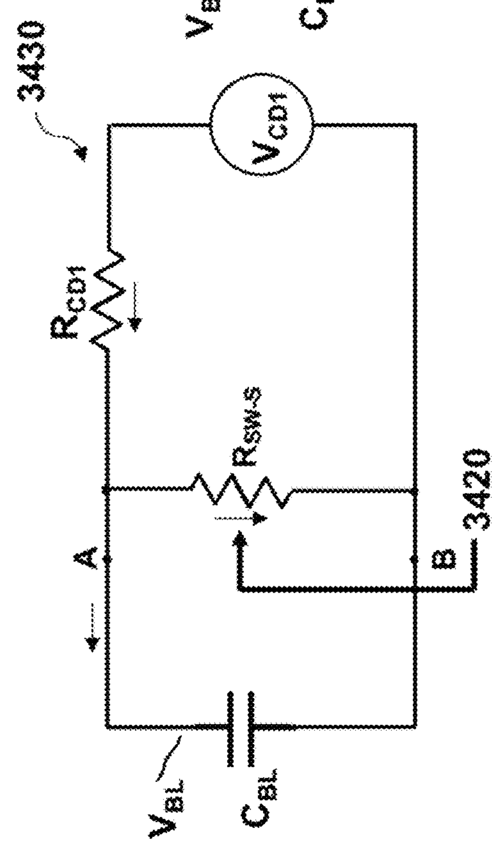
FIG. 34B is a more simplified representation of the multi-switch storage cell equivalent circuit corresponding to FIG. 34A.

Thevenin voltage $V_{TH1}$ and Thevenin resistance $R_{TH1}$ calculations may be facilitated by first isolating circuit 3410 at terminals C-D and then calculating Thevenin equivalent voltage $V_{CD1}$ shown by EQ. 8 and $R_{CD1}$ shown by EQ. 9, respectively, as follows:

$$V_{CD1}=V_{SL}+I_1\times[R_{SW\text{-}U}/(n-1)], \text{ where}$$

$$I_1=(O_{VS}-V_{SL})/[R_{SW\text{-}U}/(n-1)+R_W], \text{ therefore,}$$

$$V_{CD1}=V_{SL}+(O_{VS}-V_{SL})\times[R_{SW\text{-}U}/(n-1)]/[R_{SW\text{-}U}/(n-1)+R_W]; \text{ and} \quad \text{[EQ. 8]}$$

$$R_{CD1}=[R_{SW\text{-}U}/(n-1)]\times R_W/[R_{SW\text{-}U}/(n-1)+R_W] \quad \text{[EQ. 9]}$$

resulting in simplified multi-switch storage cell equivalent circuit 3430 illustrated in FIG. 34B.

Thevenin voltage $V_{TH1}$ shown in EQ. 10 and Thevenin resistance $R_{TH1}$ shown in EQ. 11 corresponding to Thevenin equivalent circuit 3450 illustrated in FIG. 34C may be calculated for simplified multi-switch storage cell equivalent circuit 3430 between isolated terminals A-B as follows:

$$V_{TH}1=V_{CD1}\times R_{SW\text{-}S}(R_{SW\text{-}S}+R_{CD1}) \quad \text{[EQ. 10]}$$

$$R_{TH}1=(R_{SW\text{-}S}\times R_{CD1})/(R_{SW\text{-}S}+R_{CD1}) \quad \text{[EQ. 11]}$$

Figure 34C:
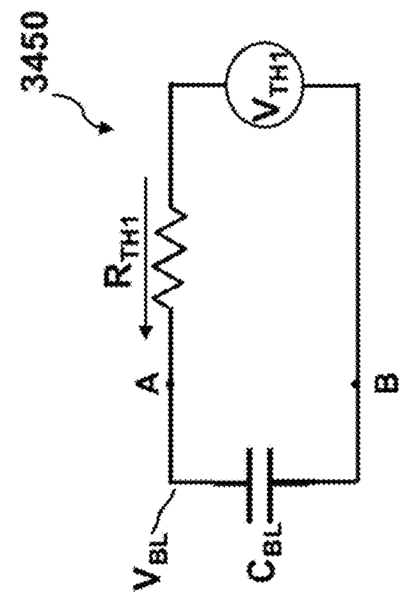
FIG. 34C is a Thevenin equivalent circuit that corresponds to FIG. 34A.

Referring now to 3D MSSC memory open architecture WRITE operation 2640 illustrated in FIG. 26C, multi-switch storage cell array WRITE operation 3300 illustrated in FIG. 33, and multi-switch storage cell equivalent circuits in FIGS. 34A-34C, equations EQ. 6-11 may be used to calculate the bit line voltage $V_{BL}$ as a function of voltage shifter/driver voltage $V_{HI}$ in response to logic "1" WRITE input for the following parameters:

- Resistive change element low resistance state value $R_{SW}=R_{LO}=100$ kΩ, which represents a logic "1", and high resistance state value $R_{SW}=R_{HI}=2$ MΩ, which represents a logic "0";
- FET $T_{VS1}$ and $T_{WR0}$ series channel resistance $R_W=1$ kΩ;
- Bit line capacitance $C_{BL}=400$ fF;
- SET voltage range=1-1.5 V and RESET voltage range=2-2.5 V;
- Voltage shifter/driver voltage $V_{HI}$; and
- $V_{SL}=V_{BIAS}=0.75$ to 1 V.

At this point in the specification, for a logic "1" WRITE operation, EQs. 6-11 may be used to calculate the value of voltage shifter/driver 2630-0 voltage $V_{HI}$ needed to ensure that voltage shifter/driver output $O_{VS0}$ meets or exceeds the maximum SET voltage $V_{SET}=1.5$ V requirement when unselected resistive change elements have resistance values of $R_{SW\text{-}U}=100$ kΩ and when unselected resistive change elements have resistance values of $R_{SW\text{-}U}=2$ MΩ.

In this example, the voltage $V_{HI}$ value is calculated for exemplary multi-switch storage cell CELLy000 shown in multi-switch storage cell array WRITE operation 3300 illustrated in FIG. 33, in which CELLy000 has n=16 resistive change elements, of which selected resistive change element SWy0,k is in a high selected resistance state $R_{SW\text{-}S}=R_{HI}=2$ MΩ RESET state because of a RESET-before-WRITE operation as described further above, and all other n−1=15 unselected resistive change elements are in a low unselected resistance state $R_{SW\text{-}U}=R_{LO}=100$ kΩ and corresponding parallel resistance $R_{SW\text{-}U}/(n-1)=6.7\times10^3$Ω.

Referring now to EQs. 8 and 9, $$V_{CD1}=1+(V_{HI}-1)\times[6.7\times10^3]/[6.7\times10^3+1\times10^3]; \; V_{CD1}=0.87V_{HI}+0.13$$

$$R_{CD1}=(6.7\times10^3\times10^3)/[6.7\times10^3+10^3]; R_{CD1}=0.87\times10^3$$

Referring now to EQs. 10 and 11, $$V_{BL}=V_{TH1}=[0.87V_{HI}+0.13]\times[2\times10^6/(2\times10^6+0.87\times10^3)]$$

$$V_{BL}=0.87V_{HI}+0.13$$

$$1.5=0.87V_{HI}+0.13; V_{HI}=1.58V$$

Therefore, voltage shifter/driver 2630-0 voltage $V_{HI}=1.58$ V.

In a logic "1" operation, $V_{HI}=1.58$ V to ensure a bit line logic "1" WRITE voltage of $V_{BL}=V_{W\text{-}LOG1}=1.50$ V.

$V_{TH1}$ and $R_{TH1}$ are calculated as follows:

$$V_{TH1}=0.87V_{HI}+0.13=0.87\times1.58+0.13; V_{TH1}=1.5V$$

$$R_{TH1}=(2\times10^6\times0.87\times10^3)/(2\times10^6+0.87\times10^3); \; R_{TH1}=0.87\times10^3\Omega$$

Referring now to EQs. 6 and 7:

$$V_{BL}=1.5(1-e^{-t/\tau_{TH1}})=1.5(1-e^{-t/0.35});$$

$$\tau_{TH1}=0.87\times10^3\times400\times10^{-15}; \tau_{TH1}=0.35 \text{ ns}$$

In t=1.5 ns, $V_{BL}=1.5\times0.99$; $V_{BL}=1.48$ V. $V_{BL}=V_{W\text{-}LOG1}$ for a logic "1" WRITE operation as shown above. Therefore, when unselected resistive change element resistance $R_{SW\text{-}U}=100$ kΩ in a logic "1" WRITE operation, voltage shifter/driver 2630-0 shown in 3D MSSC memory open architecture WRITE operation 2640 illustrated in FIG. 26C drives array bit line BL[0] to approximately 1.5 V in about 1.5 ns.

In this example, the voltage $V_{HI}$ value is calculated for exemplary multi-switch storage cell CELLy000 shown in multi-switch storage cell array WRITE operation 3300 illustrated in FIG. 33, in which CELLy000 has n=16 resistive change elements, of which selected resistive change element SWy0,k is in a high selected resistance state $R_{SW-S}=R_{HI}=2$ MΩ RESET state because of a RESET-before-WRITE operation as described further above, and all other n−1=15 unselected resistive change elements are in a high unselected resistance state $R_{SW-U}=R_{HI}=2$ MΩ and corresponding parallel resistance $R_{SW-U}/(n-1)=1.33\times10^5\Omega$. A voltage shifter/driver voltage of $V_{HI}=1.58$ is used for this calculation because if $R_{SW-U}=100$ kΩ, then $V_{W-LOG1}$ can only reach 1.5 V with $V_{HI}=1.58$ V.

Referring now to EQs. 8 and 9, $$V_{CD1}=1+(1.58-1)\times[1.33\times10^5]/[1.33\times10^5+1\times10^3];\ V_{CD1}=1.57V$$

$$R_{CD1}=(1.33\times10^5\times10^3)/[1.33\times10^5+10^3];R_{CD1}=0.99\times10^3\Omega$$

Referring now to EQs. 10 and 11, $$V_{BL}=V_{TH1}=1.57\times[2\times10^6/(2\times10^6+0.87\times10^3)];\ V_{BL}=V_{TH1}=1.57V$$

$$R_{TH1}=(2\times10^6\times0.99\times10^3)/(2\times10^6+0.99\times10^3);\ R_{TH1}=0.99\times10^3\Omega$$

In a logic "1" operation with $V_{HI}=1.58$ V and $R_{SW-U}=2$ MΩ, the bit line voltage for a logic "1" WRITE results in a bit line voltage $V_{BL}=V_{W-LOG1}=1.57$ V.

Referring now to EQs. 6 and 7:

$$V_{BL}=1.57(1-e^{-t/\tau_{TH1}})=1.57(1-e^{-t/0.40});$$

$$\tau_{TH1}=0.99\times10^3\times400\times10^{-15};\tau_{TH1}=0.40\text{ ns}$$

In t=1.5 ns, $V_{BL}=1.57\times0.975$; $V_{BL}=1.53$ V. $V_{BL}=V_{W-LOG1}$ for a logic "1" WRITE operation as shown above. Therefore, when unselected resistive change element resistance $R_{SW-U}=2$ MS/in a logic "1" WRITE operation, voltage shifter/driver 2630-0 shown in 3D MSSC memory open architecture WRITE operation 2640 illustrated in FIG. 26C drives array bit line BL[0] to approximately 1.53 V in about 1.5 ns.

Hence, for both unselected resistive change element resistance values $R_{SW-U}$ of 100 kΩ and 2 MΩ, voltage shifter/driver 2630-0 drives array bit line BL[0] to approximately 1.5 V in approximately 1.5 ns.

Referring now to logic "1" and logic "0" WRITE operation summary 3600 table illustrated in FIG. 36 for a multi-switch storage cell with n=16 resistive change elements, the current corresponding to a logic "1" WRITE operation flowing in the selected resistive change element after switching to a low resistance $R_{LO}=100$ kΩ with applied bit line voltage of 1.57 V is 15.7 uA. The n−1 unselected resistive change elements in parallel have a resistance of 6.7 kΩ and a voltage across them of 0.57 V for a current flow of 85 uA. Therefore, the corresponding voltage shifter/driver provides a total of 100.7 uA at 1.57 volts to the corresponding bit line.

Figure 35A:
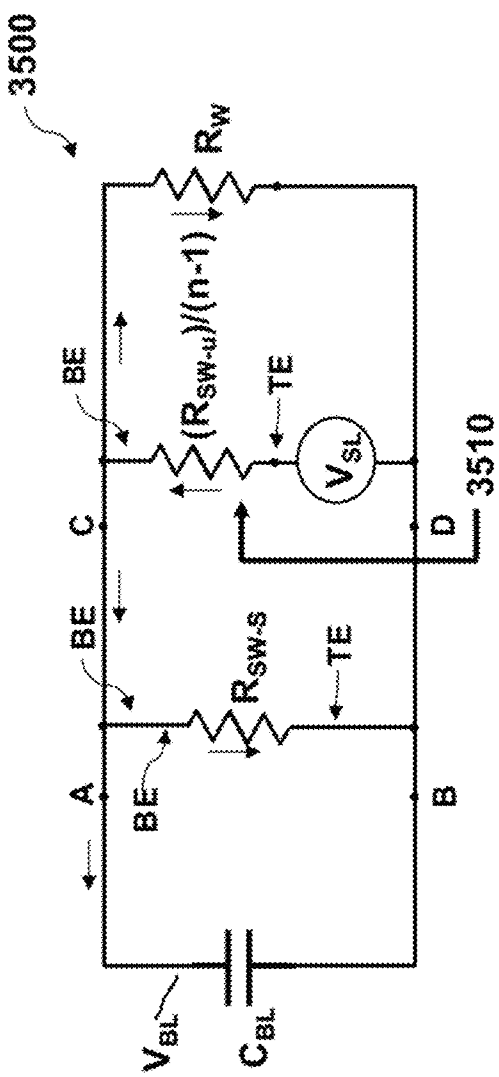
FIG. 35A is a simplified representation of a multi-switch storage cell equivalent circuit for a logic "0" WRITE operation that results in a high resistance stored state in a selected resistive change element.

Referring now to FIG. 35A, multi-switch storage cell equivalent circuit 3500 illustrated in FIG. 35A is an electrical representation of a logic "0" WRITE operation of any selected resistive change element in a multi-switch storage cell in any array of multi-switch storage cells interconnected to form a 3D MSSC array. For example, 3D MSSC memory open architecture WRITE operation 2640 illustrated in FIG. 26C and selected resistive change elements in the multi-switch storage cells described further above in multi-switch storage cell array WRITE operation 3300 illustrated FIG. 33 showing both logic "1" and logic "0" WRITE operations. Multi-switch storage cell equivalent circuit 3500 illustrated in FIG. 35A may be used, as described further below, to calculate bit line signal voltages for a logic "0" WRITE operation for any selected resistive change element in a multi-switch storage cell array WRITE operation 3300 illustrated in FIG. 33 for any time interval during a WRITE operation, including maximum and minimum bit line signal voltages as described further below.

Multi-switch storage cell equivalent circuit 3500 illustrated in FIG. 35A is a circuit representation of WRITE operation 1450 illustrated in FIG. 14B and is used to calculate the bit line voltage $V_{BL}$ as a function of time as shown by EQs. 12 and 13. Multi-switch storage cell equivalent circuit 3500 is an RC circuit representation of a logic "0" WRITE operation whose electrical response to voltage shifter/driver voltage of ground (zero volts) and select line voltage $V_{SL}$, shown in FIGS. 26C and 33, may be calculated using Thevenin equivalent circuit 3550 illustrated in FIG. 35C, having Thevenin voltage $V_{TH2}$ and Thevenin resistance $R_{TH2}$:

$$V_{BL}=V_{TH2}(1-e^{-t/\tau TH2}) \quad \text{[EQ. 12]}$$

$$\text{Where } \tau_{TH2}=R_{TH2}\times C_{BL}. \quad \text{[EQ. 13]}$$

Figure 35B:
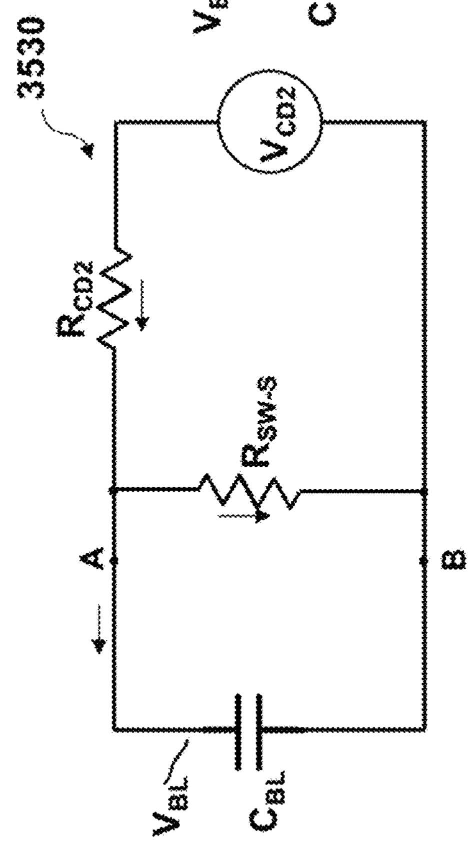
FIG. 35B is a more simplified representation of the multi-switch storage cell equivalent circuit corresponding to FIG. 35A.

Thevenin voltage $V_{TH2}$ and Thevenin resistance $R_{TH2}$ calculations may be facilitated by first isolating circuit 3510 illustrated in FIG. 35A at terminals C-D and then calculating Thevenin equivalent voltage $V_{CD2}$ shown by EQ. 14 and $R_{CD2}$ shown by EQ. 15, respectively, as follows:

$$V_{CD2}=V_{SL}\times[R_W]/[R_{SW-U}/(n-1)+R_W];\text{ and} \quad \text{[EQ. 14]}$$

$$R_{CD2}=[R_{SW-U}/(n-1)]\times R_W/[R_{SW-U}/(n-1)+R_W] \quad \text{[EQ. 15]}$$

resulting in simplified multi-switch storage cell equivalent circuit 3530 illustrated in FIG. 35B.

Thevenin voltage $V_{TH2}$ shown in EQ. 16 and Thevenin resistance $R_{TH2}$ shown in EQ. 17 corresponding to Thevenin equivalent circuit 3550 illustrated in FIG. 35C may be calculated for simplified multi-switch storage cell equivalent circuit 3530 between isolated terminals A-B as follows:

$$V_{TH2}=V_{CD2}\times R_{SW-S}/(R_{SW-S}+R_{CD2}) \quad \text{[EQ. 16]}$$

$$R_{TH}2=(R_{SW-S}\times R_{CD2})/(R_{SW-S}+R_{CD2}) \quad \text{[EQ. 17]}$$

Figure 35C:
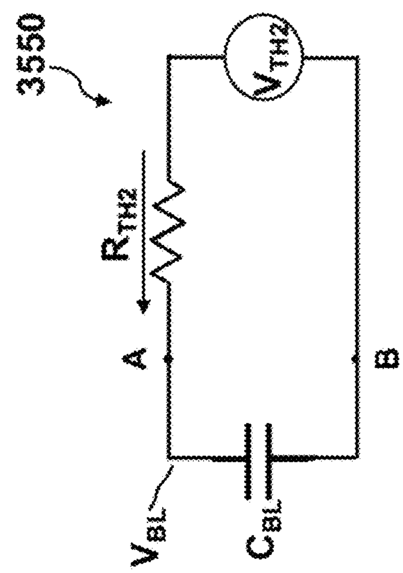
FIG. 35C is a Thevenin equivalent circuit that correspond to FIG. 35A.

Referring now to 3D MSSC memory open architecture WRITE operation 2640 illustrated in FIG. 26C, multi-switch storage cell array WRITE operation 3300 illustrated in FIG. 33, and multi-switch storage cell equivalent circuits in FIGS. 35A-35C, equations EQ. 12-17 may be used to calculate the bit line voltage $V_{BL}$ as a function bias voltage $V_{BIAS}$ in response to logic "0" WRITE input for the following parameters:

- Resistive change element low resistance state value $R_{SW}=R_{LO}=100$ kΩ, which represents a logic "1", and high resistance state value $R_{SW}=R_{H1}=2$ MΩ, which represents a logic "0";
- FET $T_{SHU1}$ and $T_{WR1}$ series channel resistance $R_W=1$ kΩ;
- Bit line capacitance $C_{BL}=400$ fF;
- SET voltage range=1-1.5 V and RESET voltage range=2-2.5 V; and
- $V_{SL}=V_{BIAS}=0.75$ to 1 V.

At this point in the specification, for a logic "0" WRITE operation, EQs. 12-17 may be used to calculate the value of bit line voltage $V_{W-LOG0}$ caused by bias voltage $V_{BIAS}$ applied to unselected resistive change elements when unselected resistive change elements have resistance values of $R_{SW-U}=100$ kΩ and when unselected resistive change elements have resistance values of $R_{SW-U}=2$ MΩ.

In this example, the $V_{W\text{-}LOG0}$ value is calculated for exemplary multi-switch storage cell CELLy001 shown in multi-switch storage cell array WRITE operation 3300 illustrated in FIG. 33, in which CELLy001 has n=16 resistive change elements, of which selected resistive change element SWy1,k is in a high selected resistance state $R_{SW\text{-}S}=R_{HI}=2$ MΩ RESET state because of a preceding RESET-before-WRITE operation as described further above, and all other n−1=unselected resistive change elements are in a low unselected resistance state $R_{SW\text{-}U}=R_{LO}=100$ kΩ and corresponding parallel resistance $R_{SW\text{-}U}/(n-1)=6.7\times10^3\Omega$.

Referring now to EQs. 14 and 15, $$V_{CD2}=1\times[1\times10^3]/[6.7\times10^3+1\times10^3];V_{CD2}=0.13V$$

$$R_{CD2}=[6.7\times10^3\times1\times10^3]/[6.7\times10^3+1\times10^3];\ R_{CD2}=0.87\times10^3$$

Referring now to EQs. 16 and 17, $$V_{BL}=V_{TH2}=0.13\times[2\times10^6/(2\times10^6+0.87\times10^3)];\ V_{TH2}=0.13V$$

$$V_{BL}=0.13V$$

$$R_{TH2}=[2\times10^6\times0.87\times10^3]/[2\times10^6+0.87\times10^3];\ R_{TH2=0.87}\times10^3\Omega$$

In a logic "0" operation, $V_{BL}=V_{W\text{-}LOG0}=0.13$ V.

If instead, $R_{SW\text{-}U}=R_{HI}=2$ MΩ, then referring to EQs. 14 and 15, $$V_{CD2}=1\times[1\times10^3]/[1.33\times10^5+1\times10^3];V_{CD2}=0.75\times10^{-2}V$$

$$R_{CD2}=[1.33\times10^5\times1\times10^3]/[1.33\times10^5+1\times10^3];\ R_{CD2}=0.99\times10^3$$

Referring now to EQs. 16 and 17, $$V_{BL}=V_{TH2}=0.75\times10^{-2}\times[2\times10^6/(2\times10^6+0.99\times10^3)];\ V_{TH2}=0.75\times10^{-2}V$$

$$R_{TH2}=[2\times10^6\times0.99\times10^3]/[2\times10^6+0.99\times10^3];\ R_{TH2}=0.99\times10^3\Omega$$

Because of the RESET-before-WRITE approach, the selected resistive change element resistance remains in the high resistance state $R_{HI}=2$ MΩ and does not switch in a logic "0" WRITE operation, the required time is zero.

Referring now to WRITE voltages across selected and unselected resistive change elements 3600 in FIG. 36 for multi-switch storage cells with n=16 resistive change elements per cell, the top row shows results for unselected resistance value $R_{SW\text{-}U}=100$ kΩ and the bottom row shows results for $R_{SW\text{-}U}=2$ MΩ, for both WRITE logic "1" and WRITE logic "0" operations.

Referring to results for WRITE logic "1", selected $R_{SW\text{-}S}$ resistive change element show a WRITE voltage in the range of 1.5 V to 1.57 V between BE and TE electrodes that meets or exceeds the maximum SET voltage requirement of 1.5 V, resulting in a SET operation transition from 2 MΩ to 100 kΩ.

Referring now to unselected $R_{SW\text{-}U}$ resistive change elements show a range of 0.75 V to V between BE and TE electrodes, which is less than the minimum SET voltage of 1.0 V, and therefore no switching; that is, the stored resistance is not disturbed.

Referring to results for WRITE logic "0", selected $R_{SW\text{-}S}$ resistive change element show a range of 0.13 V to 0.01 V between BE and TE electrodes, which is less than the minimum SET voltage of 1 V. Hence no switching; that is, the stored resistance is not disturbed.

Referring now to unselected $R_{SW\text{-}U}$ resistive change elements show a range of 0.62 V to V between TE and BE electrodes, which is less than the minimum RESET voltage of 2 V. Hence, no switching; that is, the stored resistance is not disturbed.

Figure 26D:
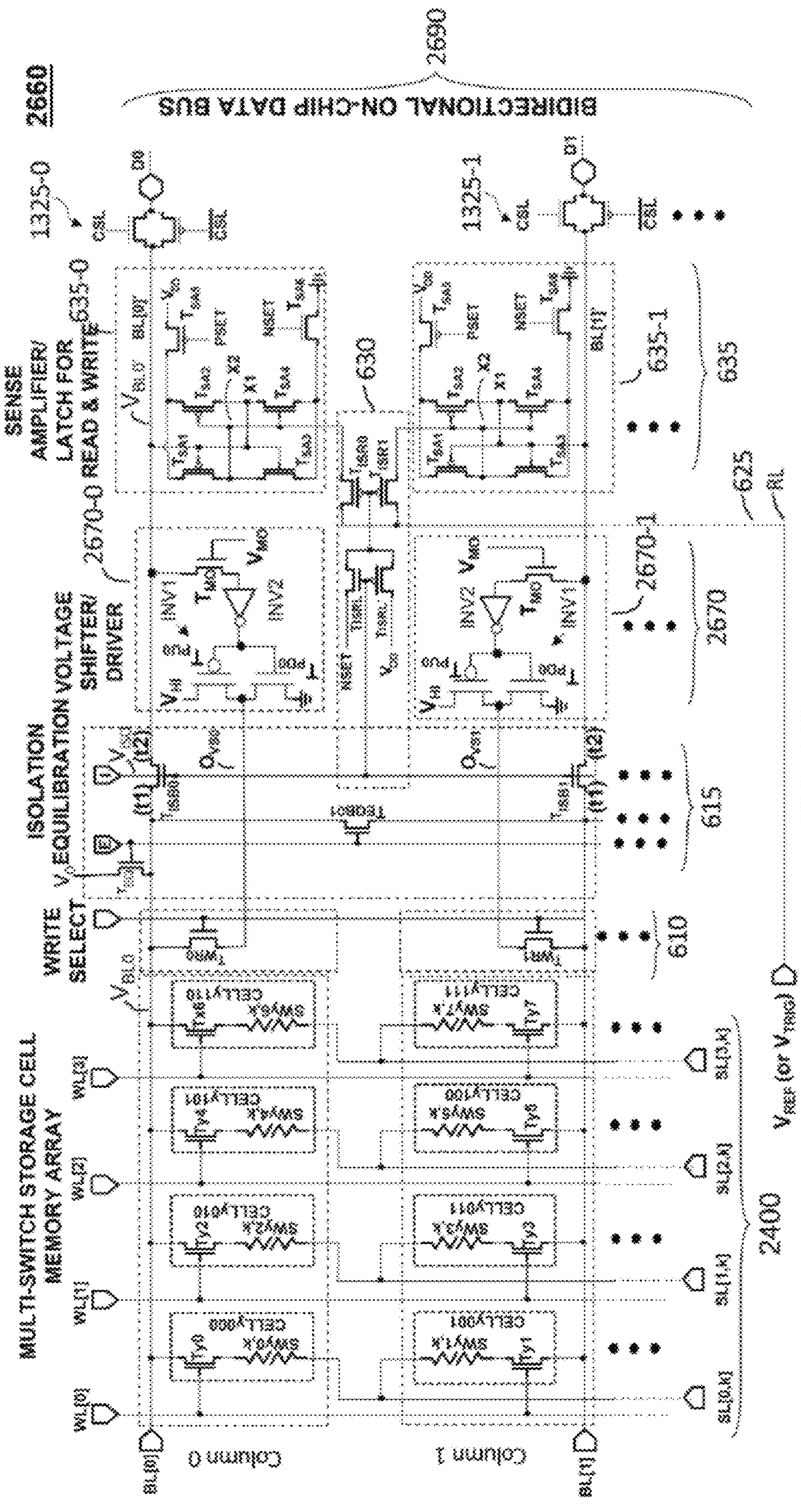
FIG. 26D is a 3D MSSC memory open architecture schematic corresponding to FIG. 26A in which a simplified voltage shifter/driver circuit replaces the corresponding voltage shifter/driver circuit in FIG. 26A.

Referring now to FIG. 26D, 3D MSSC memory open architecture schematic 2660 is essentially the same as 3D MSSC memory open architecture schematic 2600 illustrated in FIG. 26A, except that simplified voltage shifter/drivers 2670 replace voltage shifter/drivers 2630 illustrated in FIG. 26A. Voltage shifter/driver 2670-0 replaces voltage shifter/driver 2630-0 and voltage shifter/driver 2670-1 replaces voltage shifter/driver 2630-1 in FIGS. 26D and 26A, respectively. Voltage shifter/drivers are used during WRITE operations.

Voltage shifter/drivers 2670-0 and 2670-1 illustrated in FIG. 26D use the same circuits and interconnections. A mode select FET $T_{MO}$ has a drain terminal in electrical communication with bit line segment BL[0]' for voltage shifter/driver 2670-0 and in electrical communication with bit line segment BL[1]' for voltage shifter/driver 2670-1, a source terminal in electrical communication with an input of inverter INV2 in series with inverter INV1, and a gate in electrical communication with mode select voltage $V_{MO}$ to activate FET $T_{MO}$ during a WRITE operation and deactivate FET $T_{MO}$ during a READ operation, with $V_{MO}=V_{DD}$ and 0 V for WRITE and READ operations, respectively. Two inverters in series are used, INV1 and INV2, to avoid voltage polarity inversion. Referring to voltage shifter/driver 2670-0, inverter INV1 includes a pullup FET $T_{PU0}$ whose source terminal is in electrical communication with voltage $V_{HI}$ and drain terminal is in electrical communication with the common output node and a pulldown FET $T_{PD1}$ whose drain terminal is also in electrical communication with the common output node and source terminal is in electrical communication with ground (zero volts). The gate terminals of FETs $T_{PU0}$ and $T_{PD1}$ are in electrical communication with each other and the output of inverter INV2. Referring to voltage shifter/driver 2670-0, common output node output $O_{VS0}$ is in electrical communication with write select FET $T_{WR0}$. Referring to voltage shifter/driver 2670-1, inverter INV1 includes a pullup FET $T_{PU0}$ whose source terminal is in electrical communication with voltage $V_{HI}$ and drain terminal is in electrical communication with the common output node and a pulldown FET Tan whose drain terminal is also in electrical communication with the common output node and source terminal is in electrical communication with ground (zero volts). The gate terminals of FETs $T_{PU0}$ and $T_{PD1}$ are in electrical communication with each other and the output of inverter INV2. Referring to voltage shifter/driver 2670-1, common output node output $O_{VS1}$ is in electrical communication with write select FET $T_{WR1}$.

The operation of 3D MSSC memory open architecture schematic 2660 illustrated in FIG. 26D is essentially the same as described further above with respect to 3D MSSC memory open architecture schematic 2600 illustrated in FIG. 26A described further above for both READ and WRITE operations. The WRITE operation of 3D MSSC memory open architecture schematic 2660 corresponds to 3D MSSC memory WRITE operation 2640 illustrated in FIG. 26C.

Initialization of Selected Resistive Change Elements in a Memory Array with 1T, 1R Cells Referring now to U.S. Pat. No. 10,340,005 issued to Bertin and corresponding prior art FIGS. 8, 37, 38, and 39. Initialization of memory array cells with a cell select device and a single resistive change element per cell (1T, 1R cell)

is described further below with respect to nonvolatile carbon nanotube (CNT) switches, which are a type of nonvolatile resistive change element.

Electrical test site data on NV CNT switches, such as NV CNT switch 110 illustrated in prior art FIG. 5A, have shown that switch initialization after fabrication may be needed for some NV CNT switches to ensure the NV CNT switch bipolar (bidirectional) SET/RESET operation conditions summarized in Table 3800 and shown in prior art FIG. 38.

Measurements of as-fabricated (also referred to as virgin) NV CNT switches show that some switches do not display the desired bipolar SET/RESET switching voltages, such as SET voltage $V_{SET}$ in the 1-1.5 V range and RESET voltage $V_{RESET}$ in the 2-2.5 V range shown in prior art FIG. 38 and used in operating examples further above, without including electrical initialization steps after fabrication. Such electrical initialization steps may be performed on memory chips at wafer level and/or at the packaged level. NV CNT switches, such as CNT switch 110 illustrated in prior art FIG. 5A, were exposed to a DC voltage scan $V_{DCI-V}$, cell resistance was calculated, and a plot of cell resistance as a function of applied voltage was generated as shown by NV CNT switch initialization scan 3700 illustrated in prior art FIG. 37. Referring now to selected nonvolatile memory cell 500 illustrated in prior art FIG. 5A, select line SL applies a voltage to top electrode TE of NV CNT switch 110 and the bottom electrode BE is in electrical communication with the source S of cell select FET 105 in an ON state, with a drain voltage D in electrical communication with bit line BL, which is at $V_{BL}$=zero volts.

Figure 37:
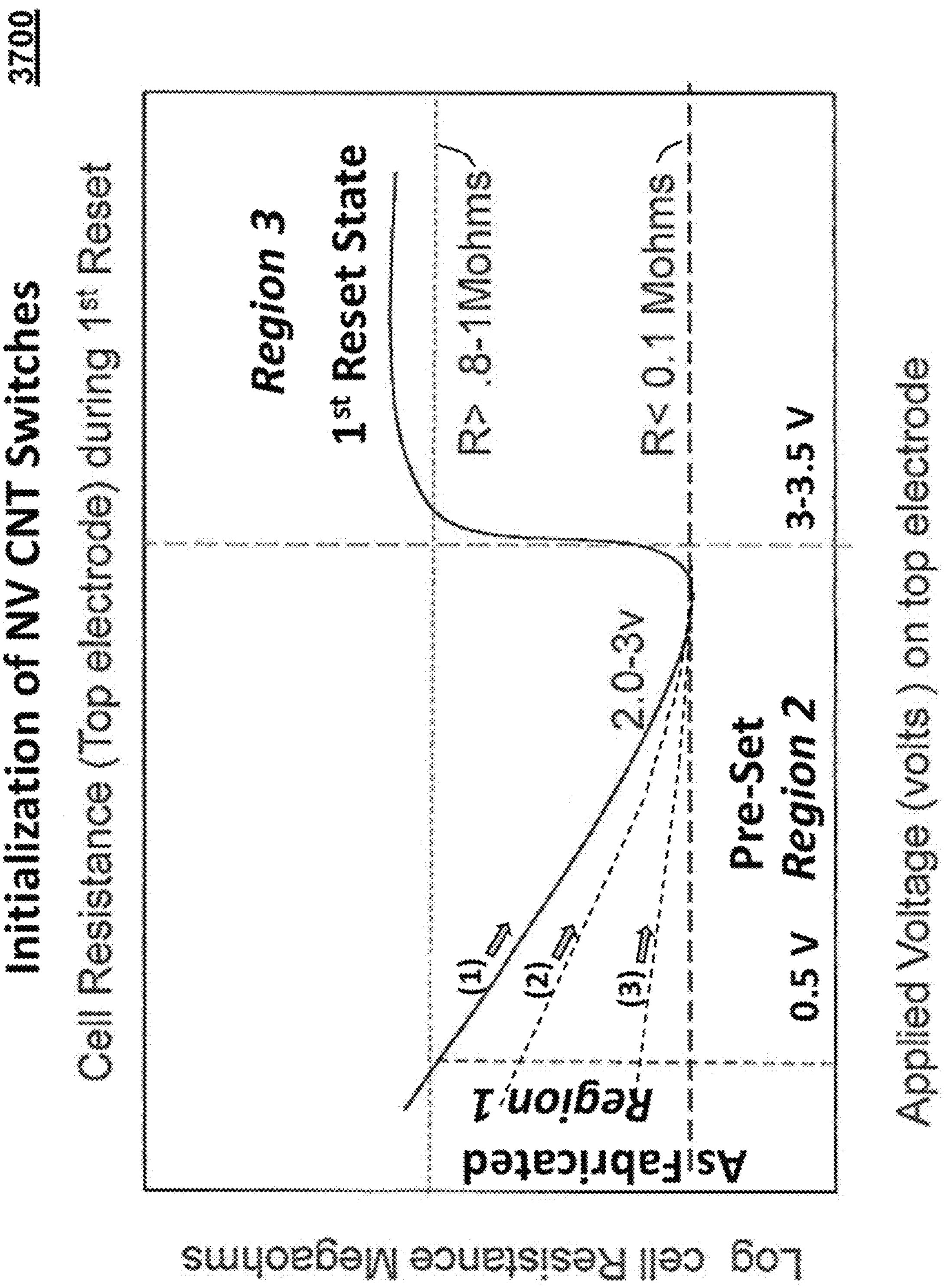
FIG. 37 illustrates a nonvolatile switch initialization scan of resistive change elements to enable operation of resistive change elements with as-fabricated resistance values greater than 100 kilo-Ohms and less than 1 Mega-Ohms. Resistive change elements are reduced in value in pre-set region 2 and then transition to a first RESET state in region 3 when the scan voltage has increased to 3 to 3.5 Volts.

Referring now to initialization scan 3700 illustrated in prior art FIG. 37, region 1 represents the cell resistance of an as-fabricated CNT switch, such as NV CNT switch 110. Three traces are shown. Trace (1) corresponds to an as fabricated resistance of at least 1 MΩ, trace (2) corresponds to an as-fabricated resistance of less than 800 kΩ, and trace (3) corresponds to an as-fabricated resistance of greater than 100 kΩ. The variation in as-fabricated resistance may be caused by CNT fabric exposure to plasma etching steps during fabrication, which may cause some CNT-to-CNT attraction and contact in CNT fabric 115 of NV CNT switch 110 (prior art FIG. 5A). Typically, some as-fabricated NV CNT switches are not in either a SET or RESET state, that is, not less than 100 kΩ or greater than 1 MΩ, respectively, for the fabricated NV NT switches. While the initialization scans described further below were applied to NV CNT switches designed to operate with a SET state of <=100 kΩ for $V_{SET}$ voltages in the 1-1.5 V range and a RESET state of >=1 M for $V_{RESET}$ in the 2-2.5 V range, the same initialization methods apply for NV CNT switches designed to operate with different SET and RESEST resistance values, such as those described further above operating in the range of a low resistance SET state of $R_{LO}$<=100 kΩ and a high resistance RESET state $R_{HI}$>=2 MΩ.

A DC voltage scan was applied to the top electrode TE with bottom electrode BE at zero volts, which results in a gradual lowering of the resistance below the as-fabricated resistance value, as shown in region 2 of prior art FIG. 37, that resulted in a minimum resistance value of approximately 100 kΩ in the 2-3 Volt range of the DC voltage scan applied to top electrode TE. Continuing the scan, an abrupt transition to a high resistance value of approximately 1 MΩ occurs at 3-3.5 V. This resistance may be referred to as the first (1') RESET state.

Once the first RESET state has been achieved, NV CNT switches operate in a bipolar mode between a low resistance $R_{LO}$ SET state and a high resistance $R_{HI}$ RESET state. For some NV CNT switches, subsequent cycles between SET and RESET states, such second and third, cycles may be needed to achieve RESET voltages in the 2-2.5 V. After completion of initialization, bipolar NV CNT switches operate in a $V_{RESET}$ voltage range of 2.0-2.5 Volts and a $V_{SET}$ voltage range of 1-1.5 Volts as shown in table 3800 illustrated in prior art FIG. 38.

NV CNT switch 110 (prior art FIG. 5A) initialization may be performed with pulses instead of DC voltage scans. Multiple pulses may be used. Multiple pulses may be at the same amplitude or varying amplitudes, typically in the range of 1-to-3 or 3.5 volts, for example. Pulse widths may be varied from 5 ns to 200 ns, and other variations and combinations thereof may be used. After applying the various pulses, a first RESET state is achieved, and subsequent cycles of $V_{SET}$ and $V_{RESET}$ are in the typical ranges described further above and as shown in table 3800 illustrated in prior art FIG. 38.

At this point in the specification, circuits, architectures, and methods of performing initialization of NV CNT switches, such as NV CNT switch 110 illustrated in prior art FIG. 5A, in a product such as a memory chip are described further below. Referring now to prior art FIG. 8, initialization and RESET circuits 800 show initialization drivers 850 and optional initialization switches 870 by which initialization operations may be performed on storage array section 605. RESET operations on storage subarrays 605-0 and 605-1 using select line drivers 805 have been described further above with respect to prior art FIG. 8. Corresponding 1T, 1R cell memory array RESET voltage distributions 400 illustrated in prior art FIG. 4 are shown superimposed on cell and array layout 200 illustrated in prior art FIG. 2.

Referring now to prior art FIG. 8, initialization drivers 850, initialization driver controller 880, and optional initialization switches 870 may be used to initialize the NV CNT switches in storage array section 605. Prior art FIG. 8 shows optional select line driver switches 840 to electrically connect and disconnect select line drivers 805 and select lines. Alternatively, select line drivers 805 outputs may be switched to a tristate mode, and therefore optional select line driver switches 840 may be omitted and select line drivers 805 may be in electrical communication with corresponding select lines in storage array section 605.

Referring now to prior art FIG. 37, NV CNT switch initialization scan 3700 shows a maximum voltage requirement of 3 to 3.5 Volts. On chip, programmable, initialization driver controller 880 in combination with initialization drivers 850 may provide a DC voltage scan, and/or a predetermined set of pulses of constant or variable voltage amplitudes, of various pulse widths, and other pulse characteristics designed to achieve initialization of all NV CNT switches in storage array section 605 to ensure bipolar (bidirectional) SET/RESET operations as described further above. Initialization drivers 850 include initialization drivers 855, 857, 859, and 861. Optional initialization driver switches 870 may be used to electrically connect and disconnect initialization drivers 855, 857, 859, 861 and select lines. Alternatively, initialization drivers 850 outputs may be switched to a tristate mode, and therefore optional initialization driver switches 870 may be omitted and initialization drivers 850 may be in electrical communication with corresponding select lines in storage array section 605.

Figure 39:
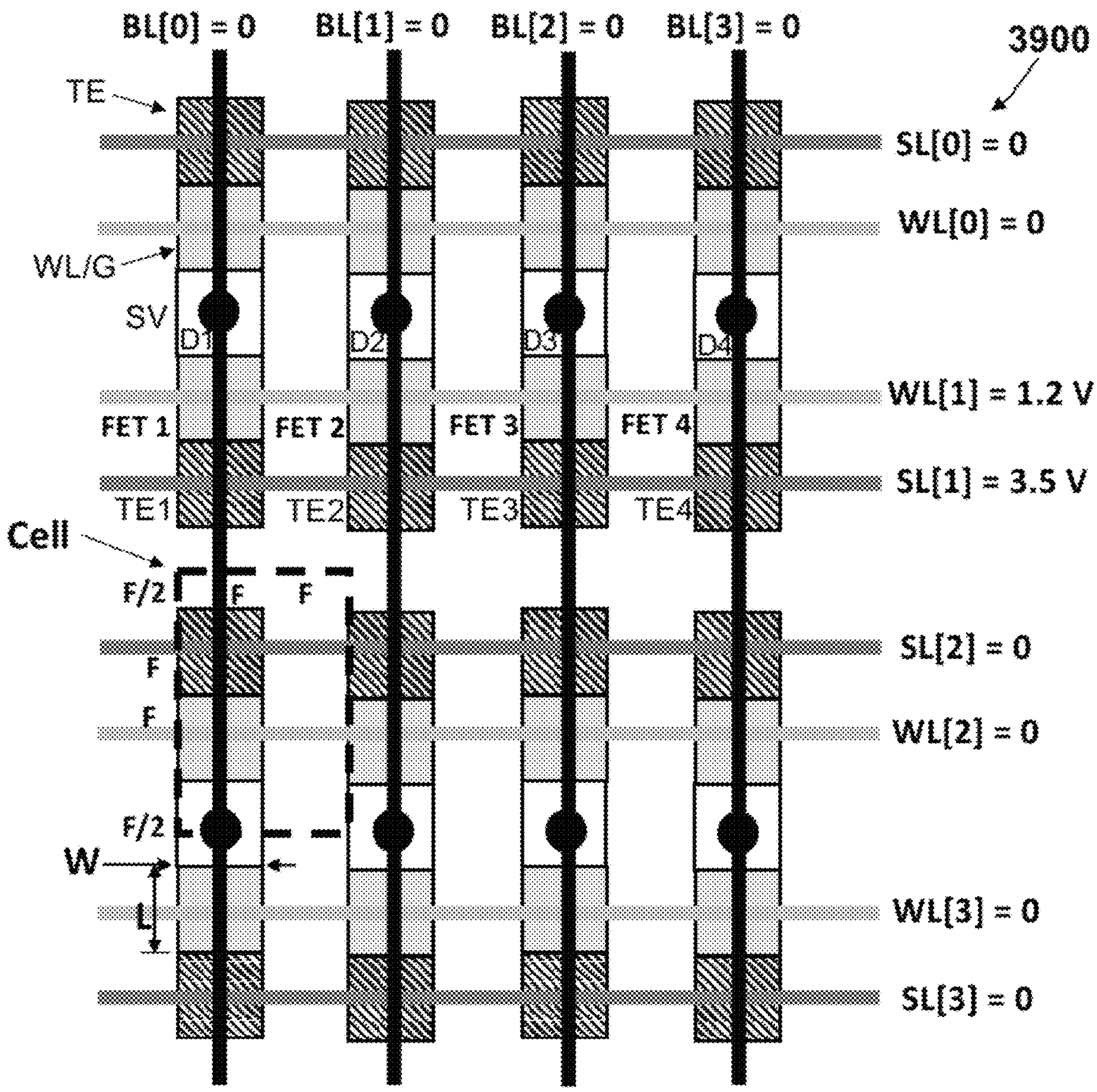
FIG. 39 illustrates a 1T, 1R cell memory array initialization voltage distribution during the initialization operation illustrated in FIG. 37.

Referring now to 1T, 1R selected nonvolatile memory cell 500 illustrated in prior art FIG. 5A, 1T, 1R cell memory array initialization voltage distribution 3900 illustrated in prior art FIG. 39, and initialization and RESET circuits 800 illustrated in prior art FIG. 8, bit lines are at zero volts during an initialization operation. Select lines SL apply initialization voltages such as a DC voltage scan and/or initialization voltage pulses to a select line corresponding to a selected (activated) word line WL. Referring now to 1T, 1R cell memory array initialization voltage distribution 3900 illustrated in FIG. 39, bit lines BL[0], BL[1], BL[2], and BL[3] are all at zero Volts. Word line WL[1] and corresponding select line SL[1] are both selected. Word line WL[1] applies a voltage of 1.2 V, for example, to the gates of FET select devices FET1, FET2, FET3, and FET4 electrically connecting source and drain terminals. Drain terminals D1, D2, D3, and D4, are in electrical communication with bit lines BL[0], BL[1], BL[2], and BL[3], respectively, are all at zero volts and so are corresponding source terminals S, since the corresponding selected FETS are ON. As illustrated in prior art FIG. 5A, source terminals S are in electrical communication with the bottom electrodes BE of the NV CNT switches 110. As shown in 1T, 1R cell memory array initialization voltage distribution illustrated in prior art FIG. 39, select line SL[1] applies an initialization DC voltage scan and/or initialization voltage pulses of up to 3.5 volts to top electrodes TE1, TE2, TE3, and TE4 of all NV CNT switches in electrical communication with select line SL[1]. Therefore, initialization voltage DC scans and/or voltage pulses appear across the terminals of the selected NV CNT switches, but do not appear across the terminals of selected FET devices.

Also, unselected cell select FET devices shown in prior art FIG. 39 are in an OFF state, all have drain terminals in electrical communication with ground through the bit lines BL and source terminals in electrical communication with ground (zero volts) because all unselected select lines SL, which are in electrical communication with the top electrodes TE of unselected NV CNT switches, are at zero volts, as also shown by unselected nonvolatile memory cell 525 illustrated in prior art FIG. 5B.

Referring now to initialization and RESET circuits 800 for a memory array with 1T, 1R cells illustrated in prior art FIG. 8 and 1T, 1R cell memory array initialization voltage distribution 3900 illustrated in FIG. 39, bit line drivers 820 and 825 correspond to bit lines BL[0] and BL[1], respectively. Bit line drivers for bit lines BL[2] and BL[3], not shown in prior art FIG. 8, are essentially the same as bit line drivers 820 and 825. The bit line driver outputs are at zero volts during initialization. Word line driver (not shown) drives word line WL[1] shown in prior art FIGS. 8 and 39. Initialization driver 857 drives select line SL[1], corresponding to word line WL[1], to initialization voltage pulses of up to 3.5 volts, which requires 3.5 volt-capable FETs. These are substantially larger than the cell select FET devices, but they are not part of the cell, and do not affect cell area. Instead, they are part of the peripheral on-pitch select line drivers.

Referring now to initialization and RESET circuits 800, initialization driver 857 applies a voltage of $V_{RESET}$ of up to 3.5 volts to select line SL[1] in electrical communication with top electrodes TE of NV CNT switches SWx2 in electrical communication with the source S of cell select FET device $T_{X2}$ and SWx3 in electrical communication with the source S of cell select FET device $T_{X3}$. Cell select FET devices $T_{X2}$ and $T_{X3}$ shown in prior art FIG. 8 correspond to cell select FET devices FET1 and FET2 shown in prior art FIG. 39. The drain terminals D of FET devices $T_{X2}$ and $T_{X3}$ at zero volts, hold the corresponding source terminals S at zero volts. The voltage drop of initialization voltage pulses of up to 3.5 volts appears across both NV CNT switches SWx2 and SWx3 thereby completing the initialization operation described further above with respect to FIGS. 8, 37, 38, and 39.

Initialization at the wafer level may simplify initialization by eliminating the additional circuits and test methods described further above. One method would be to irradiate each wafer with radiation corresponding in energy and frequency and capture cross section requirements of CNTs in contact. This radiation would supply the energy to overcome van der Waals forces holding CNTs in contact. The NV CNT switches would transition to an as-fabricated high resistance RESET state, such as first RESET state illustrated in prior art FIG. 37.

Another wafer level initialization method may be to flood wafers with electrons at one or more steps of the process. In this case, voltage differences between CNTs would produce an attractive force forming CNT-to-CNT contacts such that the as-fabricated NV CNT switches would be in a low resistance first SET state.

3D Multi-Switch Storage Cell (1 T, nR) Array Select Line Drive Matrix

3D MSSC memories may be formed with multi-switch storage cells that may be formed with n=2 to n=64 or more resistive change elements, with each resistive change element having a top electrode in electrical communication with a corresponding select line as described further above. Therefore, there is one select line electrical connection to a top electrode TE for each resistive change element in a multi-switch storage cell. For example, for n resistive change elements there are n corresponding select lines. However, there is only one word line and one array bit line electrical connection for each multi-switch storage cell in a 3D MSSC array. Select lines intersect multiple array bit lines in an array subsection as illustrated in multi-switch storage cell memory array schematic 2400 illustrated in FIGS. 24-1 and 24-2, 3D MSSC memory open architecture schematic 2600 illustrated in FIG. 26A, and 3D MSSC memory open architecture schematic 2660 illustrated in FIG. 26D. The number of array bit lines intersected by select lines and corresponding word lines is determined by the number of corresponding data lines in bidirectional on-chip data bus 2690 illustrated in FIGS. 26A and 26D. By way of examples, there may be 8, 16, 32, 64, 128, 256, 512, 1024 or more data lines depending on architectural requirements. All array bit lines intersected are used to perform the same operations, such as READ and WRITE, for example, at the same time and in parallel.

Select line voltages and currents are a function of the 3D multi-switch storage cell memory operations described further above and below. These include the following operations for each of the corresponding array bit lines: READ the resistance state of one of the n resistive change elements per array bit line; RESET the resistance state of one of the n resistive change elements per array bit line; WRITE the resistance state of one of the n resistive change elements per array bit line; and INITIALIZE one of n resistive change elements to operate with a high resistance RESET state>=2 MΩ and a low resistance SET state of <=100 kΩ per array bit line.

Referring now to open architecture 600 illustrated in prior art FIG. 6 with 1T, 1R cell arrays, READ timing diagram 700 illustrated in prior art FIG. 7A, and READ timing diagram 750 illustrated in prior art FIG. 7B, READ operations are performed with array bit line precharge then discharge as described further above, and therefore do not require a select line driver to charge an array bit line. Referring now to bit line charge READ operation 1400 illustrated in FIG. 14A, bit line charge READ timing diagram 1500 illustrated in FIG. 15A, and bit line charge READ timing diagram 1550 illustrated in FIG. 15B, when performing an array bit line charge READ operation a select line driver is required to charge an array bit line.

Referring now to initialization and RESET circuits 800 illustrated in prior art FIG. 8, each select line SL[0]-SL[3], which corresponds to word line WL[0], WL[1], WL[2], and WL[3], respectively, is in electrical communication with one of the select line drivers 805 for a RESET operation and one of the initialization drivers 850 for an initialization operation. If the initialization operation uses pulses instead of DC scans, then it may be possible to use a single driver for both operations.

Figure 41A:
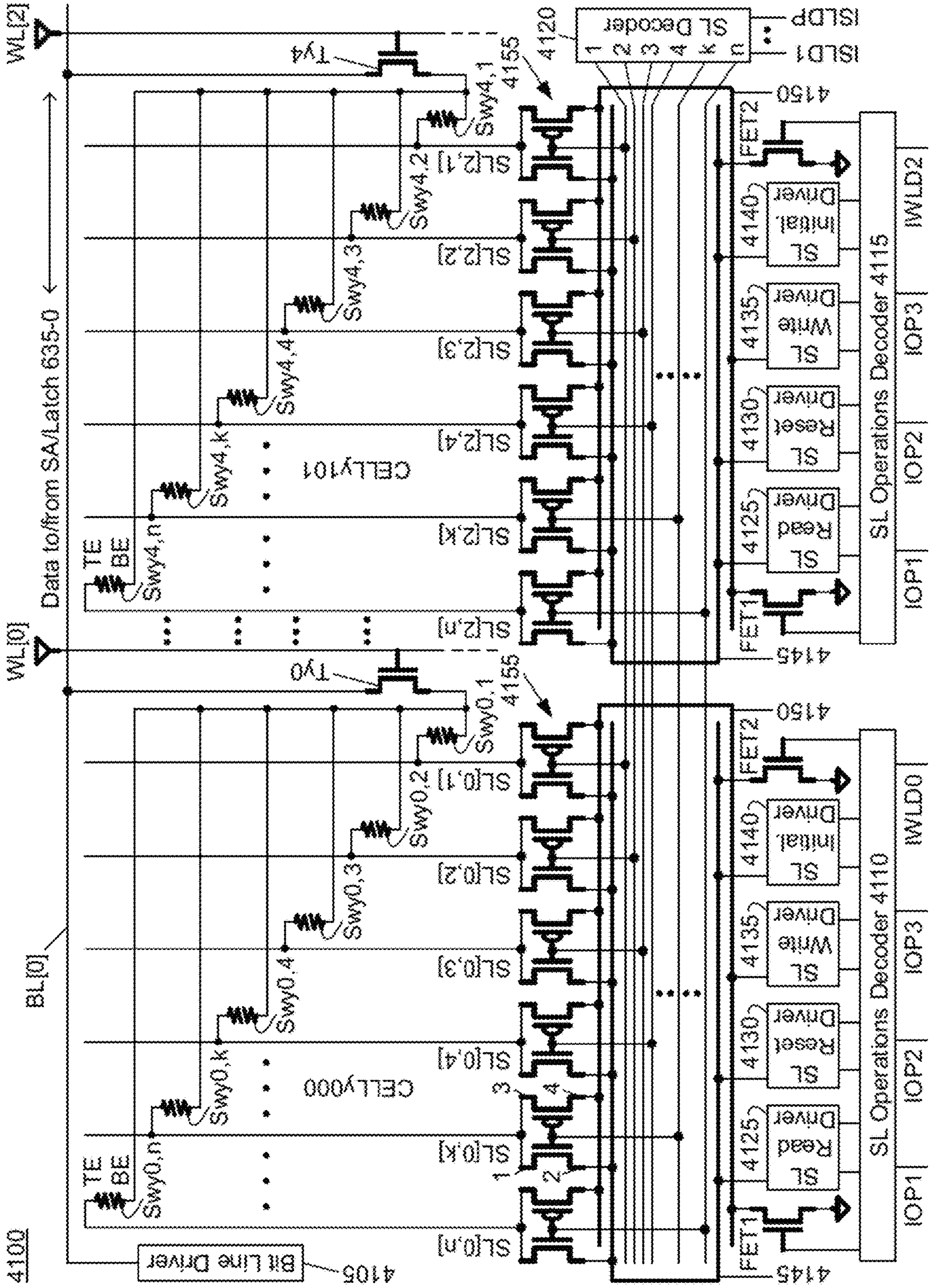
FIG. 41A illustrates a 3D multi-switch storage cell (MSSC) array select line drive matrix in which one of four select line driver functions may be applied to a multi-switch storage cell independent of the number of select lines. A 1-of-n decoder is used to drive 1-of-n select lines to a first voltage using 1-of-n select line router circuits and to drive the n−1 of n select lines to a second voltage using the n−1 of n select line router circuits. The 3D MSSC memory on-chip controller illustrated in FIG. 40 controls the driver matrix operation.

Referring now to 3D multi-switch storage cell (1T, nR) array select line drive matrix 4100 illustrated in FIG. 41A, and in view of prior art FIG. 8, for each multi-switch storage cell at the intersection of a word line and an approximately orthogonal array bit line, one select line parallel to the word line is required for each of the n resistive change elements in the multi-switch storage cell. Therefore, there are n select lines per each word line as illustrated in FIG. 41A. Comparing prior art FIG. 8 and FIG. 41A, FIG. 41A shows two additional select line operations, select line READ driver 4125 and select line WRITE driver 4135, in addition to select line RESET driver 4130 and select line INITIALIZATION driver 4140. Therefore, up to four select line drivers per select line may be required for multi-switch storage cells to perform READ operations, RESET operations, WRITE operations, and INITIALIZE operations, described further above. Up to four drivers per select line may result in substantial layout complexity and substantial power dissipation. However, as described below, just the four select line drivers may be used for all n select lines for a multi-switch storage cell. It is noted that a select line driver can be used for more than one operation. For example, a select line WRITE driver may also be used as a select line RESET driver.

Figure 40:
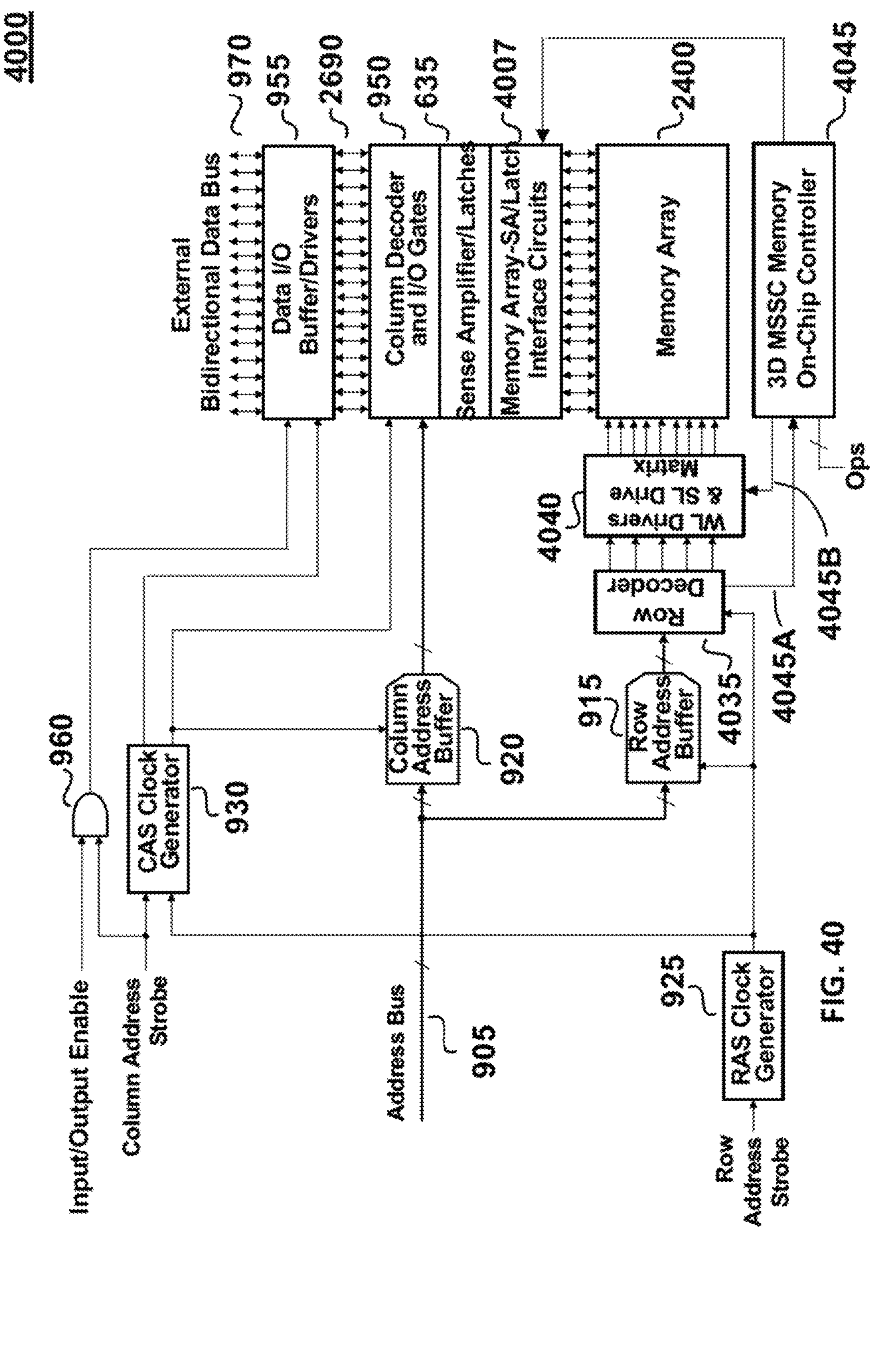
FIG. 40 illustrates a 3D multi-switch storage cell memory chip architecture.

Referring now to 3D MSSC memory chip architecture 4000 illustrated in FIG. 40, in view of resistive change memory chip architecture 900 illustrated in prior art FIG. 9A, select line drivers in word & select line drivers 940 have been replaced with 3D MSSC array select line drive matrix 4100 illustrated in FIG. 41A in word line drivers & select line drive matrix 4040. 3D MSSC memory on-chip controller 4045 replaces on-chip memory controller 945 and row decoder 4035 replaces row decoder 935. 3D MSSC memory on-chip controller 4045 with connection 4045A to row decoder 4035 and connection 4045B to word line drivers and select line drive matrix 4040, whose outputs drives a word line which selects a corresponding multi-switch storage cell at a word line-orthogonal array bit line intersection in memory array 2400. Assuming there are n resistive change elements in the multi-storage storage cell, there are n select line-orthogonal array bit line crossings of which 1 of n resistive change elements may be selected. 3D MSSC memory on-chip controller 4045 provides a number of inputs p to select line decoder 4120 illustrated in FIG. 41A. The select line decoder 4120 is in electrical communication with n decoder output lines and the select line decoder 4120 applies a positive voltage to one of the n decoder output lines and zero volts to the n−1 decoder output lines based on the inputs p to the select line decoder 4120. Assuming select line decoder 4120 is a 1 of n binary decoder, then the select line decoder 4120 activates one of n decoder output lines, where $n=2^p$. A 1 of n binary decoder operation is described in C. Mead and L. Conway, *Introduction to VLSI Systems* pp.

161-162 (Addison-Wesley Publishing Co. 1980), pp. 161-162 of which are hereby incorporated by reference. Therefore, for a multi-switch storage cell with 16 resistive change elements, for example, a 4-to-16 line decoder activates one of 16 ($2^4$) decoder output lines, which enables the selection of one of 16 resistive change elements at each array select line-bit line intersection. Referring now to 3D MSSC array select line drive matrix 4100 illustrated in FIG. 41A, there are four select line drivers, only one of which may be selected at a time, and two FETs. Hence, in this example, 3D MSSC memory on-chip controller 4045 also provides three input bits $I_{OP1}$, $I_{OP2}$, and $I_{OP3}$ to select one of the four select line driver operation options and one of two FETs to select line operations decoder 4110 illustrated in FIG. 41A. 3D MSSC memory on-chip controller 4045 also provides p select line decoder inputs $I_{SLD1}$ to $I_{SLDP}$ to select line decoder 4120. Only one SL operations decoder may be selected for each subarray, which is selected when the corresponding word line is activated by a word line decoder input. For example, SL operations decoder 4110 may be selected and activated by the WL0 word line decoder input IWLD0 or SL operations decoder 4115 may be selected and activated by the WL2 word line decoder input IWLD2, but both may not be selected at the same time.

SL decoder 4120 *n* decoder output lines enable selection of each resistive change element in each multi-switch storage cell for corresponding array bit lines, such as array bit line BL[0]. Therefore, in the above example for a 4-to-16 line decoder, 16 select lines enable selection of n=16 resistive change elements per multi-switch storage cell. If there are 256 multi-switch storage cells per bit line, then there are 256×16=4096 individual resistive change elements per array bit line in a subarray. One select line decoder 4120 is used for each 3D MSSC subarray. Therefore, if, for example, there are 64 array bit lines in a subarray, then a total of 4096×64=262,144 resistive change elements may be selected using one select line decoder 4120.

Referring now to select line INITIALIZATION driver 4140 illustrated in FIG. 41A, initialization is performed as part of the fabrication process at the wafer and/or module level as described further above with respect to prior art FIGS. 8, 37, 38, and 39. However, initialization may be used to restore a failing resistive change element operation of a 3D MSSC memory chip in the field.

Now, with respect to 3D multi-switch storage cell memory operations, any array bit line charge READ operation requires a SL READ driver 4125 as described further above to READ a stored resistance state; a RESET-before-WRITE operation requires using a SL RESET driver 4130 as described further above; and WRITE operations require a select line WRITE driver 4135 to prevent data disturb of unselected resistive change elements during a selected resistive change element SET operation as described further above and below.

Select line SL Operations Decoder 4110 illustrated in FIG. 41A receives operational inputs $I_{OP1}$, $I_{OP2}$, and $I_{OP3}$ from 3D MSSC memory on-chip controller 4045 illustrated in FIG. 40. These three bits determine which of the four select line drivers is selected in support of READ, RESET, WRITE, or INITIALIZATION operations, and which of the two FETs is selected. The corresponding word line driver decoder (not shown) also provides an input to SL operations decoder 4110 as input $I_{WLD0}$ or an input to SL operations decoder 4115 as input $I_{WLD2}$, corresponding to memory array 2400 array cells CELLy000 and CELLy101, respectively, for example, which enables the operation of the chosen select line driver. Otherwise, unselected select line drivers are tri-stated.

Each multi-switch storage cell resistive change element location is defined by the intersection of a word line, a select line parallel to the corresponding word line, and an array bit line approximately orthogonal to both the word and select lines. 3D MSSC memory on-chip controller 4045 illustrated in FIG. 40 provides p select line decoder inputs $I_{SLD1}$ to $I_{SLDp}$ to select line decoder 4120. Decoder output lines 1, 2, 3, 4, . . . , k, n are all in electrical communication with each group of n of select line router circuits 4155 corresponding to a SL operations decoder in the array bit line direction, including a group of n select line router circuits 4155 corresponding to SL operations decoder 4110 and a group of n select line router circuits 4155 corresponding to SL operations decoder 4115 for example illustrated in FIG. 41A. Hence, every select line router circuit in all groups of n select line router circuits 4155 in a subarray are activated. However, only one SL operations decoder is selected by a corresponding word line decoder voltage input, which performs one of the SL driver 4125, 4130, 4135, or 4140 operations. All other SL operations decoder word line decoder input voltages are zero volts, therefore, all four SL drivers are tri-stated, MSSC buses 4145 and 4150 are driven to zero volts, and all select lines are driven to zero volts. Assuming SL operations decoder 4110 is selected and activated by word line WL0 decoder input IWLD0, corresponding select lines SL[0,1], SL[0,2], SL[0,3], SL[0,4], SL[0,n] may be driven and the chosen SL driver operation carried out as described further below based on SL Operations Decoder 4110 operational inputs $I_{OP}$, $I_{OP2}$, and $I_{OP3}$ from 3D MSSC memory on-chip controller 4045 illustrated in FIG. 40. These three bits determine which of the four select line drivers is selected in support of READ, RESET, WRITE, or INITIALIZATION operations, and whether FET1 or FET 2 is activated. In this way, it is possible to use just the four select line drivers for READ, RESET, WRITE, and INITIALIZATION operations and one of two FETs for each of the n select lines for each multi-switch storage cell, such as CELLy000 for example.

Referring now to 3D MSSC memory chip architecture 4000 illustrated in FIG. 40, in view of resistive change memory chip architecture 900 illustrated in prior art FIG. 9A, memory array-SA/Latch interface circuits 607 have been replaced with memory array-SA/Latch interface circuits 4007 illustrated in FIG. 40. This is because 3D multi-switch storage cells WRITE operations require a select line WRITE driver 4135 to apply a voltage of 0.75 V to all top electrodes TE of unselected resistive change elements as illustrated in FIG. 42C to prevent data disturb of unselected resistive change elements during a selected resistive change element SET WRITE operation as described further below with respect to 3D MSSC memory select line pre-WRITE operation 4240 illustrated in FIG. 42C. Voltage shifter/drivers 620 shown in open architecture schematic 600 illustrated in prior art FIG. 6 may be replaced with voltage shifter/drivers 2630 shown in 3D MSSC memory open architecture 2600 illustrated in FIG. 26A. Alternatively, voltage shifter/drivers 620 shown in open architecture schematic 600 illustrated in prior art FIG. 6 may be replaced with voltage shifter/drivers 2670 shown in 3D MSSC memory open architecture 2660 illustrated in FIG. 26D.

Referring now to 3D MSSC array select line drive matrix 4100 illustrated in FIG. 41A, each multi-switch storage cell, such as CELLy000 and CELLy101, has a corresponding pair of multi-switch storage cell busses, multi-switch storage cell (MSSC) bus 4145 and MSSC bus 4150. Each select line, such as select line SL[0,k] in electrical communication with multi-switch storage CELLy000 for example, is in electrical communication with a select line router circuit of a group of n select line router circuits 4155. Each select line router circuit in the group of n select line router circuits 4155 has the same structure. Each select line router circuit includes a pair of nFET and pFET devices with gates in electrical communication with each other and a decoder output line of SL decoder 4120, such as decoder output line k for example. For the group of n select line router circuits 4155, all nFET devices are the same and all pFET devices are the same. nFET device terminal (1) and pFET device terminal (3) are in electrical communication with each other and a select line, such as select line SL[0,k] for example. Each select line router circuit of the group of n select line router circuits 4155 has an nFET device terminal (2) in electrical communication with MSSC bus 4145 and each pFET device terminal (4) in electrical communication with to MSSC bus 4150. FET1 device gate and FET2 device gate are each in electrical communication with an output select line of SL operations decoder 4110 and each has a source in electrical communication with zero volts (ground). The drain of FET1 is in electrical communication with MSSC bus 4150 and the drain of FET2 in electrical communication with MSSC bus 4145. The inputs of SL READ Driver 4125 are in electrical communication with decoder outputs of SL operations decoder 4110 and the output is in electrical communication with MSSC bus 4145; the inputs of SL RESET Driver 4130 are in electrical communication with decoder outputs of SL operations decoder 4110 and the output is in electrical communication with MSSC bus 4145; the inputs of SL WRITE Driver 4135 are in electrical communication with decoder outputs of SL operations decoder 4110 and the output is in electrical communication with MSSC bus 4150; and the inputs of SL INITIALIZATION Driver 4140 are in electrical communication with decoder outputs of SL operations decoder 4110 and the output is in electrical communication with MSSC bus 4145.

Referring now to 3D MSSC array select line drive matrix 4100 illustrated in FIG. 41A, FIG. 41A includes a bit line driver 4105 which is used in RESET, INITIALIZATION, and diagnostic operations as described further below, and is in tristate for all other operations. It is activated by SL operations decoder 4110.

Figure 42A:
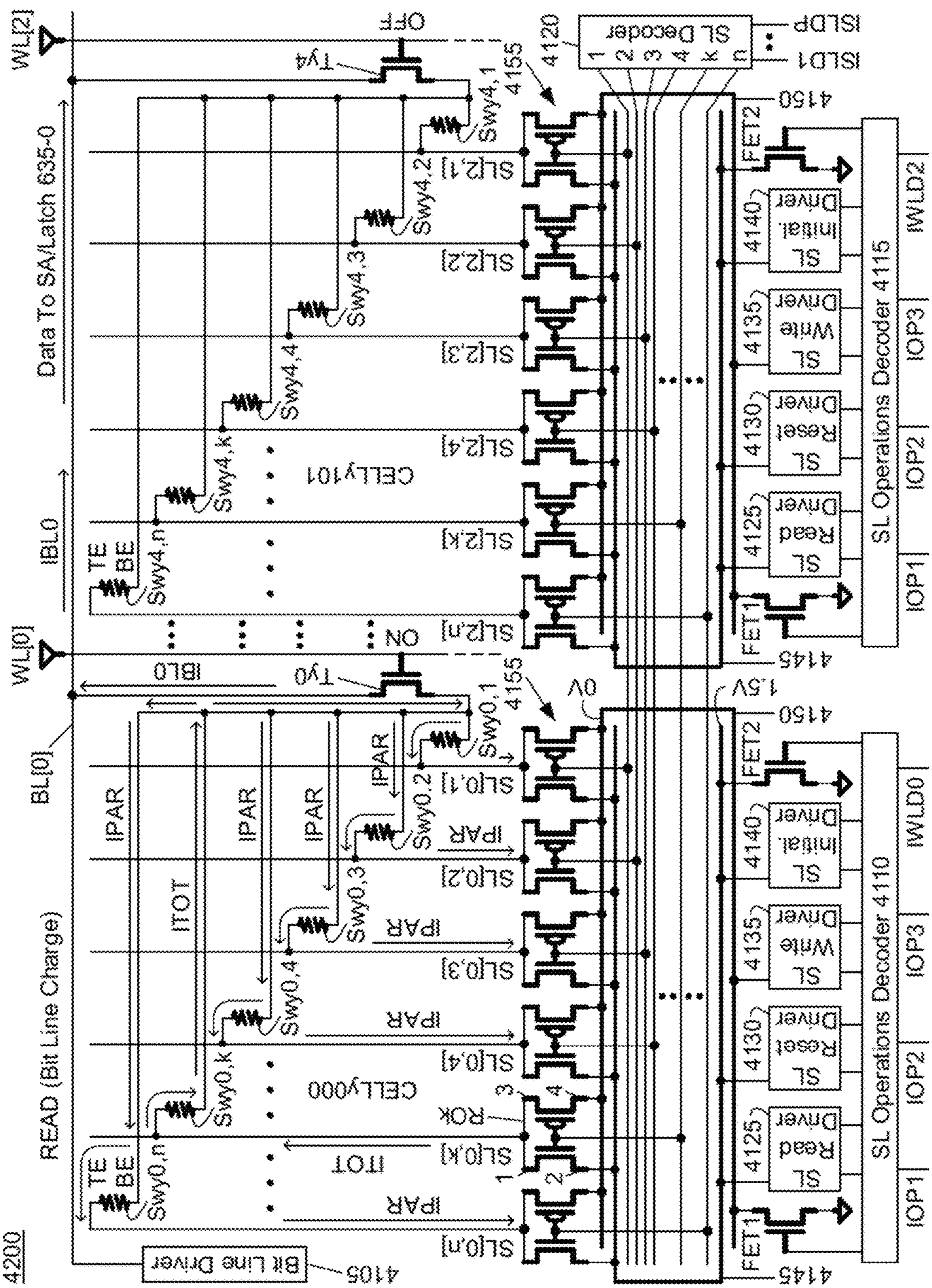
FIG. 42A illustrates a 3D MSSC memory select line drive READ operation in which the select line READ driver drives the first of a pair of MSSC buses corresponding to the selected resistive change element (RCE) in the multi-switch storage cell (MSSC). An activated FET in electrical communication with the second MSSC bus corresponding to the n−1 unselected RCEs in the MSSC drives the second MSSC bus to zero volts.

Referring now to 3D MSSC memory select line drive READ operation 4200 illustrated in FIG. 42A and a READ operation of the resistance state of resistive change element SWy0,k in selected multi-switch storage CELLy000. Word line WL[0] is activated by a WL driver (not shown) which activates cell select FET $T_{Y0}$ to an ON state and electrically connects multi-switch storage CELLy000 to array bit line BL[0]. Array bit line BL[0] is representative of all array bit lines in a subarray having multiple array bit lines such as 8, 16, 32, 64, 128, 256 or more array bit lines which are all activated at the same time.

Selected SL READ driver 4125 in electrical communication with MSSC bus 4145 and FET1 in electrical communication with MSSC bus 4150, are activated, and initiates an array bit line BL[0] charge operation with a pulse of amplitude 1.5 V as described further above with respect to FIGS. 26B and 19. SL decoder 4120 decoder output line k applies a positive voltage to the gates of nFET and pFET devices forming select line router circuit ROk of the group of n select line router circuits 4155, which turns the nFET device ON and the pFET device OFF. The nFET device applies the MSSC bus 4145 voltage to top electrode TE of selected resistive change element SWy0,k, whose bottom electrode BE is in electrical communication with the bottom electrodes BE of the n−1 unselected resistive change elements and the source of cell select FET $T_{Y0}$, which is in an ON conducting state, whose drain is in electrical communication with array bit line BL[0], activated by word line WL[0]. The SL decoder 4120 $n$−1 decoder output lines 1-to-(k−1), (k+1)-to-n apply zero volts to corresponding gates of nFET and pFET devices forming n−1 select line router circuits of the group of n select line router circuits 4155, which turn the nFET devices OFF and the pFET devices ON. The pFET devices apply the MSSC bus 4150 voltage to the top electrodes TE of the n−1 unselected resistive change elements, which are in electrical communication with ground (zero volts) through FET1 in an ON state. As shown in FIG. 42A, $I_{TOT}$ READ current flows through selected resistive change element SWy0,k and parasitic currents $I_{PAR}$ flow through each of the n−1 unselected resistive change elements to ground. Parasitic current $I_{PAR}$ in each unselected resistive change element depends on its stored resistance state. So, for example, $I_{PAR}$ in a low resistance $R_{LO}$=100 kΩ state may be 20 times greater than $I_{PAR}$ current in a high resistance $R_{HI}$=2 MΩ state. Array bit line charge current $I_{BL0}$ equals total current $I_{TOT}$ minus the sum of all parasitic currents $I_{PAR}$ and charges the array bit line BL[0] capacitance to array bit line voltage $V_{BL0}$, which is then sensed by SA/Latch 635-0 illustrated in FIG. 26B. FET2 is in an OFF state.

Referring now to FIG. 26B, 3D MSSC memory READ operation 2620 shows array bit line BL[0] voltage $V_{BL0}$ in electrical communication with terminal (t1) of isolation device Tom, which is in electrical communication with terminal (t2) through isolation device $T_{ISB0}$ in an ON conducting state. Bit line segment BL[0]' is in electrical communication with terminal (t2) and a terminal of SA/Latch 635-0, which switches to a voltage $V_{BL0'}$=$V_{DD}$ if switch SWy0,k is in a low resistance state $R_{LO}$=100 kΩ corresponding to a logic "1" state, or $V_{BL0'}$=0 V if switch SWy0,k is in a high resistance state $R_{HI}$=2 MΩ corresponding to a logic "0" state as described further above with respect to FIG. 26B. Switching waveforms for $V_{BL0}$ and $V_{BL0'}$ are shown in 3D MSSC memory bit line charge READ timing diagrams 1580 and 1590 illustrated in FIGS. 15D and 15E, respectively, for logic "1" and logic "0" states, respectively.

Referring now to 3D MSSC memory select line READ operation 4200 illustrated in FIG. 42A, 3D MSSC memory READ operation 2620 illustrated in FIG. 26B, and 3D MSSC memory chip architecture 4000 illustrated in FIG. 40, assume 3D MSSC memory on-chip controller 4045 receives a row address, column address, and operational instruction for a burst-readout of data of the information stored on each of the resistive change elements in the selected multi-switch storage cell at the corresponding word and bit line intersection. For example, multi-switch storage cell CELLy000 at the intersection of word line WL[0] and array bit line BL[0]. 3D MSSC memory on-chip controller 4045 supplies $T_{OP1}$, $T_{OP2}$, and $I_{OP3}$ inputs to SL operations decoder 4110 that activates SL READ driver 4125, FET1, and inputs $I_{SLD1}$-$I_{SLDp}$ to SL decoder 4120 that selects each of the n resistive change elements.

Referring now to FIG. 42A and selected multi-switch storage cell CELLy000, other select line drivers 4130, 4135, and 4140 are in a tristate mode. Referring now to FIG. 42A and unselected multi-switch storage cell CELLy101, the discussion below regarding unselected multi-switch storage cell CELLy101 and corresponding circuits, devices, and buses is applicable to each unselected multi-switch storage cell along array bit line BL[0] and the same circuits, devices, and buses, corresponding to each unselected multi-switch storage cell along array bit line BL[0]. Cell select FET Ty4 is in OFF state and unselected multi-switch storage cell CELLy101 is isolated from array bit line BL[0]. All unselect selected line drivers 4125, 4130, 4135, and 4140 corresponding to unselected multi-switch storage cell CELLy101 are in a tristate mode. FET1 device corresponding to multi-switch storage cell CELLy101 is in an ON state electrically connecting MSSC bus 4150 corresponding to multi-switch storage cell CELLy101 to zero volts (ground). FET2 device corresponding to multi-switch storage cell CELLy101 is in an ON state electrically connecting MSSC bus 4145 corresponding to multi-switch storage cell CELLy101 to zero volts (ground). Therefore, top electrodes TE of n resistive change elements in multi-switch storage cell CELLy101 are in electrical communication with n select line voltages of zero volts. Corresponding resistive change element bottom electrodes BE in electrical communication with each other and a source terminal of the cell select FET Ty4 in an OFF state are at zero volts.

Figure 42B:
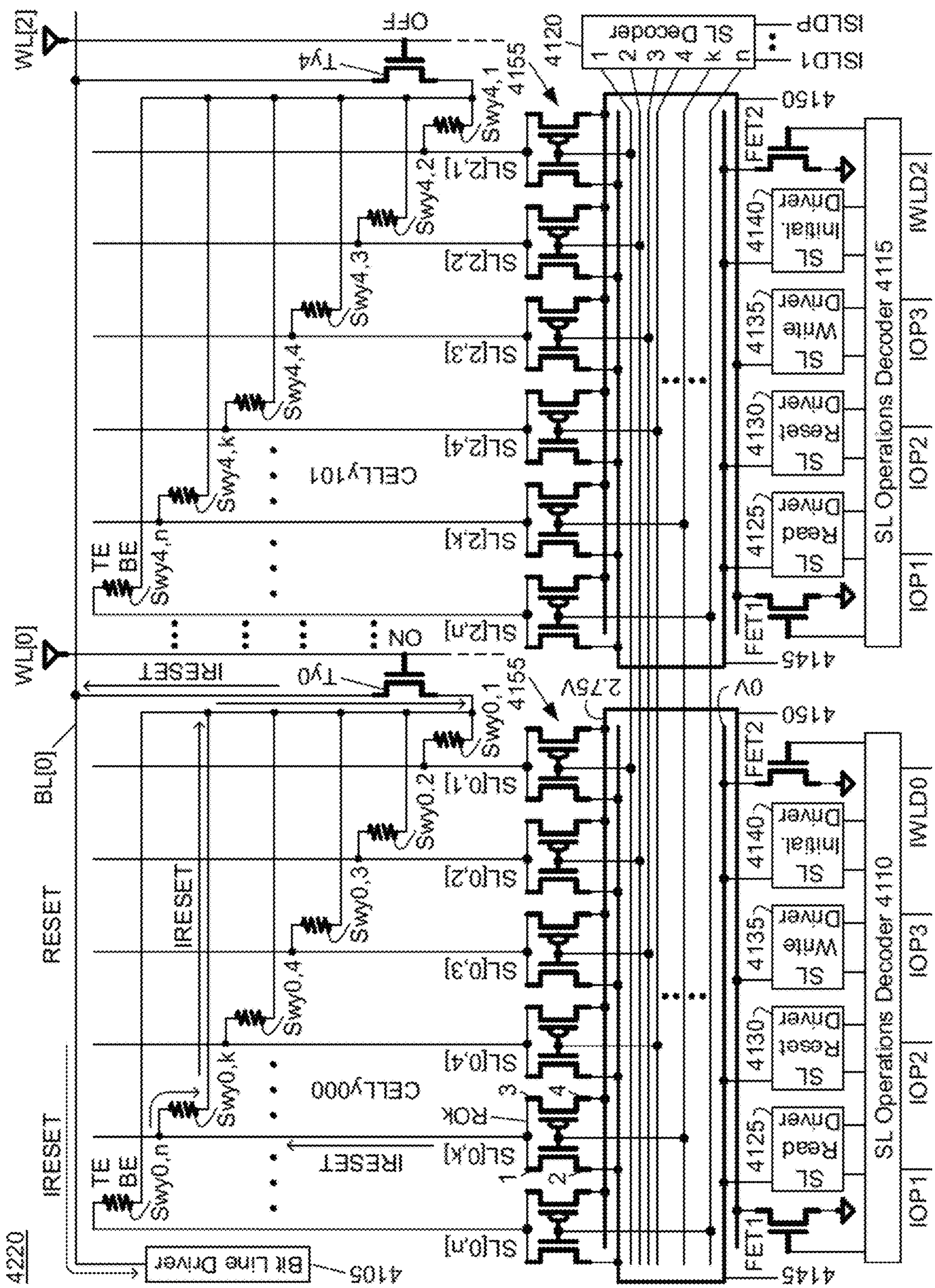
FIG. 42B illustrates a 3D MSSC memory select line drive RESET operation in which the select line RESET driver drives the first of a pair of MSSC buses corresponding to the selected RCE in the MSSC. An activated FET in electrical communication with the second MSSC bus corresponding to the n−1 unselected RCEs in the MSSC drives the second MSSC bus to zero volts.
Figure 42C:
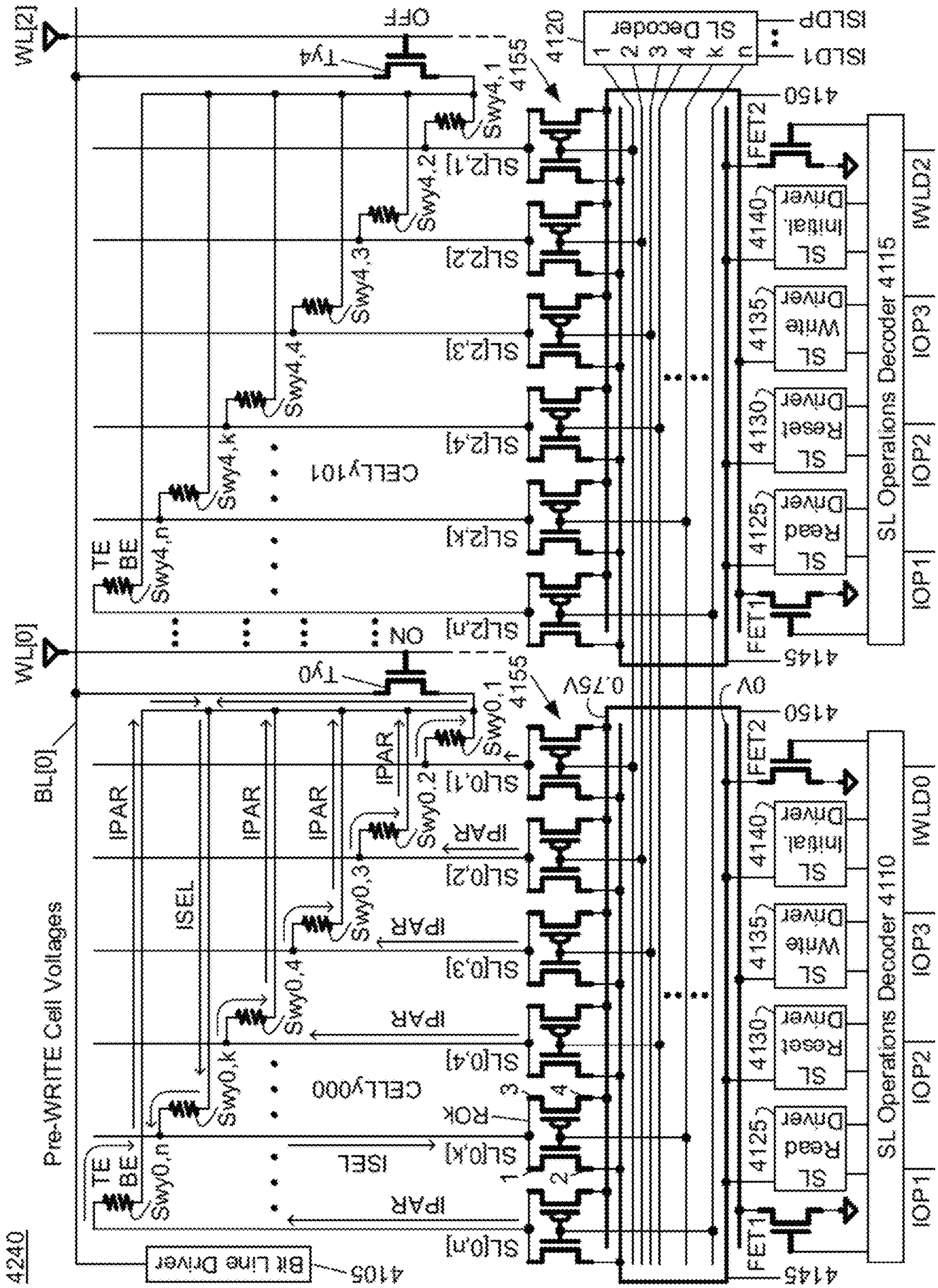
FIG. 42C illustrates a 3D MSSC memory select line drive pre-WRITE operation in which an activated FET in electrical communication with the first of a pair of MSSC buses corresponding to the selected RCE in the MSSC drives the first MSSC bus to zero volts. The select line WRITE driver drives the second MSSC bus corresponding the n−1 unselected RCEs in the MSSC to a voltage of 0.75 Volts.

Referring now to 3D MSSC memory select line drive RESET operation 4220 illustrated in FIG. 42B and a RESET operation of the resistance state of resistive change element SWy0,k in selected multi-switch storage CELLy000. Word line WL[0] is activated by a WL driver (not shown) which activates cell select FET $T_{Y0}$ to an ON state and electrically connects multi-switch storage CELLy000 to array bit line BL[0], which is held at $V_{BL0}$=0 V by array bit line driver 4105 similar to bit line driver 820 illustrated in prior art FIG. 8. Array bit line BL[0] is representative of all array bit lines in a subarray having multiple array bit lines such as 8, 16, 32, 64, 128, 256 or more array bit lines which are all activated at the same time.

Selected SL RESET driver 4130 in electrical communication with MSSC bus 4145 and FET1 in electrical communication with MSSC bus 4150, are activated, and initiates a RESET operation of resistive change element SWy0,k in selected multi-switch storage CELLy000 with a pulse of amplitude 2.75 V as described further above with respect to FIGS. 31 and 20. SL decoder 4120 decoder output line k applies a positive voltage to the gates of nFET and pFET devices forming select line router circuit ROk of the group of n select line router circuits 4155, which turns the nFET device ON and the pFET device OFF. The nFET device applies the MSSC bus 4145 voltage to top electrode TE of selected resistive change element SWy0,k, whose bottom electrode BE is in electrical communication with the source of cell select FET $T_{Y0}$, which is in an ON conducting state, whose drain is in electrical communication with array bit line BL[0] at $V_{BL0}$=0 V, activated by word line WL[0]. RESET current $I_{RESET}$ flows to ground (zero volts) through array bit line driver 4105 that electrically connects array bit line BL[0] to ground (zero volts). The bottom electrodes BE of the n−1 unselected resistive change elements are also in electrical communication with the source of cell select FET TY0, which is at approximately 0 V. The SL decoder 4120 $n$−1 decoder output lines 1-to-(k−1), (k+1)-to-n apply zero volts to corresponding gates of nFET and pFET devices forming n−1 select line router circuits of the group of n select line router circuits 4155, which turn the nFET devices OFF and the pFET devices ON. The pFET devices apply the MSSC bus 4150 voltage to the top electrodes TE of the n−1 unselected resistive change elements, which are in electrical communication with ground (zero volts) through FET1 in an ON state. Parasitic currents through the n−1 unselected resistive change elements are essentially zero as illustrated in FIG. 42B. FET2 is in an OFF state. If resistive change element SWy0,k is in low resistance state $R_{LO}$=100 kΩ, then it transitions to a RESET high resistance $R_{HI}$=2 MΩ. However, if resistive change element SWy0,k is in RESET high resistance state $R_{HI}$=2 MΩ, it remains in the high resistance state. Referring now to FIG. 31, 3D multi-switch storage cell memory RESET-before-WRITE operation 3100 shows array bit line BL[0] voltage $V_{BL0}$=0 V.

Referring now to FIG. 42B and selected multi-switch storage cell CELLy000, other select line drivers 4125, 4135, and 4140 are in a tristate mode. Referring now to FIG. 42B and unselected multi-switch storage cell CELLy101, the discussion below regarding unselected multi-switch storage cell CELLy101 and corresponding circuits, devices, and buses is applicable to each unselected multi-switch storage cell along array bit line BL[0] and the same circuits, devices, and buses, corresponding to each unselected multi-switch storage cell along array bit line BL[0]. Cell select FET Ty4 is in OFF state and unselected multi-switch storage cell CELLy101 is isolated from array bit line BL[0]. All unselected select line drivers 4125, 4130, 4135, and 4140 corresponding to unselected multi-switch storage cell CELLy101 are in a tristate mode. FET1 device corresponding to multi-switch storage cell CELLy101 is in an ON state electrically connecting MSSC bus 4150 corresponding to multi-switch storage cell CELLy101 to zero volts (ground). FET2 device corresponding to multi-switch storage cell CELLy101 is in an ON state electrically connecting MSSC bus 4145 corresponding to multi-switch storage cell CELLy101 to zero volts (ground). Therefore, top electrodes TE of n resistive change elements in multi-switch storage cell CELLy101 are in electrical communication with n select line voltages of zero volts. Corresponding resistive change element bottom electrodes BE in electrical communication with each other and a source terminal of the cell select FET Ty4 in an OFF state are at zero volts.

Referring now to 3D MSSC memory select line drive pre-WRITE operation 4240 illustrated in FIG. 42C, 3D MSSC memory select line drive pre-WRITE operation 4240 is in preparation for a WRITE operation on selected resistive change element SWy0,k in selected multi-switch storage CELLy000. Resistive change element SWy0,k is in high resistance state $R_{HI}$=2 MΩ because of a RESET-before-WRITE operation as described further above with respect to FIG. 42B. 3D MSSC memory select line drive pre-WRITE operation 4240 is required to prevent resistance state disturb of all n−1 unselected resistive change elements SWy0,1, SWy0,2, SWy0,3, SWy0,4, . . . , SWy0,k−1, SWy0,k+1, . . . and SWy0,n in multi-switch storage CELLy000 during a WRITE operation of a logic "1" state as described further below. 3D MSSC memory select line drive pre-WRITE operation 4240 takes place simultaneously with 3D MSSC memory voltage shifter/driver WRITE logic "1" or WRITE logic "0" operations 2660 illustrated in FIG. 26C. That is, 3D MSSC memory select line drive pre-WRITE operation 4240 occurs at the same time as SA/Latch 635-0 receives and latches the WRITE data from bidirectional on-chip data bus 2690 and therefore introduces no WRITE time delay. Word line WL[0] is activated by a WL driver (not shown) which activates cell select FET $T_{Y0}$ to an ON state and electrically connects selected multi-switch storage CELLy000 to array bit line BL[0]. Array bit line BL[0] is representative of all array bit lines in a subarray having multiple array bit lines such as 8, 16, 32, 64, 128, 256 or more array bit lines which are all activated at the same time.

Selected SL WRITE driver 4135 in electrical communication with MSSC bus 4150 and FET2 in electrical communication with MSSC bus 4145, are activated, and the selected SL WRITE driver 4135 charges array bit line BL[0] voltage $V_{BL0}$ to less-than or approximately equal to 0.75 V as follows. SL decoder 4120 decoder output line k applies a positive voltage to the gates of nFET and pFET devices forming select line router circuit ROk of the group of n select line router circuits 4155, which turns the nFET device ON and the pFET device OFF. FET2 is in an ON state and electrically connects MSSC bus 4145 to ground (zero volts). FET1 is in an OFF state. The nFET device applies the MSSC bus 4145 voltage of zero volts to top electrode TE of selected resistive change element SWy0,k, whose bottom electrode BE is in electrical communication with the bottom electrodes BE of the n−1 unselected resistive change elements and the source of cell select FET TY0, which is in an ON conducting state, whose drain is in electrical communication with array bit line BL[0], activated by word line WL[0]. The SL decoder 4120 $n$−1 decoder output lines 1-to-(k−1), (k+1)-to-n apply zero volts to corresponding gates of nFET and pFET devices forming n−1 select line router circuits of the group of n select line router circuits 4155, which turn the nFET devices OFF and the pFET devices ON. The pFET devices apply the MSSC bus 4150 voltage to the top electrodes TE of the n−1 unselected resistive change elements, which are in electrical communication with 0.75 V by SL WRITE driver 4135. As shown in FIG. 42C, $I_{SEL}$ pre-WRITE current flows through selected resistive change element SWy0,k to ground (zero volts) and parasitic currents $I_{PAR}$ flow through each of the n−1 unselected resistive change elements to bottom electrodes electrically connected in parallel and the source of cell select FET Ty0 in an ON conductive state, whose drain is in electrical communication with array bit line BL[0]. Parasitic current $I_{PAR}$ in each unselected resistive change element depends on its stored resistance state. So, for example, $I_{PAR}$ in a low resistance $R_{LO}$=100 kΩ state may be 20 times greater than $I_{PAR}$ current in a high resistance $R_{HI}$=2 MΩ state. Since selected resistive change element SWy0,k is at a RESET resistance of 2 MΩ, the voltage of all n bottom electrodes BE and array bit line BL[0] voltage $V_{BL0}$ may be calculated as 0.75V×(2 MΩ/(2 MS2+$R_{UN\_P}$)), where $R_{UN\_P}$ is the parallel resistance value of the n−1 unselected switches in parallel. Referring to the resistive change element SET voltage range of 1-1.5 V as described further above, bottom electrodes BE and array bit line BL[0] are less than or equal to approximately 0.75 V and resistive change element SWy0,k resistance value is not disturbed during the 3D MSSC memory select line drive Pre-WRITE operation 4240 illustrated in FIG. 42C. The resistance state of the n−1 unselected resistive change elements is also not disturbed.

Referring now to FIG. 42C and selected multi-switch storage cell CELLy000, other select line drivers 4125, 4130, and 4140 are in a tristate mode. Referring now to FIG. 42C and unselected multi-switch storage cell CELLy101, the discussion below regarding unselected multi-switch storage cell CELLy101 and corresponding circuits, devices, and buses is applicable to each unselected multi-switch storage cell along array bit line BL[0] and the same circuits, devices, and buses, corresponding to each unselected multi-switch storage cell along array bit line BL[0]. Cell select FET Ty4 is in OFF state and unselected multi-switch storage cell CELLy101 is isolated from array bit line BL[0]. All unselected select line drivers 4125, 4130, 4135, and 4140 corresponding to unselected multi-switch storage cell CELLy101 are in a tristate mode. FET1 device corresponding to multi-switch storage cell CELLy101 is in an ON state electrically connecting MSSC bus 4150 corresponding to multi-switch storage cell CELLy101 to zero volts (ground). FET2 device corresponding to multi-switch storage cell CELLy101 is in an ON state electrically connecting MSSC bus 4145 corresponding to multi-switch storage cell CELLy101 to zero volts (ground). Therefore, top electrodes TE of n resistive change elements in multi-switch storage cell CELLy101 are in electrical communication with n select line voltages of zero volts. Corresponding resistive change element bottom electrodes BE in electrical communication with each other and a source terminal of the cell select FET Ty4 in an OFF state are at zero volts.

Figure 42D:
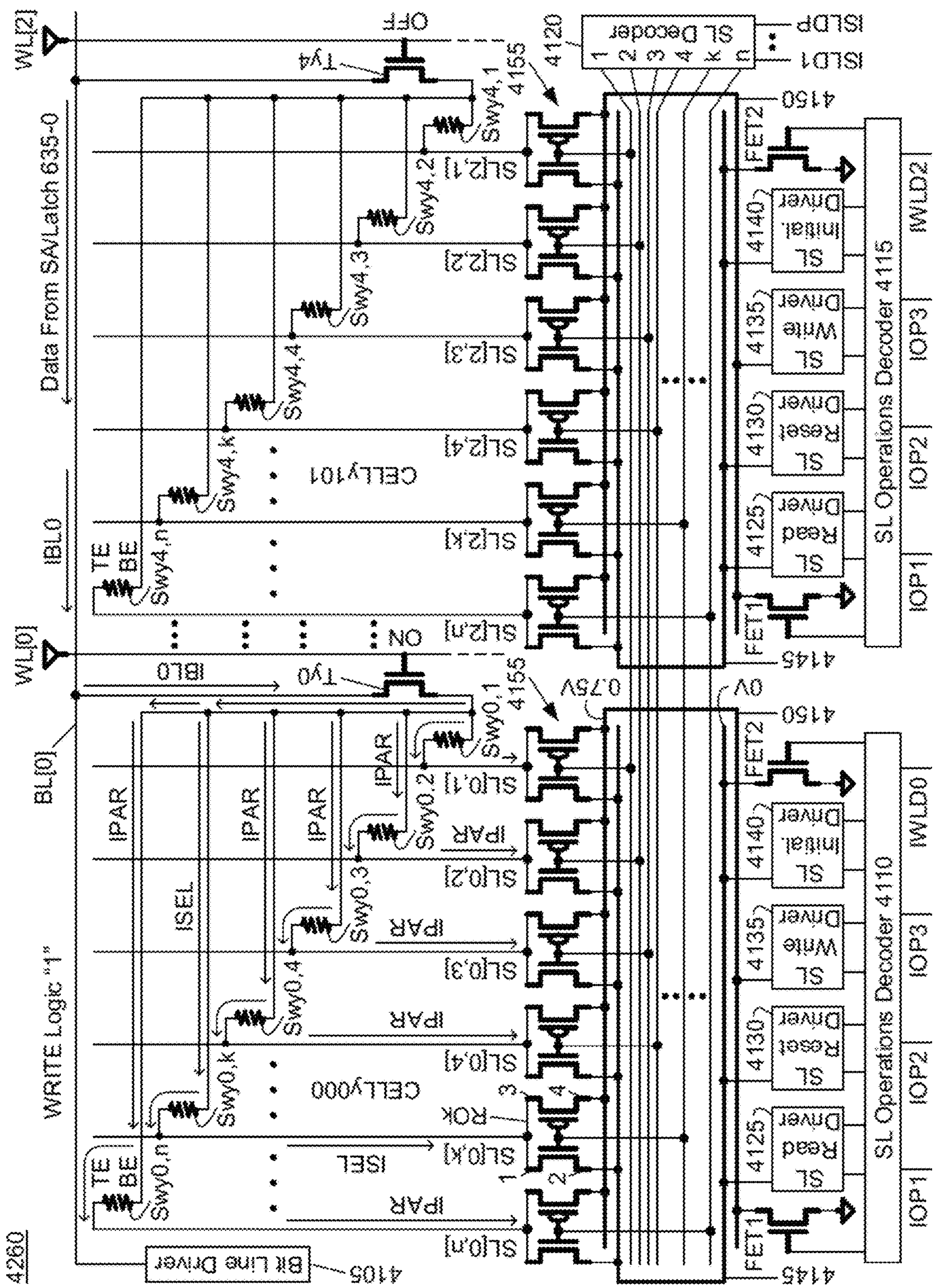
FIG. 42D illustrates a 3D MSSC memory select line drive WRITE logic “1” operation in which a bit line voltage of 1.5 Volts is applied to a MSSC with voltages corresponding to the pre-WRITE operation illustrated in FIG. 42C, in which a selected RCE top electrode is at zero volts and the n−1 unselected RCEs top electrodes are at 0.75 Volts to prevent a WRITE disturb.

Referring now to 3D MSSC memory voltage shifter/driver WRITE logic "1" operation 4260 illustrated in FIG. 42D, in view of 3D MSSC memory select line drive pre-WRITE operation 4240 illustrated in FIG. 42C, FIG. 42D shows array bit line BL[0] voltage $V_{BL0}$ and corresponding currents for a 3D MSSC memory WRITE operation 2660 illustrated in FIG. 26C for a logic "1" data input from on-chip bidirectional data bus 2690 resulting in a low resistance $R_{LO}$=100 kΩ state stored in selected resistive change element SWy0,k in selected multi-switch storage CELLy000, shown in both multi-chip storage cell memory array 2400 illustrated in FIG. 26C and in selected multi-switch storage CELLy000 illustrated in FIG. 42D.

Referring now to FIG. 26C, the logic "1" data input corresponds to a voltage signal of amplitude $V_{DD}$, where $V_{DD}$=1 V as described further above, which is transmitted by data bus coupling circuit 1325-0 to bit line segment BL[0]', which is in electrical communication with a terminal of SA/Latch 635-0. Isolation device $T_{ISB0}$ is in an OFF state during a WRITE operation. As described further above with respect to FIG. 26C, SA/Latch 635-0 switches to a $V_{DD}$=1 V state that is transmitted to voltage shifter/driver 2630-0, in electrical communication with a voltage source that supplies voltage $V_{HI}$. In a WRITE logic "1" operation, output voltage $O_{VS0}$, which is equal to $V_{HI}$, needs to be sufficiently high to drive bit array bit line BL[0] to 1.5 volts because resistive change elements have a $V_{SET}$ voltage range of 1-1.5 V as described further above and the maximum $V_{SET}$ voltage is 1.5 V. Voltage shifter/driver 2630-0 output $O_{VS0}$ is in electrical communication with a first terminal of WRITE select device $T_{RW0}$.

As described further above with respect to selected multi-switch storage CELLy000 illustrated in FIG. 42C, selected resistive change element SWy0,k has a top electrode TE in electrical communication with select line SL[0,k] which is at zero volts. The bottom electrode BE, in electrical communication with the n−1 bottom electrodes of the n−1 unselected resistive change elements and the source of cell select FET Ty0, with top electrodes TE of each of the n−1 resistive change elements in electrical communication with separate select lines at 0.75 V, results in an array bit line BL[0] voltage $V_{BL0}$ of less than or equal to 0.75 volts applied to the second terminal of WRITE select device $T_{WR0}$ when cell select FET Ty0 is in an ON state.

As described further above with respect to 3D MSSC memory WRITE operation 2640 illustrated in FIG. 26C and 3D MSSC memory select line drive pre-WRITE operation 4240 illustrated in FIG. 42C, pre-WRITE operation 4240 occurs at the same time as SA/Latch 635-0 receives and latches the WRITE data from on-chip bidirectional data bus 2690. WRITE select device $T_{RW0}$ is activated by a gate WRITE select voltage as shown in FIG. 26C, and array bit line BL[0] in electrical communication with selected multi-switch storage CELLy000 transitions to 1.5 V as shown by 3D MSSC memory select line drive WRITE logic "1" operation illustrated in FIG. 26C. Cell select FET Ty0 is activated by word line WL[0] and array bit line voltage $V_{BL0}$=1.5 V is transmitted from the drain to the source, which is in electrical communication with all bottom electrodes BE of n resistive change elements. Selected resistive change element SWy0,k with top electrode TE in electrical communication with select line SL[0,k] which is at zero volts, results in a $V_{SET}$ voltage of 1.5 V between bottom electrode BE and top electrode TE. Since resistive change element SWy0,k was RESET to a high resistance state $R_{HI}$=2 MS/in a RESET-before-WRITE operation described further above with respect to FIG. 42B prior to the WRITE operation, resistive change element SWy0,k switches to and stores a low resistance value of $R_{LO}$=100 kΩ corresponding to a logic "1" state. $I_{SEL}$ current flows through selected resistive change element SWy0,k to top electrode TE in electrical communication with select line SL[0,k] in electrical communication with zero volts.

The n−1 unselected resistive change elements also have 1.5 V applied to the bottom electrodes BE. However, since all top electrodes TE are in electrical communication with select lines at 0.75 V, bottom electrode BE to top electrode TE is 1.5 V-0.75 V=0.75 V, which is 0.25 volts less than the minimum $V_{SET}$ voltage of 1 V, and therefore, their respective resistance states are not disturbed. $I_{PAR}$ currents flow through the n−1 unselected resistive change elements. Array bit line current $I_{BL0}$ is equal to $I_{SEL}$ current plus the sum of the n−1 $I_{PAR}$ currents.

Figure 42E:
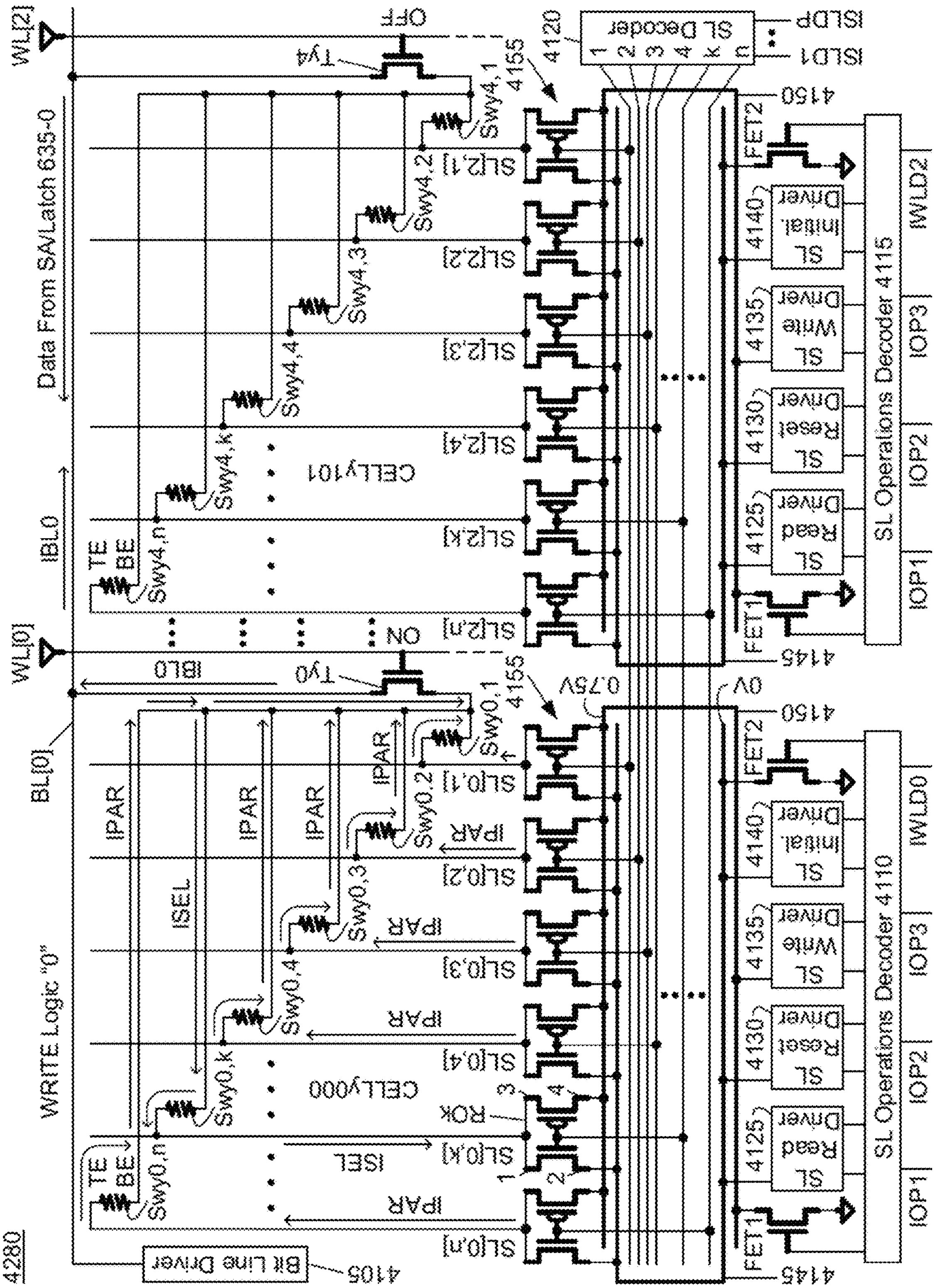
FIG. 42E illustrates a 3D MSSC memory select line drive WRITE logic “0” operation in which a bit line voltage of zero Volts is applied to a MSSC with voltages corresponding to the pre-WRITE operation illustrated in FIG. 42C, in which a selected RCE top electrode is at zero volts and the n−1 unselected RCEs top electrodes are at 0.75 Volts.

Referring now to 3D MSSC memory voltage shifter/driver WRITE logic "0" operation 4280 illustrated in FIG. 42E, in view of 3D MSSC memory select line drive pre-WRITE operation 4240 illustrated in FIG. 42C, FIG. 42E shows array bit line BL[0] voltage $V_{BL0}$ and corresponding currents for a 3D MSSC memory multi-switch storage cell array WRITE operation 2640 illustrated in FIG. 26C for a logic "0" data input from on-chip bidirectional data bus 2690 resulting in a high resistance $R_{HI}$=2 MΩ state stored in selected resistive change element SWy0,k in selected multi-switch storage CELLy000, shown in both multi-switch storage cell memory array 2400 illustrated in FIG. 26C and in selected multi-switch storage CELLy000 illustrated in FIG. 42E.

Referring to FIG. 26C, the logic "0" operation is shown with respect to array bit line BL[1]. However, since array bit line BL[0] may receive both logic "1" and logic "0" data inputs, FIG. 42E shows the logic "0" operation with respect to array bit line BL[0] as a matter of convenience. Therefore, the BL[1] logic "0" WRITE operation is presented with respect to BL[0] in FIG. 42E.

Referring now to FIG. 26C, the logic "0" data input corresponds to a voltage signal of amplitude of zero volts as described further above, which is transmitted by data bus coupling circuit 1325-0 to bit line segment BL[0]', which is in electrical communication with a terminal of SA/Latch 635-0. Isolation device $T_{ISB0}$ is in an OFF state during a WRITE operation. As described further above with respect to FIG. 26C, SA/Latch 635-0 switches to a zero volt state that is transmitted to voltage shifter/driver 2630-0, in electrical communication with a voltage source that supplies voltage $V_{HI}$. In a WRITE logic "0" operation, the voltage shifter/driver 2630-0 output $O_{VS0}$=0 V is applied to a first terminal of WRITE select device $T_{RW0}$.

As described further above with respect to selected multi-switch storage CELLy000 illustrated in FIG. 42C, selected resistive change element SWy0,k has top electrode TE in electrical communication with select line SL[0,k] which is at zero volts. The bottom electrode BE, in electrical communication with the n−1 bottom electrodes of the n−1 unselected resistive change elements and the source of cell select FET Ty0, with top electrodes TE of each of the n−1 resistive change elements in electrical communication with separate select lines at 0.75 V, results in an array bit line BL[0] voltage $V_{BL0}$ of less than or equal to 0.75 volts applied to the second terminal of WRITE select device $T_{WR0}$ when cell select FET Ty0 is in an ON state.

As described further above with respect to 3D multi-switch storage cell memory WRITE operation 2640 illustrated in FIG. 26C and 3D MSSC memory select line drive pre-WRITE operation 4240 illustrated in FIG. 42C, pre-WRITE operation 4240 occurs at the same time as SA/Latch 635-0 receives and latches the WRITE data from on-chip bidirectional data bus 2690. WRITE select device $T_{RW0}$ is activated by a gate WRITE select voltage as shown in FIG. 26C, and array bit line BL[0] in electrical communication with selected multi-switch storage CELLy000 transitions to 0 V as shown by 3D MSSC memory select line drive WRITE logic "0" operation illustrated in FIG. 26C. Cell select FET Ty0 is activated by word line WL[0] and array bit line voltage $V_{BL0}$=0 V is transmitted from the drain to the source, which is in electrical communication with all bottom electrodes BE of n resistive change elements. Selected resistive change element SWy0,k with top electrode TE in electrical communication with select line SL[0,k] which is at zero volts, results in a $V_{SET}$ voltage of approximately zero volts between bottom electrode BE and top electrode TE. Since resistive change element SWy0,k was RESET to a high resistance state $R_{HI}$=2 MΩ in a RESET-before-WRITE operation described further above with respect to FIG. 42B prior to the WRITE operation, resistive change element SWy0,k remains in the high resistance state corresponding to a logic "0" state. $I_{SEL}$ current flow through selected resistive change element SWy0,k to top electrode TE in electrical communication with select line SL[0,k] in electrical communication with zero volts is approximately zero.

The n−1 unselected resistive change elements also have zero volts applied to the bottom electrodes BE. However, since all top electrodes TE are in electrical communication with select lines at 0.75 V, bottom electrode BE to top electrode TE is 0 V-0.75 V=−0.75 V, with a minimum $V_{SET}$ voltage of 1 V and therefore, their respective resistance states are not disturbed. $I_{PAR}$ currents flow through the n−1 unselected resistive change elements from top electrodes TE to bottom electrodes BE. Array bit line current $I_{BL0}$ is equal to $I_{SEL}$ current minus the sum of the n−1 $I_{PAR}$ currents. Therefore, array bit line current $I_{BL0}$ flows out of selected multi-switch storage CELLy000 and through pull down device $T_{ISB0}$ illustrated in FIG. 26C. Since FIG. 26C WRITE logic "0" is illustrated with respect to BL[1], the current shown through $T_{ISB1}$ corresponds to the current flowing through $T_{ISB0}$ for a logic "0" operation on array bit line BL[0].

Waveforms 3D MSSC memory RESET-before-WRITE operation, WRITE logic "1", and WRITE logic "0" of a selected resistive change element in a selected multi-switch storage cell, such as selected multi-switch storage CELLy000 described further above, correspond to WRITE timing diagram 980 illustrated in prior art FIG. 9B.

Figure 42F:
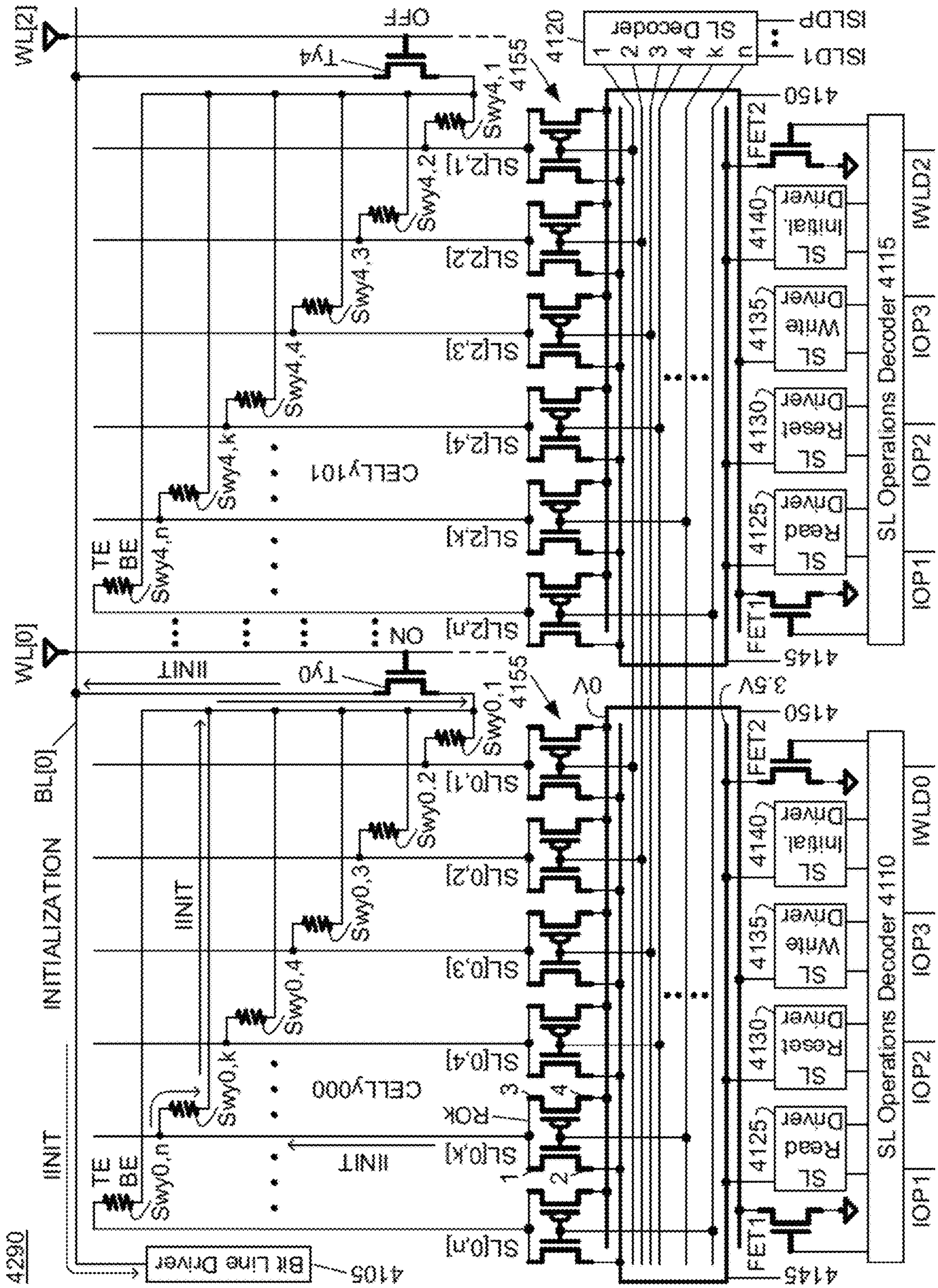
FIG. 42F illustrates a 3D MSSC memory select line drive INITIALIZATION operation in which the select line INITIALIZATION driver drives the first of a pair of MSSC buses corresponding the selected RCE in the MSSC. An activated FET in electrical communication with the second MSSC bus corresponding to the n−1 unselected RCEs in the MSSC drives the second MSSC bus to zero volts.

Referring now to 3D MSSC memory select line drive INITIALIZATION operation 4290 illustrated in FIG. 42F and an INITIALIZATION operation of the resistance state of resistive change element SWy0,k in selected multi-switch storage CELLy000. Word line WL[0] is activated by a WL driver (not shown) which activates cell select FET $T_{Y0}$ to an ON state and electrically connects multi-switch storage CELLy000 to array bit line BL[0], which is held at $V_{BL0}$=0 V by array bit line driver 4105 similar to array bit line driver 820 illustrated in prior art FIG. 8. Array bit line BL[0] is representative of all array bit lines in a subarray having multiple array bit lines such as 8, 16, 32, 64, 128, 256 or more array bit lines which are all activated at the same time.

As described further above with respect to NV CNT switch initialization scan 3700 illustrated in FIG. 37, some as fabricated (also referred to as virgin) resistive change elements may have a range of initial resistance values in an indeterminate resistance range that does not correspond to the desired operational SET and RESET described further above. Furthermore, the ability of resistive change elements to switch reproducibly between low resistance SET states and high resistance RESET states needs to be established by I-V scans or pulsed waveforms applied to resistive change elements top electrodes TE relative to bottom electrodes BE at zero volts. Therefore, an INITIALIZATION operation described further above with respect to FIG. 37 is required. This operation may be performed at the wafer and/or packaged level prior 3D MSSC memory product ship.

Selected SL INITIALIZATION driver 4140 in electrical communication with MSSC bus 4145 and FET1 in electrical communication with MSSC bus 4150, are activated, and initiate an INITIALIZATION operation of resistive change element SWy0,k in selected multi-switch storage CELLy000 with an I-V scan or a pulse of amplitude of up to 3.5 V applied to top electrode TE as described further above with respect to FIGS. 37 and 39. SL decoder 4120 decoder output line k applies a positive voltage to the gates of nFET and pFET devices forming select line router circuit ROk of the group of n select line router circuits 4155, which turns the nFET device ON and the pFET device OFF. The nFET device applies the MSSC bus 4145 voltage to top electrode TE of selected resistive change element SWy0,k, whose bottom electrode BE is in electrical communication with the source of cell select FET $T_{Y0}$, which is in an ON conducting state, whose drain is in electrical communication with array bit line BL[0] at $V_{BL0}$=0 V, activated by word line WL[0]. INITIALIZATION current $I_{INIT}$ flows to ground (zero volts) through array bit line driver 4105 that electrically connects array bit line BL[0] to ground (zero volts). The bottom electrodes BE of the n−1 unselected resistive change elements are also in electrical communication with the source of cell select FET TY0, which is at approximately 0 V. The SL decoder 4120 *n*−1 decoder output lines 1-to-(k−1), (k+1)-to-n apply zero volts to corresponding gates of nFET and pFET devices forming n−1 select line router circuits of the group of n select line router circuits 4155, which turn the nFET devices OFF and the pFET devices ON. The pFET devices apply the MSSC bus 4150 voltage to the top electrodes TE of the n−1 unselected resistive change elements, which are in electrical communication with ground (zero volts) through FET1 in an ON state. Parasitic currents through the n−1 unselected resistive change elements are essentially zero, therefore, parasitic currents flowing through the n−1 unselected resistive change elements are not shown in FIG. 42F. FET2 is in an OFF state. At the start of the resistive change element SWy0,k INITIALIZATION operation, the resistive change element is in an indeterminant state as illustrated by FIG. 37, and transitions from a range of as-fabricated resistance values to a low resistance state, and then to a $1^{st}$ RESET state illustrated in FIG. 37. Then, resistive change element may be cycled several times between high and low resistance states until switching operation between the low resistance SET state and the high resistance RESET state is established.

While INITIALIZATION operations are performed on as-fabricated resistive change elements of multi-switch storage cells of 3D MSSC arrays at the wafer or packaged level, the operation of failing resistive change elements in shipped 3D MSSC memories may be restored at the packaged level by repeating INITIALIZATION operations.

Referring now to FIG. 42F and selected multi-switch storage cell CELLy000, other select line drivers 4125, 4130, and 4135 are in a tristate mode. Referring now to FIG. 42F and unselected multi-switch storage cell CELLy101, the discussion below regarding unselected multi-switch storage cell CELLy101 and corresponding circuits, devices, and buses is applicable to each unselected multi-switch storage cell along array bit line BL[0] and the same circuits, devices, and buses, corresponding to each unselected multi-switch storage cell along array bit line BL[0]. Cell select FET Ty4 is in OFF state and unselected multi-switch storage cell CELLy101 is isolated from array bit line BL[0]. All unselected select line drivers 4125, 4130, 4135, and 4140 corresponding to unselected multi-switch storage cell CELLy101 are in a tristate mode. FET1 device corresponding to multi-switch storage cell CELLy101 is in an ON state electrically connecting MSSC bus 4150 corresponding to multi-switch storage cell CELLy101 to zero volts (ground). FET2 device corresponding to multi-switch storage cell CELLy101 is in an ON state electrically connecting MSSC bus 4145 corresponding to multi-switch storage cell CELLy101 to zero volts (ground). Therefore, top electrodes TE of n resistive change elements in multi-switch storage cell CELLy101 are in electrical communication with n select line voltages of zero volts. Corresponding resistive change element bottom electrodes BE in electrical communication with each other and a source terminal of the cell select FET Ty4 in an OFF state are at zero volts.

At this point in the specification, READ, RESET, WRITE, and INITIALIZATION operations with respect to one resistive change element within a selected multi-switch storage cell, such as CELLy000 for example, have been described further above with respect to FIGS. 41A, and FIGS. 42A-42F. However, there may be advantages to performing simultaneous operations on two or more resistive change elements, or all resistive change elements, within multi-switch storage cells as described further below. These include the following operations: RESET all resistive change elements in a multi-switch storage cell simultaneously and INITIALIZATION of all resistive change elements in a multi-switch storage cell or multiple-switch storage cells simultaneously.

Figure 41B:
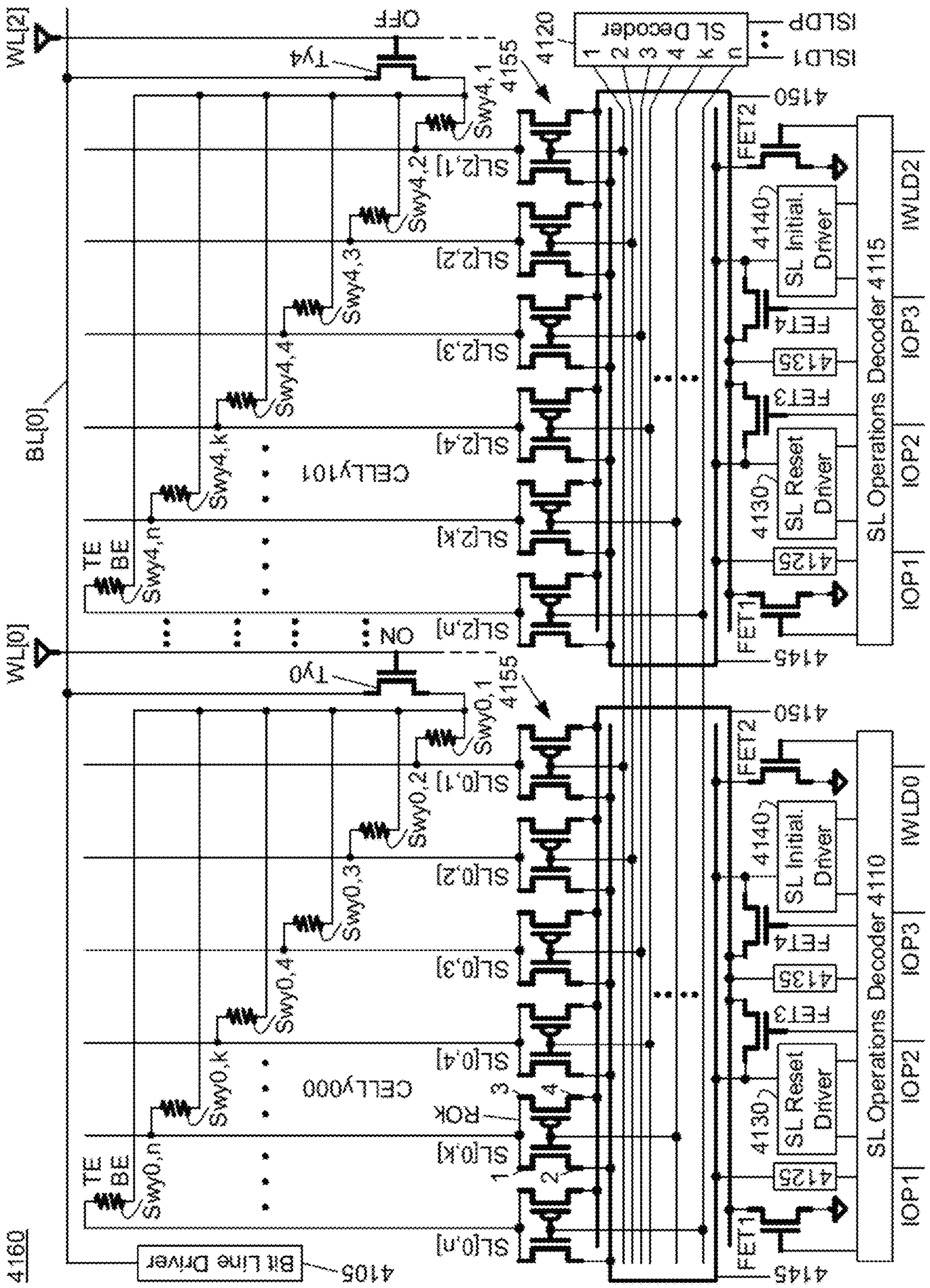
FIG. 41B illustrates changes to FIG. 41A that enable select line RESET drivers and INITIALIZATION drivers to simultaneously RESET or initialize all resistive change elements in a multi-switch storage cell.

Referring now to 3D MSSC array select line drive matrix 4160 illustrated in FIG. 41B, FIG. 41B illustrates changes to 3D MSSC array select line drive matrix 4100 illustrated in FIG. 41A to enable simultaneous RESET and INITIALIZATION operations on all resistive change elements in a selected multi-switch storage cell. FET3, whose gate voltage is controlled by SL operations decoder 4110, has a first terminal in electrical communication with the output of SL RESET driver 4130 and a second terminal in electrical communication with MSSC bus 4150. FET3 is in an OFF state during the READ, RESET, WRITE, and INITIALIZATION of one selected resistive change element as illustrated and described further above with respect to FIGS. 42A-42F. FET4, whose gate voltage is controlled by SL operations decoder 4110, has a first terminal in electrical communication with the output of SL INITIALIZATION driver 4140 and a second terminal in electrical communication with MSSC bus 4150. FET4 is in an OFF state during the READ, RESET, WRITE, and INITIALIZATION of one selected resistive change element as illustrated and described further above with respect to FIGS. 42A-42F.

3D MSSC memory on-chip controller 4045 illustrated in 3D MSSC memory chip architecture 4000 illustrated in FIG. 40 provides input signals $I_{OP1}$, $I_{OP2}$, and $I_{OP3}$ to operations decoder 4110.

3D MSSC array select line drive matrix 4160 illustrated in FIG. 41B performs the same electrical functions as 3D MSSC array select line drive matrix 4100 illustrated in FIG. 41A if FET3 and FET4 are in an OFF state. Therefore, the 3D MSSC memory select line drive READ, RESET, WRITE, and INITIALIZATION operations on one selected resistive change element described in FIGS. 42A-42F may be performed using the 3D MSSC array select line drive matrix 4160 illustrated in FIG. 41B.

Referring now to 3D MSSC memory RESET-before-WRITE operation 3200 illustrated in FIG. 32 that shows two select lines SL[0,k] and SL[0,1] that are simultaneously driven by select line voltage $V_{SL}$ and may be used to simultaneously RESET resistive change elements SWy0,k and SWy0,1, respectively. Select line voltage $V_{SL}$ corresponds to select line voltage $V_{SL2}$=2.75 illustrated in FIG. 20, which is a representation of a 3D MSSC memory RESET operation 2000. As described further above with respect to FIG. 32, any number of RESET operations, including all resistive change elements in the multi-switch storage cell, may occur at approximately the same time. 3D MSSC array select line drive matrix 4160 illustrated in FIG. 41B is a circuit function designed to enable a simultaneous RESET-before-WRITE operation of all resistive change elements in a selected multi-switch storage cell, such as CELLy000. The circuit function illustrated in FIG. 41B may also be used to perform the READ, RESET, WRITE, and INITIALIZATION operations of one selected resistive change element in a selected multi-switch storage cell described above with respect to FIG. 41A, and FIGS. 42A-42F.

Figure 42G:
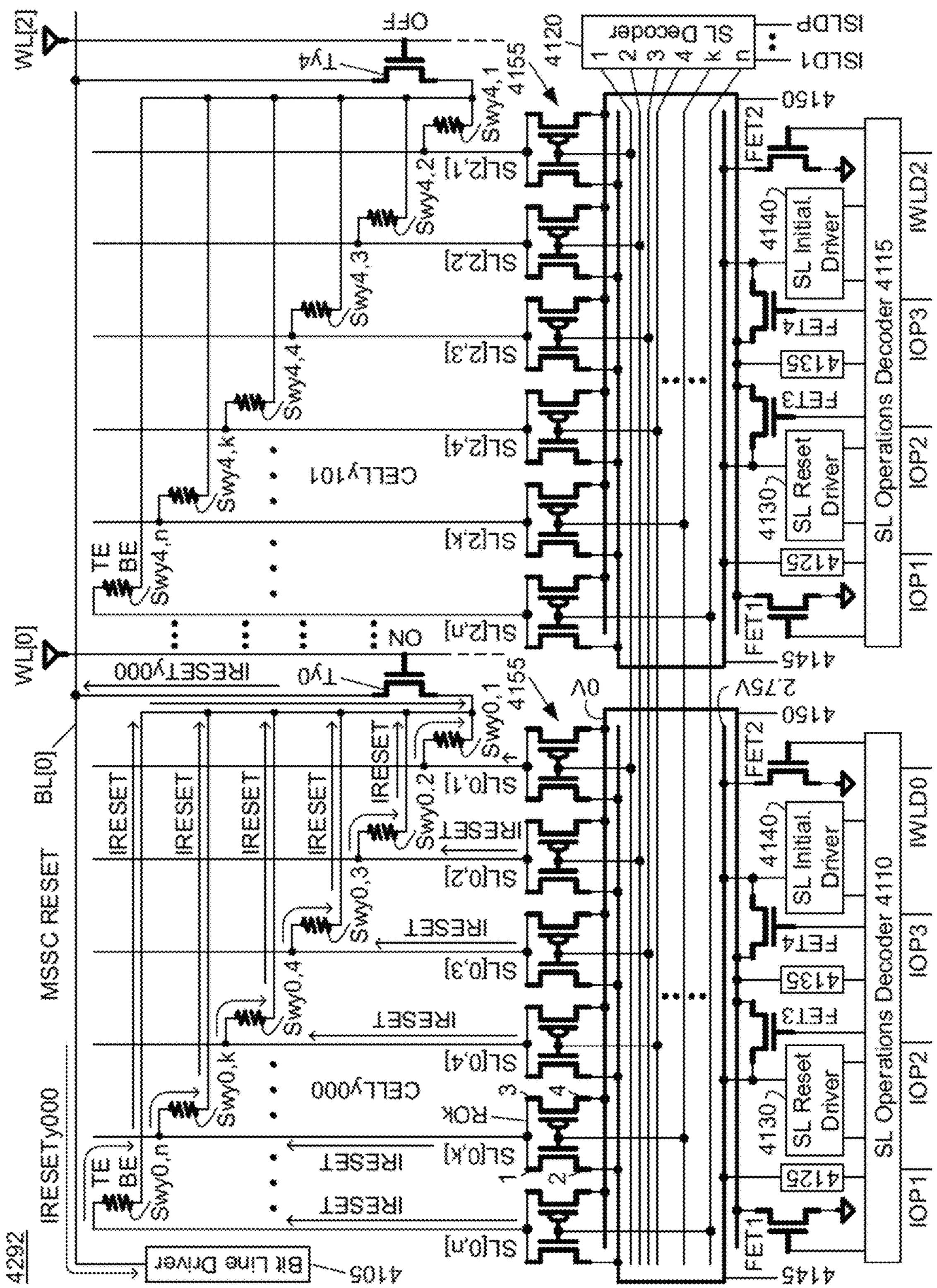
FIG. 42G illustrates a 3D MSSC memory multi-select line drive RESET operation in which the select line RESET driver drives both pairs of MSSC buses corresponding the selected multi-switch storage cell.

Referring now to 3D MSSC memory multi-select line drive RESET operation 4292 illustrated in FIG. 42G and a simultaneous RESET operation of the resistance state of all resistive change elements in selected multi-switch storage cell CELLy000. Word line WL[0] is activated by a WL driver (not shown) which activates cell select FET $T_{Y0}$ to an ON state and electrically connects multi-switch storage CELLy000 to array bit line BL[0], which is held at $V_{BL0}$=0 V by array bit line driver 4105 similar to bit line driver 820 illustrated in prior art FIG. 8. Array bit line BL[0] is representative of all array bit lines in a subarray having multiple array bit lines such as 8, 16, 32, 64, 128, 256 or more array bit lines which are all activated at the same time.

FET1, FET2, and FET4 are all in an OFF state and FET3 is in an ON state when performing a simultaneous RESET operation of all resistive change elements in a selected multi-switch storage cell. The selected SL RESET driver 4130 output is in electrical communication with MSSC bus 4145 and MSSC bus 4150. Selected SL RESET driver 4130 is activated and initiates a RESET operation of all resistive change elements in selected multi-switch storage CELLy000. Resistive change element SWy0,k receives a pulse of amplitude 2.75 V as described further above with respect to FIGS. 32 and 20. SL decoder 4120 decoder output line k applies a positive voltage to the gates of nFET and pFET devices forming select line router circuit ROk of the group of n select line router circuits 4155, which turns the nFET device ON and the pFET device OFF. The nFET device applies the MSSC bus 4145 voltage to top electrode TE of selected resistive change element SWy0,k, whose bottom electrode BE is in electrical communication with the source of cell select FET $T_{Y0}$, which is in an ON conducting state, whose drain is in electrical communication with array bit line BL[0] at $V_{BL0}$=0 V, activated by word line WL[0]. RESET current $I_{RESET}$ flows to ground (zero volts) through array bit line driver 4105 that electrically connects array bit line BL[0] to ground (zero volts). The bottom electrodes BE of the n−1 unselected resistive change elements are also in electrical communication with the source of cell select FET Ty0, which is at approximately 0 V.

SL decoder 4120 *n*−1 decoder output lines 1-to-(k−1) and (k+1)-to-n apply a zero voltage to the gates of nFET and pFET devices forming the n−1 select line router circuits of group of n select line router circuits 4155, which turn the corresponding nFET devices OFF and the pFET devices ON. Top electrodes TE of the n−1 unselected resistive change elements are in electrical communication with MSSC bus 4150 through pFET devices in an ON state, which are in electrical communication with the output of SL RESET driver 4130 output though FET3 in an ON state, and applies MSSC bus 4150 voltage to the top electrodes TE of the n−1 selected resistive change elements whose bottom electrodes BE are in electrical communication with each other and the source of cell select FET $T_{Y0}$, which is in an ON conducting state, whose drain is in electrical communication with array bit line BL[0] at $V_{BL0}$=0 V, activated by word line WL[0]. The sum of the n RESET currents $I_{RESET}$ flows to ground (zero volts) through array bit line driver 4105 that electrically connects array bit line BL[0] to ground (zero volts).

If any of the n resistive change elements are in low resistance state $R_{LO}$=100 kΩ, then they transition to a RESET high resistance $R_{HI}$=2 MΩ. However, if any of the n resistive change elements are in RESET high resistance state $R_{HI}$=2 MΩ, they remain in the high resistance state. Referring now to FIG. 32, 3D MSSC memory RESET-before-WRITE operation 3200 shows array bit line BL[0] voltage $V_{BL0}$=0 V.

Referring now to FIG. 42G and selected multi-switch storage cell CELLy000, other select line drivers 4125, 4135, and 4140 are in a tristate mode. Referring now to FIG. 42G and unselected multi-switch storage cell CELLy101, the discussion below regarding unselected multi-switch storage cell CELLy101 and corresponding circuits, devices, and buses is applicable to each unselected multi-switch storage cell along array bit line BL[0] and the same circuits, devices, and buses, corresponding to each unselected multi-switch storage cell along array bit line BL[0]. Cell select FET Ty4 is in OFF state and unselected multi-switch storage cell CELLy101 is isolated from array bit line BL[0]. All unselected select line drivers 4125, 4130, 4135, and 4140 corresponding to unselected multi-switch storage cell CELLy101 are in a tristate mode. FET1 device corresponding to multi-switch storage cell CELLy101 is in an ON state electrically connecting MSSC bus 4150 corresponding to multi-switch storage cell CELLy101 to zero volts (ground). FET2 device corresponding to multi-switch storage cell CELLy101 is in an ON state electrically connecting MSSC bus 4145 corresponding to multi-switch storage cell CELLy101 to zero volts (ground). Therefore, top electrodes TE of n resistive change elements in multi-switch storage cell CELLy101 are in electrical communication with n select line voltages of zero volts. Corresponding resistive change element bottom electrodes BE in electrical communication with each other and a source terminal of the cell select FET Ty4 in an OFF state are at zero volts.

Referring now to 3D MSSC memory select line pre-WRITE operation 4240 illustrated in FIG. 42C, 3D MSSC memory WRITE operation 2640 illustrated in FIG. 26C, and 3D MSSC memory chip architecture 4000 illustrated in FIG. 40, assume 3D MSSC memory on-chip controller 4045 receives a row address, column address, and operational instruction for a burst-write of data of the information stored on each of the resistive change elements in the selected multi-switch storage cell at the corresponding word and bit line intersection. For example, multi-switch storage cell CELLy000 at the intersection of word line WL[0] and array bit line BL[0]. 3D MSSC memory on-chip controller 4045 supplies $I_{OP1}$, $I_{OP2}$, and $I_{OP3}$ inputs to SL operations decoder 4110 that activates SL WRITE driver 4135 and inputs $I_{SLD1}$-$I_{SLDp}$ to SL decoder 4120 that selects each of the n resistive change elements.

Referring now to NV CNT switch initialization scan 3700 and 1T, 1R cell memory array initialization voltage distribution 3900 illustrated in FIGS. 37 and 39, respectively, an INITIALIZATION operation is not part of the 3D MSSC memory product specification and corresponding operations. Rather, the INITIALIZATION operation is part of the 3D MSSC memory fabrication process which may be carried out at the wafer and/or packaged level. The INITIALIZATION operation is part of product test and characterization operations carried out prior to product shipment in which throughput is an important factor. Hence, it is desirable to implement the INITIALIZATION operation simultaneously on as many resistive change elements as possible.

Figure 42H:
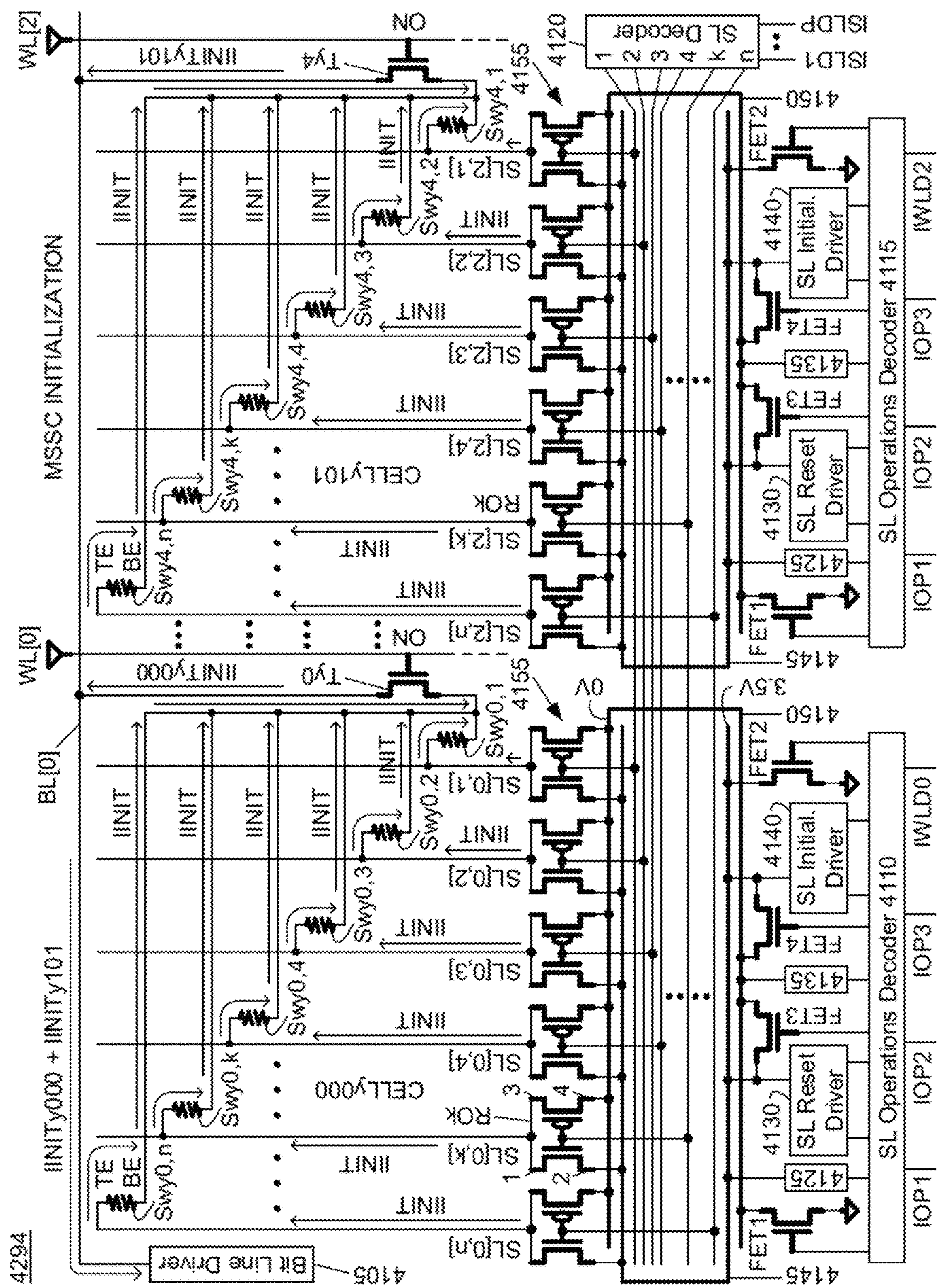
FIG. 42H illustrates a 3D MSSC memory multi-select line drive INITIALIZATION operation in which the select line INITIALIZATION driver drives both pairs of MSSC buses corresponding the selected multi-switch storage cell.

Simultaneous INITIALIZATION operations on all resistive change elements in a selected multi-switch storage cell, such as CELLy000 illustrated in 3D MSSC memory multi-select line drive INITIALIZATION operation 4294 illustrated in FIG. 42H increases product test throughput. For example, for simultaneous INITIALIZATION operations on all resistive change elements in multi-switch storage cell CELLy000, multi-switch storage cell CELLy000 cell select FET Ty0 is in an ON state and multi-switch storage cell CELLy101 cell select FET Ty4 and cell select FETs in all other multi-switch storage cells along array bit line BL[0] are in an OFF state.

However, it is desirable to perform simultaneous INITIALIZATION operations on multiple selected multi-switch storage cells in 3D MSSC memory multi-select line drive INITIALIZATION operation 4294 as illustrated in FIG. 42H. Hence, multi-switch storage cell CELLy000 cell select FET Ty0 and multi-switch storage cell CELLy101 cell select FET Ty4 are in an ON state. In addition to multi-switch storage cells CELLy000 and CELLy101, additional multi-switch storage cells along array bit line BL[0] may be selected and cell select FETs in the other selected multi-switch storage cells are in an ON state. Cell select FETs in unselected multi-switch storage cells along array bit line BL[0] are in OFF state. Further, all multi-switch storage cells along array bit line BL[0] may be selected and cell select FETs in all multi-switch storage cells along array bit line BL[0] are in an ON state. Multi-switch storage cell memory array schematic 2400 illustrated in FIGS. 24-1 and 24-2 shows additional multi-switch storage cells.

Referring now to 3D MSSC memory chip architecture 4000 illustrated in FIG. 40, 3D MSSC memory on-chip controller 4045 as described further above is designed to respond to and execute the 3D MSSC memory product functions in response to inputs from memory controller functions on other chips such as microprocessors, microcontrollers, FPGAs, or other logic functions, for example. However, 3D MSSC memory on-chip controller 4045 may also be designed to execute additional operations in response to test and diagnostic program tester inputs required as part of the fabrication process prior to product shipment.

As described further above with respect to NV CNT switch initialization scan 3700 illustrated in FIG. 37, some as fabricated (also referred to as virgin) resistive change elements may have a range of initial resistance values in an indeterminate resistance range that does not correspond to the desired operational SET and RESET described further above. Furthermore, the ability of resistive change elements to switch reproducibly between low resistance SET states and high resistance RESET states needs to be established by I-V scans or pulsed waveforms applied to resistive change elements top electrodes TE relative to bottom electrodes BE at zero volts. Therefore, an INITIALIZATION operation described further above with respect to FIG. 37 is performed simultaneously initializing all resistive change elements in multi-switch storage cells CELLy000 and CELLy101 illustrated in FIG. 42H and other multi-switch storage cells not shown. This operation may be performed at the wafer and/or packaged level prior 3D MSSC memory product ship.

Referring now to 3D MSSC memory multi-select line drive INITIALIZATION operation 4294 illustrated in FIG. 42H and a simultaneous INITIALIZATION operation of the resistance state of all resistive change elements in selected multi-switch storage cells CELLy000 and CELLy101. Word line WL[0] is activated by a WL driver (not shown) which activates cell select FET $T_{Y0}$ to an ON state and electrically connects multi-switch storage cell CELLy000 to array bit line BL[0], which is held at $V_{BL0}$=0 V by an array bit line driver 4105 similar to bit line driver 820 illustrated in prior art FIG. 8. Multi-switch storage cell CELLy101 is initialized at the same time as CELLy000. Word line WL[2] is activated by a WL driver (not shown) which activates cell select FET Ty4 to an ON state and electrically connects multi-switch storage cell CELLy101 to array bit line BL[0], which is at $V_{BL0}$=0 V. Array bit line BL[0] is representative of all array bit lines in a subarray having multiple array bit lines such as 8, 16, 32, 64, 128, 256 or more array bit lines which are all activated at the same time.

When performing a simultaneous INITIALIZATION operation of all resistive change elements in multiple selected multi-switch storage cells, FET1-FET4 corresponding to each of the selected multi-switch storage cells along array bit line BL[0] are in ON or OFF states as follows, FET1, FET2, and FET3 are all in an OFF state and FET4 is in an ON state. Each selected SL INITIALIZATION driver 4140 output is in electrical communication with a MSSC bus 4145 and a MSSC bus 4150. The selected SL INITIALIZATION drivers 4140 are activated and initiate an INITIALIZATION operation of all resistive change elements in multiple selected multi-switch storage cells.

Referring now to multi-switch storage cell CELLy000, selected SL INITIALIZATION driver 4140, in electrical communication with MSSC bus 4145 and MSSC bus 4150, is activated and initiates an INITIALIZATION operation of resistive change element SWy0,k in selected multi-switch storage cell CELLy000 with an I-V scan or a pulse of amplitude of up to 3.5 V applied to top electrode TE as described further above with respect to FIGS. 37 and 39. SL decoder 4120 decoder output line k applies a positive voltage to the gates of nFET and pFET devices forming select line router circuit ROk of the group of n select line router circuits 4155, which turns the nFET device ON and the pFET device OFF. The nFET device applies the MSSC bus 4145 voltage to top electrode TE of selected resistive change element SWy0,k, whose bottom electrode BE is in electrical communication with the source of cell select FET $T_{Y0}$, which is in an ON conducting state, whose drain is in electrical communication with array bit line BL[0] at $V_{BL0}$=0 V, activated by word line WL[0]. INITIALIZATION current $I_{INIT}$ flows to ground (zero volts) through array bit line driver 4105 that electrically connects array bit line BL[0] to ground (zero volts). The bottom electrodes BE of the n−1 unselected resistive change elements are also in electrical communication with the source of cell select FET $T_{Y0}$, which is at approximately 0 V.

SL decoder 4120 *n*−1 decoder output lines 1-to-(k−1) and (k+1)-to-n apply a zero voltage to the gates of nFET and pFET devices forming the select line router circuits of the group of n select line router circuits 4155, which turn the corresponding nFET devices OFF and the pFET devices ON. Top electrodes TE of the n−1 unselected resistive change elements are in electrical communication with MSSC bus 4150 through pFET devices in an ON state, which are in electrical communication with the output of SL INITIALIZATION driver 4140 output though FET4 in an ON state, and applies MSSC bus 4150 voltage to the top electrodes TE of the n−1 selected resistive change elements whose bottom electrodes BE are in electrical communication with each other and the source of cell select FET $T_{Y0}$, which is in an ON conducting state, whose drain is in electrical communication with array bit line BL[0] at $V_{BL0}$=0 V, activated by word line WL[0].

Referring now to multi-switch storage cell CELLy101, initialized simultaneously with CELLy000 and other multi-switch storage cells not shown, selected SL INITIALIZATION driver 4140, in electrical communication with MSSC bus 4145 and MSSC bus 4150, is activated and initiates an INITIALIZATION operation of resistive change element SWy4,k in selected multi-switch storage cell CELLy101 with an I-V scan or a pulse of amplitude of up to 3.5 V applied to top electrode TE as described further above with respect to FIGS. 37 and 39. SL decoder 4120 decoder output line k applies a positive voltage to the gates of nFET and pFET devices forming select line router circuit ROk of the group of n select line router circuits 4155, which turns the nFET device ON and the pFET device OFF. The nFET device applies the MSSC bus 4145 voltage to top electrode TE of selected resistive change element SWy0,k, whose bottom electrode BE is in electrical communication with the source of cell select FET Ty4, which is in an ON conducting state, whose drain is in electrical communication with array bit line BL[0] at $V_{BL0}$=0 V, activated by word line WL[2]. INITIALIZATION current $I_{INIT}$ flows to ground (zero volts) through array bit line driver 4105 that electrically connects array bit line BL[0] to ground (zero volts). The bottom electrodes BE of the n−1 unselected resistive change elements are also in electrical communication with the source of cell select FET Ty4, which is at approximately 0 V.

SL decoder 4120 *n*−1 decoder output lines 1-to-(k−1) and (k+1)-to-n apply a zero voltage to the gates of nFET and pFET devices forming the select line router circuits of the group of n select line router circuits 4155, which turn the corresponding nFET devices OFF and the pFET devices ON. Top electrodes TE of the n−1 unselected resistive change elements are in electrical communication with MSSC bus 4150 through pFET devices in an ON state, which are in electrical communication with the output of SL INITIATION driver 4140 output though FET4 in an ON state, and applies MSSC bus 4150 voltage to the top electrodes TE of the n−1 selected resistive change elements whose bottom electrodes BE are in electrical communication with each other and the source of cell select FET Ty4, which is in an ON conducting state, whose drain is in electrical communication with array bit line BL[0]] at $V_{BL0}$=0 V, activated by word line WL[0].

Referring to CELLy000, the sum of the n initialization currents $I_{INIT}$ flows to ground (zero volts) through array bit line driver 4105 that electrically connects array bit line BL[0] to ground (zero volts). Referring to CELLy101, the sum of the n initialization currents $I_{INIT}$ flows to ground (zero volts) through array bit line driver 4105 that electrically connects array bit line BL[0] to ground (zero volts). The sum of the n initialization currents $I_{INIT}$ for each additional selected multi-switch storage cell along array bit line BL[0] also flows through array bit line driver 4105 that electrically connects array bit line BL[0] to ground (zero volts). The sum of the n initialization currents $I_{INIT}$ for other selected multi-switch storage cells not shown.

Referring now to 3D MSSC memory multi-select line drive RESET operation 4292 and 3D MSSC memory multi-select line drive INITIALIZATION operation 4294 illustrated in FIGS. 42G and 42H, respectively, added FET3 and FET4 enable the multi-select line functions. However, FET3 and FET4 are an addition to all the functions described further above. FIGS. 42G and 42H show only a portion of the circuit functions for simplicity. However, it should be understood, that FIGS. 42G and 42H include SL READ driver 4125, SL RESET driver 4130, SL WRITE driver 4135, SL INITIALIZATION driver 4140, FET1, FET2, and that FET3 and FET4 were added to perform all the functions described further above with respect to FIGS. 41A, 41B, 42A-42F plus the multi-select line RESET and INITIALIZATION functions also described further above.

Referring now to 3D MSSC arrays with multi-switch storage cells, initialization at the wafer level may simplify initialization by eliminating the additional circuits and test methods described further above. One method would be to irradiate each wafer with radiation corresponding in energy and frequency and capture cross section requirements of CNTs in contact. This radiation would supply the energy to overcome van der Waals forces holding CNTs in contact. The NV CNT switches would transition to an as-fabricated high resistance RESET state, such as first RESET state illustrated in prior art FIG. 37.

Another wafer level initialization method may be to flood wafers with electrons at one or more steps of the process. In this case, voltage differences between CNTs would produce an attractive force forming CNT-to-CNT contacts such that the as-fabricated NV CNT switches would be in a low resistance first SET state.

An operation to READ the combined parallel resistance state of all resistive change elements in a multi-switch storage cell is described further below.

Measuring the Resistance State of a Resistive Change Element in a Multi-Switch Storage Cell Array As described further above, initialization of some as-fabricated nonvolatile carbon nanotube switches may be needed with respect to NV CNT switch initialization scan 3700 illustrated in FIG. 37. Hence, initialization capability is included in 3D MSSC memory chip designs as described further above. Two approaches for adding initialization capability are described with respect to FIGS. 42F and 42H, with initialization operations controlled by 3D MSSC memory on-chip controller 4045 as part of 3D MSSC memory chip architecture 4000 illustrated in FIG. 40. Referring now to FIG. 42F, 3D MSSC memory select line drive INITIALIZATION operation 4290 shows a first initialization operation that initializes one resistive change element, switch SWy0,k in this example, in a multi-switch storage cell, multi-switch storage CELLy000 in this example. Referring now to FIG. 42H, 3D MSSC memory multi-select line drive INITIALIZATION operation 4294 simultaneously initializes all resistive change elements in a multi-switch storage cell and simultaneously initializes multiple multi-switch storage cells in a 3D MSSC array. The operation illustrated in FIG. 42H is designed for high-through put initialization in a fabricator environment as described further above.

3D MSSC memory chip diagnostic capability is needed to measure the resistance value of individual resistive change elements. Diagnostic capability may be used to verify that initialization operations result in the desired resistance values for chip operation. For example, 3D MSSC arrays described further above have a resistive change element resistance exclusion zone between SET low resistance $R_{LO}$<=100 kΩ values and RESET high resistance $R_{HI}$>=2 MΩ. Resistance values in the resistance exclusion zone may require adjustment of INITIALIZATION operation parameters.

Diagnostic capability may be used to assist in failure analysis of a failed bit location by measuring the resistive change element resistance in that location. For example, resistance values in the resistance exclusion zone may indicate resistance change (or drift) over time during product operation. Resistance values substantially less than 100 kΩ may result in non-recoverable low resistance values and resistance values substantially higher than 2 MΩ may result in non-recoverable high resistance values.

Figure 43A:
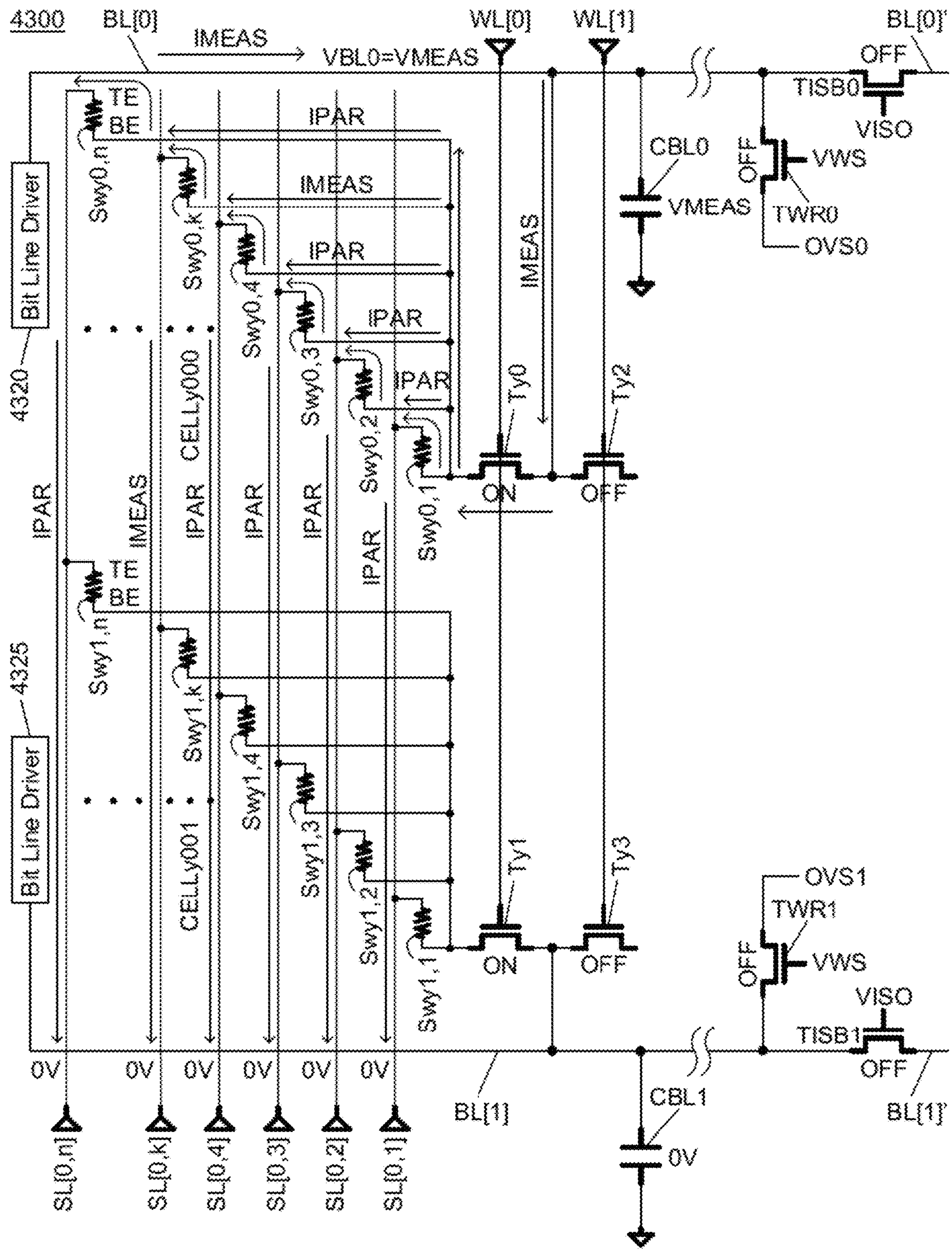
FIG. 43A illustrates a first part of a schematic of a 3D MSSC memory resistance measurement of a resistive change element (RCE) in a MSSC memory array.
Figure 43B:
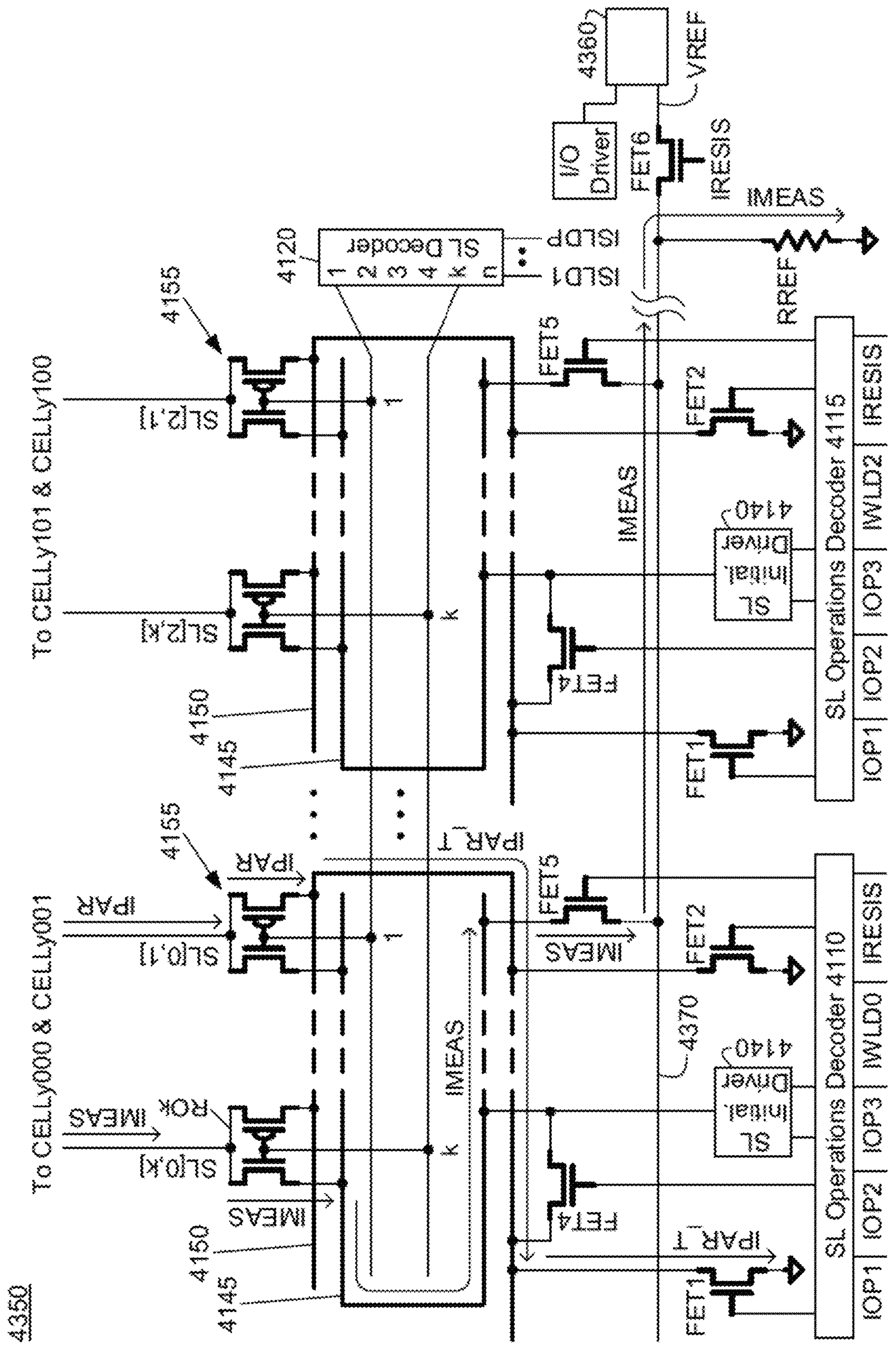
FIG. 43B illustrates a second part of a schematic of a 3D MSSC memory resistance measurement of a resistive change element (RCE) in a MSSC memory array.

Referring now to resistance measurement of a resistive change element (RCE) in a multi-switch storage cell (MSSC) memory array 4300 illustrated in FIG. 43A and resistance measurement of a RCE in a MSSC memory array 4350 illustrated in FIG. 43B, FIG. 43B shows the addition of FET5 to enable the measurement of a RCE resistance value. However, FIG. 43B is an addition to all the functions described further above. FIG. 43B shows only a portion of the circuit functions for simplicity. However, it should be understood, that FIG. 43B includes SL READ driver 4125, SL RESET driver 4130, SL WRITE driver 4135, SL INITIALIZATION driver 4140, FET1, FET2, FET3, FET4 and FET5 and is able to perform all the functions described further above with respect to FIGS. 41A, 41B, 42A-42H plus the RCE resistance measurement function described further below. As described further above, a 3D MSSC array includes multi-switch storage cells (MSSC), each with n RCEs, located at the intersection of each word line and bit line, having n select lines approximately parallel to word lines and bit lines approximately orthogonal to word lines and select lines.

Referring now to FIG. 43A, MSSC CELLy000, CELLy001, and other MSSCs (not shown) along word line WL0, all MSSCs along word line WL0 are in electrical communication with a corresponding bit line through a cell select FET in an ON conductive state. For example, MSSC CELLy000 in electrical communication with bit line BL[0] through cell select FET Ty0 in an ON state and MSSC CELLy001 in electrical communication with bit line BL[1] through cell select FET Ty1 in an ON state. Bit line BL[0] is in electrical communication bit line driver 4320 and bit line BL[1] is in electrical communication with bit line driver 4325. Bit line driver 4320 is similar to bit line driver 4105 described further above with respect to FIG. 41A and bit line driver 4325 is the same as bit line driver 4320. Referring to FIG. 43A, each bit line, such as bit lines BL[0] and BL[1], is disconnected from SA/Latches and voltage shifter/drivers. Referring to 3D MSSC memory open architecture 2600 illustrated in FIG. 26A, bit line BL[0] is disconnected from array bit line segment BL[0]' and SA/Latch 635-0 by isolation device $T_{ISB0}$ in an OFF state, and also disconnected from voltage shifter/driver 2630-0 by WRITE select device $T_{WR0}$ in an OFF state. Bit line BL[1] is disconnected from array bit line segment BL[1]' and SA/Latch 635-1 by isolation device $T_{ISB1}$ in an OFF state, and also disconnected from voltage shifter/driver 2630-1 by WRITE select device $T_{WR1}$ in an OFF state. As described further above, SL decoder 4120 decoder output line k applies a positive voltage to the gates of nFET and pFET devices forming select line router circuit ROk of the group of n select line router circuits 4155, which turns the nFET device ON and the pFET device OFF. SL decoder 4120 *n*−1 decoder output lines 1-to-(k−1), (k+1)-to-n apply zero volts to corresponding gates of nFET and pFET devices forming n−1 select line router circuits of the group of n select line router circuits 4155, which turn the nFET devices OFF and the pFET devices ON.

Referring now to MSSC CELLy000, corresponding bit line driver 4320 is in an ON state and electrically connects array bit line BL[0] to $V_{MEAS}$ and the bottom electrodes BE of all n RCEs in MSSC CELLy000 to $V_{MEAS}$. The top electrode TE of selected RCE SWy0,k is in electrical communication with select line SL[0,k], which is at a near zero voltage because current $I_{MEAS}$ flows through the nFET device of select line router circuit ROk to MSSC bus 4145 and FETS and through $R_{REF}$ to ground, where $I_{MEAS} \times R_{REF} << V_{MEAS}$ because $R_{REF} << R_{SWy0,k}$ as illustrated in FIG. 43B. The bottom electrodes BE of the n−1 unselected RCEs in MSSC CELLy000, RCE SWy0,3 in electrical communication with representative select line SL[0,3] for example, are at $V_{MEAS}$ and the corresponding top electrodes TE are at zero volts since select lines SL[0,1]-to-SL[0,k−1], SL[0,k+1]-to-SL[0,n] are in electrical communication with MSSC bus 4150 through corresponding pFET devices of the n−1 select line router circuits of the group of n select line router circuits and the MSSC bus 4150 is in electrical communication with ground (zero volts) through FET1. All unselected RCEs conduct a parasitic current $I_{PAR}$ as illustrated by exemplary RCE SWy0,3. The value of Iran for each RCE is a function of the resistance state of the RCE, low resistance $R_{LO}$=100 kΩ or high resistance $R_{HI}$=2 MΩ.

Referring now to MSSC CELLy001, cell select FET Ty1 is in an ON state electrically connecting bit line BL[1] to the bottom electrodes BE of the n RCEs in MSSCELLy001. Bit line driver 4325 is in tristate. The top electrode TE of selected RCE SWy1,k is in electrical communication with select line SL[0,k] which is at near zero volts. The top electrodes of unselected n−1 RCEs in MSSC CELLy001 are in electrical communication with select lines SL[0,1]-to-SL[0,k−1], SL[0,k+1]-to-SL[0,n] which are at zero volts. The bit line BL[1] voltage is determined by the voltages applied to the n top electrodes TE of the RCEs in electrical communication with the n select lines SL[0,1]-to-SL[0,n], which are at or near zero volts. Therefore, corresponding bottom electrodes BE are at or near zero volts and bit line BL[1] is also at or near zero volts.

Other MSSCs along word line WL[0] corresponding to MSSC CELLy001 also have bottom electrodes of n RCEs in electrical communication with bit lines, such as bit line BL[2], bit line BL[3], and so forth, with corresponding bit line drivers in tristate. Other MSSCs along word line WL[0] corresponding to MSSC CELLy001 have n RCEs with top electrodes at or near zero volts and bottom electrodes in electrical communication with a corresponding bit line, such as bit line BL[2], bit line BL[3], and so forth, also at or near zero volts. Hence, the $I_{MEAS}$ current flowing through RCE SWy0,k and the parasitic currents $I_{PAR}$ corresponding to MSSC CELLy000 are the only currents flowing in all the cells in electrical communication with selected word line WL[0]. $I_{MEAS}$ is routed to a current measuring circuit by FET5 and the sum of all parasitic currents $I_{PAR}$ T are routed to ground by FET1 as illustrated in FIG. 43B.

The bit line BL[0] voltage $V_{MEAS}$ is applied to the drain of cell select FET Ty0 in an ON conducting state activated by word line WL[0] and bit line voltage $V_{MEAS}$ is applied to the bottom electrodes BE of MSSC CELLy000 as described further above. The drains of all other cell select FETs along activated word line WL[0], such as cell select FET Ty1 in electrical communication with bit line BL[1], are in electrical communication with bit lines with voltages at or near zero volts as explained further above. All cell select FETs in electrical communication with un-activated word lines WL[1], WL[2], and so forth are in an OFF state and all corresponding MSSCs are disconnected from corresponding bit lines BL[0], BL[1], BL[2], and so forth.

Referring to FIGS. 43A, 43B, and 41A, the FET5 device was added to the select line drivers and FETs in electrical communication with SL operations decoder 4110, SL operations decoder 4115, and all other SL operations decoders (not shown) along the bit line direction. A resistance measurement input control $I_{RESIS}$ from 3D MSSC memory on-chip controller 4045 illustrated in FIG. 40 was also added to enable routing measurement current $I_{MEAS}$, corresponding to the resistance value of RCE SWy0,k in this example, to measurement bus 4370 and through reference resistor $R_{REF}$ to ground. However, only SL operations decoder 4110 activates FET5 device because both the resistance measurement input control $I_{RESIS}$ and word line decoder input $I_{WLD0}$ are activated. Referring to SL operations decoder 4115, the FET5 device remains in an OFF state because while resistance measurement input $I_{RESIS}$ is activated, word line decoder input $I_{WLD2}$ is not activated. Since only word line WL[0] is activated, word line decoder input $I_{WLD2}$ and all other word line decoders along the bit line direction (not shown) are not activated and all corresponding FET5 devices remain in an OFF state. Also, since only word line WL[0] is activated, all cell select FETs in electrical communication with other word lines along the bit line direction are in an OFF state because corresponding word line WL[2] and all other word lines along the bit line direction are not activated, and therefore no currents flow in any of the corresponding multi-switch storage cells.

The FET6 device switches to an ON state and applies $V_{REF}$ to pad 4360. In this example, pad 4360 is shared with an I/O driver, which is in tristate during this operation. However, if a dedicated (unshared) pad is used, then FET6 is not needed. Measurement current $I_{MEAS}=V_{REF}/R_{REF}$. Referring now to FIG. 43A, bit line driver 4320 applies a pre-determined measurement voltage $V_{MEAS}$ to bit line BL[0], chosen as $V_{MEAS}$=0.5 V not to disturb the resistance state of resistive change elements having a $V_{SET}$ range of 1-1.5 V and a $V_{RESET}$ range of 2-2.5 V. Since both measurement voltage $V_{MEAS}$ and measurement current $I_{MEAS}$ are known, the resistance value of RCE SWy0,k is $R_{RES}=V_{MEAS}/I_{MEAS}$.

By way of example, assuming a 3D MSSC subarray having 256 word lines WL[0] to WL[255], 16 bit lines BL[0] to BL[15], there are 4096 multi-switch storage cells in the subarray, one at each word line-bit line intersection. Assuming n=16 resistive change elements per multi-switch storage cell, there are 65,536 resistive change elements in this subarray example. Referring now to the resistive change element resistance value measurement operation described with respect to resistance measurement of a RCE in a MSSC memory array 4300 and 4350 illustrated in FIGS. 43A and 43B, respectively, this resistance value measurement operation applied to this 3D MSSC subarray example measures the resistance of 1 resistive change element in a 3D MSSC sub-array with 65,536 resistive change elements.

In this example, the resistance value of RCE SWy0,k in MSSC CELLy000 is measured by applying $V_{MEAS}$=0.5 V to bit line BL[0] as described further above. The 3D MSSC memory is in electrical communication with a tester that applies waveforms-to and reads waveforms-from the 3D MSSC memory to chip pads at the wafer level and/or terminals of a packaged chip. If RCE resistance value is $R_{LO}$=100 kΩ, then current $I_{MEAS}$=0.5/100 kΩ=5 uA flows through reference resistor $R_{REF}$=10 kΩ as described further above. The voltage $V_{REF}$ applied to pad 4360 illustrated in FIG. 43B equals 5 uA×10 kΩ=50 mV. The diagnostic program uses the 50 mV to calculate an $I_{MEAS}$ current of 5 uA, and since the measurement voltage $V_{MEAS}$=0.5 V, the diagnostic program calculates (0.5 V)/(5 uA) and records an RCE SWy0,k resistance value of 100 kΩ. Similarly, if $V_{REF}$=2.5 mV, then the diagnostic program calculates a measurement current of 0.25 uA. Since the measurement voltage is $V_{MEAS}$=0.5 V, the diagnostic program records a RCE resistance value of (0.5V)/(0.25 uA)=2 MΩ. Each of these two resistance values are outside the resistance exclusion zone described above. If, however, if $V_{REF}$=10 mV, then $I_{MEAS}$=1 uA and the RCE resistance value is (0.5 V)/(1 uA)=500 kΩ, which places the RCE resistance within the exclusion zone.

As described further above, the 3D MSSC array architecture with select lines SL parallel to word lines WL and bit lines BL orthogonal to word lines WL and select lines SL is configured and functionally operated in such a way that no current flows between multiple CNT switch cells, which enables cell-level data processing. For example, if all n select lines in electrical communication with top electrodes TE of resistive change elements of multi-switch storage cells are in electrical communication with zero volts, then all resistive change elements in each multi-switch storage cell are electrically connected in parallel and have a total resistance value $R_T$ given by EQ. 18 of:

$$1/R_T=1/R_1+1/R_2 1/R_3+1/R_4 . . . +1/R_K . . . +1/Rn$$

Such cell-level data processing may be of value for in-memory computing (also referred to as computing in-memory) applications described further below.

Figure 43C:
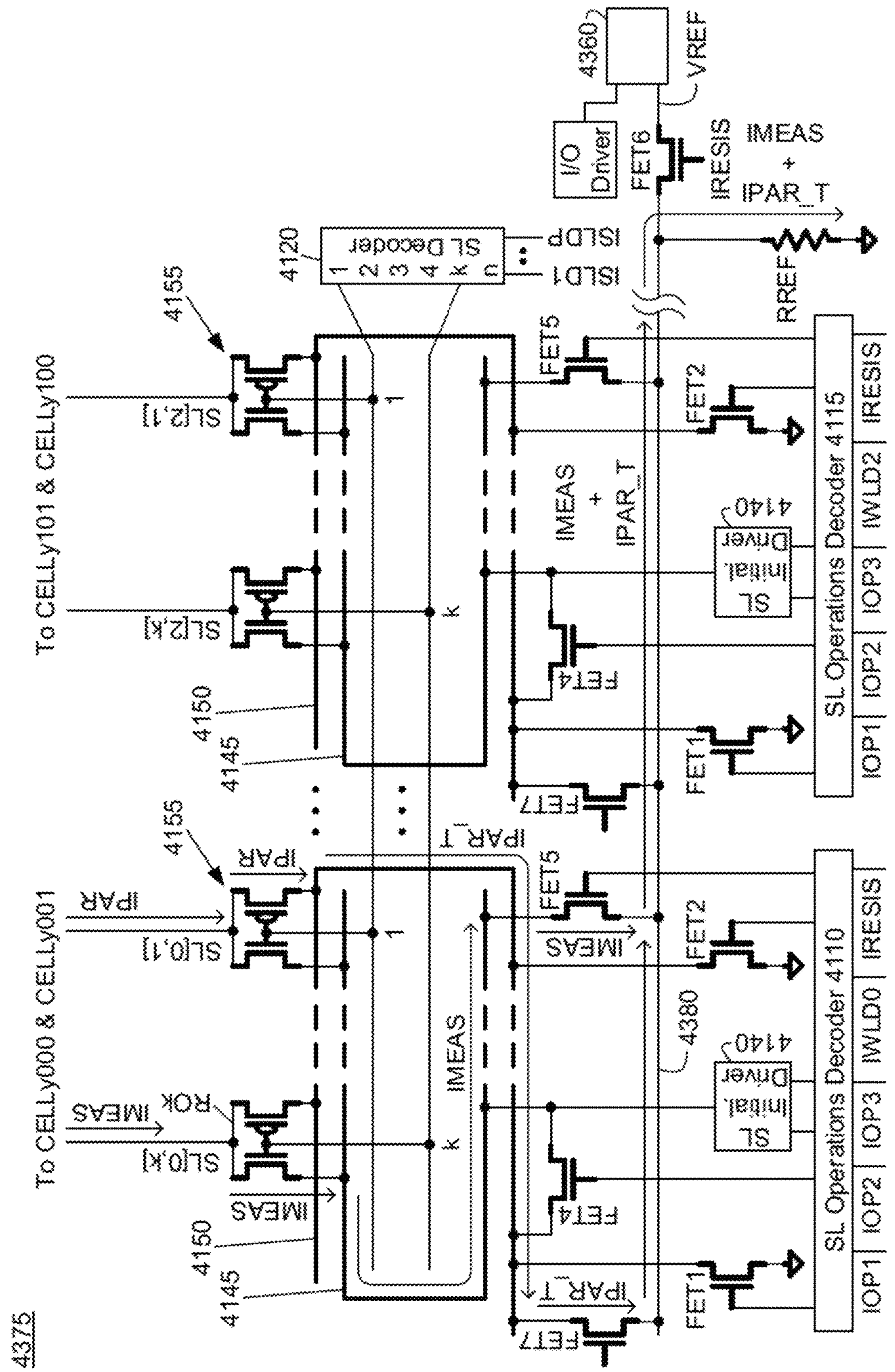
FIG. 43C illustrates a 3D MSSC memory resistance measurement of a multi-switch storage cell (MSSC) with all resistive change elements electrically connected in parallel.

Referring now to resistance measurement of a resistive change element (RCE) in a multi-switch storage cell (MSSC) memory array 4300 illustrated in FIG. 43A and parallel resistance measurement of all RCEs in a MSSC memory array 4375 illustrated in FIG. 43C, FIG. 43C shows the addition of FET7 to enable the measurement of the resistance value of all RCEs in parallel. In this example, the resistance value of all RCEs in MSSC CELLy000 in parallel. FIG. 43C is an addition to all the functions described further above. FIG. 43C shows only a portion of the circuit functions for simplicity. However, it should be understood, that FIG. 43C includes SL READ driver 4125, SL RESET driver 4130, SL WRITE driver 4135, SL INITIALIZATION driver 4140, FET1, FET2, FET3, FET4, FET5, FETE, and FET7 and is able to perform all the functions described further above with respect to FIGS. 41A, 41B, 42A-42H, 43A, 43B, plus the MSSC parallel resistance value of all RCEs in parallel described further below. As described further above, a 3D MSSC array includes multi-switch storage cells (MSSC), each with n RCEs, located at the intersection of each word line and bit line, having n select lines approximately parallel to word lines and bit lines approximately orthogonal to word lines and select lines.

Referring now to parallel resistance measurement of all RCEs in MSSC memory array 4375 illustrated in FIG. 43C, FIG. 43C is essentially the same as FIG. 43B plus the addition of FET7. In operation, when FET7 is in an ON state and FET1 is in an OFF state, then the sum of all parasitic currents $I_{PAR\_T}$ is in electrical communication with measurement bus 4380, which corresponds to measurement bus 4370 plus the electrical connection of a terminal of FET7. Therefore, measurement bus 4380 carries the measurement current $I_{MEAS}$ plus the total parasitic current $I_{PAR\_T}$, in this example the total current through MSSC CELLy000. Since measurement voltage $V_{MEAS}$ is applied to the bottom electrode of all RCEs in MSSC CELLy000, then $I_{MEAS}+I_{PAR\_T}$ is equal to the total current flowing through multi-switch storage cell CELLy000.

In this example, the parallel resistance value $R_{MSSC}$ of all RCEs in parallel of MSSC CELLy000 is measured by applying $V_{MEAS}$=0.5 V to bit line BL[0] as described further above. The 3D MSSC memory is in electrical communication with a tester that applies waveforms-to and reads waveforms-from the 3D MSSC memory to chip pads at the wafer level and/or terminals of a packed chip. Or, alternatively, to a logic chip. If MSSCELLy000 has n=16 RCEs, the maximum and minimum values of the parallel resistance $R_{MSSC}$ with $R_{LO}$=100 kΩ and $R_{HI}$=2 MΩ, then the minimum resistance $R_{MSSC-MIN}$=100 kS2/16=6.25 kΩ and the maximum resistance $R_{MSSC-MAX}$=6 MS/16=125 kΩ. The maximum MSSC total current $I_{TOT-MAX}$=0.5/6.25 kΩ=80 uA and the minimum MSSC total current $I_{TOT-MIN}$=0.5/125 kΩ=4 uA. The voltage $V_{REF}$ at pad 4360 ranges between a maximum $V_{REF-MAX}$=80 uA×10 kΩ=800 mV and a minimum $V_{REF-MIN}$=4 uA×10 kΩ=40 mV.

The maximum and minimum values of the parallel resistance of the MSSC CELLy000 can be calculated from the measured maximum and minimum $V_{REF}$ voltage applied to pad 4360. $V_{REF-MAX}$=800 mV corresponds to 80 uA through reference resistor $R_{REF}$=10 kΩ, and since $V_{MEAS}$=0.5 V is applied across all 16 parallel RCEs, then $R_{MSSC-MIN}=V_{MEAS}$ $I_{TOT-MAX}$=0.5 V/uA, $R_{MSSC-MIN}$=6.25 kΩ. $V_{REF}$-MIN=40 mV corresponds to 4 uA through reference resistor $R_{REF}$=10 kΩ, and since $V_{MEAS}$=0.5 V is applied across all 16 parallel RCEs, then $R_{MSSC-MAX}=V_{MEAS}$ $I_{TOT-MIN}$=0.5 V/4 uA, $R_{MSSC-MAX}$=125 kΩ.

If each of the resistance values of the RCEs correspond to a weighting factor of a neural network, the $R_{MSSC}$ corresponds to the parallel combination of all weighting factors. The resistance value of $R_{MSSC}$ weighting factor will be within the range of 6.25 kΩ and 125 kΩ.

Cell-Level Redundancy in a Multi-Switch Storage Cell

Multi-switch storage cell examples illustrated further above may have as many as 4, 8, 16, 32, 64 or more resistive change elements in each single multi-switch storage cell. However, one or more resistive change elements may be added to the multi-switch storage cells for use in redundancy operations. For example, a 16 resistive change element cell may have one or two additional resistive change elements for use in redundancy operations. Each additional redundant resistive change element has a top electrode TE in electrical communication with an additional select line, the redundant select line, and a bottom electrode BE in electrical communication with the bottom electrodes of all other resistive change elements, which are also all in electrical communication with the source of the cell select FET. As described further below with respect to FIG. 44, the select line in electrical communication with the top electrode of TE of the defective RCE is deactivated. The resistance value of the defective RCE may have any resistance value from zero Ohms to giga Ohms without interfering with the operation of the corresponding MSSC. This is because the defective RCE cannot conduct current and is electrically isolated from the multi-switch storage cell RCEs, and the redundant RCE replaces the defective RCE. Hence, the number of electrically active RCEs in the corresponding MSSC remains n.

Performing the initialization operation described further above on the defective resistive change element in the multi-switch storage cell may restore resistive change element operation. However, if this is not successful, then the defective RCE is replaced with a redundant RCE as described further below with respect to FIG. 44.

Replacing Failed Resistive Change Elements in a Multi-Switch Storage Cell with Redundant Resistive Change Elements Adding one redundant bit (RCE) to each multi-switch storage cell enables one repair operation, two redundant bits to each multi-switch storage cell enables two repair operations, and so forth. Assuming an error has been detected at a memory address, diagnostic methods described further above may be applied. Unlike DRAMs, 3D MSSC memories resistive change elements have low sensitivity to alpha particles and other radiation that may result in soft errors. Therefore, most errors may be hard-fails. Referring to resistance measurement of a RCE in a MSSC memory array 4300 illustrated in FIGS. 43A and 43B, the resistance of the failed resistive change element can be measured as described further above.

Repair of the defective resistive change element with 3D MSSC memory select line drive INITIALIZATION operation 4290 illustrated in FIG. 42F may be used to restore the resistive change element operation. If the resistive change element cannot be repaired, then substitution with a redundant resistive change element may be used. As described further above, the defective RCE resistance may have any resistance value because it is electrically isolated from the corresponding multi-switch storage cell. Because resistive change elements in several multi-switch storage cells have a common select line as described further above, a redundant select line is used which replaces all resistive change elements sharing the common select line.

Replacement of defective word lines and defective bit lines with redundant word and bit lines using latch circuits is well known in the semiconductor industry and described in K. Itoh, *VLSI Memory Chip Design* pp. 178-192 (Springer Publisher 2001), pp. 178-192 of which are hereby incorporated by reference. A similar approach may be used to replace a word line with a redundant word line and a bit line with a redundant bit line. However, 3D MSSC memories use a select line drive matrix, not a dedicated driver for each select line, and therefore 3D MSSC memory select line redundancy differs from those well known in the semiconductor industry.

Figures 1, 44:
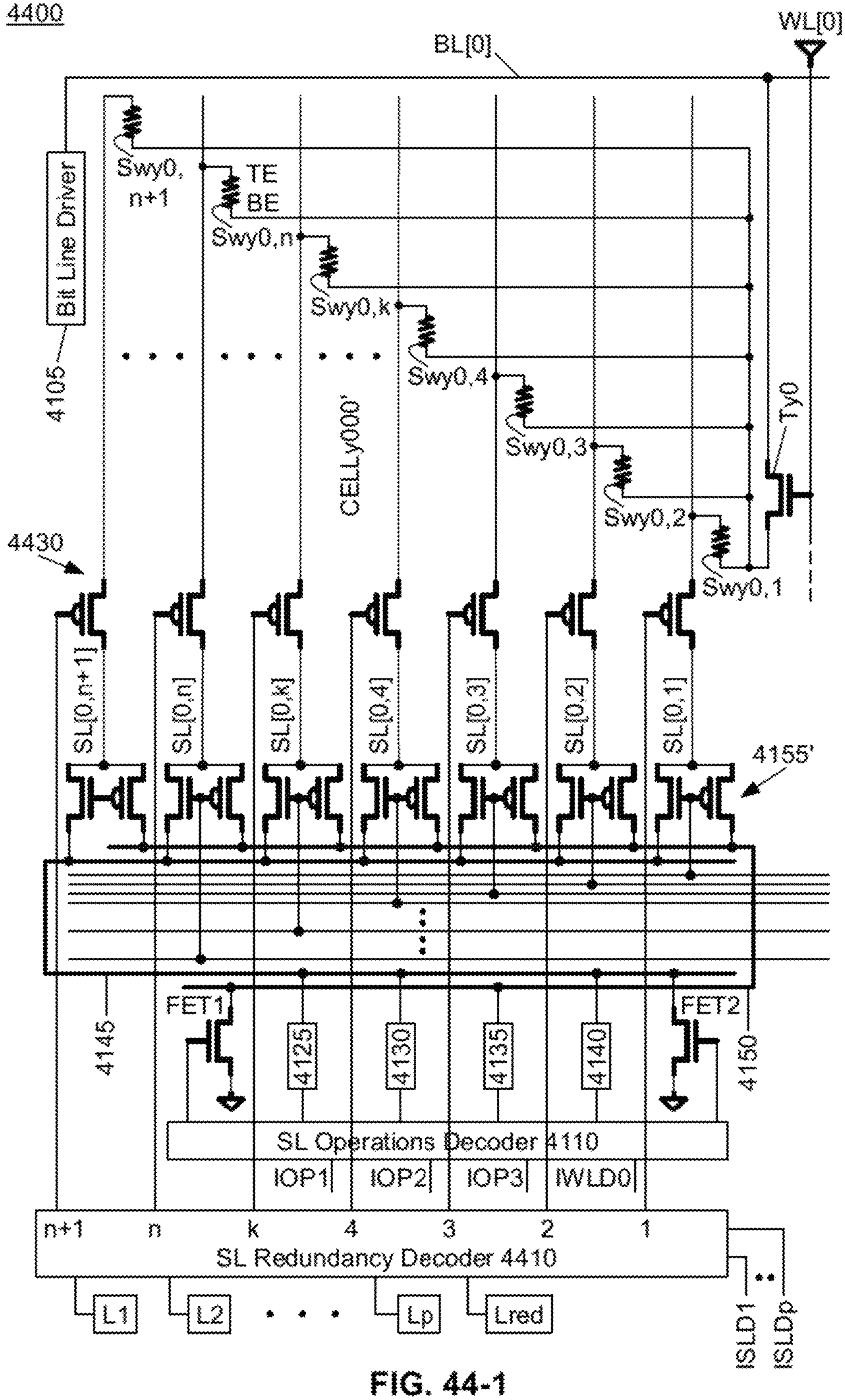
Figures 2, 44:
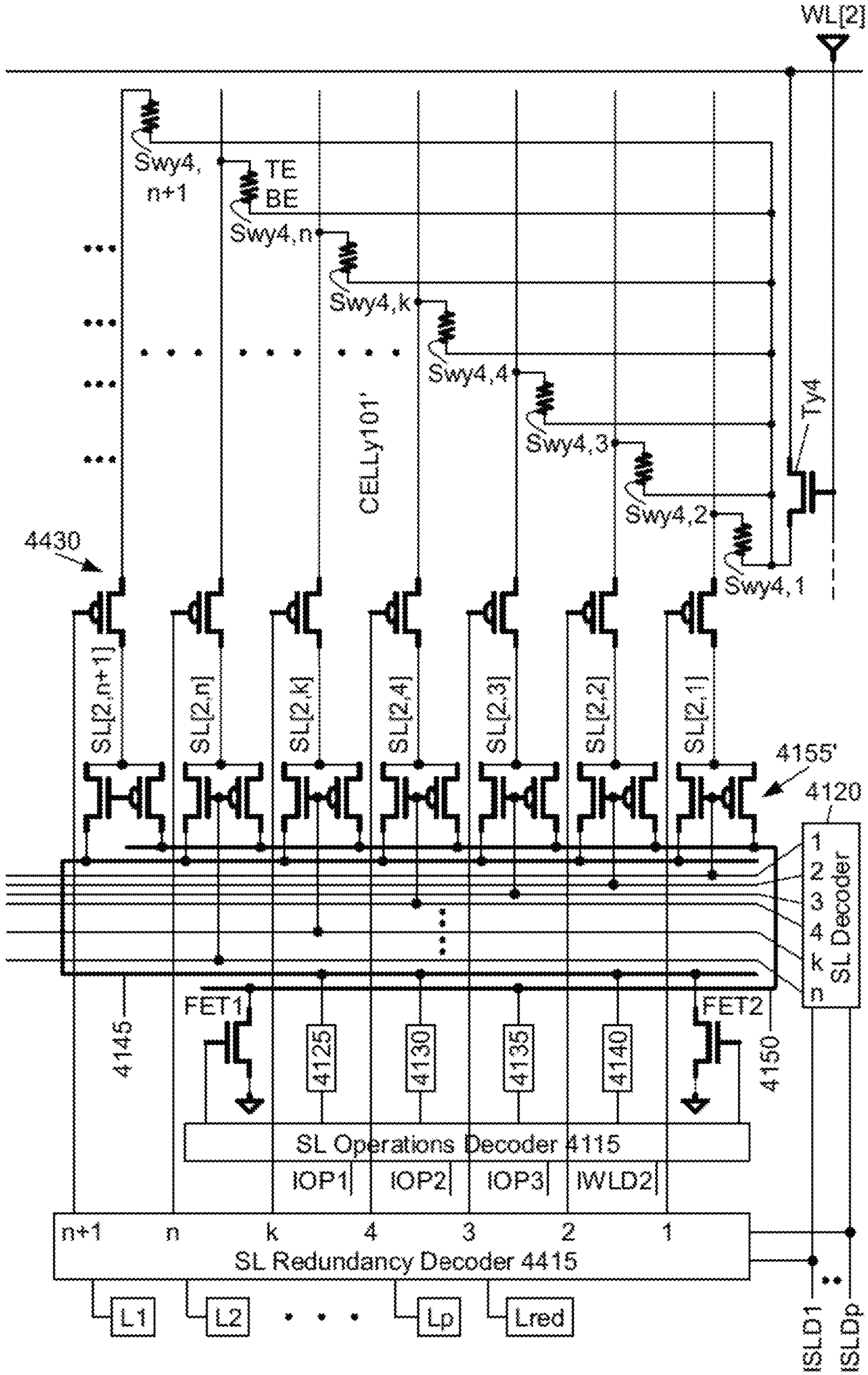

Referring now to FIGS. 44-1 and 44-2, 3D MSSC array select line drive matrix with redundancy 4400 shows an architecture and circuits added to 3D MSSC array select line drive matrix 4100 illustrated in FIG. 41A to enable the 3D MSSC memory redundancy illustrated in FIGS. 44-1 and 44-2.

Referring now to FIGS. 44-1 and 44-2 and FIG. 41A, the 3D MSSC select line drive matrix was redrawn to enable the addition of the select line redundancy circuits. Also, a redundant RCE SWy0,n+1 was added to CELLy000 to form CELLy000' and a redundant RCE SWy4,n+1 was added to CELLy101 to form CELLy101'. SL redundancy decoder 4410, corresponding to CELLy000', was added to enable activation of redundant RCE SWy0,n+1 and deactivation of any one of the n RCEs SWy0,1-SWy0,n. SL redundancy decoder 4415, corresponding to CELLy101', was added to enable activation of redundant RCE SWy4,n+1 and deactivation of any one of the n RCEs SWy4,1-SWy4,n. The operation of SL redundancy decoder 4410 and SL redundancy decoder 4415, corresponding to CELLy000' and CELLy101', respectively, and any other SL redundancy decoders along the bit line direction are the same. Redundancy enable FET devices 4430 each have a gate terminal voltage controlled by a select line redundancy decoder output, which determines which select line is replaced if redundancy is required. Each of the redundancy enable FET devices 4430 has a first terminal in electrical communication with an output of a select line router circuit of a group of n+1 select line router circuits 4155' and a second terminal in electrical communication with a top electrode TE of a corresponding RCE. The group of n+1 select line router circuits 4155' is essentially the same in operation as the group of n select line router circuits 4155, except that the group of n+1 select line router circuits 4155' has an additional select line router circuit corresponding to redundancy select line SL[0,n+1]. Hence, the group of n select line router circuits 4155 has n select line router circuits and the group of n+1 select line router circuits 4155' has n+1 select line router circuits. Each redundancy enable FET device may be in an ON state or in an OFF state.

Referring now to FIGS. 44-1 and 44-2, SL redundancy decoder 4410 inputs include select line redundancy latches L1, L2, . . . , Lp and $L_{RED}$. The latch $L_{RED}$ state either prevents or enables a redundancy operation. The latches L1, L2, Lp states are set by inputs from 3D MSSC memory on-chip controller 4045 illustrated in FIG. 40, which determine which select line will be deactivated and replaced with a redundancy select line. SL redundancy decoder 4410 inputs also include the same control inputs Tam to $I_{SLDp}$ to SL decoder 4120. Therefore, 3D MSSC memory on-chip controller 4045 inputs provides control signals to both SL decoder 4120 and SL redundancy decoder 4410. If inputs $I_{SLD1}$ to $I_{SLDP}$ correspond to the states of latches L1 to Lp, then the corresponding select line will be deactivated and the redundant line activated. As described further above, SL decoder 4120 is a 1 of n decoder, and if there are 4 inputs then there are 16 decoder output lines for example. Therefore, one of the decoder output lines of SL decoder 4120 will always be activated. However, if no redundancy is required based on the state of latch $L_{RED}$, then n of the n+1 SL redundancy decoder 4410 outputs are set to zero volts and the n+1 output is set to a positive voltage, therefore activating all p-type FETs in redundancy enable FET devices 4430, except the p-type FET corresponding to select line SL[0,n+1] corresponding to RCE SWy0,n+1, which is turned off by the positive voltage output. The RCE SWy0,n+1 bottom electrode BE is in electrical communication with the bottom electrodes of the other n RCEs and has the same bottom electrode BE voltage. The select line SL[0,n+1] in electrical communication with the corresponding top electrode TE is deactivated and no current flows through RCE SWy0,n+1.

If, however, a select line is to be replaced based on the state of latch $L_{RED}$, then the select line to be replaced is deactivated and the redundant select line is activated. 3D MSSC memory on-chip controller 4045 illustrated in FIG. 40 switches the state of latch $L_{RED}$ to the redundancy enabling state. For example, when SL decoder 4120 is a 1 of 16 decoder and there are 4 inputs and 16 decoder output lines, the states of latches L1, L2, L3, and L4 contain the defective select line address, which is typically programmed into the one-time programmable latches during wafer test, or fuses or anti-fuses that are programmed using well known industry methods. Latch $L_{RED}$ is also programmed to enable select line redundancy decoder 4410, in this example, to compare select line addresses provided by 3D MSSC memory on-chip controller 4045 illustrated in FIG. 40 with the defective select line address in latches L1, L2, L3, and L4. If there is no match, then the corresponding select line is activated. However, if there is a match, then the select redundancy enable FET device corresponding to the matching address will be turned OFF deactivating the corresponding select line. Select line redundancy decoder 4410 activates select line SL[0,n+1] in electrical communication with the top electrode of a redundant RCE, which stores the information.

Referring now to latches L1 to Lp and $L_{RED}$, a nonvolatile carbon nanotube switch may be integrated into each latch as described further below enabling 3D MSSC memory on-chip controller 4045 to program each of the corresponding CNT switches in the field if errors are detected. Built-in select test (BIST) may be included, in communication with 3D MSSC memory on-chip controller 4045 illustrated in FIG. 40, to simplify testing prior to product ship. BIST inclusion in DRAMs is described in K. Itoh, *VLSI Memory Chip Design* pp. 192-194 (Springer Publisher 2001), pp. 192-194 of which are hereby incorporated by reference. Similar BIST functions may be used in 3D MSSC memory design. Also, bypassing defective RCEs and replacing with working RCEs may be carried out in the field when an error is detected. A resistive change element may be used in latches as described further above and described further below with respect to FIG. 45.

It is desirable to enable the replacement of word, bit, and select lines that become defective during product operation in the field, enabling the 3D MSSC memory to continue operating without interruption. Therefore, it is desirable to use non-volatile latch circuits with programmable resistive change elements described with respect to FIG. 45 that enable the reconfiguration of the memory while operating in systems in the field.

The 3D MSSC memory design may include the ability to repair detected data errors as described further above. These data errors may be detected with an on-chip Hamming Error Correction Code (ECC) circuit or by off-chip ECC in a logic interface chip. An on-chip ECC circuit is described in H. L. Kalter, *A* 50 *ns DRAM with a* 10-*ns data rate and on-chip ECC*, IEEE Journal of Solid-State Circuits, Volume 25, Issue 5, pp. 1118-1128 (October 1990), pp. 1118-1128 of which are hereby incorporated by reference. A similar ECC approach may be included in 1T, 1R cell memory and 3D MSSC memory designs. Referring now to 3D MSSC memory open architecture schematic 2600 illustrated in FIG. 26A, for ECC detection, 6 additional bits are required for a 16-bit word resulting in a 22-bit word and 8 additional bits are required for a 64-bit word resulting in a 72 bit word. The additional data bits enable double error detection and single error correction.

Figure 45:
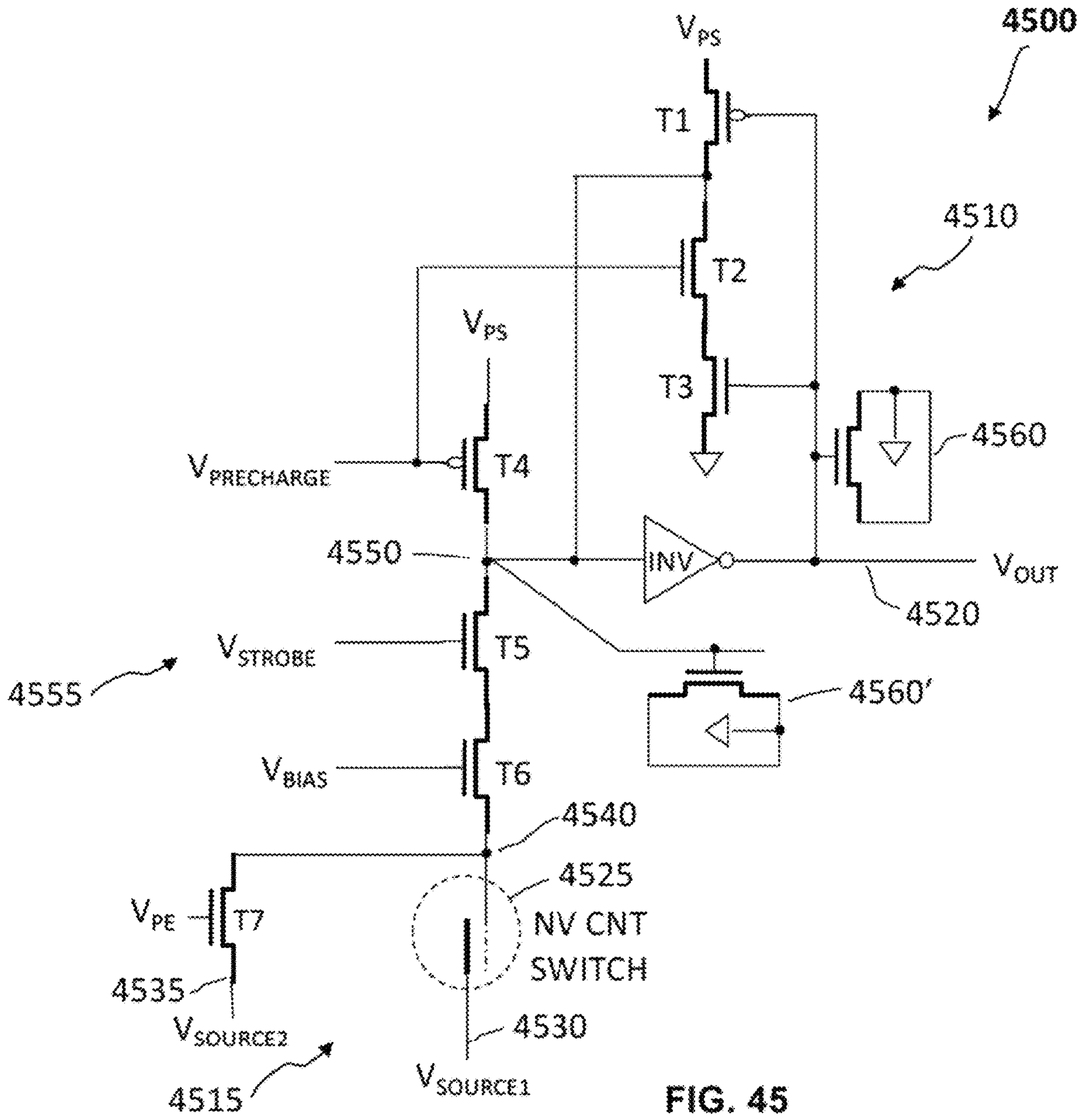
FIG. 45 illustrates a prior art programmable latch circuit with a resistive change element whose programmed resistance value enables or disables the selection of a redundant resistive change element.

Prior art FIG. 45 illustrates a non-volatile carbon nanotube-based latch circuit 4500, which is described in detail in U.S. Pat. No. 8,008,745 issued to Bertin et al. Latch circuit 4500 includes latch subset 4510, which includes inverter INV and an inverter with feedback enable means having pFET T1 with a first terminal in electrical communication with a power supply $V_{PS}$ and a second terminal electrically connected in series with nFET T2, which is electrically connected in series with nFET T3, and nFET T3 is in electrical communication with zero volts (ground). The output of inverter INV is in electrical communication with output terminal 4520, which is in electrical communication with the gates of nFET T3 and pFET T1. The second terminal of pFET T1 is in electrical communication with node 4550, which is in electrical communication with the input of inverter INV. A precharge voltage $V_{PRECHARGE}$ is in electrical communication with the gate of nFET T2.

CNT switch programming path 4515 may be used to program 2-terminal NV CNT switch 4525 to a low resistance state or a high resistance state. Program enable voltage $V_{PE}$ applied to the gate of nFET T7 turns nFET T7 ON, thereby providing a programming path to adjust NV CNT switch 4525 to a low resistance state or a high resistance state. The resistance state of NV CNT switch 4525 is the input to latch circuit 4500. NV CNT switch 4525 has a first terminal in electrical communication with terminal 4530 and a second terminal in electrical communication with node 4540. nFET T7 has a first terminal in electrical communication with terminal 4535 and a second terminal in electrical communication with node 4540.

Strobe path 4555 includes precharge pFET T4 with gate in electrical communication with gate voltage $V_{PRECHARGE}$ activation, a first terminal in electrical communication with power supply $V_{PS}$ and a second terminal in electrical communication with node 4550. Node 4550 is in electrical communication with a first terminal of nFET T5 with gate in electrical communication with strobe pulse $V_{STROBE}$ and a second terminal in electrical communication with a first terminal of nFET T6 with gate in electrical communication with voltage $V_{BIAS}$ and second terminal in electrical communication with node 4540. Optional capacitors 4560 and 4560' are in electrical communication with node 4520 and output node 4550, respectively for additional latch stability.

In operation, $V_{PE}$ turns nFET T7 ON enabling the programming of NV CNT switch 4525 to a high or low resistance state. NV CNT switch 4525 is similar in operation to resistive change elements described further above. In this example, NV CNT switch 4525 operates in a bidirectional mode. However, since this not a high-speed operation, a unidirectional NV CNT switch may be used instead. In this example, terminal 4530 is in electrical communication with $V_{SOURCE1}$, which is in electrical communication with a top electrode of NV CNT switch 4525. If $V_{SOURCE2}$ is in electrical communication with zero volts, and $V_{SOURCE1}$ applies a RESET voltage, then NV CNT switch 4525 is RESET to a high resistance state, of at least 1 MΩ for example. However, if $V_{SOURCE1}$ is in electrical communication with ground and $V_{SOURCE2}$ applies a SET voltage, then NV CNT switch 4525 is SET to a low resistance state. The resistance state of NV CNT switch 4525 may be SET and RESET multiple times. However, during a latch circuit activation, nFET T7 is in OFF state and $V_{SOURCE1}$ is at zero volts.

During a latch circuit 4500 operation, $V_{PRECHARGE}$ voltage is applied to the gate of pFET T4, which precharges node 4550 to power supply $V_{PS}$, which may be $V_{DD}$ in this example. Next, $V_{STROBE}$ is applied to the gate of nFET T5, which turns ON. $V_{BIAS}$ turns nFET T6 ON and node 4550 is discharged through nFETs T5 and T6, through NV CNT switch 4525 to terminal 4530 at zero volts.

In this example, the low resistance state of NV CNT switch 4525 is less than or equal to kΩ and nFET T6 operates in the linear range with a resistance of no more than 50 kΩ. The combined resistance of nFET T6 and NV CNT switch 4525 is no more than 100 kΩ, which is the resistive trip point of latch circuit 4500. Therefore, the NV CNT switch 4525 low resistance state results in a relatively low discharge voltage on node 4550, output voltage VOUT at terminal 4520 switches to $V_{DD}$, 1V in these examples. However, if the resistance state of NV CNT switch 4525 is at 1 MΩ or higher, node 4550 leakage is small and output voltage VOUT on terminal 4520 is zero volts.

Reducing the Risk of Driving Resistive Change Elements to Unrecoverable Low Resistance States and Unrecoverable High Resistance States Measurements on CNT switch-type of resistive change elements with excitations designed to force low storage resistance values substantially below $R_{LO}$=100 kΩ or storage resistance values substantially higher than $R_{HI}$=2 MΩ have shown that for some of these CNT switches, excitations in the typical excitation range cannot switch them out of these states. For 3D MSSC memories with multi-switch storage cells, operational methods may be used to substantially reduce the risk. These methods may also be applied to memories with single-switch storage cells.

Referring now to 3D MSSC memory open architecture schematic 2600 illustrated in FIG. 26A, multi-switch storage cell memory array schematic 2400 illustrated in FIGS. 24-1 and 24-2, and initialization and RESET circuits 800 illustrated in prior art FIG. 8, the following operations may be performed to minimize the risk of resistive change elements transitioning to non-recoverable high resistance or low resistance values. These operations are performed in such a way as to be hidden, that is, not disturbing the overall function (operation) of the 3D MSSC memory. An example of a well-known hidden operation is the hidden refresh operation used in DRAM memories.

A first preventative non-recoverable state hidden operation may be performed as follows. Resistive change elements SWy0,k in CELLy000 and SWy1,k in CELLy001 in FIGS. 24-1 and 26A may be used as illustrative examples. First data bus lines D0 and D1 in bidirectional on-chip data bus 2690 are disconnected from SA/Latches 635-0 and 635-1, respectively. Next, a READ operation as described further above is performed and corresponding SA/Latches 635-0 and 635-1, respectively, switch to corresponding logic states. For a stored low resistance state $R_{LO}$=100 kΩ corresponding to a logic “1” state, for example, SA/Latch node X1 is at $V_{DD}$ and node X2 is at zero volts, and for a stored high resistance state $R_{HI}$=2 MΩ corresponding to a logic “0” state, for example, SA/Latch node X1 is at zero volts and node X2 is at $V_{DD}$.

Next, isolating FET devices $T_{ISB0}$ and $T_{ISB1}$ are turned OFF, disconnecting array bit lines BL[0] and BL[1] of multi-switch storage cell memory array 2400 from SA/latches 635-0 and 635-1, respectively. Also, WRITE select FET devices $T_{WR0}$ and $T_{WR1}$ are turned OFF, thereby isolating array bit lines BL[0] and BL[1] from voltage shifter/driver 2630-0 and 2630-1, respectively.

Next, referring now to initialization and RESET circuits 800 illustrated in prior art FIG. 8, bit line drivers 820 and 825 in electrical communication with array bit lines BL[0] and BL[1], respectively, and select line driver 810 of select line drivers 805, may be used to apply SET and RESET pulses to array bit lines BL[0] and BL[1] without disturbing the stored resistive states in SA/Latches 635-0 and 635-1.

Referring now to multi-switch storage cell array 3100 illustrated in FIG. 31, RESET pulses of 2.75 V and even higher voltage may be applied to selected resistive change elements SWy0,k and SWy1,k as described further above with respect to FIG. 31 without disturbing the stored resistance values of unselected resistive change elements in the multi-switch storage cell. Referring now to multi-switch storage cell WRITE operation 3300 illustrated in FIG. 33 and logic “1” and logic “0” WRITE operation summary 3600 illustrated in FIG. 36, SET pulses of up to approximately 1.6 volts may be applied by bit line drivers 820 and 825 to BL[0] and BL[1], respectively, and to resistive change elements SWy0,k and SWy1,k, respectively, without disturbing the stored resistance values of unselected resistive change elements in the multi-switch storage cell.

Preventative non-recoverable state hidden operations may apply one or multiple pulses of varying amplitudes, spacings, and widths for both RESET and SET operations thereby causing select resistive change elements to switch between SET and RESET one or more times. The last operation in the sequence is a RESET operation.

Next, as described further above with respect to 3D MSSC memory open architecture WRITE operation 2640 illustrated in FIG. 26C and logic “1” and logic “0” WRITE operation summary 3600 illustrated in FIG. 36, voltage shifter/drivers 2630-0 and 2630-1 are turned ON, write select switches $T_{WR0}$ and $T_{WR1}$ are turned ON, and SA/latches 635-0 and 635-1 restore the resistive states of switches SWy0,k and SWy1,k and the preventative non-recoverable state hidden operations has been completed.

A second preventative method of minimizing the risk of resistive change elements in a multi-switch storage cell transitioning to non-recoverable high resistance or low resistance states without disturbing stored resistance values is described further below. This second preventative method may be performed using the RESET and SET operations described further above during a WRITE operation as the input data on the on-chip data bus is transferred to SA/Latches during a WRITE operation. After the WRITE address location has been identified, a RESET-before-WRITE operation may be performed on the bits corresponding to a word line in a 3D MSSC subarray, then SET and RESET operations may be performed as described further above as the input data from the on-chip data bus is transferred to corresponding latches. If, for example, the on-chip data bus is a 64 bit bus and the corresponding word line has 1024 bits, then 16 on-chip clock cycles are required to load all the data in the corresponding SA/Latches. These SA/latches may be isolated from the multi-switch storage cell memory array, such as multi-switch storage cell memory array illustrated in FIG. 26A as described above, enabling RESET and SET operations as described further above with respect to prior art FIG. 8 to be performed, ending with a RESET operation in which all resistive change elements in electrical communication with the selected word lines are left in a high resistance RESET state. Then, the WRITE data from the SA/latches may be transferred to the corresponding selected resistive change elements. For logic “0”, the resistance change elements are left in a high resistance state. For a logic “1”, the resistance change elements are adjusted to a low resistance state.

Combinations of both the first and second preventative methods may be used to minimize the risk of resistive change elements in multi-switch storage cells transitioning to non-recoverable high resistance or low resistance states without disturbing stored resistance values. These same methods may be applied to resistive change elements in single-switch storage cells.

If these methods of preventing too-low resistive change element SET resistance values and too-high RESET resistance values for the selected resistive change element (RCE) are not successful, resistance value of the RCE may be measured as described further above with respect to resistance measurement of a RCE in a MSSC memory array 4300 illustrated in FIGS. 43A and 43B. If the RCE operation cannot be restored, then the defective RCE may be replaced by a redundant RCE element as described further above with respect to 3D MSSC array select line drive matrix with redundancy 4400 illustrated in FIGS. 44-1 and 44-2.

3D MSSC Memory Cell Level Data Processing for Machine Learning, Artificial Intelligence, and Other Applications Using in Memory Computing 3D MSSC memory cell level data processing is enabled by a 3D MSSC array architecture with select lines SL parallel to word lines WL and bit lines BL orthogonal to select lines SL and word lines WL. This is because the 3D MSSC array architecture is configured and functionally operated in such a way that no current flows between multiple CNT switch cells as described further above. A READ operation, with relatively small signal voltages, is especially sensitive to such sneak path currents between multi-switch storage cells in either bit line or word line direction, which can vary depending on the data stored in other multi-switch storage cells within the same memory sub-array.

As described further above, for diagnostic purposes in case of a data error, the combination of FIGS. 43A and 43B illustrate resistance measurement of 1 selected RCE of n RCEs in a MSSC memory array 4300 and 4350, respectively, which provides a voltage proportional to the actual resistance (analog) value of the RCE as described further above. If performing an initialization operating described with respect to FIG. 42F is not successful in restoring the RCE operation, then the defective RCE is replaced with a redundant RCE as described with respect to FIGS. 44-1 and 44-2. The repaired MSSC cell still has n operational resistive change elements because the defective selected RCE has been replaced with a redundant RCE. Circuits and the functional operation to replace the defective RCE is described further above with respect to 3D MSSC array select line drive matrix with redundancy 4400 illustrated in FIGS. 44-1 and 44-2.

An example of cell level data processing was described further above with respect to FIGS. 43A and 43C. The circuits and operations used to measure the resistance state of one RCE in a MSSC described further above with respect to FIGS. 43A and 43B may be modified to measure the cell-level resistance of a MSSC with all n RCEs in parallel as described further above with respect to parallel resistance measurement of all RCEs in a MSSC array memory 4375 illustrated in FIG. 43C.

At this point in the specification, descriptions of various digital and analog circuits and corresponding MSSC cell-level operations that may be performed is described further below with respect to 3D MSSC memory cell level data processing architecture schematic 4600 illustrated in FIG. 46. 3D MSSC memory on-chip controller 4045 illustrated in FIG. 40 may be modified to also include MSSC cell-level operation in high speed digital and/or analog modes described further below.

Assuming a 3D MSSC memory having memory arrays formed with multi-switch storage cells with n resistive change elements with bottom electrodes BE in electrical communication with each other and one terminal of a cell select device, such as source S of a cell select FET for example, and n top electrodes TE in electrical communication with n corresponding select lines SL at zero volts (ground), then the total resistance $R_T$ of the parallel combination of all n resistive change elements within each selected cell along a selected word line can be outputted to the corresponding bit line BL in electrical communication with drain D of the cell select FET of each multi-switch storage cell. The value of resistance $R_T$ of n parallel resistive change elements in parallel can be calculated using equation EQ. 18 as follows.

$$1/R_T = 1/R_1 + 1/R_2 1/R_3 + 1/R_4 \ldots + 1/R_K \ldots + 1/Rn \qquad \text{[EQ. 18]}$$

The value of $R_T$ can be determined electronically by cell level data processing as described further below. The electronically determined value of $R_T$ for each multi-switch storage cell outputted on each corresponding bit line BL can be electronically compared with a chosen trigger voltage $V_{TRIG}$, which is similar to a reference voltage $V_{REF}$ described further above and illustrated in FIG. 26A. Referring to FIG. 46, the voltage corresponding to a cell resistance value $R_T$ may be determined by passing a known current from a known current source through all the n resistive change elements electrically connected in parallel in a multi-switch storage cell to generate a bit line voltage proportional to the value $R_T$ as described further below. If, for example, the voltage proportional to the determined value of $R_T$ is greater than a voltage proportional to the desired trigger voltage $V_{TRIG}$ resistance value, an electronic circuit switches to an output of $V_{DD}$. However, if the voltage proportional to the value of $R_T$ is less than the voltage proportional to the desired trigger $V_{TRIG}$ resistance value, then, for example, the electronic circuit switches to an output voltage of zero volts. The desired reference (or trigger) resistance value can be calculated using equation EQ. 18 and the corresponding voltage proportional to the resistance value may be calculated by resistance value $R_T$ multiplied by the current from the known current source as described further below. Since multiple combinations of individual resistive change element resistance values $R_1$ to Rn can result in the same values of $R_T$ and corresponding bit line voltages greater than the desired reference (or trigger) value, or less than the desired trigger value, computer calculations may be useful in determining the desired reference (or trigger) $R_T$ and corresponding voltage value. The desired reference (or trigger) voltage value(s) may be an input to the 3D MSSC memory from an external source such as a processor (CPU, GPU, or other processor), a logic function such as an FPGA, or a subsystem or system.

The cell level data processing circuit described further above provides an output in digital form. That is, a voltage of $V_{DD}$ or zero volts, by comparing the reference (or trigger) voltage $V_{TRIG}$ with the bit line voltage resulting from a current source flowing through parallel connection of the resistive change elements in the selected multi-switch storage cell. Alternatively, a cell level data processing analog circuit may be used to provide an analog output voltage proportional to multi-switch storage cell resistance value $R_T$ as described further below.

It may be possible for 3D MSSC memory cell level data processing results to be transmitted to a processor that then modifies WRITE inputs to the 3D MSSC memory based on the results of the cell level data processing. The processor may change all or only a portion of the WRITE inputs with data masking for example. 3D MSSC memories with multiple resistive change elements per cell, for example n=16, 32, 64 or more, result in relatively large memory functions in a relatively small footprint. This compact, functionally relatively large 3D MSSC memory on a relatively small footprint, may enable one or more embedded memories, one or more embedded processors, and one or more embedded logic hardware accelerators such FPGAs on the same chip enabling substantially greater number of interconnections operating at substantially less capacitive loading enabling greater performance and lower power by reducing the number of needed on-off chip connections. An example of nonvolatile CNT field programmable gate array is illustrated in U.S. Pat. No. 7,852,114 issued to Bertin et al.

Figure 46:
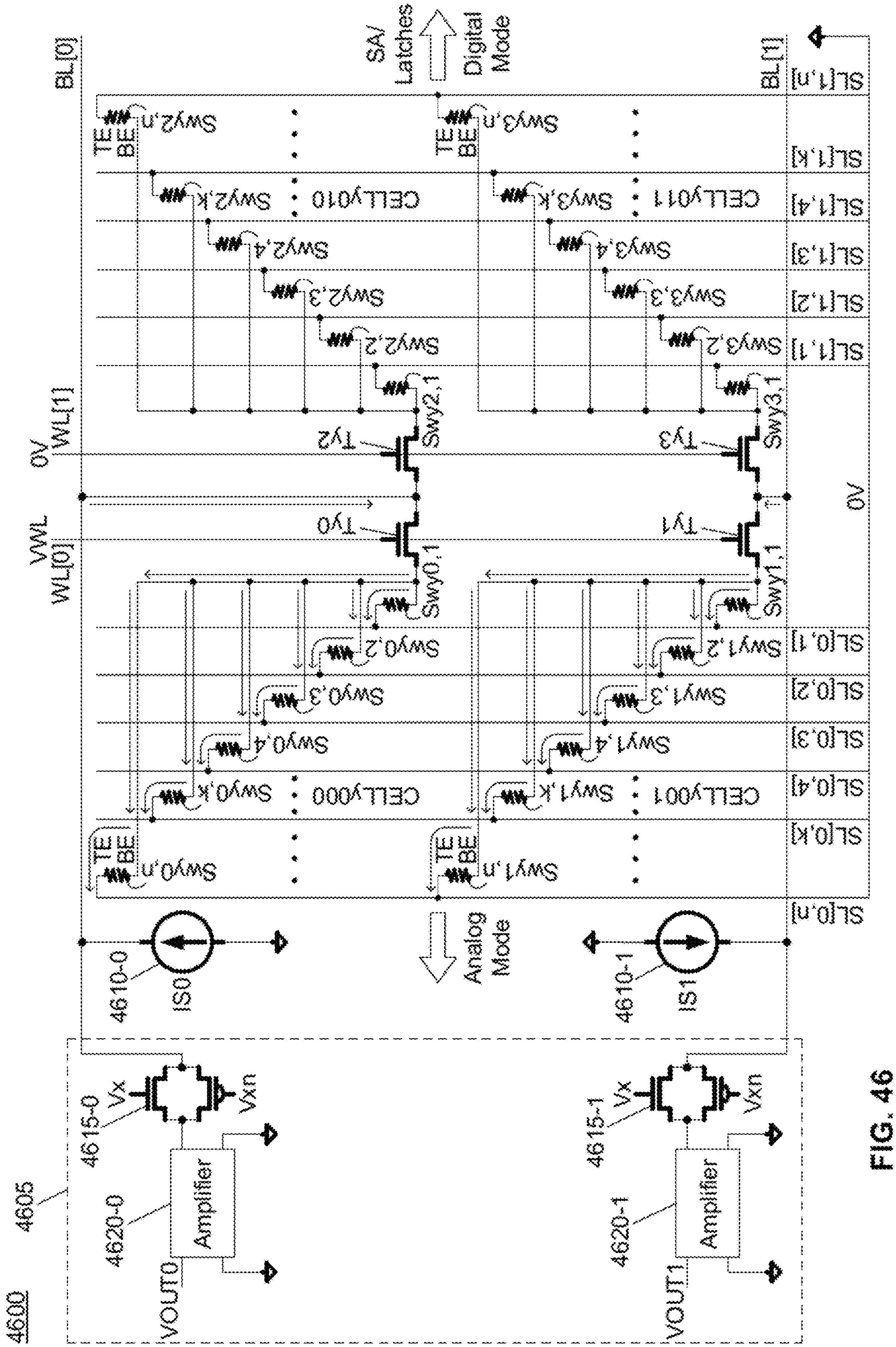
FIG. 46 illustrates the 3D MSSC memory cell level data processing architecture schematic in which the parallel resistance of a selected resistive change elements in a MSSC may be estimated using a digital readout or may be measured precisely using analog circuits in an example of in-memory processing. The MSSC resistance value may be changed by changing the resistance of one or more of the corresponding resistive change elements.

Referring now to FIG. 46, 3D MSSC memory cell level data processing architecture schematic 4600 shows the CELLy000, CELLy001, CELLy010, and CELLy011 subset of multi-switch storage cell memory array 2400 illustrated in FIGS. 24-1 and 24-2, cell level data processing analog circuit 4605, and current sources 4610-0 and 4610-1. In this example, and referring now to multi-switch storage cell CELLy000, word line WL[0] is activated and turns cell select FET Ty0 to an ON state electrically connecting bit line BL[0], in electrical communication with drain D of cell select FET Ty0, to source S of cell select FET Ty0, which is in electrical communication with bottom electrodes BE of all resistive change elements SWy0,1 to SWy0,n. The top electrodes TE of all resistive change elements SWy0,1 to SWy0,n are each in electrical communication with separate select lines SL[0,1] to SL[0, n], respectively, all of which are in electrical communication with zero volts (ground) as illustrated in FIGS. 43A and 43C. Current source 4610-0 supplies a known current to array bit line BL[0], which flows though all parallel connected resistive change elements in multi-switch storage cell CELLy000. The resistance of all resistive change elements in CELLy000 have a combined value of $R_{T0}$ as shown by equation EQ. 18, resulting in bit line voltage $V_{BL0}$ equal to $I_{S0} \times R_{T0}$. Current source circuits are described in the reference R. J. Baker, *CMOS: Circuit Design, Layout, and Simulation* pp. 427-433 (IEEE Press 1998), pp. 427-433 of which are hereby incorporated by reference.

Referring now to FIG. 46, 3D MSSC memory cell level data processing architecture schematic 4600 shows the CELLy000, CELLy001, CELLy010, and CELLy011 subset of multi-switch storage cell memory array 2400 illustrated in FIGS. 24-1 and 24-2, cell level data processing analog circuit 4605, and current sources 4610-0 and 4610-1. In this example, and referring now to multi-switch storage cell CELLy001, word line WL[0] is activated and turns cell select FET Ty1 to an ON state electrically connecting bit line BL[1], in electrical communication with drain D of cell select FET Ty1, to source S of cell select FET Ty1, which is in electrical communication with bottom electrodes BE of all resistive change elements SWy1,1 to SWy1,n. The top electrodes TE of all resistive change elements SWy1,1 to SWy1,n are each in electrical communication with separate select lines SL[0,1] to SL[0, n], respectively, all of which are in electrical communication with zero volts (ground) as illustrated in FIGS. 43A and 43C. Current source 4610-1 supplies a known current to array bit line BL[1], which flows though all parallel connected resistive change elements in multi-switch storage cell CELLy001. The resistance of all resistive change elements in CELLy001 have a combined value of $R_{T1}$ as shown by equation EQ. 18, resulting in bit line voltage $V_{BL1}$ equal to $I_{S1} \times R_{T1}$. Typically, $I_{S0}=I_{S1}$.

Referring now to FIG. 46, word line WL[1] is at zero volts and cell select FETs Ty2 and Ty3 are in an OFF state. Select lines SL[1,1] to SL[1,n] lines are at zero volts. The bit line voltage in electrical communication with drains D of cell select FETs Ty2 and Ty3 is 0.5 V or less during cell level data processing operations as described further below. Therefore, resistive change elements resistance states in CELLy010 and CELLy011 are not disturbed.

The bit line voltages occurring during 3D MSSC memory cell level data processing must not disturb the nonvolatile resistance state of the resistive change elements. As discussed further above, the SET voltage applied to bit lines is $V_{SET}$ 1-1.5 V for example. During cell level data processing, the maximum voltage is limited to 0.5 V to provide a 0.5 V margin.

Referring now to equation EQ. 18, if the resistance values of all resistive change elements in parallel have the same resistance value, $R_1=R_2=R_3=R_4= \ldots R_K= \ldots Rn=R$, then $R_T=R/n$. As described further above, resistive change element resistance used in these examples has a high resistance state value of $R_{HI}$=2 MS/and low resistance state value of $R_{LO}$=100 kΩ. In this example, n=16 resistive change elements per multi-switch storage cell is assumed, therefore $R_{TMAX}$=(2 MΩ/16)=125 kΩ. The SET voltage in this example is in the range of 1.0 to 1.5 V. Therefore, the current source value is chosen such that the bit line voltage does not exceed 0.5 V so as not to disturb resistive change element resistance change values. If $I_{S0}=I_{S1}$=4 uA, then $V_{BL0}$ and $V_{BL1}$ have a maximum voltage of 125 kΩ×4 uA equal to 0.5 V (500 mV). The value of $R_{TMIN}$=(100 kΩ/16)=6.25 kΩ. Therefore, with a current source of 4 uA, $V_{BL0}$ and $V_{BL1}$ have a minimum voltage of 6.25 kΩ×4 uA equal to 25 mV. The voltage range of bit lines BL[0] and BL[1], or any other bit line along selected word line WL[0], is 25 mV to 500 mV.

Referring to FIG. 46, current sources 4610-0 and 4610-1 are in electrical communication with bit lines BL[0] and BL[1], respectively. Referring to cell level data processing analog circuit 4605, CMOS transfer devices 4615-0 and 4615-1 in electrical communication with bit lines BL[0] and BL[1], respectively, and amplifiers 4620-0 and 4620-1, respectively. Amplifiers 4620-0 and 4620-1 provide analog output voltages $V_{OUT0}$ and $V_{OUT1}$ proportional to array bit line BL[0] voltage $V_{BL0}$ and array bit line BL[1] voltage $V_{BL1}$, respectively.

In operation, current sources 4610-0 and 4610-1 supply source currents Iso and Isi to bit lines BL[0] and BL[1], respectively, resulting in bit line voltages $V_{BL0}=I_{S0} \times R_{T0}$ and $V_{BL}$1=Isi×$R_{T1}$, respectively, where the maximum value of Iso and Isi is 4 uA in this example. Typically, in this example, $I_{S0}=I_{S1}=I_S$=4 uA. Referring now to FIGS. 43A and 46, bit line drivers 4320 and 4325 may be tri-stated so that current sources 4610-0 and 4610-1 may supply current to bit lines BL[0] and BL[1], respectively. Alternatively, the current from current sources 4610-0 and 4610-1 may be provided by modifying bit line drivers 4320 and 4325 illustrated in FIG. 43A to include a current source option, such as described in the reference R. J. Baker, *CMOS: Circuit Design, Layout, and Simulation* pp. 427-433 (IEEE Press 1998), pp. 427-433 of which are hereby incorporated by reference.

In a digital cell level data processing operation, CMOS transfer devices 4615-0 and 4615-1 are in an OFF state. Referring now to 3D MSSC memory open architecture schematic 2600 illustrated in FIG. 26A, a 3D MSSC memory control circuit such as 3D MSSC memory on-chip controller 4045 illustrated in FIG. 40 replaces the reference voltage $V_{REF}$ with trigger voltage $V_{TRIG}$ used in a digital cell level processing operation. SA/Latches 635-0 and 635-1 outputs X1 and X2, respectively, switch to a voltage of $V_{DD}$ or 0V. If, for example, $V_{BL0}$ is greater than $V_{TRIG}$ applied to reference line 625 (RL), then output X1 switches to $V_{DD}$ corresponding to READ timing diagram 1580 illustrated in FIG. 15D. However, for example, if $V_{BL1}$ is less than $V_{TRIG}$ applied to reference line 625 (RL), then the output X1 switches to 0 V as illustrated in READ timing diagram 1590 illustrated in FIG. 15E.

The SA/Latches of all bit lines activated by word line WL[0] in this example, temporarily store SA/Latch states corresponding to output X1 voltages of $V_{DD}$ or 0V. Data bus lines forming data bus 2690 shown in FIG. 26A transfer $V_{DD}$ or 0 V to an external data bus through I/O drivers 955 illustrated in FIG. 40.

Referring now to cell level data processing analog circuit 4605 illustrated in FIG. 46 and 3D MSSC memory open architecture schematic 2600 illustrated in FIG. 26A, multi-switch storage cell memory array bit lines such as bit lines BL[0] and BL[1] can be isolated from SA/latches such as SA/Latches 635-0 and 635-1 by turning OFF isolation devices, such as isolation devices $T_{ISB0}$ and $T_{ISB1}$, respectively, and bit lines such as BL[0] and BL[1] can be isolated from bit line drivers such as voltage shifter/driver 2630-0 and voltage shifter/driver 2630-1 by turning OFF WRITE select FET devices $T_{WR0}$ and $T_{WR1}$. Isolating multi-switch storage cell memory array 2400 is needed during 3D MSSC memory cell level data processing in an analog mode since SA/latch switching may drive bit lines BL[0] and BL[1] to 0.3 V or 0V as described further above, thereby interfering with the analog operation.

Memory operation can be carried out during 3D MSSC memory cell level data processing in an analog mode because SA/latches are electrically isolated from corresponding bit lines as explained further above. For example, SA/Latch data transfer to the on-chip data bus and I/O drivers to the external data-bus and data transfer from the external data bus to I/O drivers and the on-chip data bus to SA/Latches may be carried out at the same time as analog cell level data processing.

Referring now to cell level data processing analog circuit 4605 illustrated in FIG. 46, CMOS amplifier design options are described in R. J. Baker, *CMOS: Circuit Design, Layout, and Simulation* Chapter 12, pp. 489-524 (IEEE Press 1998), pp. 489-524 of which are hereby incorporated by reference.

Amplifiers 4620-0 and 4620-1 gain may be chosen such that VouTo and VouTi outputs, respectively, are consistent with relatively low voltage operation. As described further above, for a maximum resistance change value of $R_{HI}$=2 MS/and multi-switch storage cells with n=16 resistive change elements, bit lines such as BL[0] and BL[1] voltage for a current source of 4 uA is 500 mV. The corresponding minimum bit line voltage for the current source of 4 uA is 25 mV. An amplifier gain of 4 results in an amplifier operating range of 0.1 V to 2 V. If the $R_{HI}$ is reduced to 1 MΩ, then a current source of 8 uA results in a maximum bit line voltage of 500 mV. The minimum voltage for an 8 uA current source is 50 mV. With an amplifier gain of 4, the amplifier output voltage range is 0.2 V to 2 V, for example.

An A/D converter (not shown) may be added to cell level data processing analog circuit 4605 outputs to convert the analog voltage to digital outputs. A/D converters are described in the reference R. J. Baker, *CMOS: Circuit Design, Layout, and Simulation* Chapter 12, pp. 489-524 (IEEE Press 1998), pp. 489-524 of which are hereby incorporated by reference.

Referring now to FIGS. 15D and 15E, 24-1, 24-2, 26A, 42A-42E, and 46, any multi-switch storage cell subarray in a 3D MSSC memory may be operated in a resistive change element READ and WRITE mode for any individual resistive change element in each multi-switch storage cell in the subarray as described further above. Also, any multi-switch storage cell subarray in a 3D MSSC memory may also be operated in a cell level processing circuit mode in which an output corresponding to the parallel resistance $R_T$ (EQ. 18) may be calculated as described further above.

A Potential Applications of 3D MSSC Memory Cell Level Data Processing

A potential application of 3D MSSC memory cell level data processing in the area of large high-speed neural networks is described further below. Referring now to U.S. Pat. No. 8,659,940, Carbon Nanotube-Based Neural Networks and Methods of Making and Using Same, issued to Bertin et al., resistive change elements using CNT switches are used to store weighting factors. CNT switches and CMOS circuits are combined to form carbon nanotube (CNT) dendrites, CNT neurons, CNT axons, CNT synapse, and are interconnected in ways that simulate biological neurological functions. Incremental voltages and currents applied to CNT switches result in small changes in stored resistance values. Currents flowing through CNT switches connected to nodes, for example, can result in increased voltages, and when voltages exceed a reference value, CNT synapses "fire" generating pulse spikes that travels through the CNT-based neural network, in which multiple CNT switches change to other resistive states. Such a CNT neural network is low speed and low power. However, the concept of CNT switches storing weighting factors may be used in large high-speed neural networks as described further below.

Referring now to 3D MSSC memory open architecture schematic 2600 illustrated in FIG. 26A, multi-switch storage cell memory array 2400 illustrated in FIGS. 24-1 and 24-2, and 3D MSSC memory cell level data processing architecture schematic 4600 illustrated in FIG. 46 with multi-switch storage cell examples using n=16 resistive change elements per cell (n may be less than 16, or 32, 64, or more), resistive change elements may be used to store the weighting factors of high-speed neural networks. Cell level data processing of weighting factors may be carried out at the high speed of 3D MSSC memory. 3D MSSC memories described further above can overlap memory READ and WRITE operations and cell level data processing operations, since sub-arrays described further above can operate in both modes. For example, 3D MSSC memory open architecture schematic 2600 illustrated in FIG. 26A and described further above supports both modes of operation. It may be possible for 3D MSSC memory cell level data processing results to be transmitted to a processor that then modifies WRITE inputs to the 3D MSSC memory based on the results of the cell level data processing. The processor may change all or only a portion of the WRITE inputs with data masking for example.

Referring now to 3D MSSC memory open architecture schematic 2600 illustrated in FIG. 26A, multi-switch storage cell memory array 2400 illustrated in FIGS. 24-1 and 24-2, 3D MSSC memory cell level data processing architecture schematic 4600 illustrated in FIG. 46, and equation EQ. 18, resistive change elements can be in a low resistance state $R_{LO}$, which is equal to 100 kΩ (or lower) in this example, or a high resistance state $R_{HI}$, which is equal to 2 MΩ (or higher) in this example. However, referring to equation EQ. 18 and as described further above, for n=16, all multi-switch storage cell resistance values combined in parallel, $R_T$, are between a maximum resistance of 125 kΩ and a minimum resistance is 6.25 kΩ. Resistance values between 125 kΩ and 6.25 MΩ can be formed with many combinations of $R_{HI}$ and $R_{LO}$ resistance values. Each multi-switch storage cell at a bit line and word line intersection can have a different value of $R_T$. 3D MSSC memory open architecture schematic 2600 illustrated in FIG. 26A, operating in a cell level data processing mode with trigger line (reference line) 625 voltage equal to $V_{TRIG}$, can simultaneously compare bit line voltages to a trigger (reference) voltage proportional the $R_T$ across all bit lines intersecting the selected word line, store results in SA/Latches 635 and provide 1024 output voltages VOUT at $V_{DD}$ or zero volts to external bidirectional data bus 970 as illustrated in FIG. 40, depending if bit line voltage $V_{BL}$ is greater than the reference (or trigger) voltage $V_{TRIG}$ or less than $V_{TRIG}$, respectively. A processor may use these voltages to adjust some or all resistive change elements in the various multi-switch storage cells of a 3D MSSC array.

Also, cell level data processing analog circuit 4605 illustrated in FIG. 46 can provide analog outputs corresponding to each bit line along a selected word line, such as output voltage $V_{OUT0}$ corresponding to array bit line BL[0] and $V_{OUT1}$ corresponding to array bit line BL[1].

3D MSSC memories with multiple resistive change elements per cell, for example n=16, 32, 64 or more, result in relatively large memory functions in a relatively small footprint. This compact, functionally relatively large 3D MSSC memory on a relatively small footprint, and may enable one or more embedded 3D MSSC memories, one or more embedded processors, and one or more embedded logic hardware accelerators such FPGAs on the same chip enabling substantially greater number of interconnections operating at substantially less capacitive loading, enabling greater performance and lower power by reducing the number of needed off chip connections, resulting in a substantially high-speed neural network.

These multiple embedded chips may be tiled and interconnected in a multi-chip package with a processor, controller, and other functions.

Although the present disclosure has been described in relation to particular embodiments thereof, many other variations and modifications and other uses will become apparent to those skilled in the art. It is preferred, therefore, that the present disclosure not be limited by the specific disclosure herein.

What is claimed is:

1. An electrical device comprising:

a multi-switch storage cell array, wherein said multi-switch storage cell array comprises:

a plurality of bit lines;

a plurality of word lines;

a plurality of groups of multiple select lines; and a plurality of multi-switch storage cells, wherein each multi-switch storage cell comprises:

a plurality of resistive change elements, wherein each resistive change element has a first electrode, a second electrode, and a resistive change material between said first electrode and said second electrode, and wherein each first electrode is in electrical communication with a select line of a group of multiple select lines;

a field effect transistor having a drain terminal, a gate terminal, and a source terminal, wherein said drain terminal is in electrical communication with a bit line of said plurality of bit lines, and wherein said gate terminal is in electrical communication with a word line of said plurality of word lines; and an intracell wiring electrically connecting second electrodes of said plurality of resistive change elements together and to said source terminal of said field effect transistor;

a plurality of circuits configured to supply an amount of current for a cell level operation of a multi-switch storage cell of said plurality of multi-switch storage cells, wherein each circuit is in electrical communication with a bit line of said plurality of bit lines;

a plurality of word line driver circuits, wherein each word line driver circuit is in electrical communication with a word line of said plurality of word lines;

a plurality of select line driver circuitries, wherein each select line driver circuitry is in electrical communication with a group of multiple select lines of said plurality of groups of multiple select lines, wherein each select line driver circuitry is configured to receive signals from decoders, and wherein each select line driver circuitry is configured to apply voltages to select lines based on signals from decoders; and wherein said plurality of circuits configured to supply an amount of current for a cell level operation of a multi-switch storage cell of said plurality of multi-switch storage cells, said plurality of word line driver circuits, and said plurality of select line driver circuitries are operable together to generate a voltage for a cell level operation of a multi-switch storage cell of said plurality of multi-switch storage cells.

2. The electrical device of claim 1, wherein each resistive change element is adjustable between at least two resistive states.

3. The electrical device of claim 2, wherein resistive change elements of each plurality of resistive change elements store weighting factors of a neural network.

4. The electrical device of claim 1, wherein said resistive change material comprises a nanotube fabric.

5. The electrical device of claim 1, wherein said word line forms said gate terminal of said field effect transistor.

6. The electrical device of claim 1, wherein said plurality of circuits configured to supply an amount of current for a cell level operation of a multi-switch storage cell of said plurality of multi-switch storage cells are current sources.

7. The electrical device of claim 1, wherein said plurality of circuits configured to supply an amount of current for a cell level operation of a multi-switch storage cell of said plurality of multi-switch storage cells are bit line driver circuits.

8. The electrical device of claim 1, further comprising a cell level data processing analog circuit configured to provide output voltages for cell level operations of multi-switch storage cells of said plurality of multi-switch storage cells, wherein said cell level data processing analog circuit is in electrical communication with said plurality of bit lines.

9. The electrical device of claim 8, wherein said cell level data processing analog circuit comprises:

a plurality of complementary metal-oxide semiconductor transfer devices, wherein each complementary metal-oxide semiconductor transfer device is in electrical communication with a bit line of said plurality of bit lines; and a plurality of amplifiers, wherein each amplifier is in electrical communication with a complementary metal-oxide semiconductor transfer device of said plurality of complementary metal-oxide semiconductor transfer devices.

10. An electrical device comprising:

a multi-switch storage cell array, wherein said multi-switch storage cell array comprises:

a plurality of bit lines;

a plurality of word lines;

a plurality of groups of multiple select lines; and a plurality of multi-switch storage cells, wherein each multi-switch storage cell comprises:

a plurality of resistive change elements, wherein each resistive change element has a first electrode, a second electrode, and a resistive change material between said first electrode and said second electrode, and wherein each first electrode is in electrical communication with a select line of a group of multiple select lines;

a field effect transistor having a drain terminal, a gate terminal, and a source terminal, wherein said drain terminal is in electrical communication with a bit line of said plurality of bit lines, and wherein said gate terminal is in electrical communication with a word line of said plurality of word lines; and an intracell wiring electrically connecting second electrodes of said plurality of resistive change elements together and to said source terminal of said field effect transistor;

a bit line segment for each bit line of said plurality of bit lines;

an isolation device for each bit line of said plurality of bit lines, wherein each isolation device is in electrical communication with a bit line of said plurality of bit lines and a bit line segment for that bit line, and wherein each isolation device is configured to electrically connect a bit line of said plurality of bit lines and a bit line segment for that bit line based on a signal from a controller;

a plurality of latch circuits, wherein each latch circuit is in electrical communication with a bit line segment;

a reference line interface circuit in electrical communication with said plurality of latch circuits, wherein said reference line interface circuit is configured to provide a trigger voltage to said plurality of latch circuits;

a cell level data processing analog circuit configured to provide output voltages for cell level operations of multi-switch storage cells of said plurality of multi-switch storage cells, wherein said cell level data processing analog circuit is in electrical communication with said plurality of bit lines;

a plurality of circuits configured to supply an amount of current for a cell level operation of a multi-switch storage cell of said plurality of multi-switch storage cells, wherein each circuit is in electrical communication with a bit line of said plurality of bit lines;

a plurality of word line driver circuits, wherein each word line driver circuit is in electrical communication with a word line of said plurality of word lines; and a plurality of select line driver circuitries, wherein each select line driver circuitry is in electrical communication with a group of multiple select lines of said plurality of groups of multiple select lines, wherein each select line driver circuitry is configured to receive signals from decoders, and wherein each select line driver circuitry is configured to apply voltages to select lines based on signals from decoders.

11. The electrical device of claim 10, wherein said electrical device is operable in a digital mode for cell level operations and an analog mode for cell level operations.

12. The electrical device of claim 11, wherein said electrical device operable in a digital mode and an analog mode at a same time for cell level operations of a multi-switch storage cell of said plurality of multi-switch storage cells.

13. The electrical device of claim 10, wherein each resistive change element is adjustable between at least two resistive states.

14. The electrical device of claim 13, wherein resistive change elements of each plurality of resistive change elements store weighting factors of a neural network.

15. The electrical device of claim 10, wherein said resistive change material comprises a nanotube fabric.

16. The electrical device of claim 10, wherein said word line forms said gate terminal of said field effect transistor.

17. The electrical device of claim 10, wherein each isolation device is a field effect transistor.

18. The electrical device of claim 10, wherein each latch circuit comprises:

two cross coupled complementary metal-oxide semiconductor inverters;

a pull up transistor; and a pull down transistor.

19. The electrical device of claim 10, wherein said plurality of circuits configured to supply an amount of current for a cell level operation of a multi-switch storage cell of said plurality of multi-switch storage cells are current sources.

20. The electrical device of claim 10, wherein said plurality of circuits configured to supply an amount of current for a cell level operation of a multi-switch storage cell of said plurality of multi-switch storage cells are bit line driver circuits.

21. The electrical device of claim 10, wherein said cell level data processing analog circuit comprises:

a plurality of complementary metal-oxide semiconductor transfer devices, wherein each complementary metal-oxide semiconductor transfer device is in electrical communication with a bit line of said plurality of bit lines; and a plurality of amplifiers, wherein each amplifier is in electrical communication with a complementary metal-oxide semiconductor transfer device of said plurality of complementary metal-oxide semiconductor transfer devices.

22. An electrical device comprising:

a multi-switch storage cell array, wherein said multi-switch storage cell array comprises:

a plurality of bit lines;

a plurality of word lines;

a plurality of groups of multiple select lines; and a plurality of multi-switch storage cells, wherein each multi-switch storage cell comprises:

a plurality of resistive change elements, wherein each resistive change element has a first electrode, a second electrode, and a resistive change material between said first electrode and said second electrode, and wherein each first electrode is in electrical communication with a select line of a group of multiple select lines;

a field effect transistor having a drain terminal, a gate terminal, and a source terminal, wherein said drain terminal is in electrical communication with a bit line of said plurality of bit lines, and wherein said gate terminal is in electrical communication with a word line of said plurality of word lines; and an intracell wiring electrically connecting second electrodes of said plurality of resistive change elements together and to said source terminal of said field effect transistor;

a bus line;

a plurality of bit line driver circuits, wherein each bit line driver circuit is in electrical communication with a bit line of said plurality of bit lines;

a plurality of word line driver circuits, wherein each word line driver circuit is in electrical communication with a word line of said plurality of word lines; and a plurality of select line driver circuitries, wherein each select line driver circuitry is in electrical communication with a group of multiple select lines of said plurality of groups of multiple select lines, wherein each select line driver circuitry is in electrical communication with said bus line, wherein each select line driver circuitry is configured to receive signals from decoders, and wherein each select line driver circuitry is configured to apply voltages to select lines and rout current to said bus line based on signals from decoders.

23. The electrical device of claim 22, further comprising a resistor in electrical communication with said bus line.

24. The electrical device of claim 23, wherein said electrical device is operable to generate a voltage for a cell level operation of a multi-switch storage cell of said plurality of multi-switch storage cells.

25. The electrical device of claim 23, further comprising an output pad in electrical communication with said bus line.

26. The electrical device of claim 23, further comprising:

a field effect transistor in electrical communication with said bus line;

an output pad in electrical communication with said field effect transistors; and an input/output driver circuit in electrical communication with said output pad.

27. The electrical device of claim 22, wherein each resistive change element is adjustable between at least two resistive states.

28. The electrical device of claim 27, wherein resistive change elements of each plurality of resistive change elements store weighting factors of a neural network.

29. The electrical device of claim 22, wherein said word line forms said gate terminal of said field effect transistor.

30. The electrical device of claim 22, wherein each bit line driver circuit of said a plurality of bit line driver circuits is configured to supply a voltage for a cell level operation of a multi-switch storage cell of said plurality of multi-switch storage cells.

31. The electrical device of claim 22, wherein each select line driver circuitry is configured to rout a current flowing through a resistive change element in a multi-switch storage cell of said plurality of multi-switch storage cell to said bus line.

32. The electrical device of claim 22, wherein each select line driver circuitry is configured to rout current flowing through all resistive change elements in a multi-switch storage cell of said plurality of multi-switch storage cells to said bus line.

* * * * *